US011605791B2

(12) United States Patent
Macinnis et al.

(10) Patent No.: US 11,605,791 B2
(45) Date of Patent: Mar. 14, 2023

(54) ORGANIC ELECTROLUMINESCENT MATERIALS AND DEVICES

(71) Applicant: UNIVERSAL DISPLAY CORPORATION, Ewing, NJ (US)

(72) Inventors: Morgan C. Macinnis, Ewing, NJ (US); George Fitzgerald, Lambertville, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 1062 days.

(21) Appl. No.: 16/117,638

(22) Filed: Aug. 30, 2018

(65) Prior Publication Data

US 2019/0074456 A1 Mar. 7, 2019

Related U.S. Application Data

(60) Provisional application No. 62/553,328, filed on Sep. 1, 2017.

(51) Int. Cl.

| | |
|---|---|
| ***H01L 51/54*** | (2006.01) |
| ***H01L 51/00*** | (2006.01) |
| ***H01L 51/50*** | (2006.01) |
| ***C07F 15/00*** | (2006.01) |

(52) U.S. Cl.

CPC ...... *H01L 51/0087* (2013.01); *C07F 15/0033* (2013.01); *C07F 15/0086* (2013.01); *H01L 51/0085* (2013.01); *H01L 51/0094* (2013.01); *H01L 51/5004* (2013.01); *H01L 51/5024* (2013.01); *H01L 51/5012* (2013.01); *H01L 51/5016* (2013.01)

(58) Field of Classification Search

None

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Yang et al. J. Mater. Chem. C 2013, 1, 3317. (Year: 2013).*
Rao et al. Chem. Eur. J. 2012, 18, 11306-11316. (Year: 2012).*
Machine translation of KR2014-0052757. (Year: 2014).*
A. Liberman-Martin et al. "A Remote Lewis Acid Trigger Dramatically Accelerates Biaryl Reduction Elimination from a Platinum Complex" J. A. Chem. Soc. 2013, 135, 9612-9615.

(Continued)

*Primary Examiner* — Andrew K Bohaty
(74) *Attorney, Agent, or Firm* — Duane Morris LLP

(57) ABSTRACT

A compound having a structure selected from the group consisting of:

Formula I

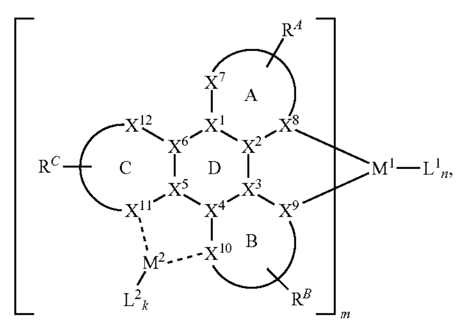

and

Formula II

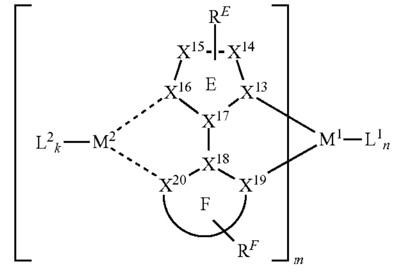

is disclosed.

16 Claims, 2 Drawing Sheets

(56) References Cited

U.S. PATENT DOCUMENTS

| | | | |
|---|---|---|---|
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2011/0050092 | A1* | 3/2011 | Takada ................... H05B 33/14 313/504 |
| 2014/0027716 | A1* | 1/2014 | Tsai .................... H01L 51/0067 257/40 |
| 2015/0200369 | A1* | 7/2015 | Kozhevnikov ....... H01L 51/009 544/225 |
| 2016/0072082 | A1 | 3/2016 | Brooks et al. |

FOREIGN PATENT DOCUMENTS

| | | | |
|---|---|---|---|
| EP | 2034538 | | 3/2009 |
| GB | 2515491 | | 12/2014 |
| JP | 200511610 | | 1/2005 |
| JP | 2007123392 | | 5/2007 |
| JP | 2007254297 | | 10/2007 |
| JP | 2008074939 | | 4/2008 |
| KR | 20140052757 | A * | 5/2014 |
| WO | 01/39234 | | 5/2001 |
| WO | 02/02714 | | 1/2002 |
| WO | 02015654 | | 2/2002 |
| WO | 03040257 | | 5/2003 |
| WO | 03060956 | | 7/2003 |
| WO | 2004093207 | | 10/2004 |
| WO | 2004107822 | | 12/2004 |
| WO | 2005014551 | | 2/2005 |
| WO | 2005019373 | | 3/2005 |
| WO | 2005030900 | | 4/2005 |
| WO | 2005089025 | | 9/2005 |
| WO | 2005123873 | | 12/2005 |
| WO | 2006009024 | | 1/2006 |
| WO | 2006056418 | | 6/2006 |
| WO | 2006072002 | | 7/2006 |
| WO | 2006082742 | | 8/2006 |
| WO | 2006098120 | | 9/2006 |
| WO | 2006100298 | | 9/2006 |
| WO | 2006103874 | | 10/2006 |
| WO | 2006114966 | | 11/2006 |
| WO | 2006132173 | | 12/2006 |
| WO | 2007002683 | | 1/2007 |
| WO | 2007004380 | | 1/2007 |
| WO | 2007063754 | | 6/2007 |
| WO | 2007063796 | | 6/2007 |
| WO | 2008056746 | | 5/2008 |
| WO | 2008101842 | | 8/2008 |
| WO | 2008132085 | | 11/2008 |
| WO | 2008143059 | | 11/2008 |
| WO | 2009000673 | | 12/2008 |
| WO | 2009003898 | | 1/2009 |
| WO | 2009008311 | | 1/2009 |
| WO | 2009018009 | | 2/2009 |
| WO | 2009021126 | | 2/2009 |
| WO | 2009050290 | | 4/2009 |
| WO | 2009062578 | | 5/2009 |
| WO | 2009063833 | | 5/2009 |
| WO | 2009066778 | | 5/2009 |
| WO | 2009066779 | | 5/2009 |
| WO | 2009086028 | | 7/2009 |
| WO | 2009100991 | | 8/2009 |
| WO | 2010032663 | | 3/2010 |

OTHER PUBLICATIONS

Shiba et al. "C—C Bond Forming Reductive Elimination from Diarylplatinum Complexes Driven by Visible-Light-Mediated Photoredox Reactions" Organometallics, 2015, 34, 4844-4853.

A. Liberman-Martin et al. "Biaryl Reductive Elimination is Dramatically Accelerated by Remote Lewis Acid Binding to a 2,2'-Bipyrimidyl-Platinum Complex: Evidence for a Bidentate Ligand Dissociation Mechanism" Organometallics 2016, 35, 1064-1069.

Trofymchuk, et al. "N-Arylcyano-β-diketiminate Methallyl Nickel Complexes: Synthesis, Adduct Formation, and Reactivity toward Ethylene" Organometallics 2013, 32, 7323-7333.

Na, et al. "Postsynthetic Systematic Electronic Tuning of Organoplatinum Photosensitizers via Secondary Coordination Sphere Interactions" Organometallics 2016, 35, 2267-2274.

Maity, et al. "Main Group Lewis Acid-Mediated Transformations of Transition-Metal Hydride Complexes" Chem. Rev. 2016, 116, 8873-8911.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

(56) References Cited

OTHER PUBLICATIONS

Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Tum-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergard et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/553,328, filed Sep. 1, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

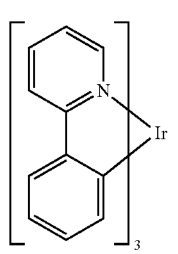

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Heterocyclic materials for use as blue phosphorescent materials in OLED devices is disclosed. The materials incorporate multiple aromatic rings bonded to transition metals. Aza-nitrogen atoms are incorporated to shift the color to shorter wavelengths. Lewis acids are bonded datively to these nitrogen atoms to stabilize the molecules A compound having a structure selected from the group consisting of:

Formula I

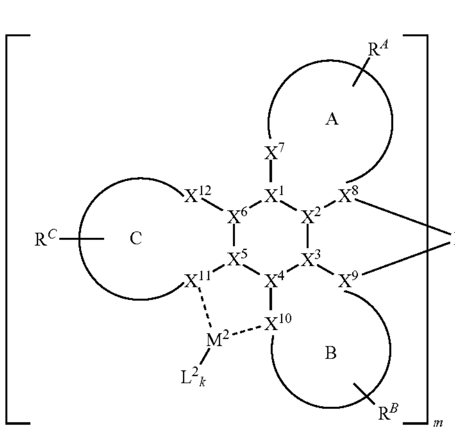

Formula II

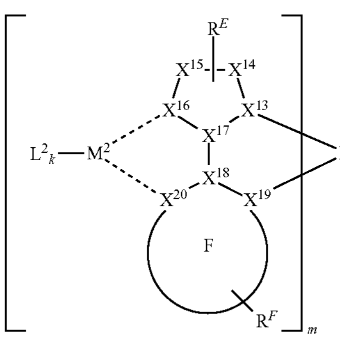

is disclosed. In Formula I and Formula II, $X^1$ to $X^{20}$ are each independently selected from the group consisting of carbon and nitrogen. In Formula I, rings A, B, and C are each independently a 5- or 6-membered aromatic ring, and all are fused to ring D and form a first ligand having an 18-$\pi$ electronic system. In Formula II, ring E is a 5-membered aromatic ring, ring F is a 5- or 6-membered aromatic ring, the structure formed by ring E and ring F connected together forms a first ligand in Formula II. $R^A$, $R^B$, $R^C$, $R^E$, and $R^F$ each independently represents none to a maximum possible number of substitutions. $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof. Any substitutions in $R^A$, $R^B$, $R^C$, $R^E$, and $R^F$ are optionally joined or fused into a ring. $M^1$ is a metal having atomic weight greater than 40. $M^2$ is selected from the group consisting of B, Al, Ga, Si, Ge, Sn, Zn, Cd, Pd, Pt, Co, Rh, Ir, Re, Ru, Os, Cu, Ag, and Au. In Formula I, $M^2$ coordinates to at least one of $X^{10}$ and $X^{11}$, and in Formula II, $M^2$ coordinates to at least one of $X^{16}$ and $X^{20}$. The variable m has a value of at least 1 and m+n is the maximum number of ligands that are attached to W. The variable k has a value of at least 1 and is the maximum number of ligands $L^2$ that can be attached to $M^2$ based on the valency of $M^2$. Each $L^1$ can be a monodentate or multidentate ligand. The first ligand is optionally linked with $L^1$ to comprise a multidentate ligand.

An OLED comprising the compound of the present disclosure in one of its organic layers is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
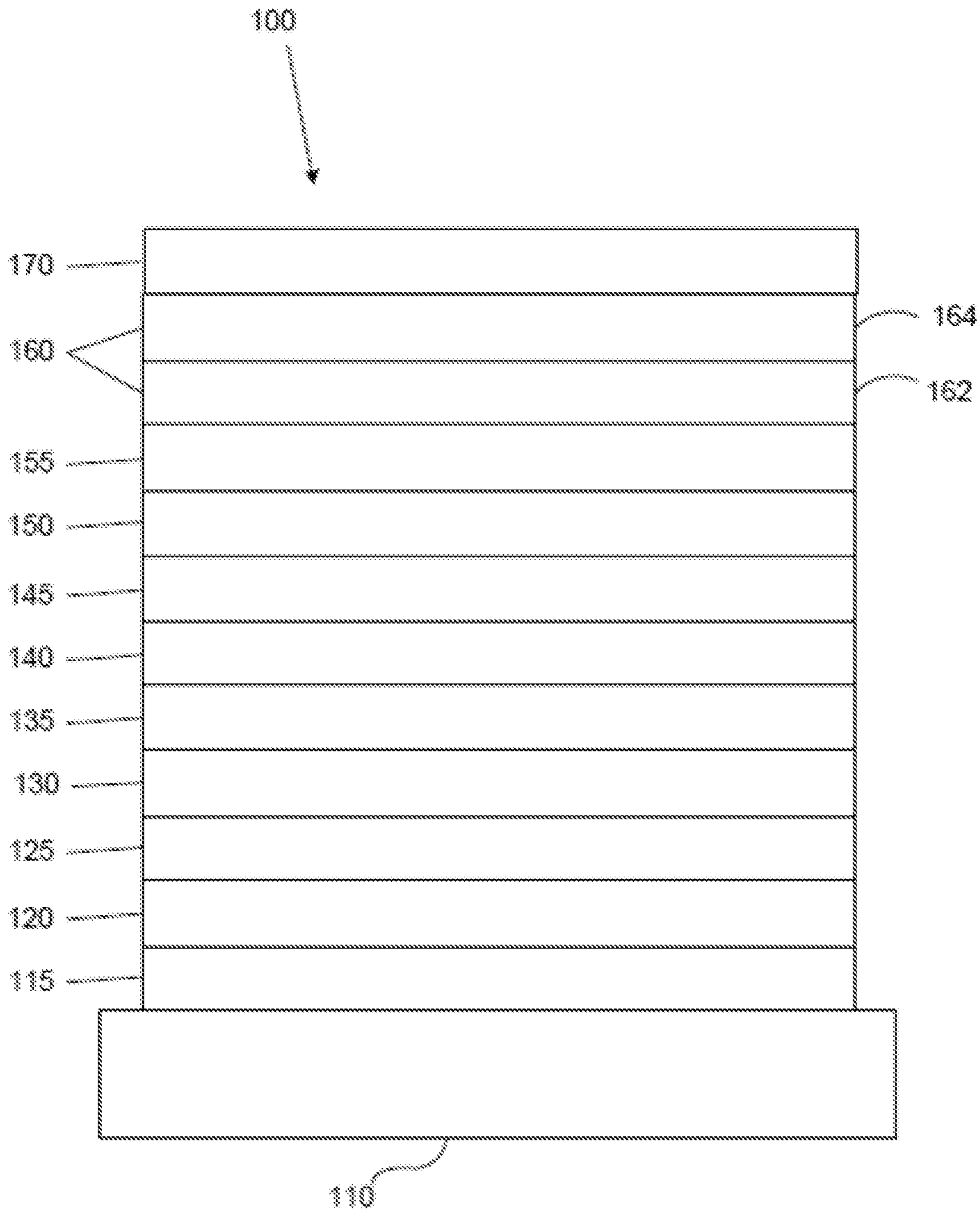
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
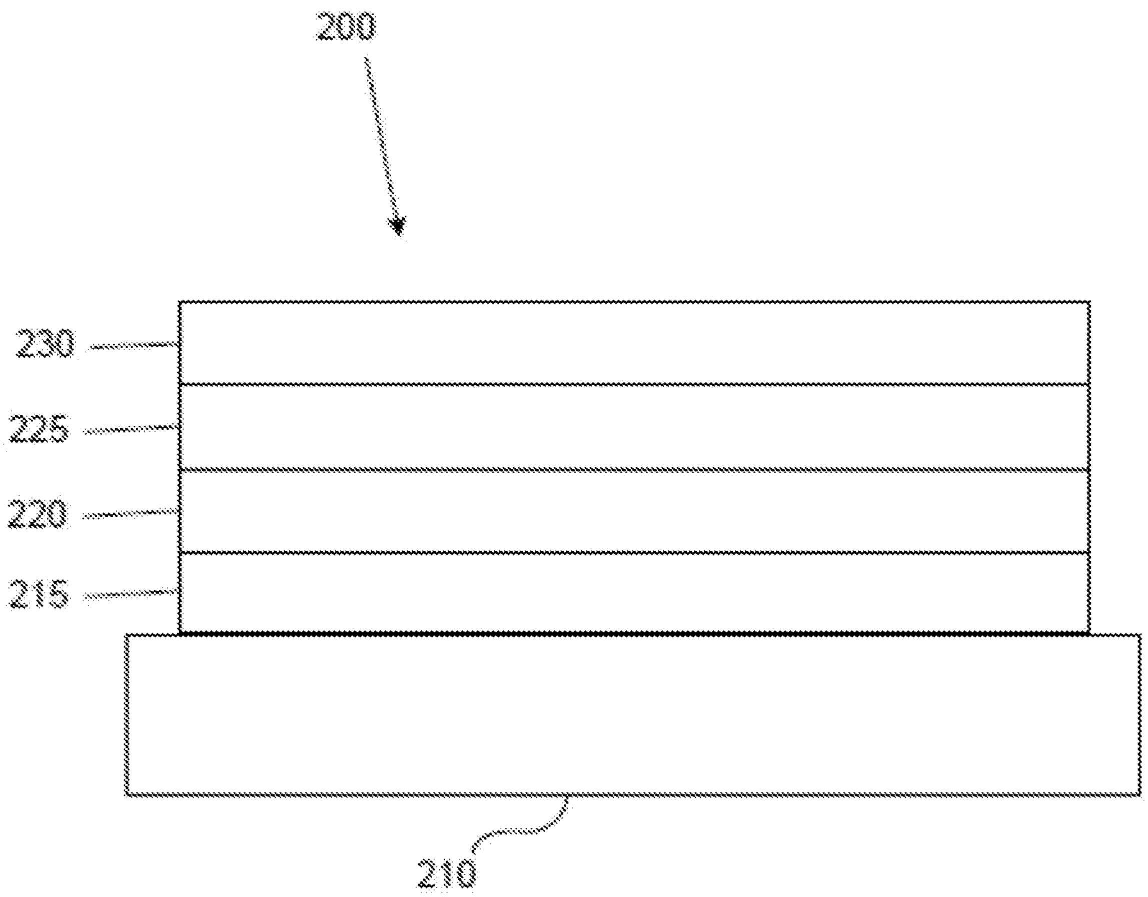
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each R can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

A compound having a structure selected from the group consisting of:

Formula I

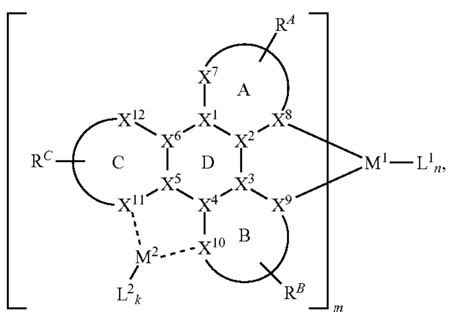

and

Formula II

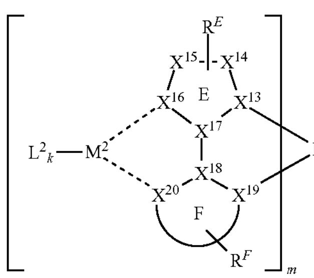

is disclosed. In Formula I and Formula II, $X^1$ to $X^{20}$ are each independently selected from the group consisting of carbon and nitrogen. In Formula I, rings A, B, and C are each independently a 5- or 6-membered aromatic ring, and all are fused to ring D and form a first ligand having an 18-π electronic system. In Formula II, ring E is a 5-membered aromatic ring, ring F is a 5- or 6-membered aromatic ring, the structure formed by ring E and ring F connected together forms a first ligand in Formula II. $R^A$, $R^B$, $R^C$, $R^E$, and $R^F$ each independently represents none to a maximum possible number of substitutions. $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof. Any substitutions in $R^A$, $R^B$, $R^C$, $R^E$, and $R^F$ are optionally joined or fused into a ring. $M^1$ is a metal having atomic weight greater than 40. $M^2$ is selected from the group consisting of B, Al, Ga, Si, Ge, Sn, Zn, Cd, Pd, Pt, Co, Rh, Ir, Re, Ru, Os, Cu, Ag, and Au. In Formula I, $M^2$ coordinates to at least one of $X^{10}$ and $X^{11}$, and in Formula II, $M^2$ coordinates to at least one of $X^{16}$ and $X^{20}$. The variable m has a value of at least 1 and m+n is the maximum number of ligands that are attached to W. The variable k has a value of at least 1 and is the maximum number of ligands $L^2$ that can be attached to $M^2$ based on the valency of $M^2$. Each $L^1$ can be a monodentate or multidentate ligand. The first ligand is optionally linked with $L^1$ to comprise a multidentate ligand.

In some embodiments of the compound, $R^A$, $R^B$, $R^C$, $R^E$, $R^F$, and $L^2$ are each independently selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some embodiments of the compound, $M^1$ is selected from the group consisting of Ir, Rh, Re, Ru, Os, Pt, Au, and Cu. In some embodiments, $M^1$ is Ir or Pt.

In some embodiments of the compound, $M^2$ is selected from the group consisting of B, Al, Zn, Si, and Ge. In some embodiments of the compound, n is 0. In other embodiments, n is at least 1.

In some embodiments of the compound, the rings A, B, C, and F are each independently a 6-membered aromatic ring. In some embodiments, one of the rings A, B, and C is a 5-membered aromatic ring, and the remaining rings A, B, and C are each independently a 6-membered aromatic ring. In other embodiments, two of the rings A, B, and C are each independently a 5-membered aromatic ring, and the remaining one of rings A, B, and C is a 6-membered aromatic ring.

In some embodiments of the compound, the ring A is a 5-membered aromatic ring, the rings B and C are each independently a 6-membered aromatic ring.

In some embodiments of the compound, the first ligand-$M^1$ is selected from the group consisting of:

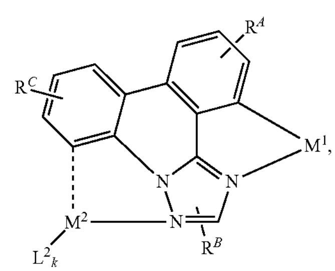

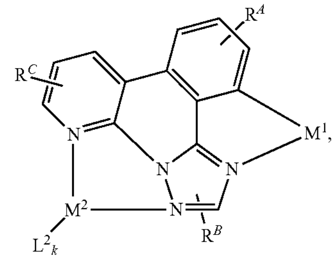

-continued
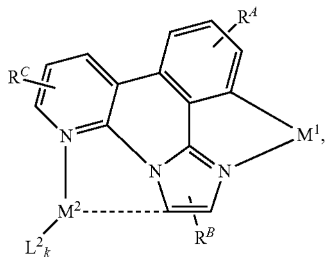
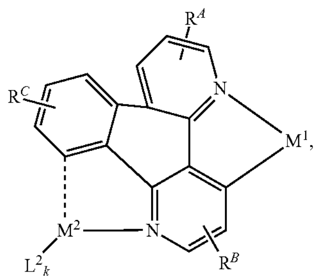
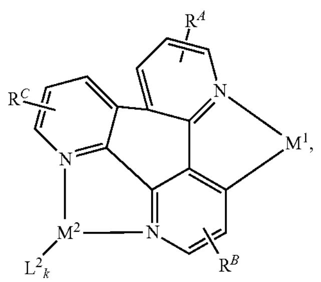
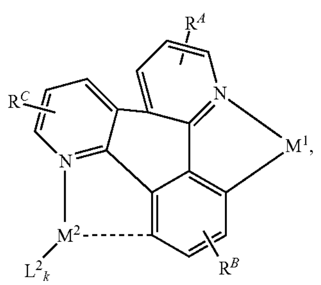
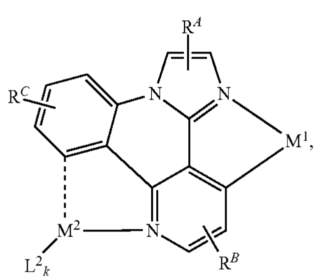
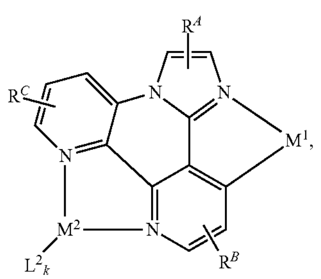
-continued
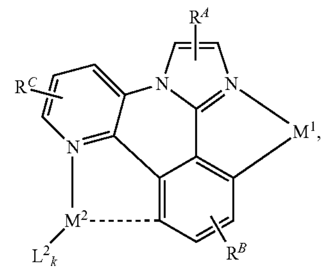
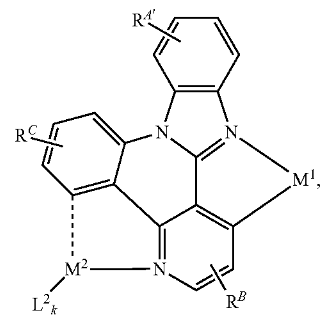
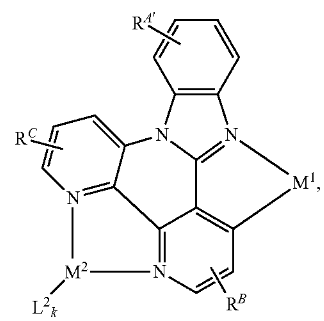
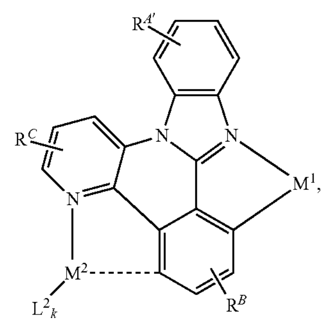
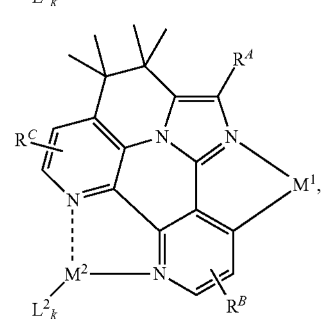

-continued
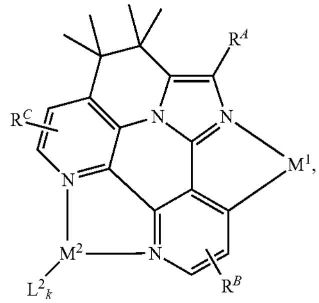
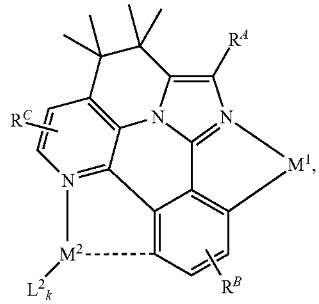
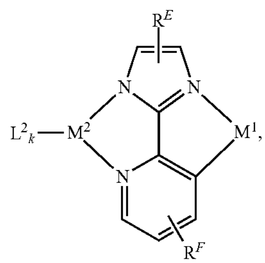
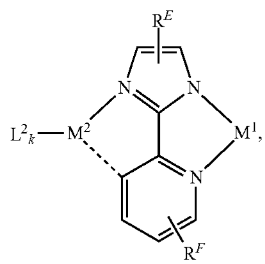
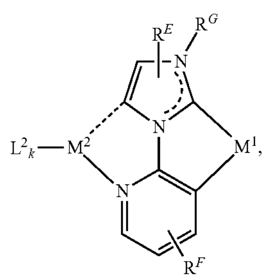
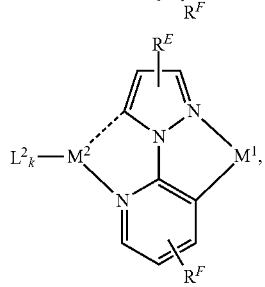
-continued
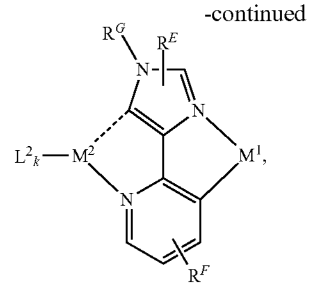
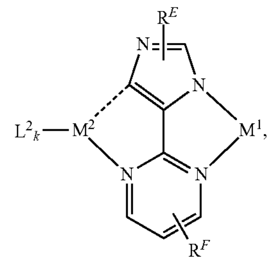
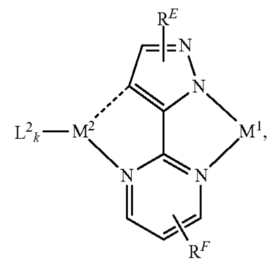
and
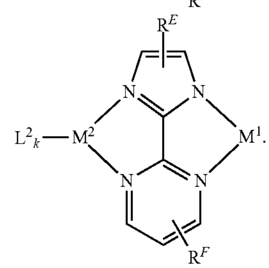
In some embodiments of the compound, each $L^1$ is independently selected from the following Group A structures consisting of:
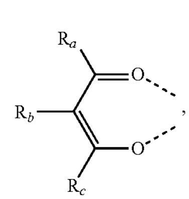
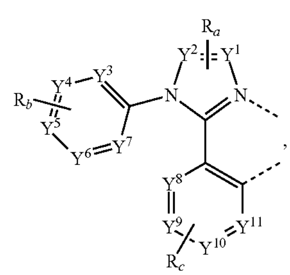
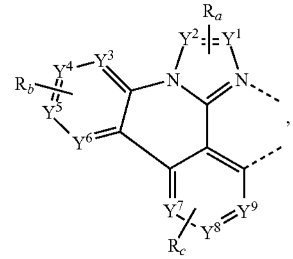

-continued
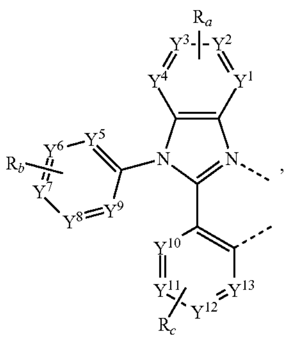
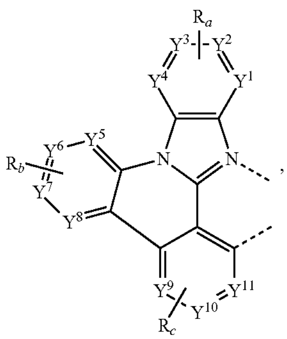
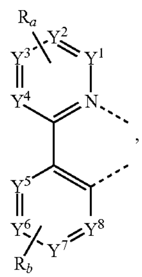
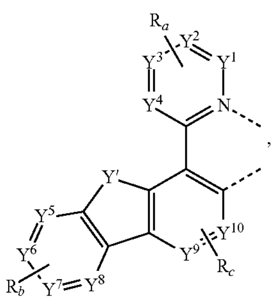
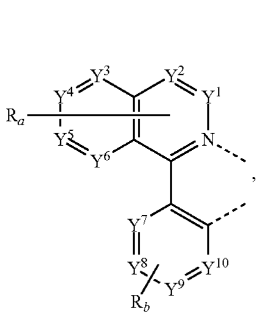
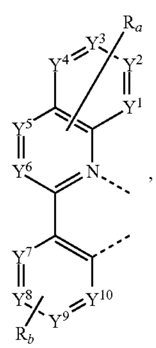
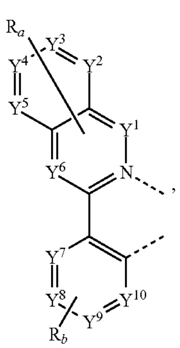
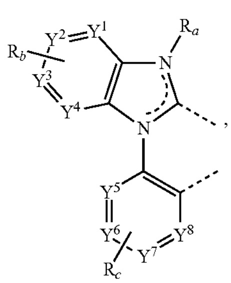
-continued
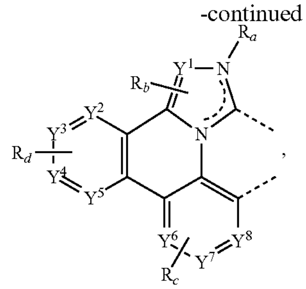
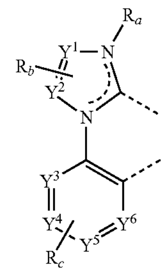
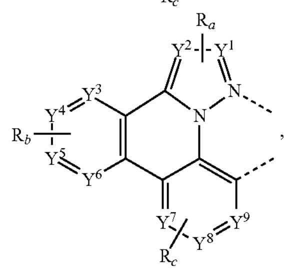
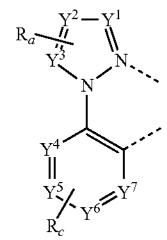
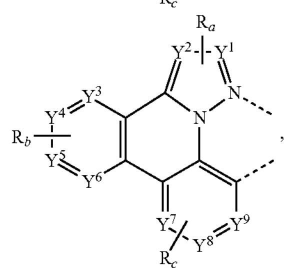
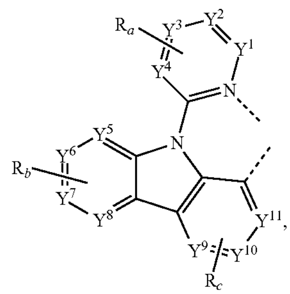
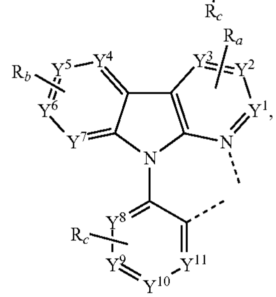
and
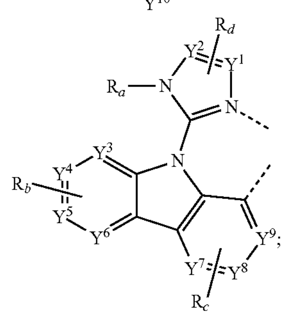
where each $Y^1$ to $Y^{13}$ is independently selected from the group consisting of carbon and nitrogen; where Y' is selected from the group consisting of BR', NR', PR', O, S, Se, C═O, S═O, $SO_2$, CR'R", SiR'R", and GeR'R"; where R' and R" are optionally fused or joined to form a ring; where each $R_a$, $R_b$, $R_c$, and $R_d$ may represent from mono substitution to the possible maximum number of substitution, or no substitution; where R', R", $R_a$, $R_b$, $R_c$, and $R_d$ are each independently selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and where any two adjacent substituents of $R_a$, $R_b$, $R_c$, and $R_d$ are optionally fused or joined to form a ring or form a multidentate ligand.

In some embodiments of the compound, each $L^1$ are each independently selected from the group consisting of:

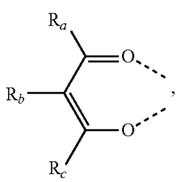
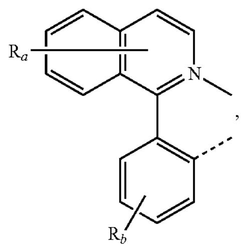
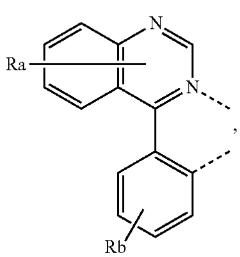
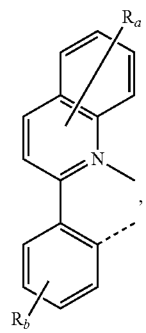
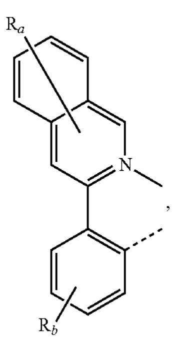
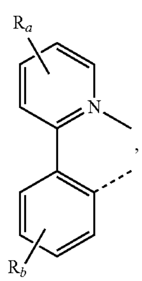
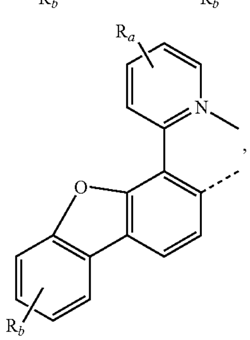
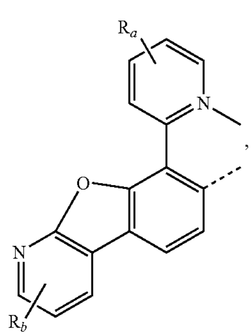

-continued

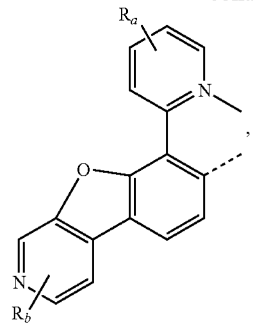
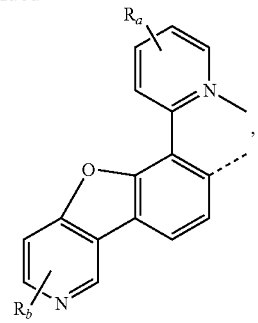
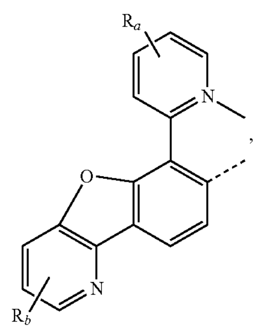
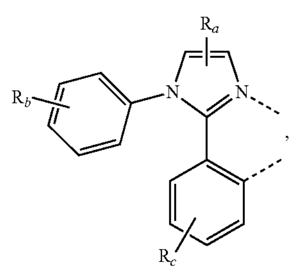
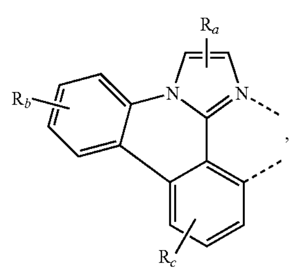
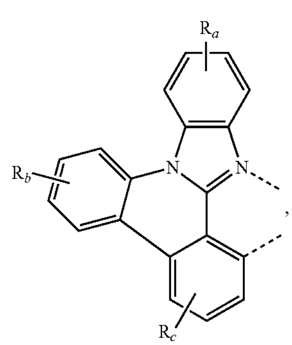

-continued
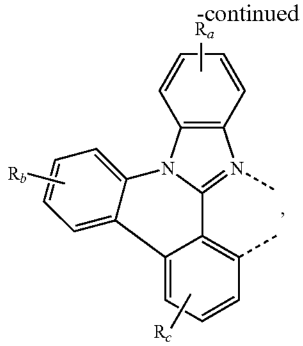
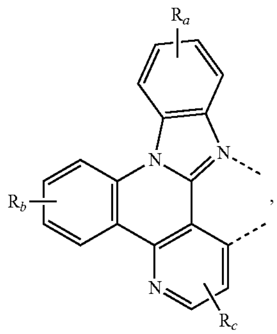
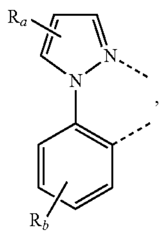
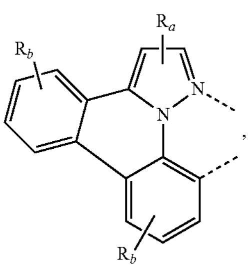
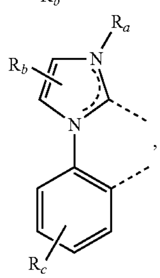
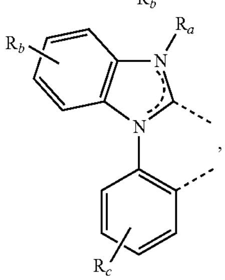
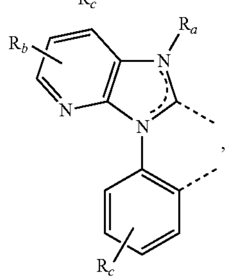
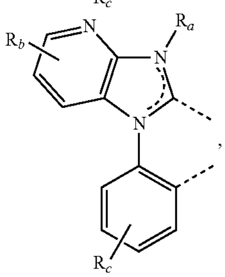
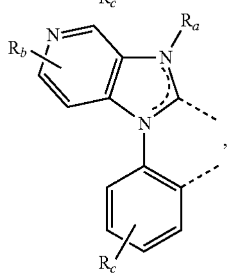
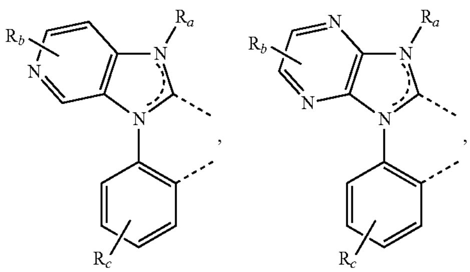
-continued
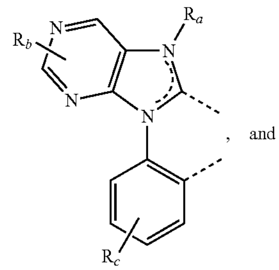
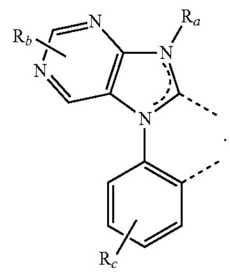
In some embodiments of the compound where each $L^1$ is independently selected from the Group A structures, the first ligand-$M^1$ structure is selected from the group consisting of:
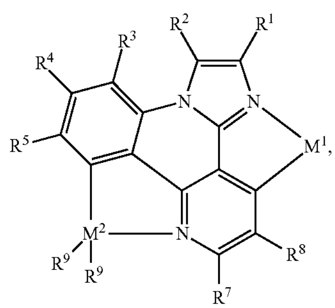
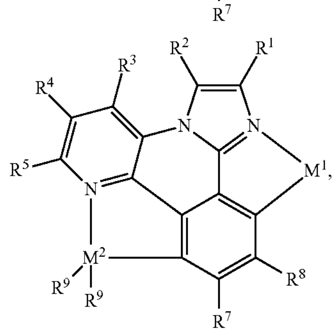
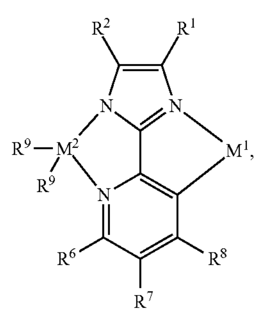
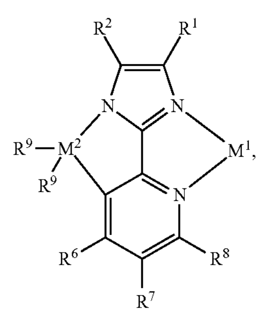

-continued
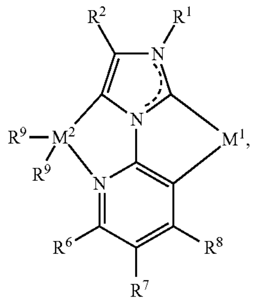
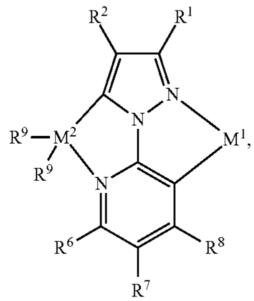
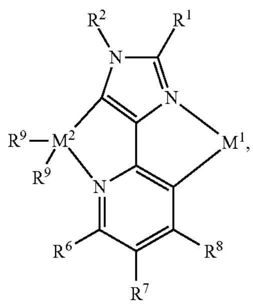
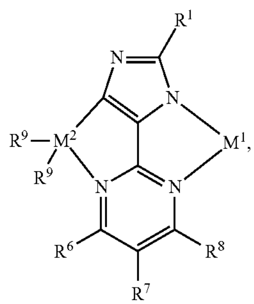
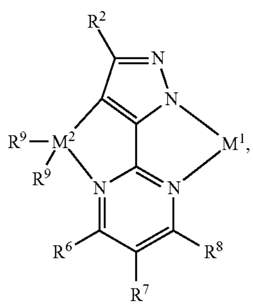
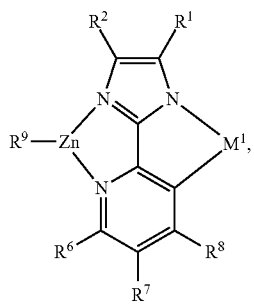
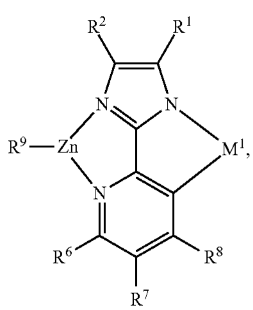
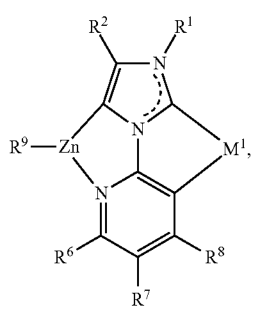
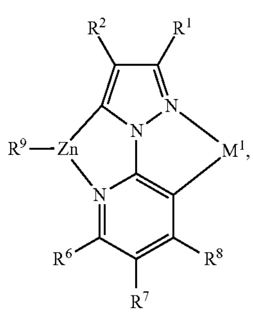
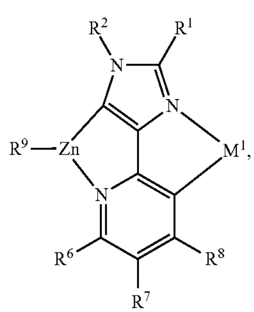
-continued
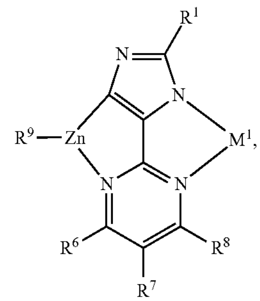
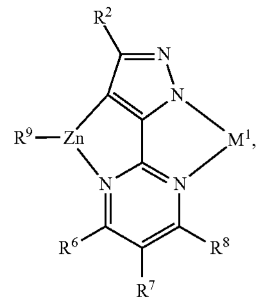
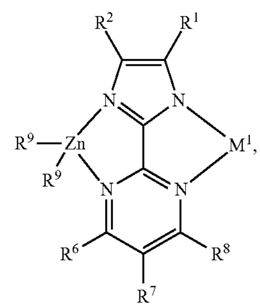
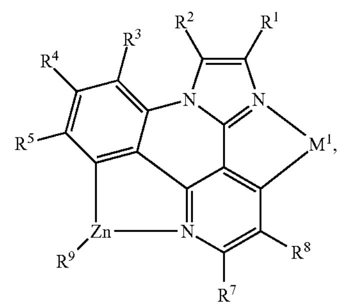
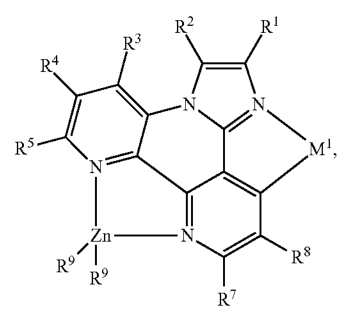
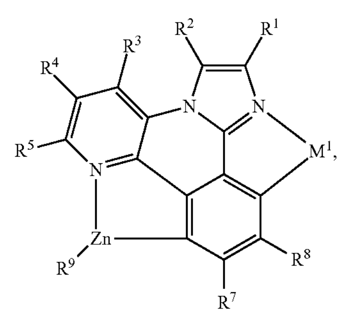

-continued
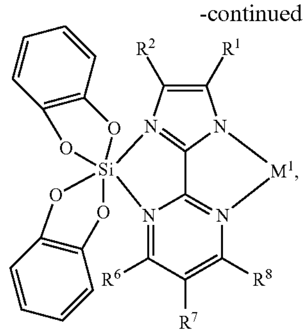
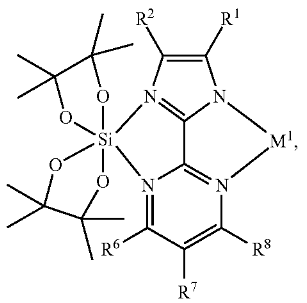
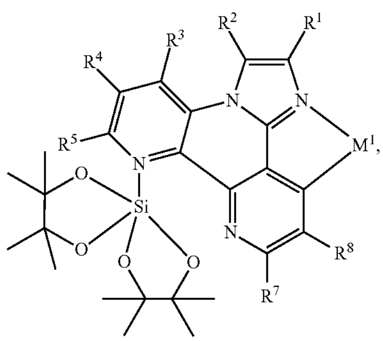
and
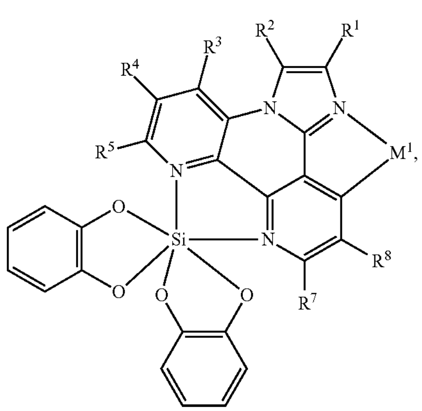
where $R^1$, $R^2$, $R^3$, $R^4$, $R^5$, $R^6$, $R^7$, and $R^8$ have the same definition as R'; and where $R^9$ has the same definition as $L^2$.
In some embodiments of the compound, the first ligand-$M^1$ structure is selected from the group consisting of:
LA1
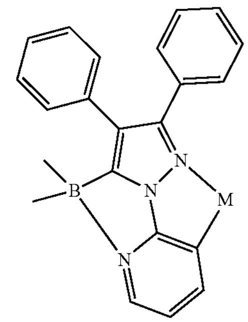
LA2
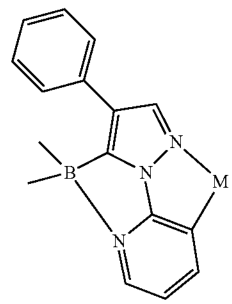
LA3
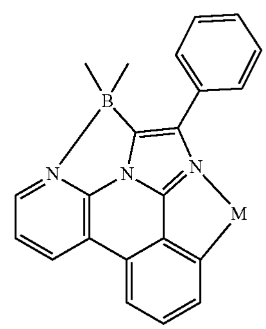
LA4
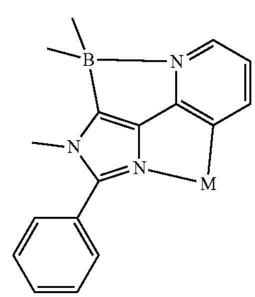
LA5
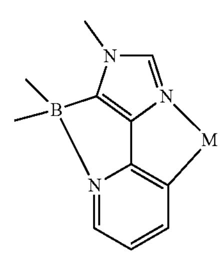

-continued
LA6
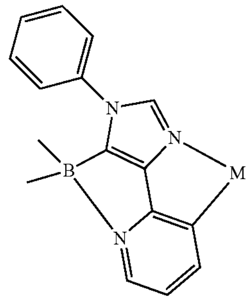
LA7
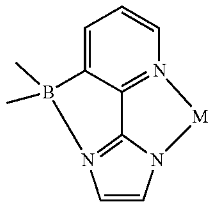
LA8
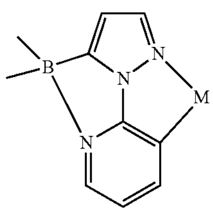
LA9
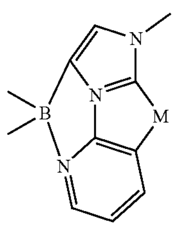
LA10
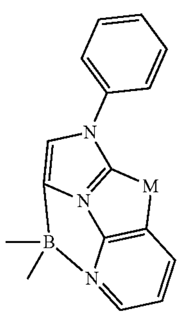
LA11
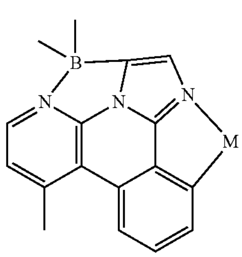
-continued
LA12
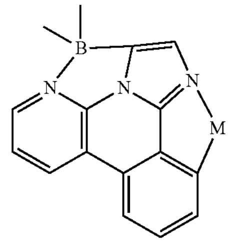
LA13
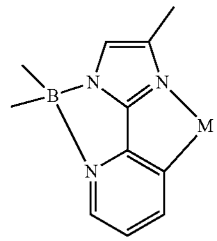
LA14
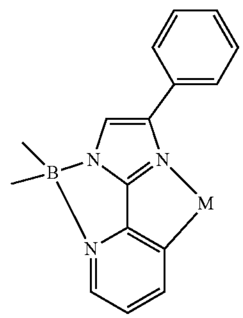
LA15
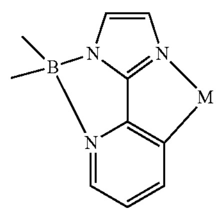
LA16
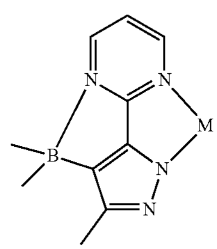
LA17
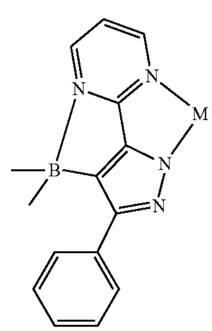

-continued
LA18
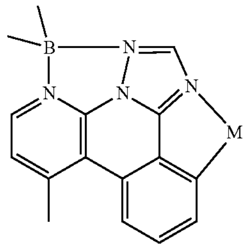
LA19
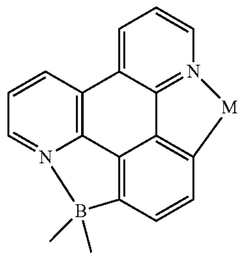
LA20
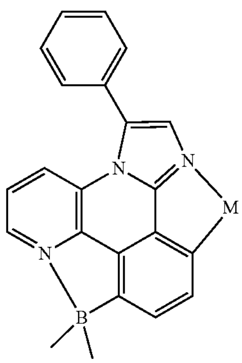
LA21
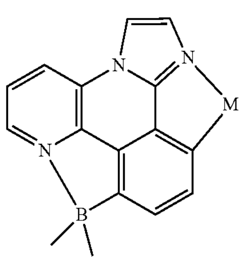
LA22
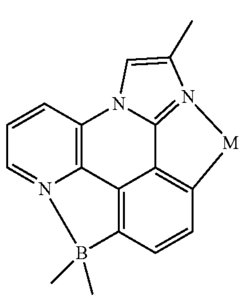
-continued
LA23
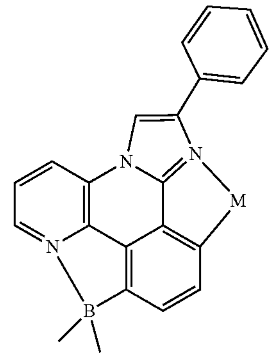
LA24
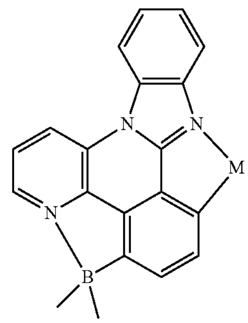
LA25
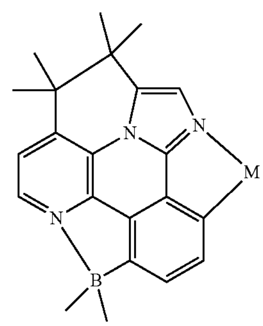
LA26
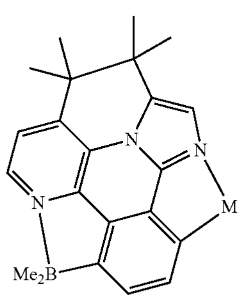
LA27
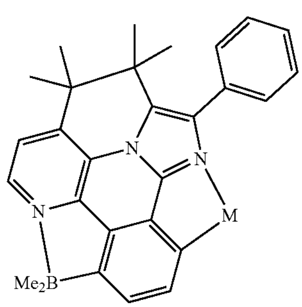

LA28
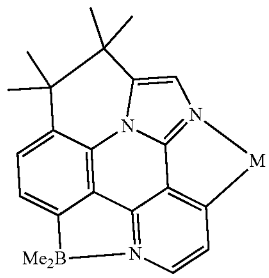
LA29
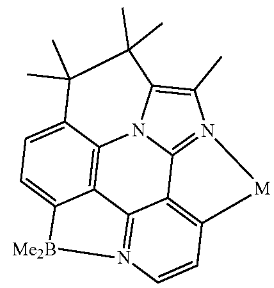
LA30
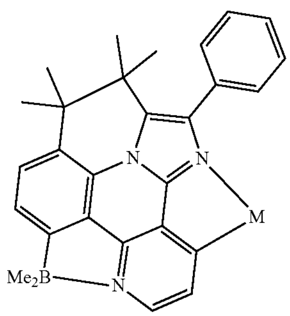
LA31
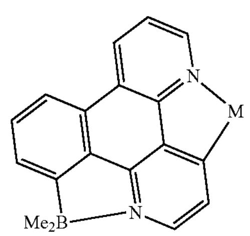
LA32
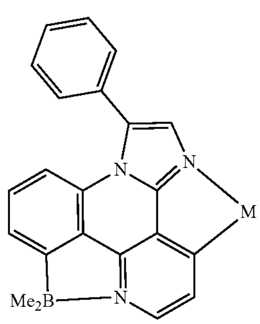
LA33
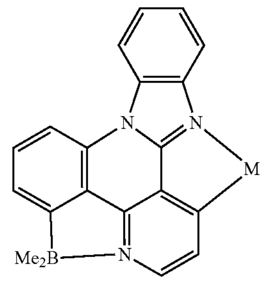
LA34
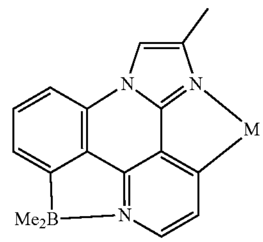
LA35
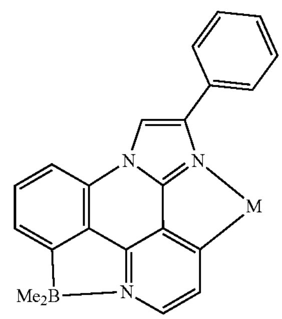
LA36
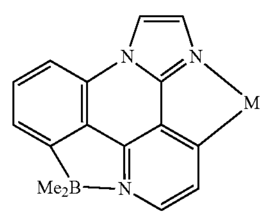
LA37
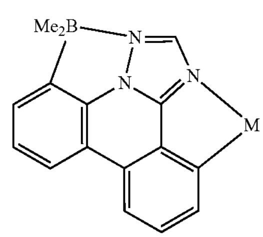
LA38
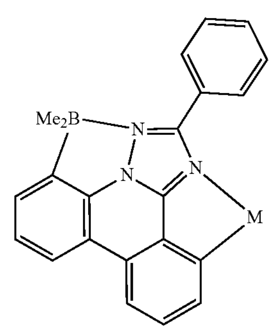

-continued
LA39
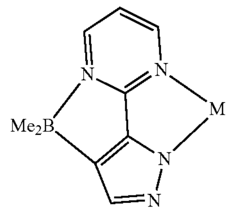
LA40
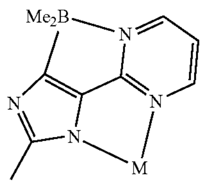
LA41
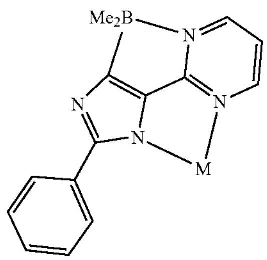
LA42
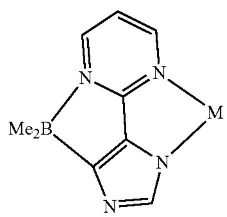
LA43
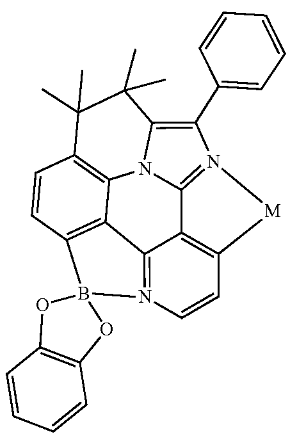
LA44
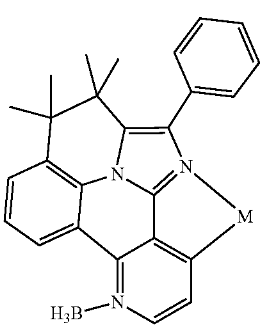
-continued
LA45
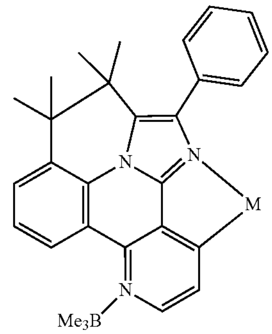
LA46
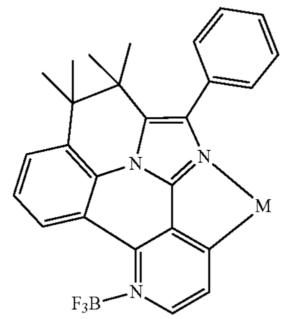
LA47
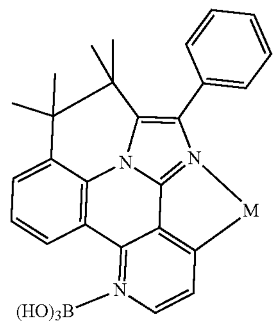
LA48
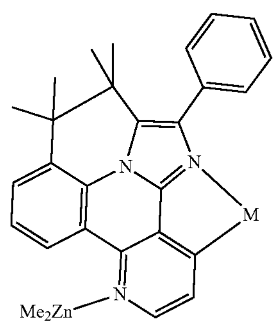
LA49
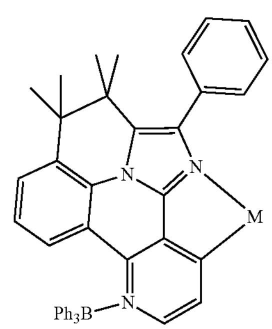

-continued
LA50
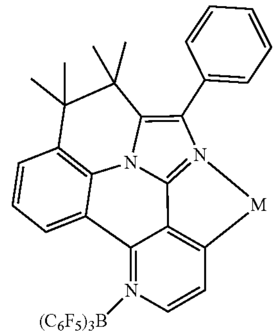
LA51
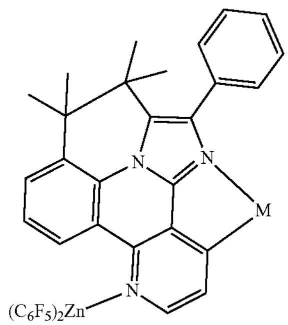
LA52
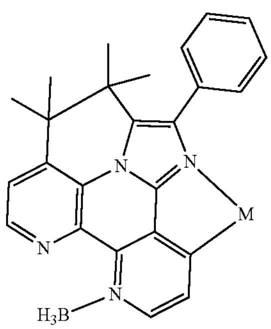
LA53
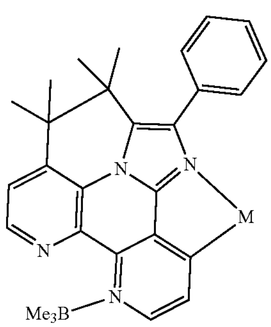
LA54
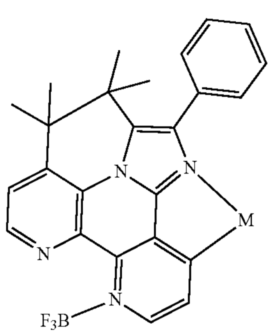
-continued
LA55
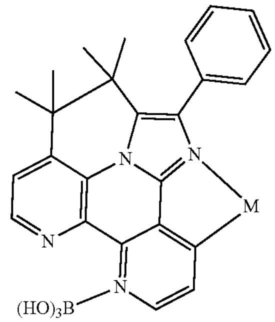
LA56
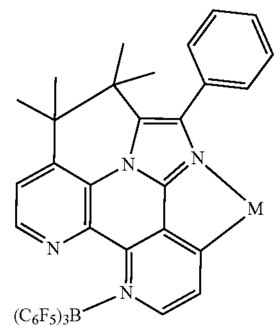
LA57
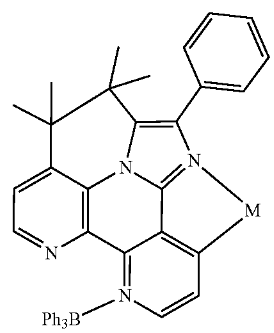
LA58
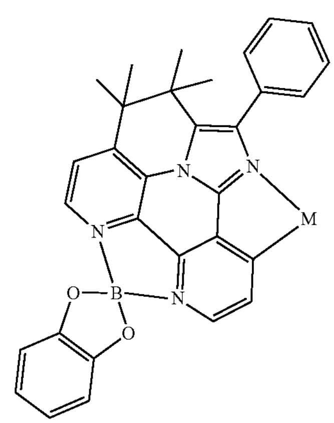

-continued
LA59
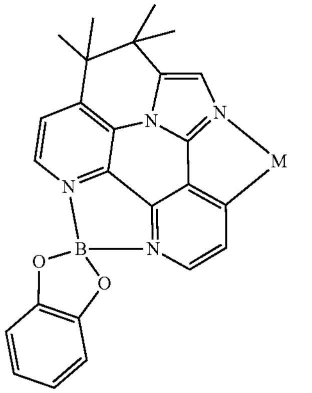
LA60
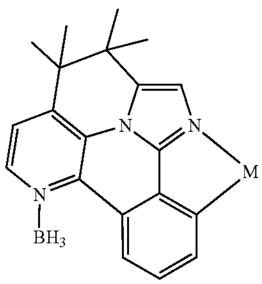
LA61
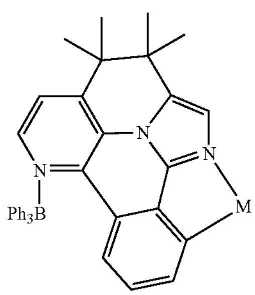
LA62
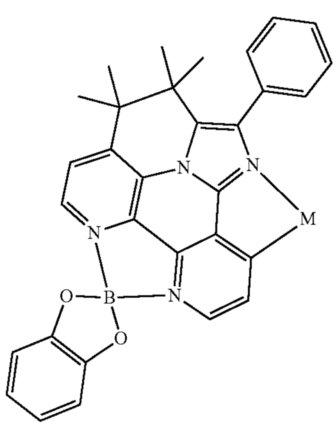
-continued
LA63
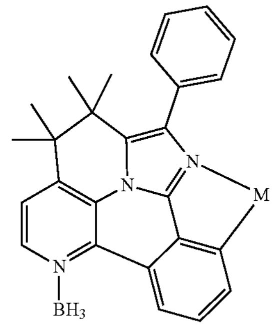
LA64
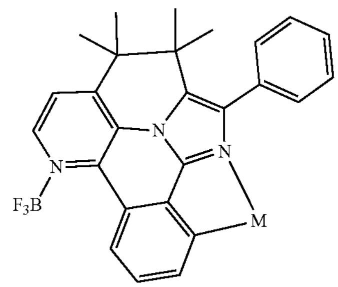
LA65
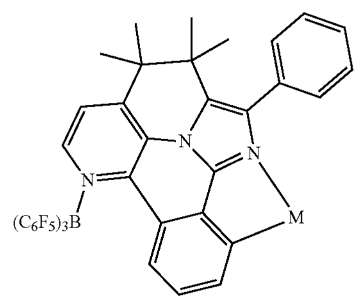
LA66
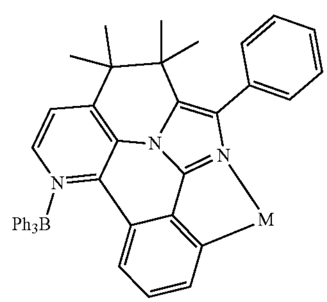
LA67
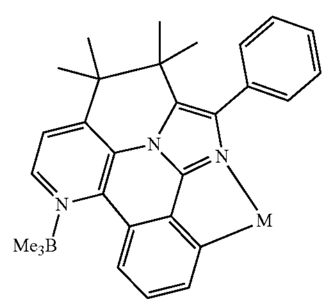

-continued
LA68
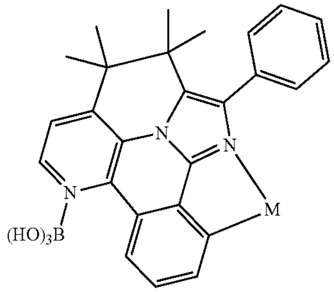
LA69
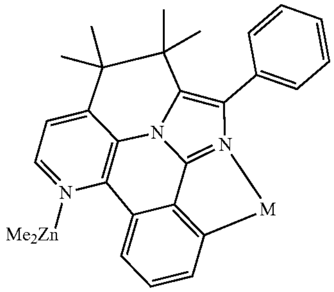
LA70
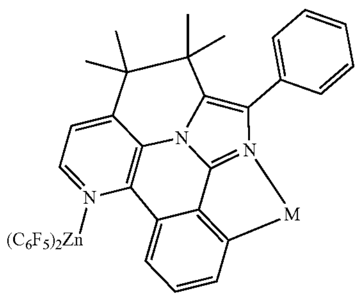
LA71
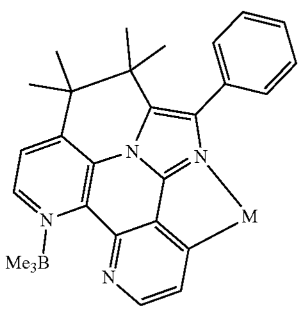
LA72
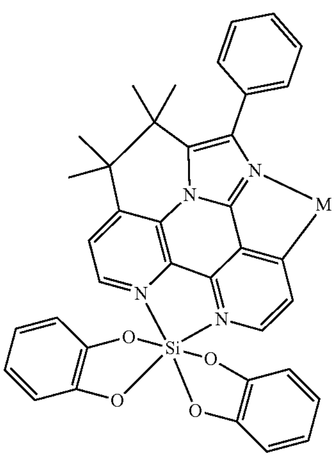
-continued
LA73
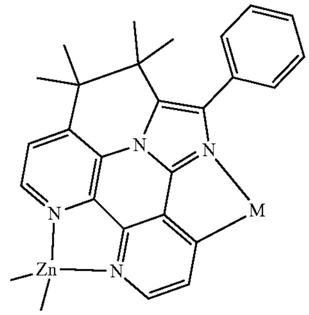
LA74
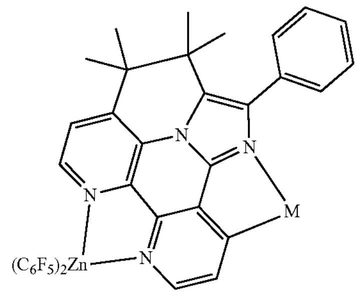
LA75
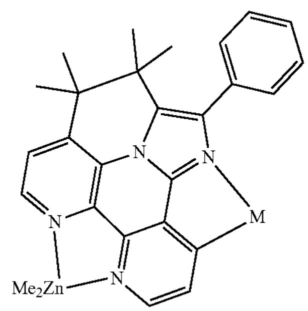
LA76
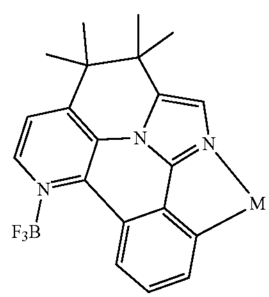
LA77
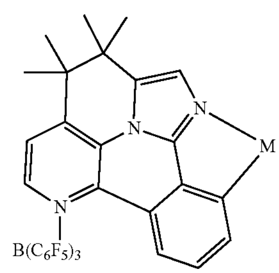

LA78
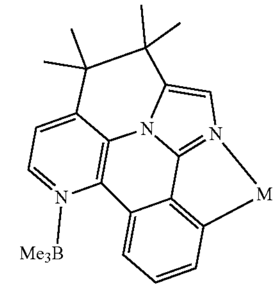
LA79
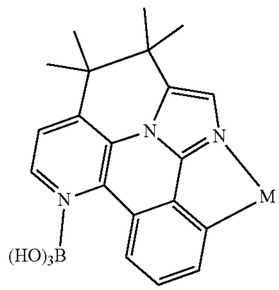
LA80
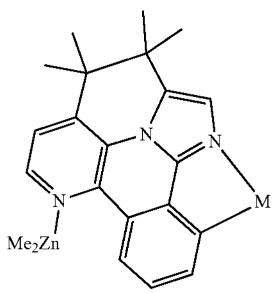
LA81
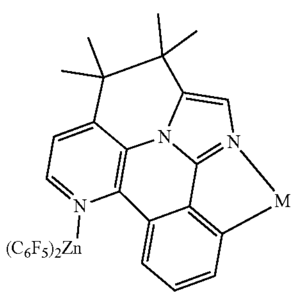
LA82
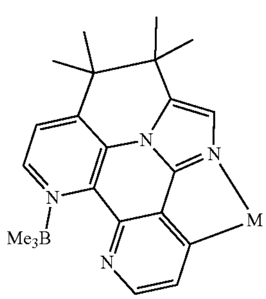
LA83
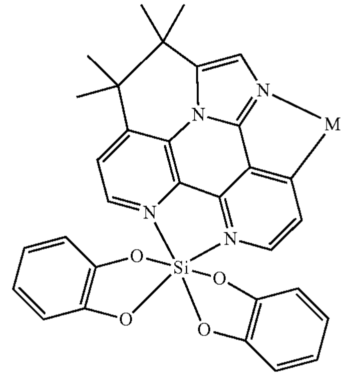
LA84
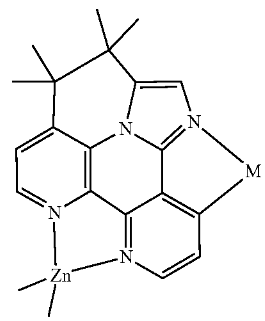
LA85
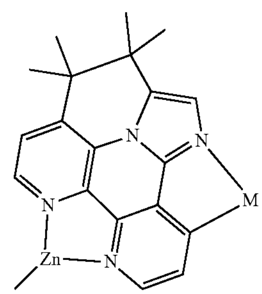
LA86
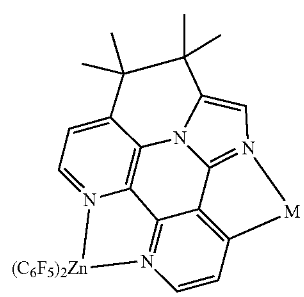

-continued
LA87
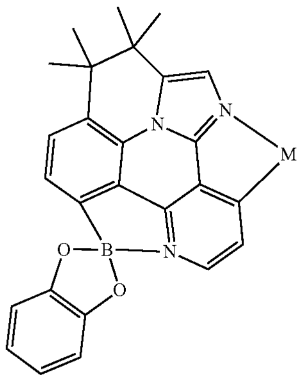
LA88
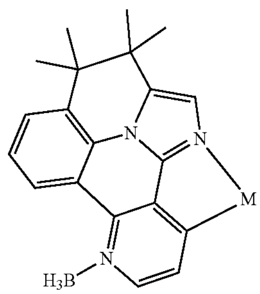
LA89
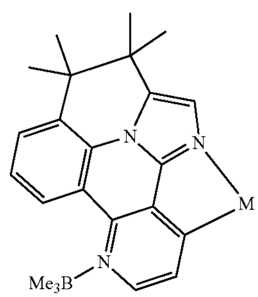
LA90
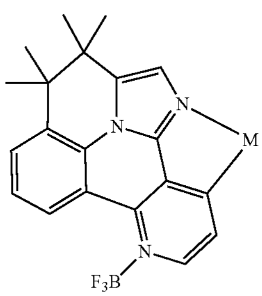
LA91
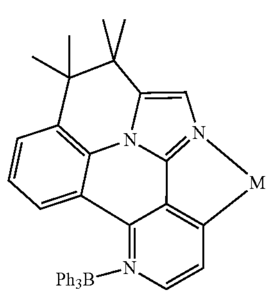
-continued
LA92
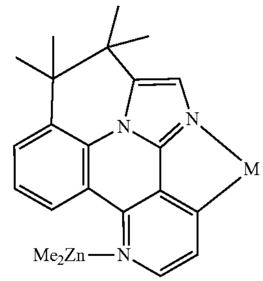
LA93
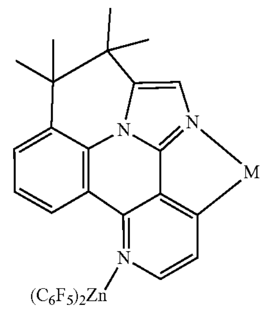
LA94
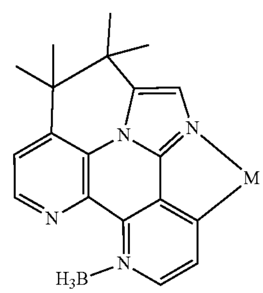
LA95
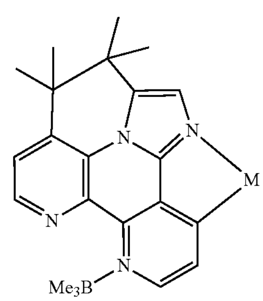
LA96
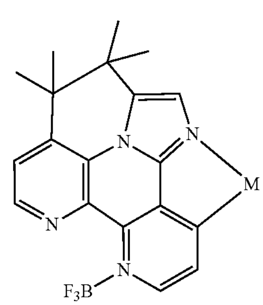

-continued
LA97
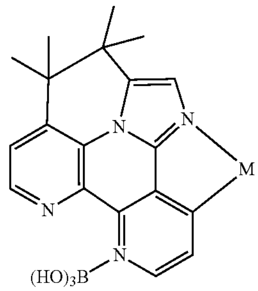
LA98
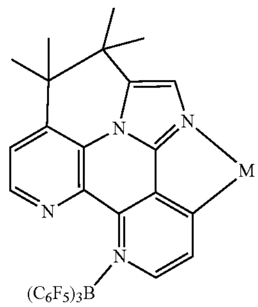
LA99
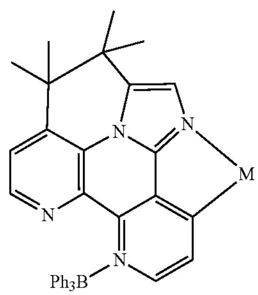
LA100
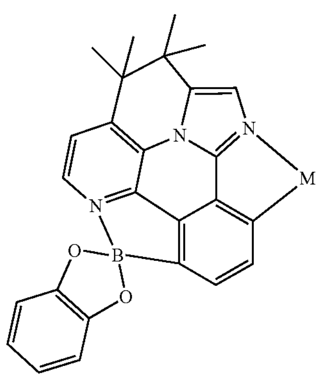
LA101
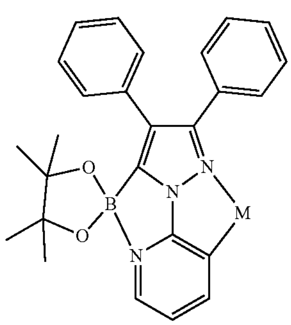
-continued
LA102
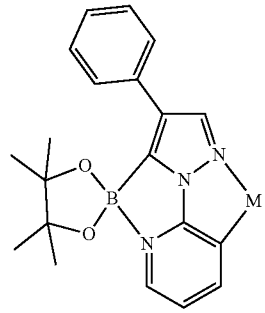
LA103
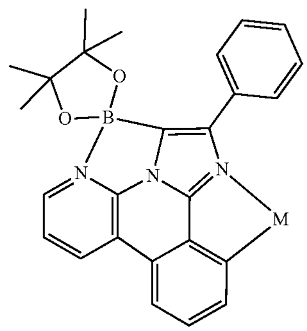
LA104
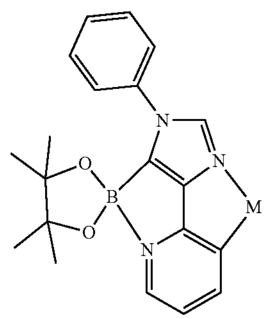
LA105
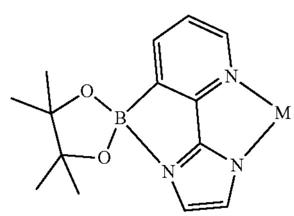
LA106
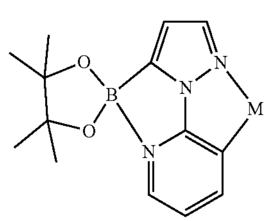

-continued
LA107
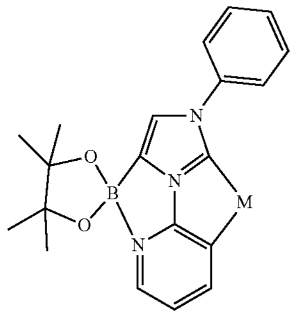
LA108
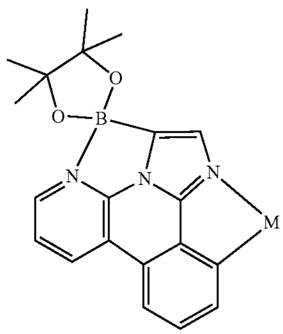
LA109
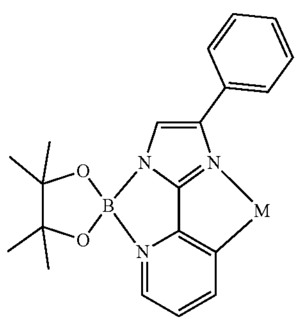
LA110
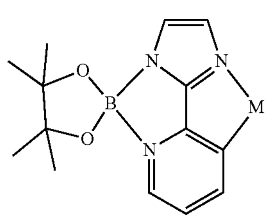
LA111
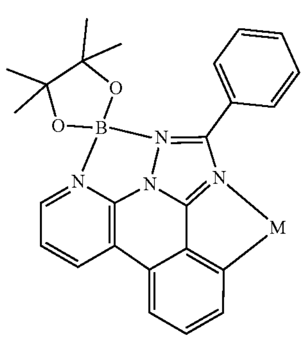
-continued
LA112
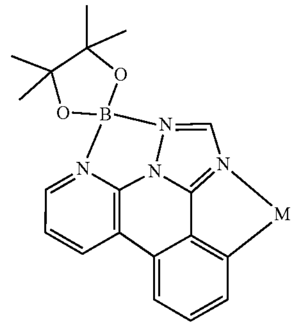
LA113
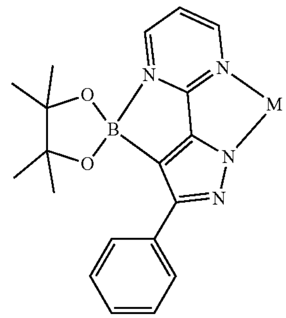
LA114
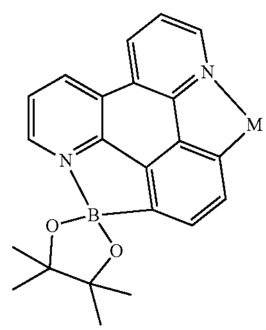
LA115
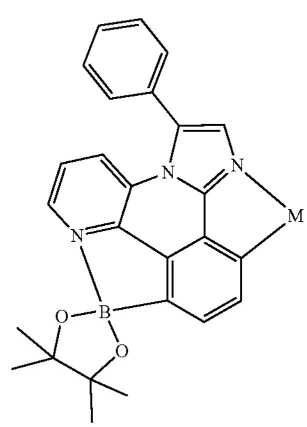

-continued
LA116
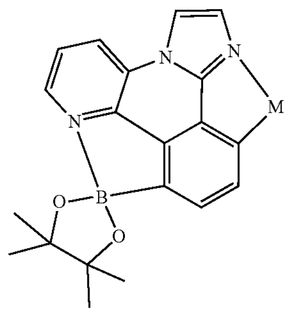
LA117
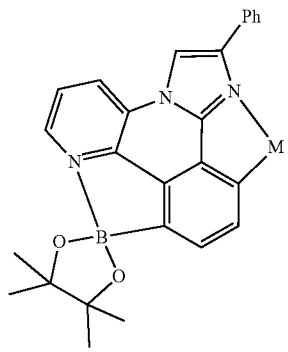
LA118
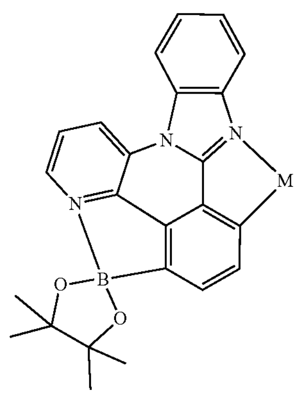
LA119
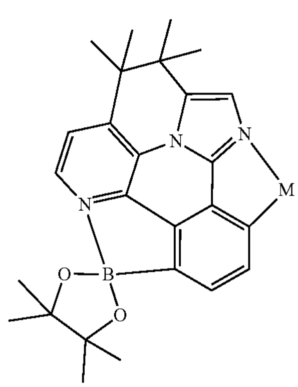
-continued
LA120
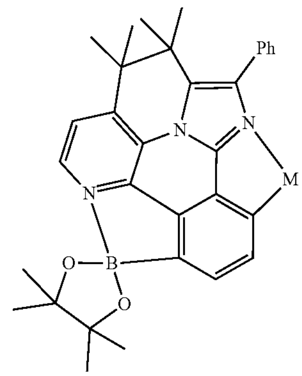
LA121
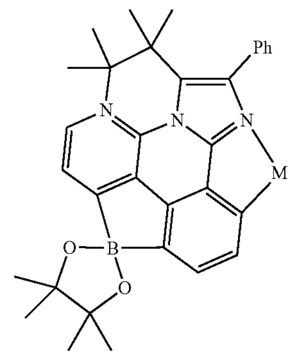
LA122
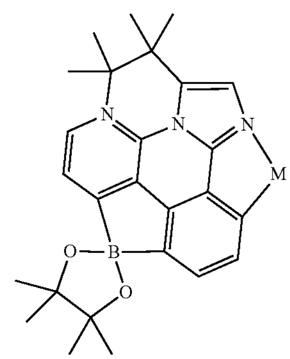
LA123
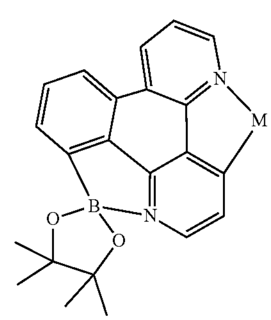

-continued
LA124
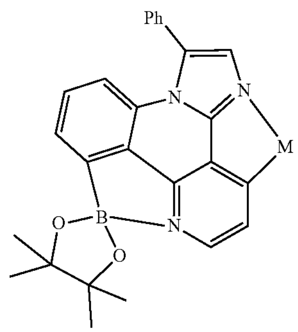
LA125
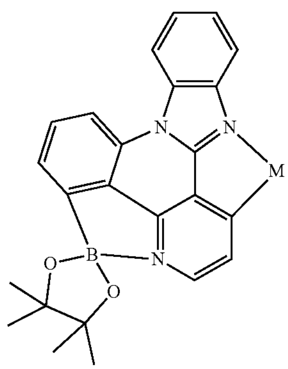
LA126
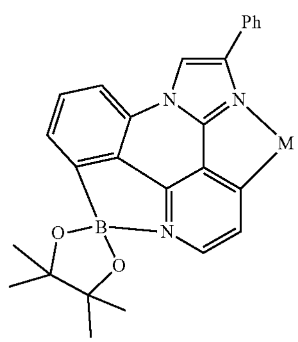
LA127
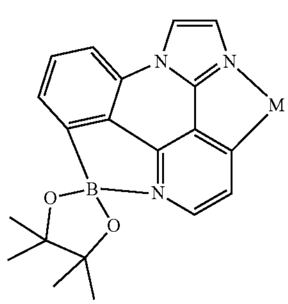
-continued
LA128
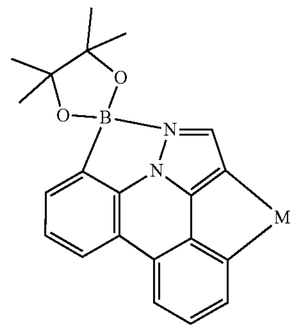
LA129
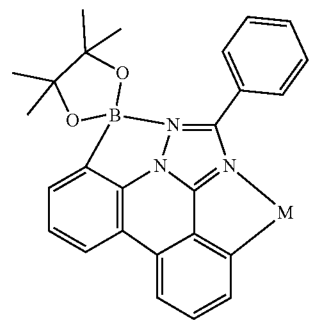
LA130
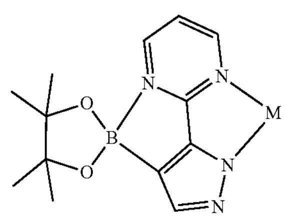
LA31
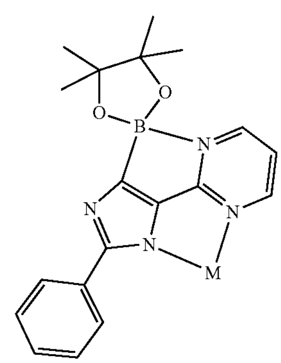
LA32
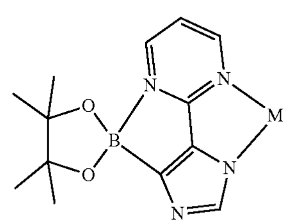

-continued
LA133
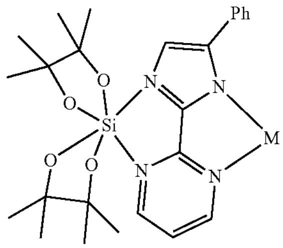
LA134
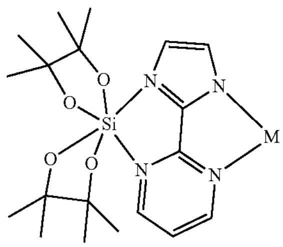
LA135
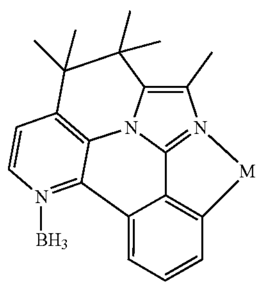
LA136
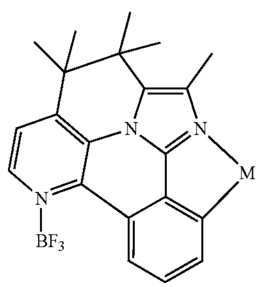
LA137
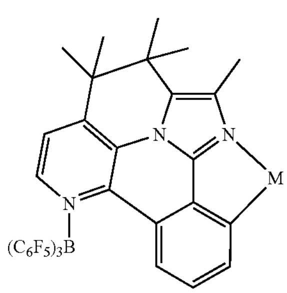
LA138
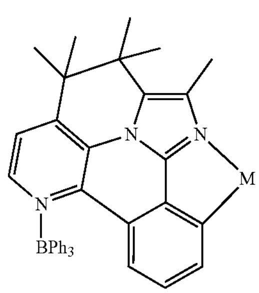
-continued
LA139
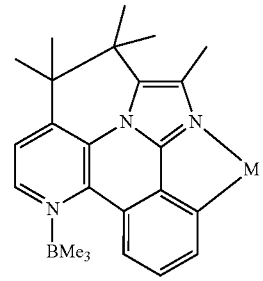
LA140
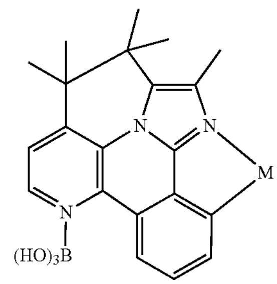
LA141
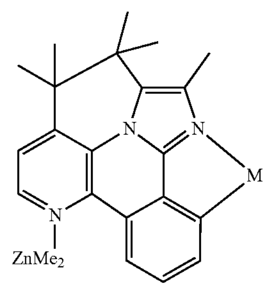
LA142
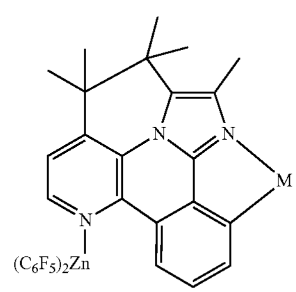
LA143
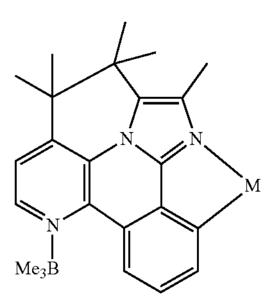

-continued
LA144
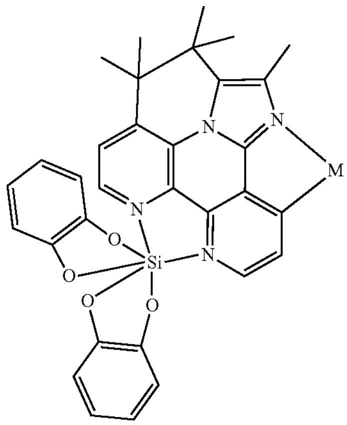
LA145
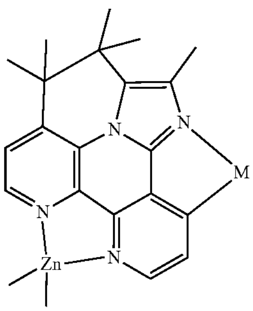
LA146
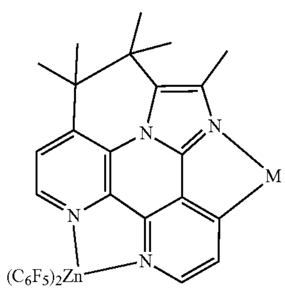
LA147
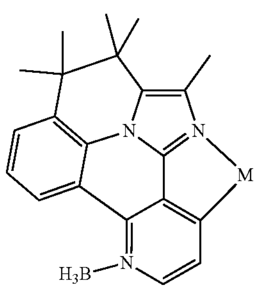
LA148
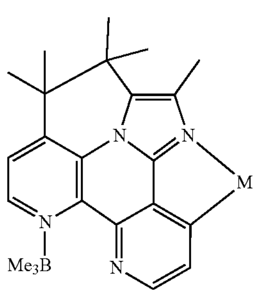
-continued
LA150
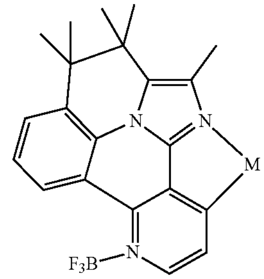
LA151
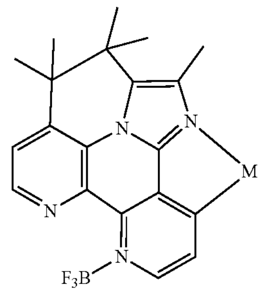
LA152
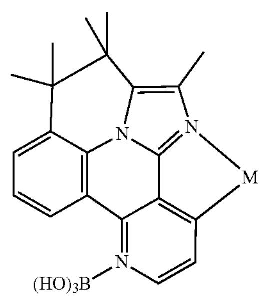
LA153
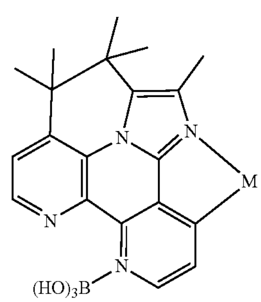
LA154
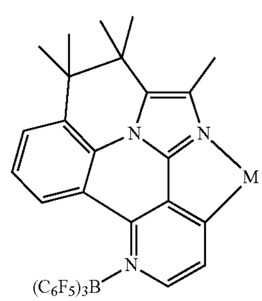

-continued
LA155
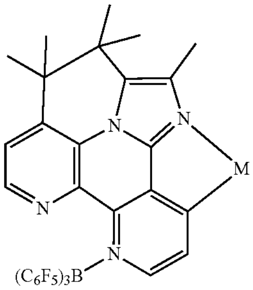
LA156
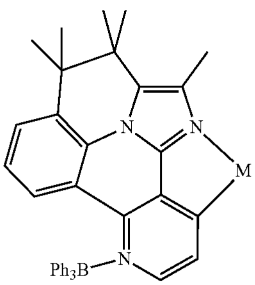
LA157
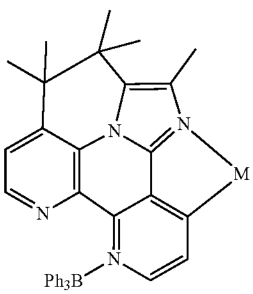
LA158
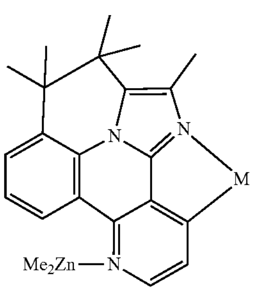
LA159
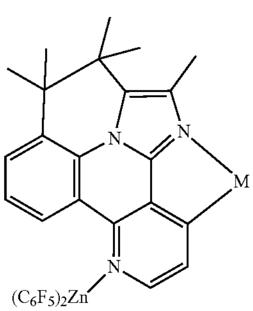
-continued
LA160
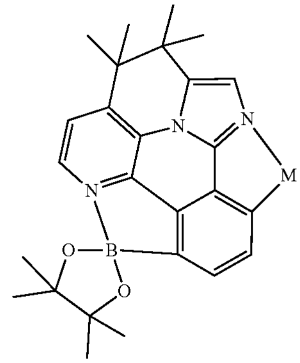
LA161
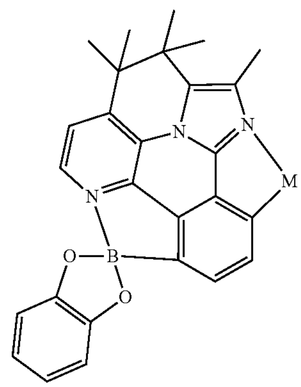
LA162
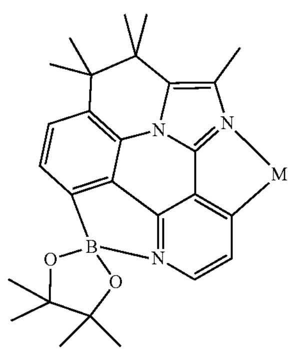
LA163
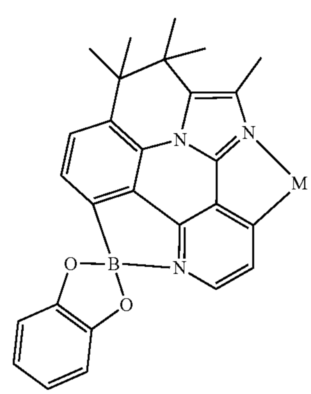

LA164
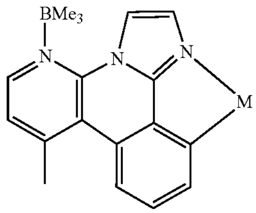
LA165
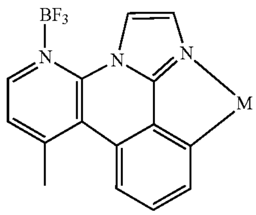
LA166
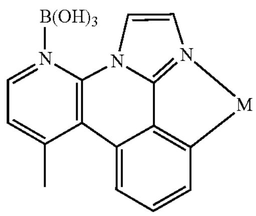
LA167
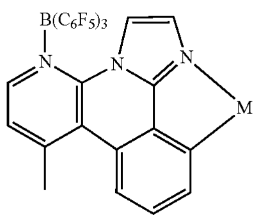
LA168
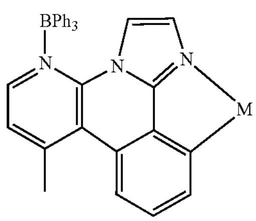
LA169
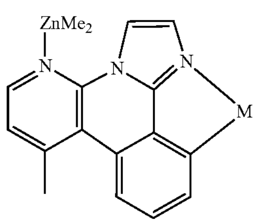
LA170
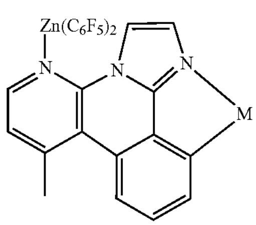
LA171
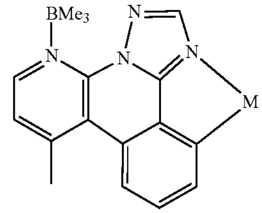
LA172
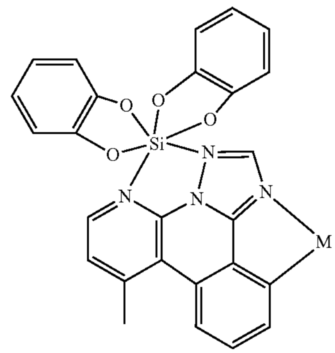
LA173
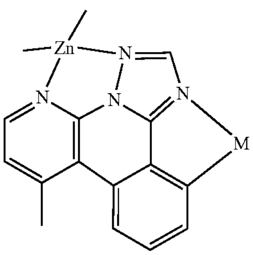
LA174
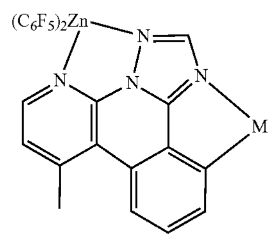
LA175
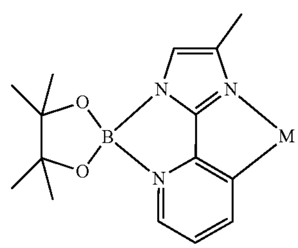
LA176
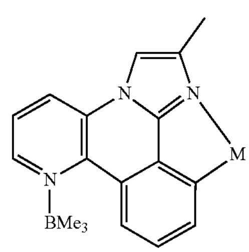

LA177
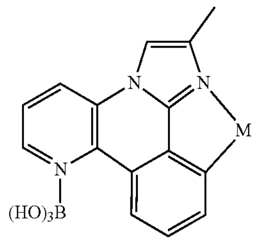
LA178
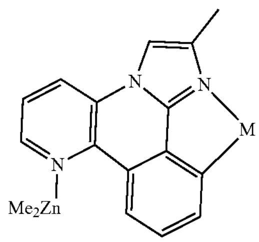
LA179
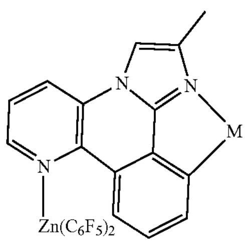
LA180
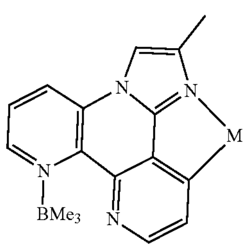
LA181
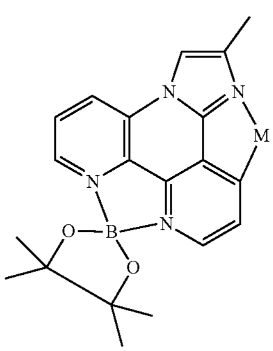
LA182
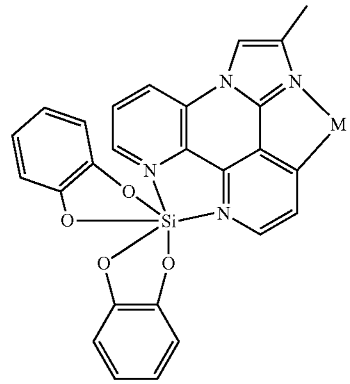
LA183
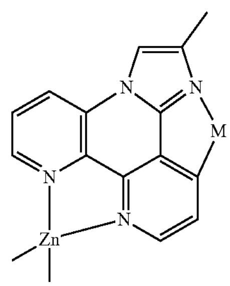
LA184
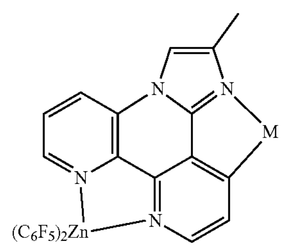
LA185
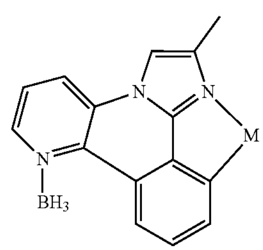
LA186
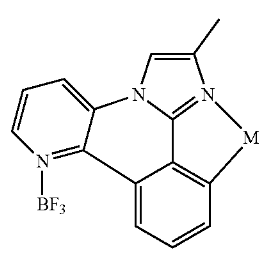

-continued
LA187
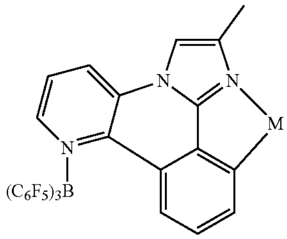
LA188
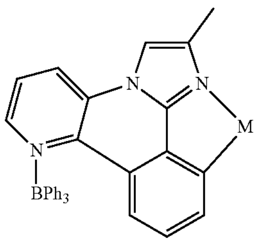
LA189
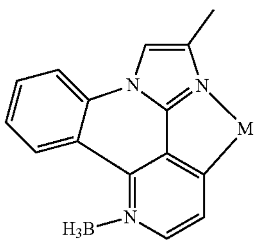
LA190
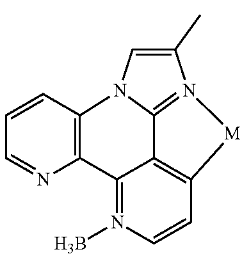
LA191
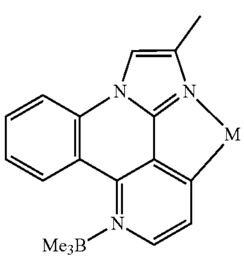
LA192
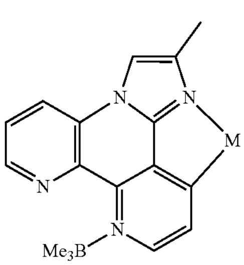
-continued
LA193
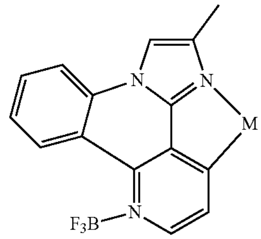
LA194
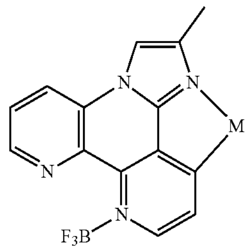
LA195
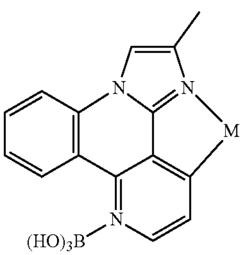
LA196
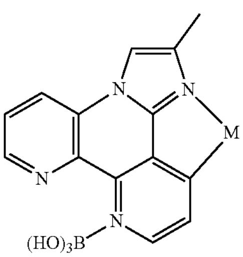
LA197
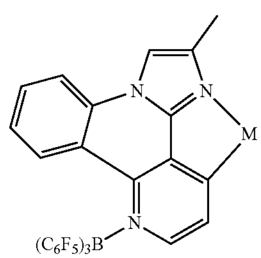
LA198
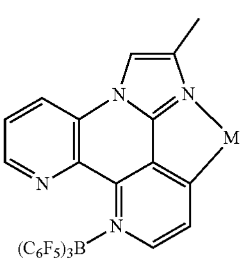

-continued
LA199
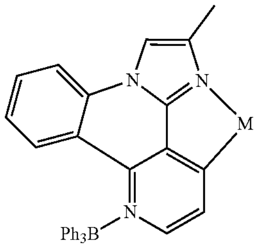
LA200
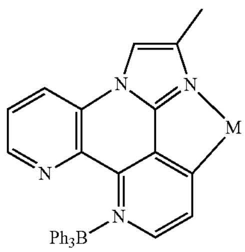
LA201
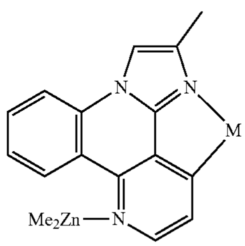
LA202
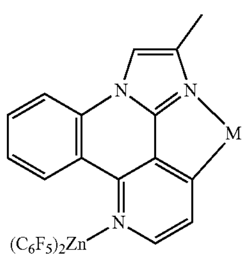
LA203
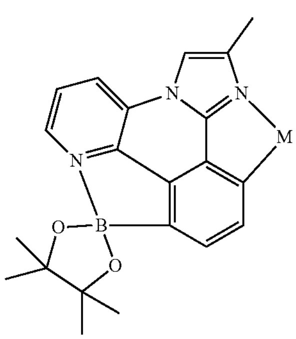
-continued
LA204
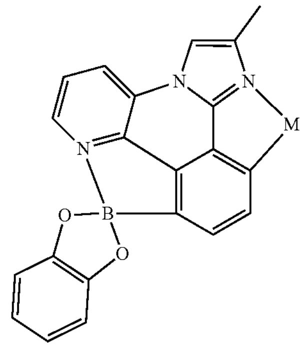
LA205
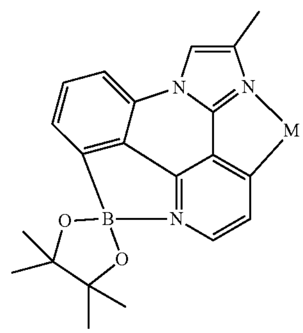
LA206
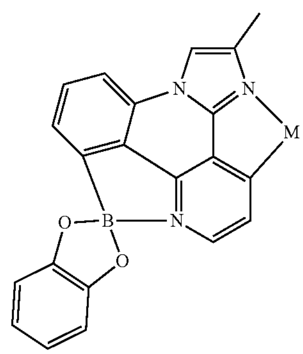
LA207
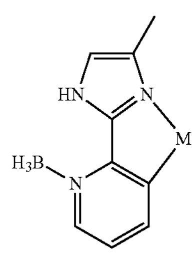
LA208
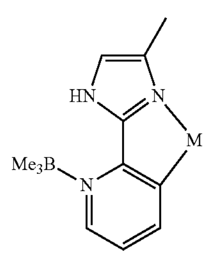

-continued
LA209
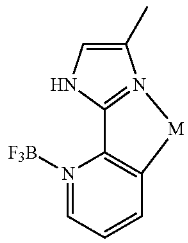
LA210
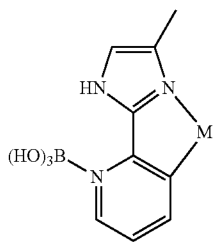
LA211
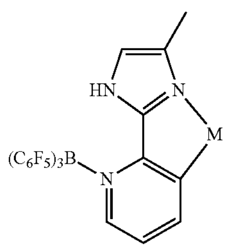
LA212
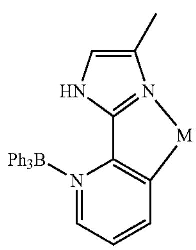
LA213
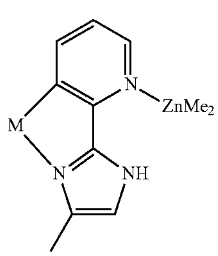
LA214
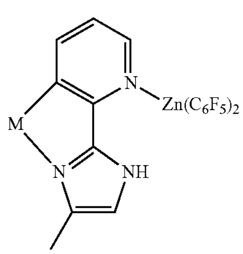
-continued
LA215
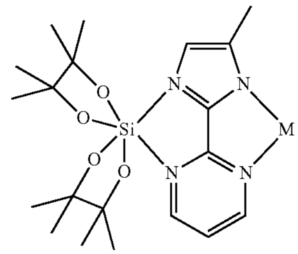
LA216
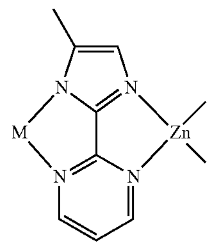
LA217
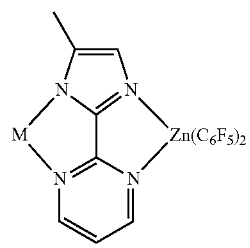
LA218
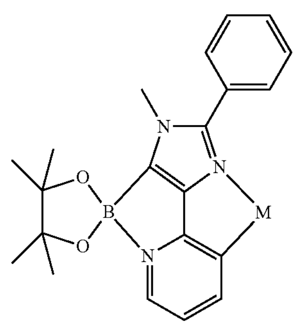
LA219
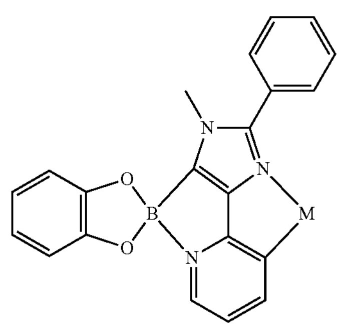
LA220
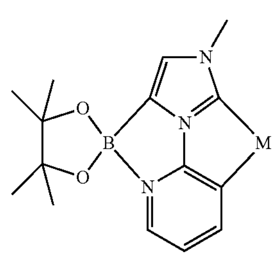

-continued
LA221
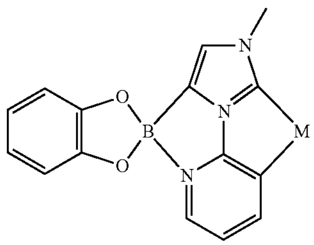
LA222
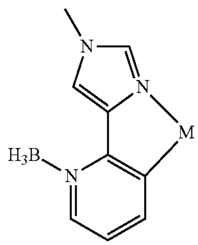
LA223
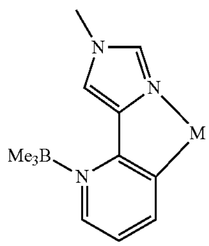
LA224
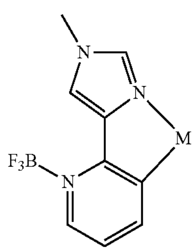
LA225
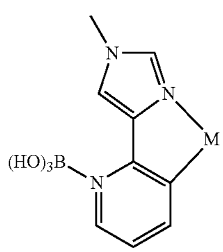
LA226
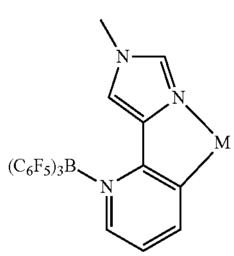
-continued
LA227
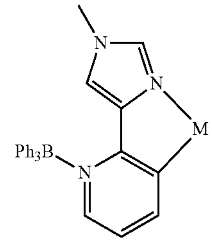
LA228
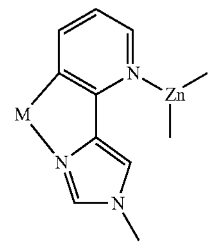
LA229
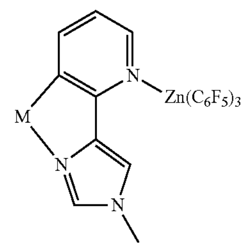
LA230
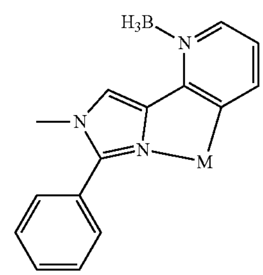
LA231
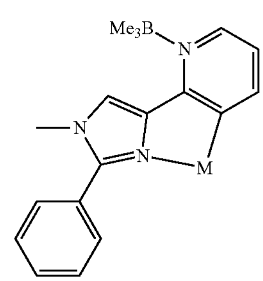
LA232
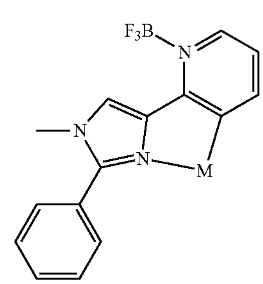

-continued
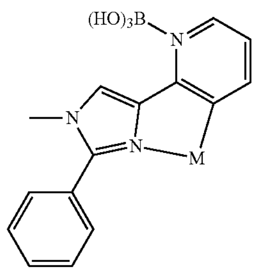
LA233
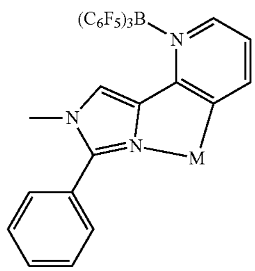
LA234
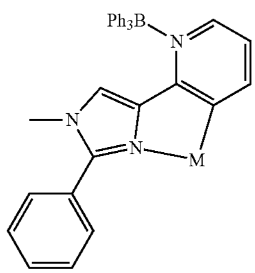
LA235
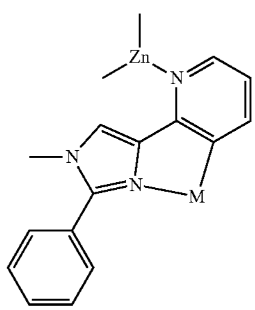
LA236
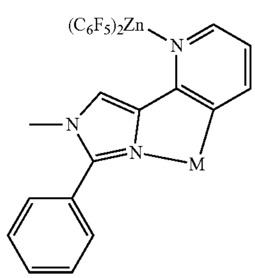
LA237
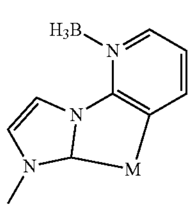
LA238
-continued
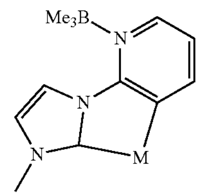
LA239
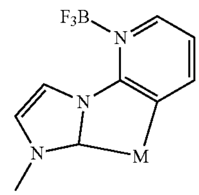
LA240
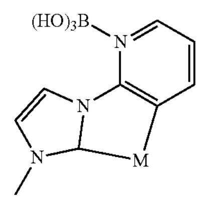
LA241
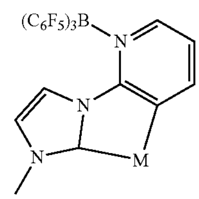
LA242
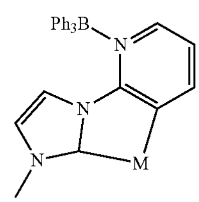
LA243
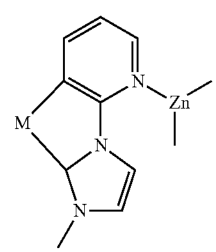
LA244
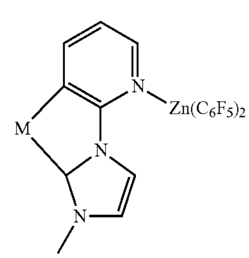
LA245

-continued
LA246
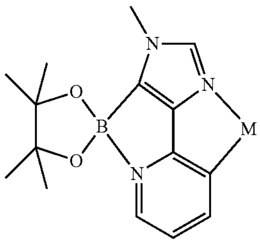
LA247
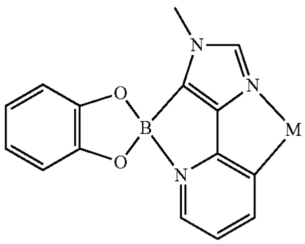
LA248
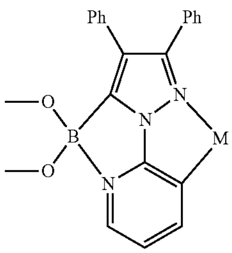
LA249
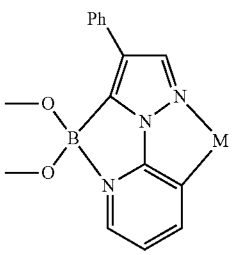
LA250
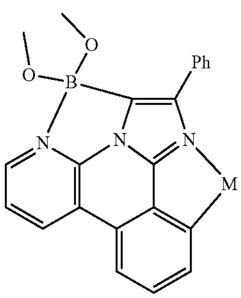
LA251
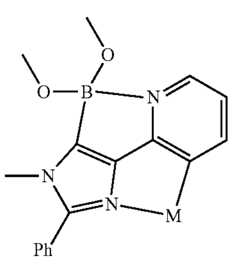
-continued
LA252
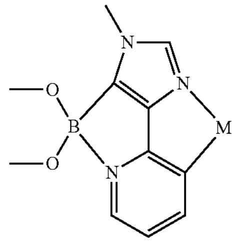
LA253
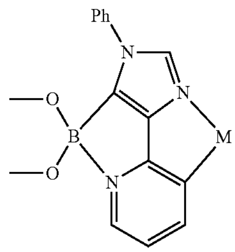
LA254
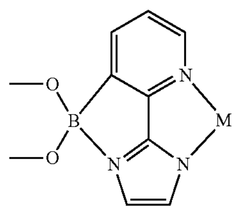
LA255
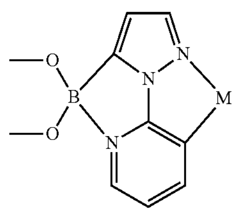
LA256
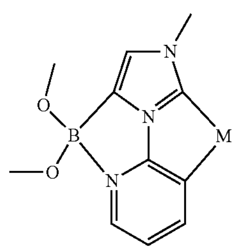
LA257
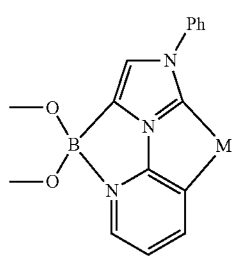

-continued
LA258
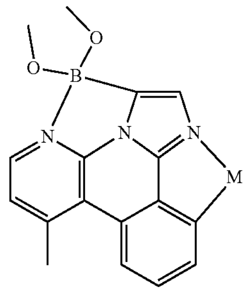
LA259
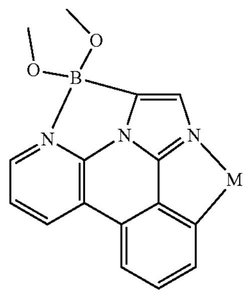
LA260
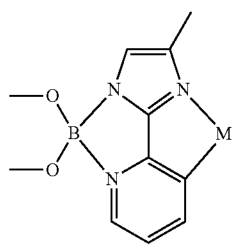
LA261
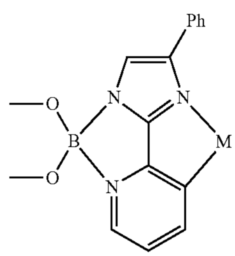
LA262
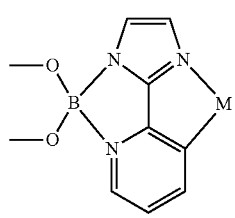
LA263
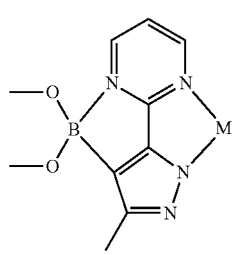
-continued
LA264
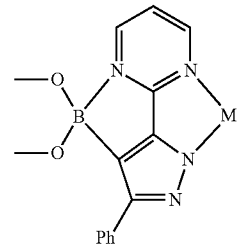
LA265
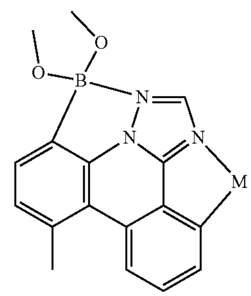
LA266
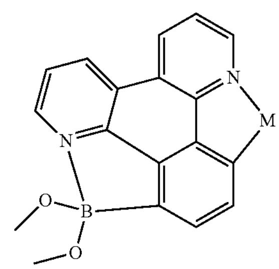
LA267
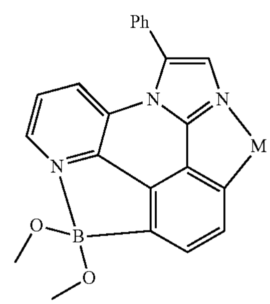
LA268
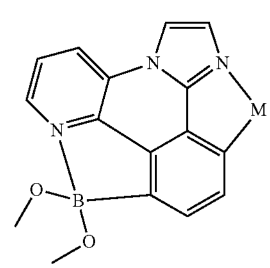

LA269
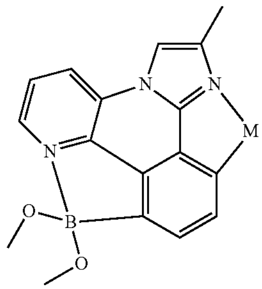
LA270
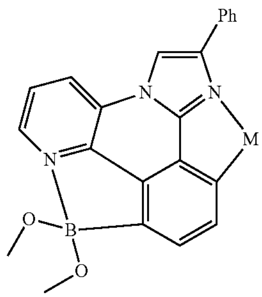
LA271
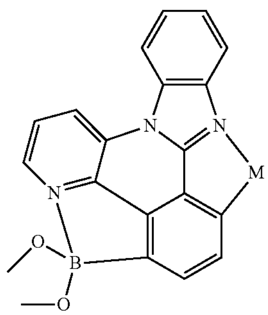
LA272
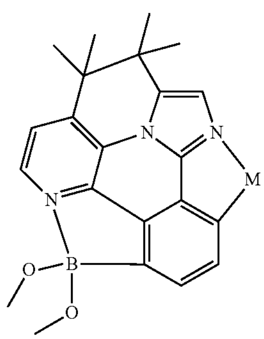
LA273
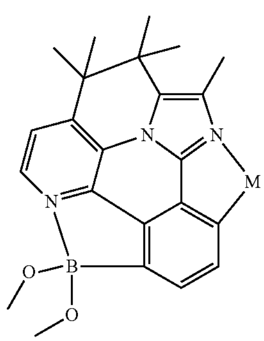
LA274
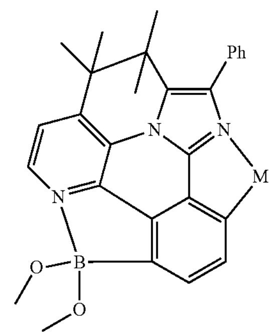
LA275
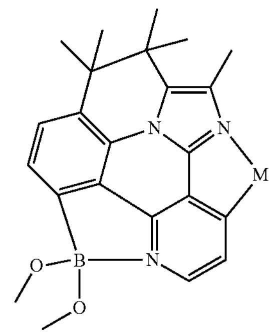
LA276
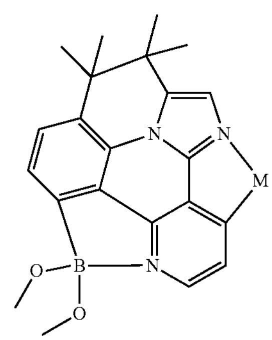
LA277
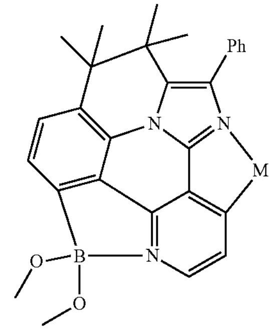
LA278
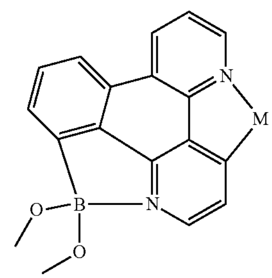

-continued
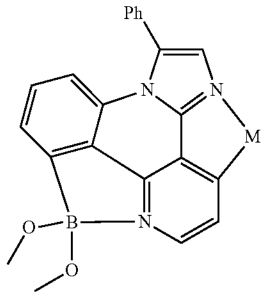
LA279
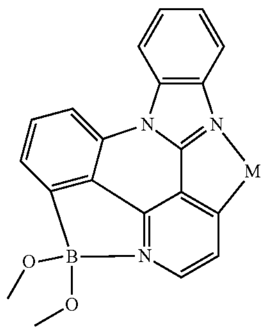
LA280
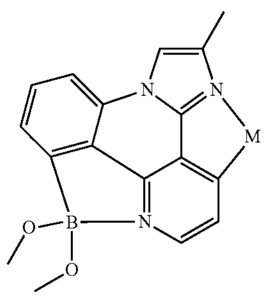
LA281
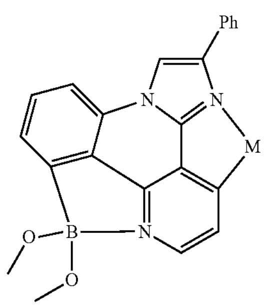
LA282
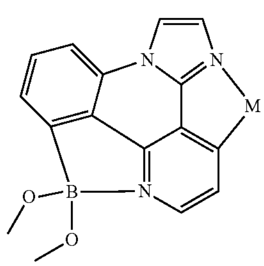
LA283
-continued
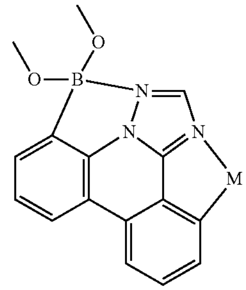
LA284
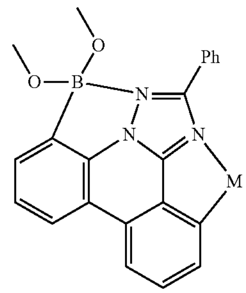
LA285
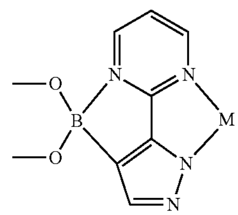
LA286
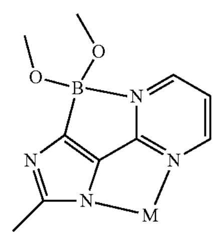
LA287
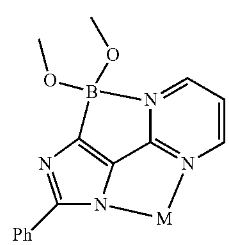
LA288
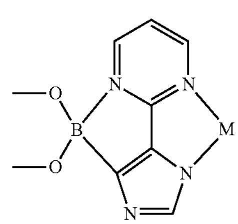
LA289

-continued
LA290
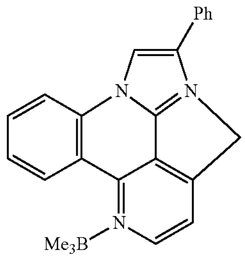
LA291
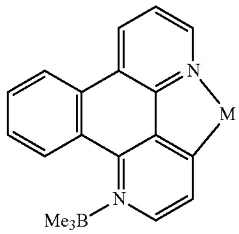
LA292
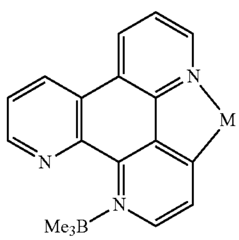
LA293
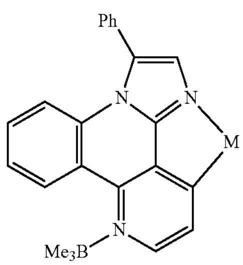
LA294
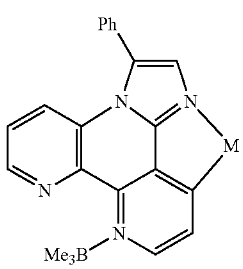
LA295
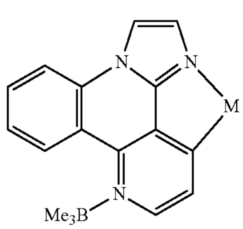
-continued
LA296
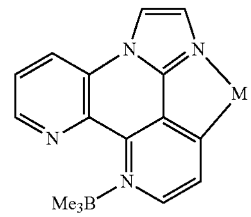
LA297
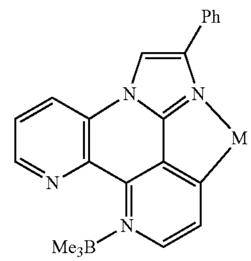
LA298
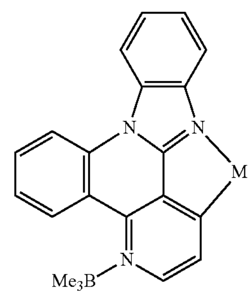
LA299
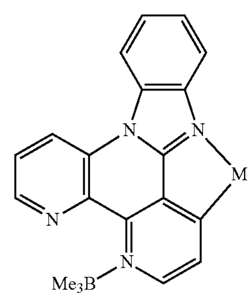
LA300
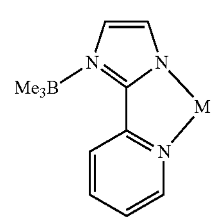
LA301
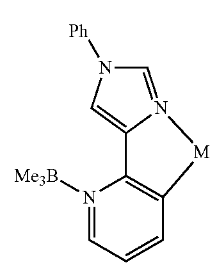

-continued
LA302
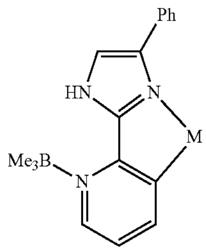
LA303
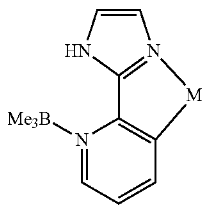
LA304
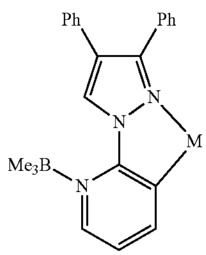
LA305
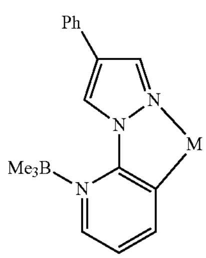
LA306
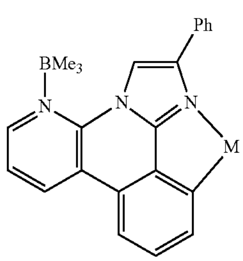
LA307
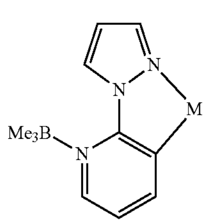
-continued
LA308
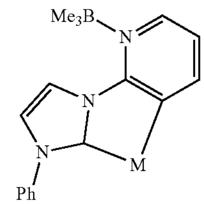
LA309
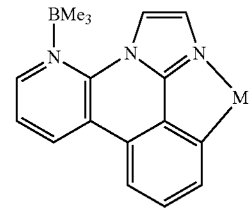
LA310
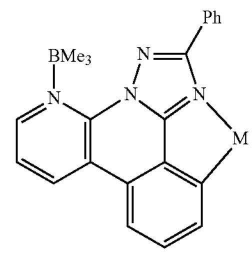
LA311
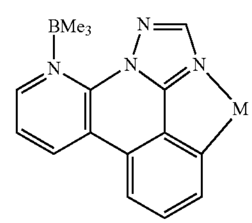
LA312
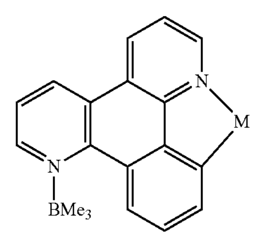
LA313
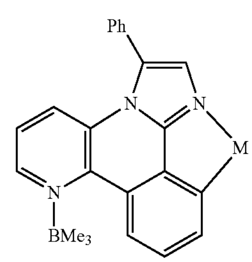
LA314
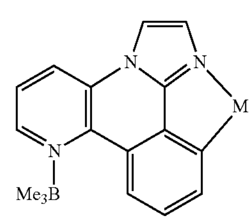

LA315
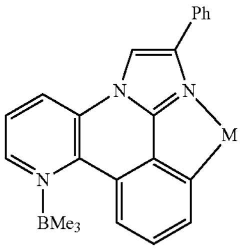
LA316
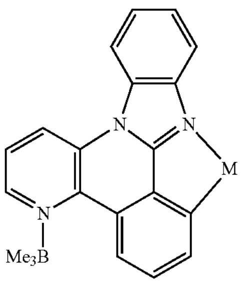
LA317
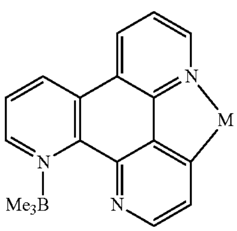
LA318
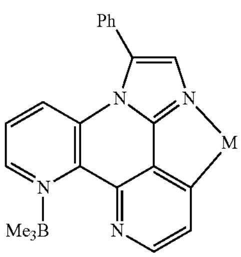
LA319
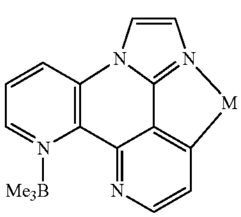
LA320
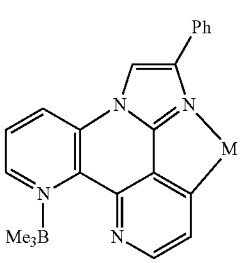
LA321
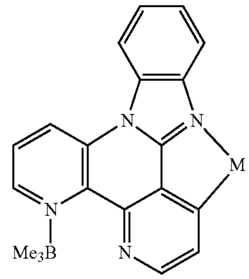
LA322
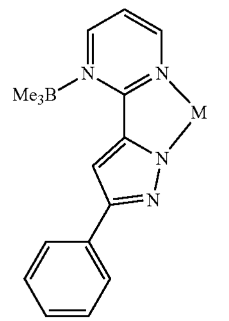
LA323
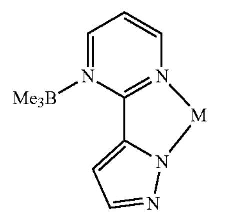
LA324
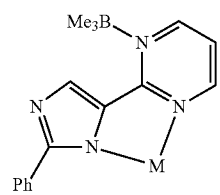
LA325
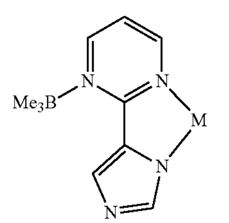
LA326
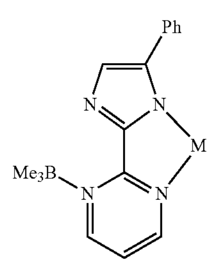

-continued
LA327
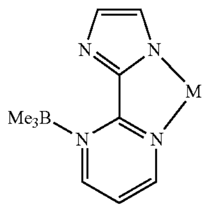
LA328
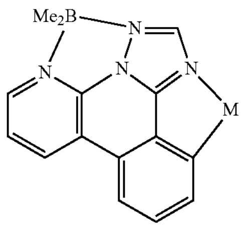
LA329
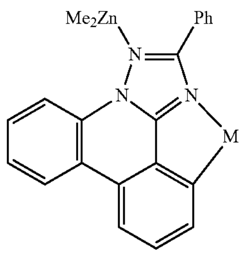
LA330
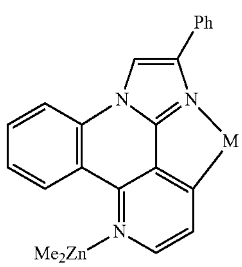
LA331
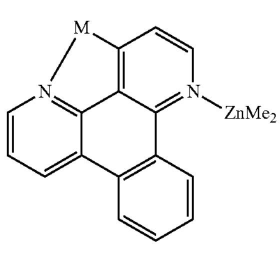
LA332
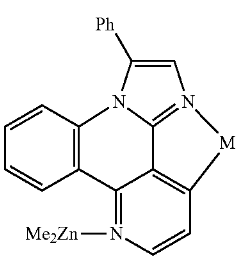
-continued
LA333
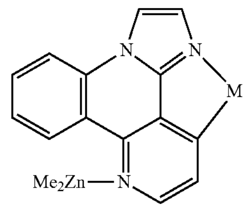
LA334
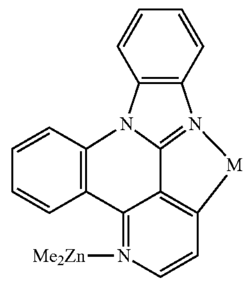
LA335
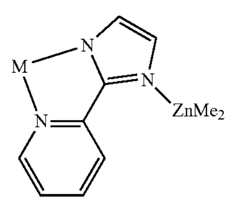
LA336
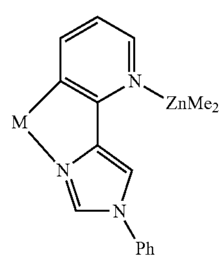
LA337
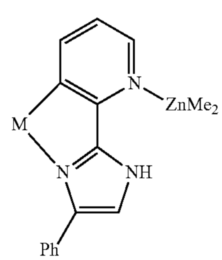
LA338
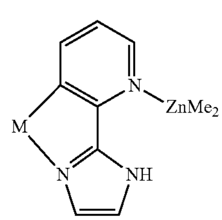

-continued
LA339
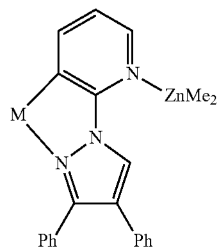
LA340
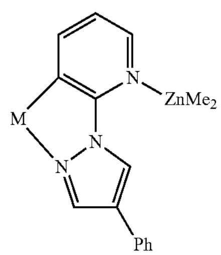
LA341
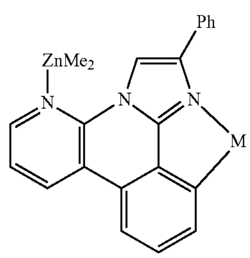
LA342
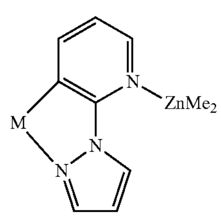
LA343
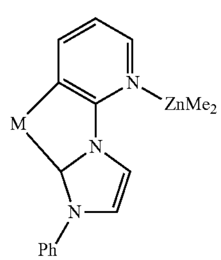
LA344
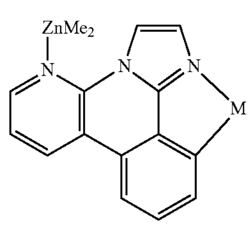
-continued
LA345
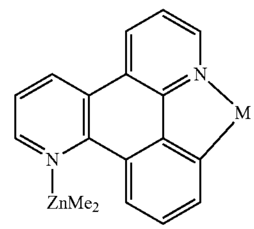
LA346
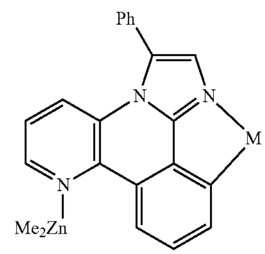
LA347
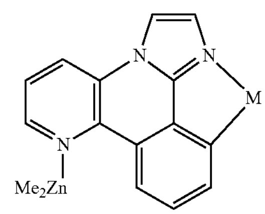
LA348
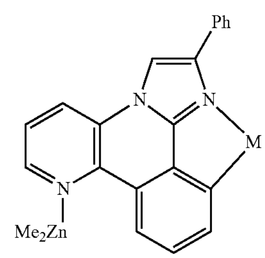
LA349
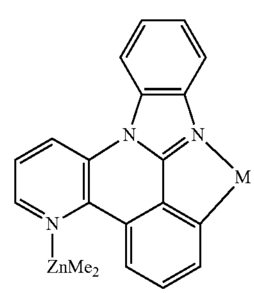
LA350
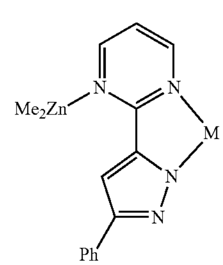

-continued
LA351
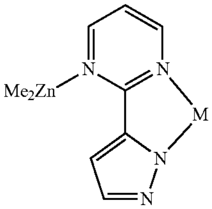
LA352
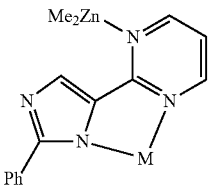
LA353
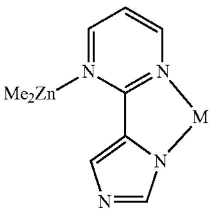
LA354
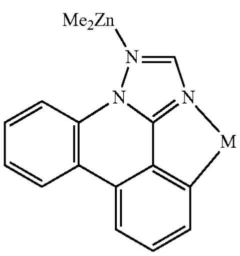
LA355
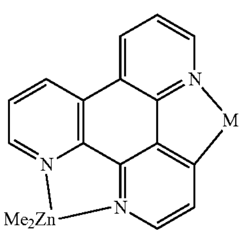
LA356
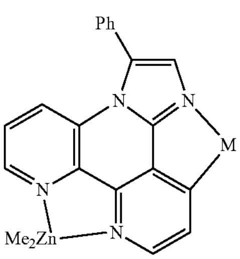
-continued
LA357
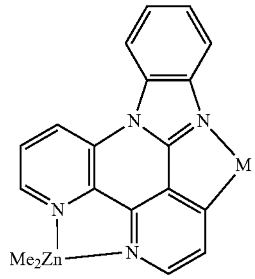
LA358
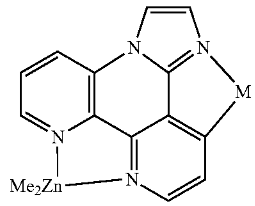
LA359
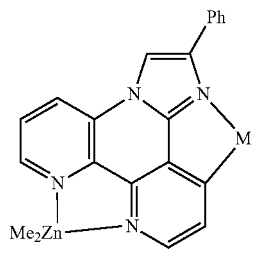
LA360
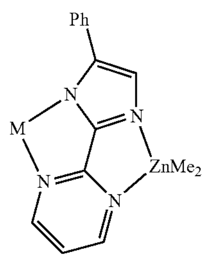
LA361
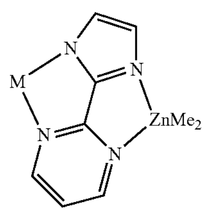
LA362
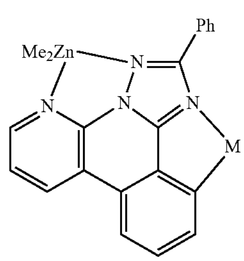

LA363
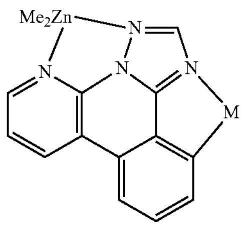
LA364
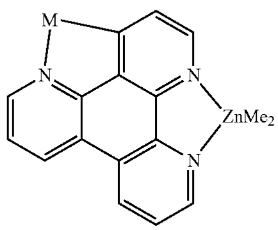
LA365
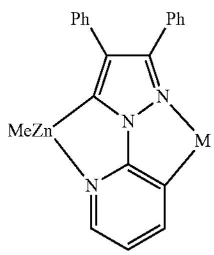
LA366
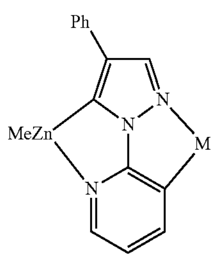
LA367
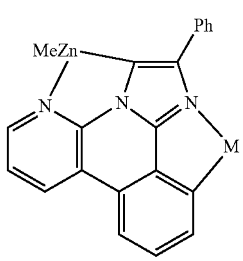
LA368
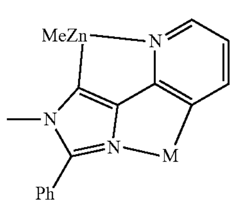
LA369
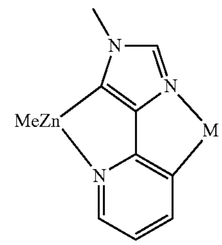
LA370
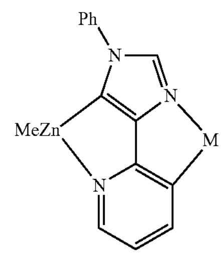
LA371
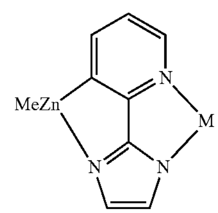
LA372
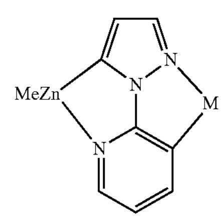
LA373
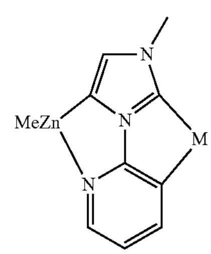
LA374
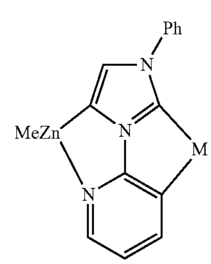

LA375
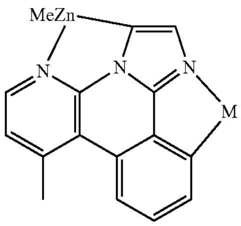
LA376
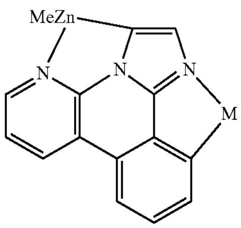
LA377
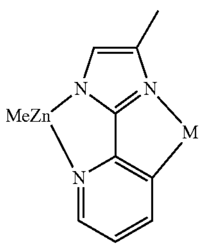
LA378
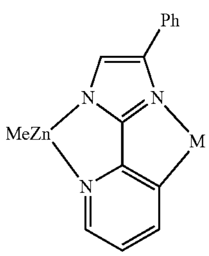
LA379
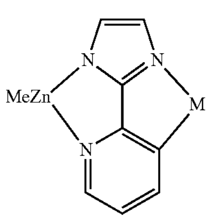
LA380
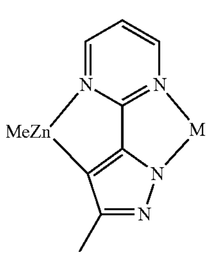
LA381
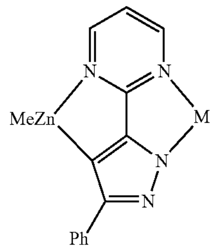
LA382
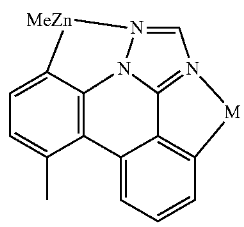
LA383
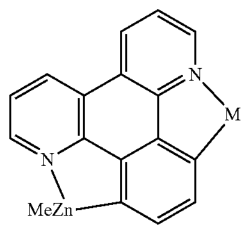
LA384
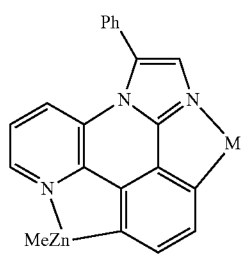
LA385
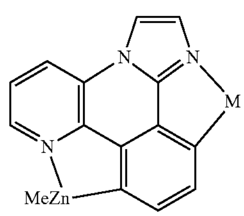
LA386
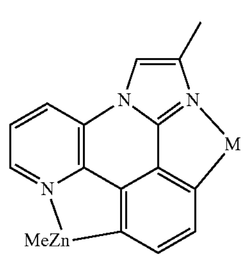

-continued
LA387
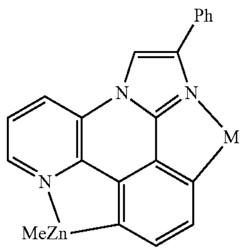
LA388
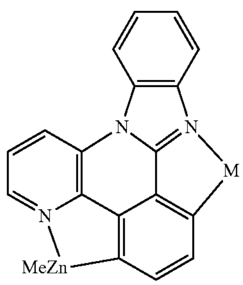
LA389
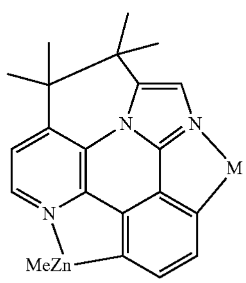
LA390
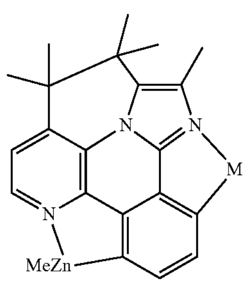
LA391
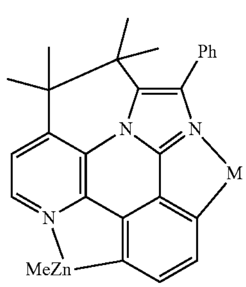
-continued
LA392
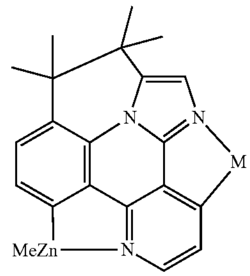
LA393
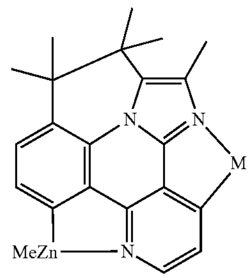
LA394
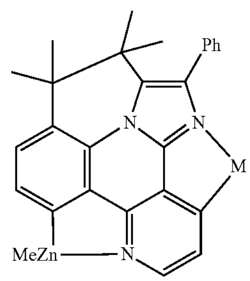
LA395
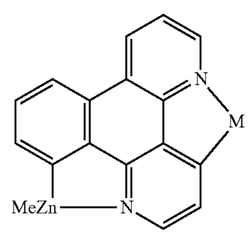
LA396
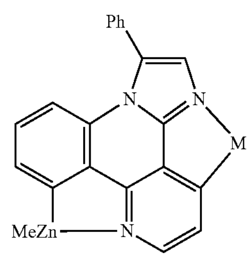
LA397
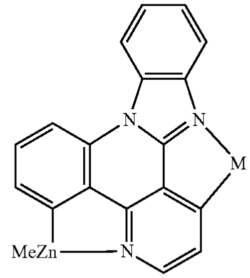

-continued
LA398
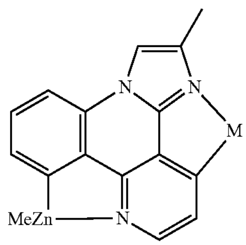
LA399
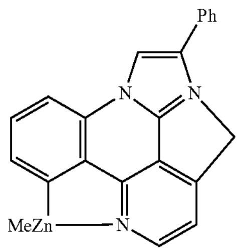
LA400
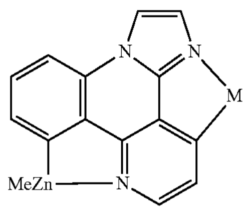
LA401
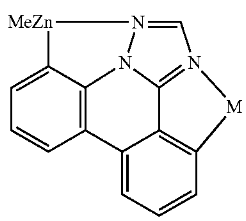
LA402
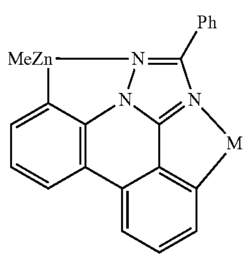
LA403
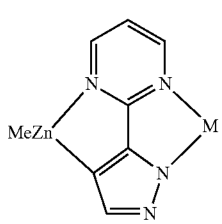
LA404
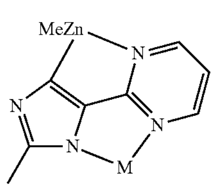
-continued
LA405
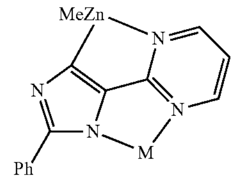
LA406
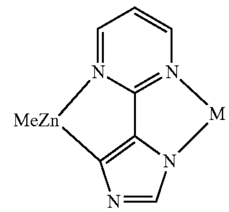
LA407
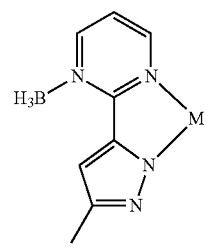
LA408
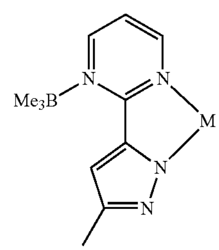
LA409
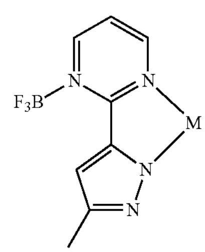
LA410
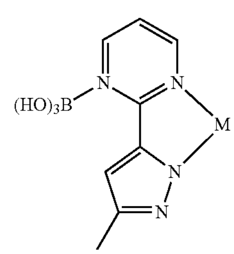

-continued
LA411
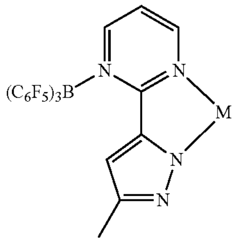
LA412
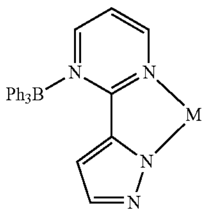
LA413
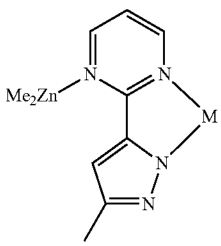
LA414
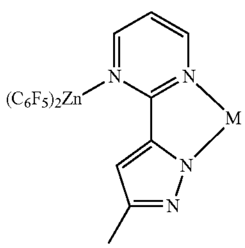
LA415
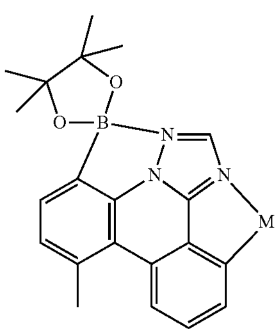
LA416
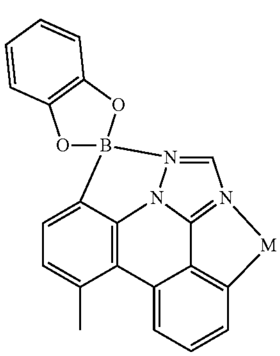
-continued
LA417
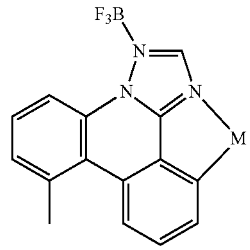
LA418
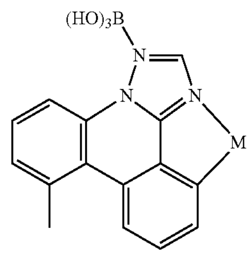
LA419
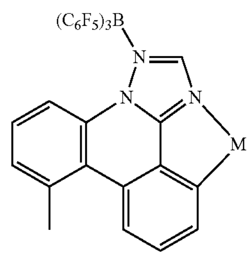
LA420
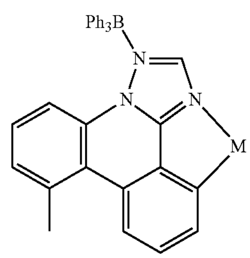
LA421
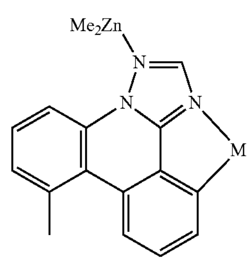
LA422
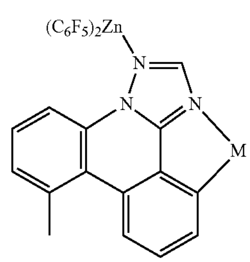

LA423
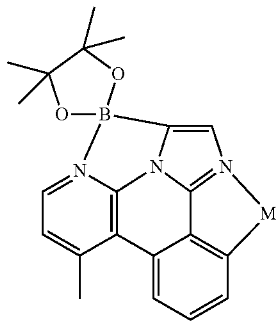
LA424
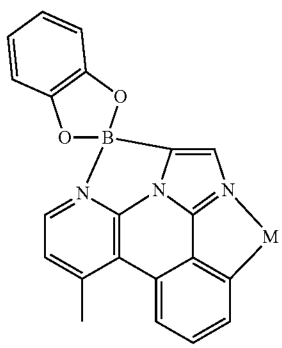
LA425
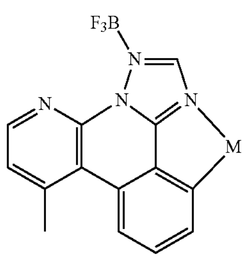
LA426
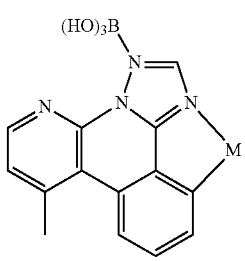
LA427
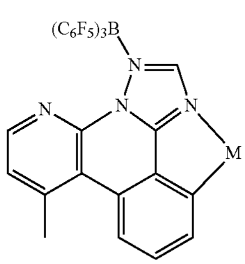
LA428
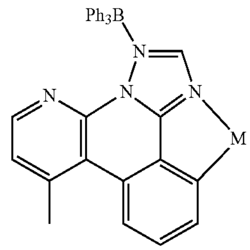
LA429
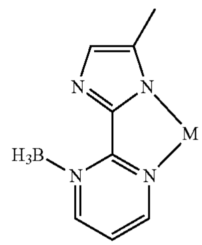
LA430
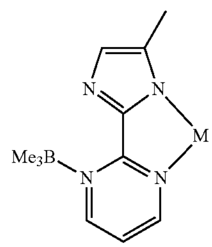
LA431
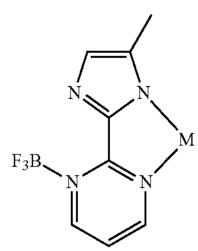
LA432
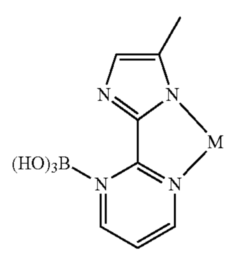
LA433
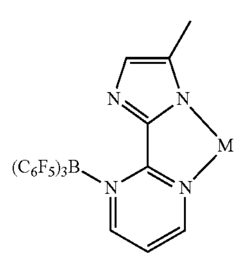

-continued
LA434
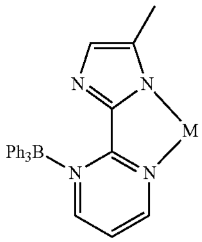
LA435
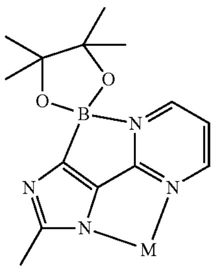
LA436
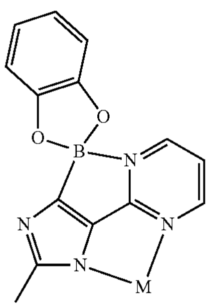
LA437
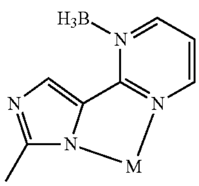
LA438
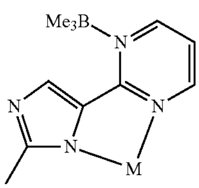
LA439
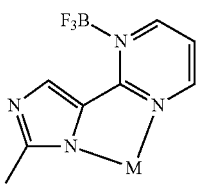
LA440
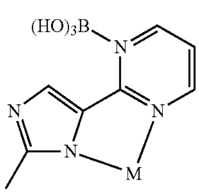
-continued
LA441
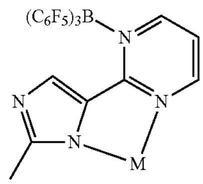
LA442
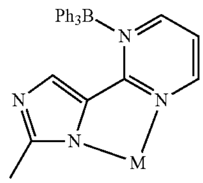
LA443
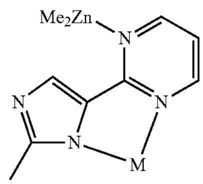
LA444
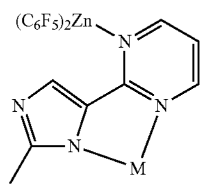
LA445
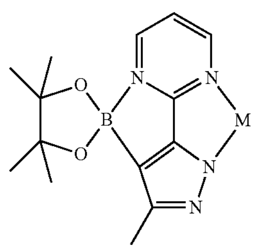
LA446
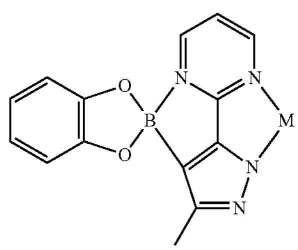
LA447
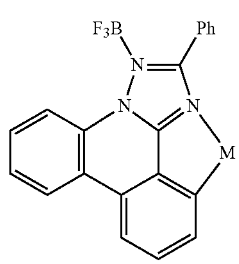

-continued
LA448
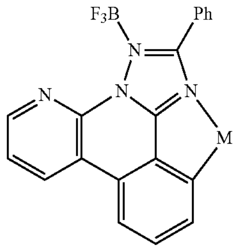
LA449
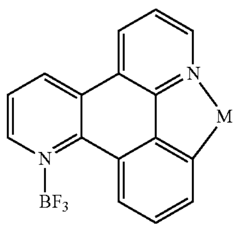
LA450
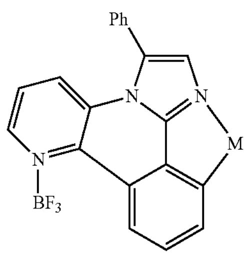
LA451
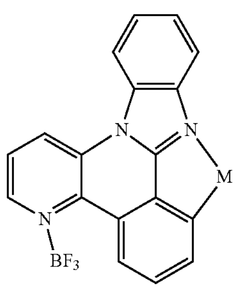
LA452
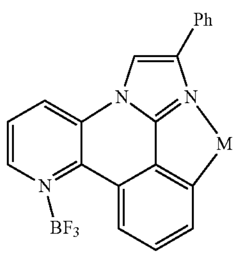
LA453
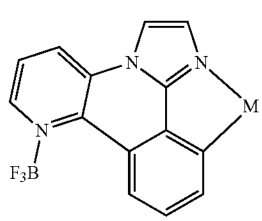
-continued
LA454
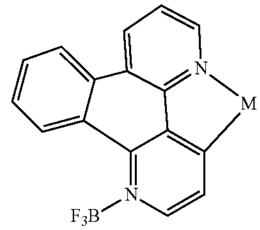
LA455
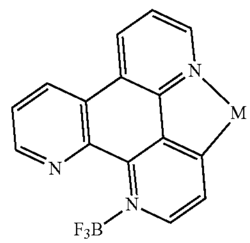
LA456
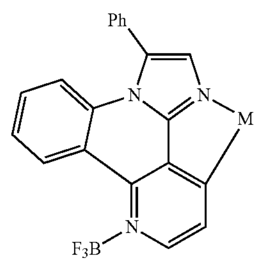
LA457
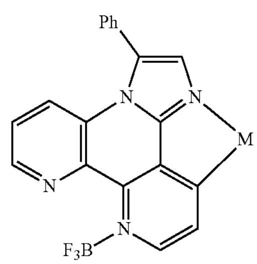
LA458
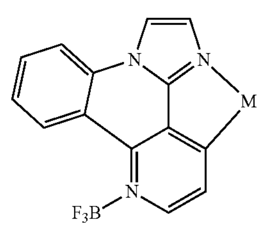
LA459
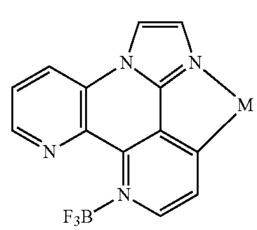

-continued
LA460
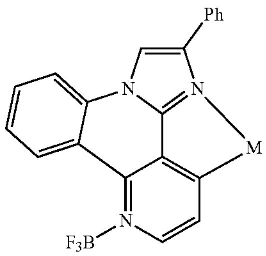
LA461
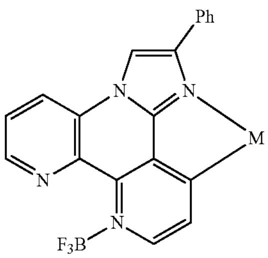
LA462
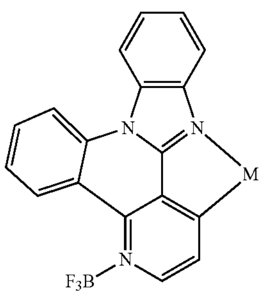
LA463
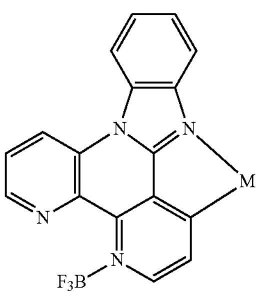
LA464
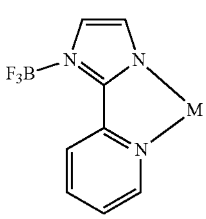
LA465
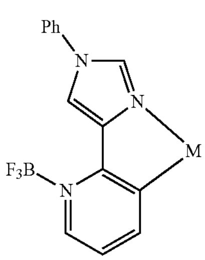
-continued
LA466
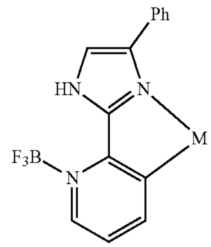
LA467
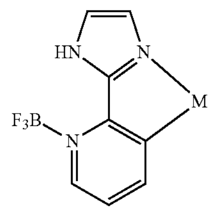
LA468
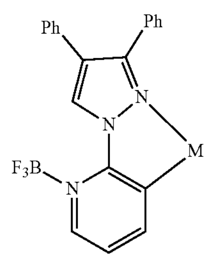
LA469
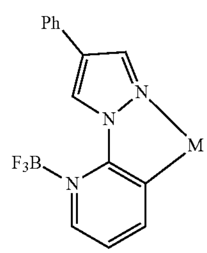
LA470
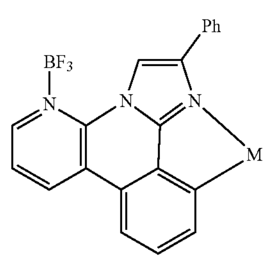
LA471
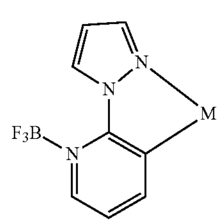

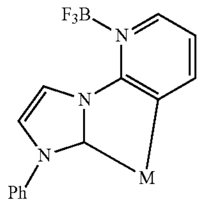
LA472
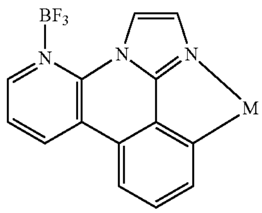
LA473
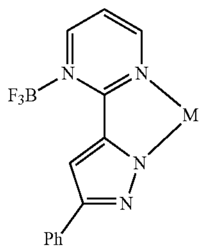
LA474
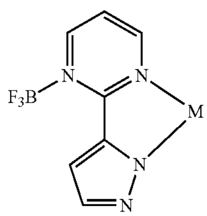
LA475
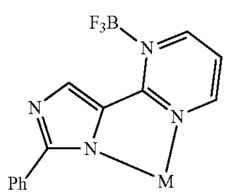
LA476
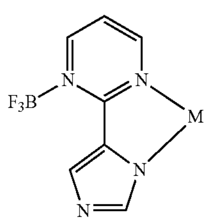
LA477
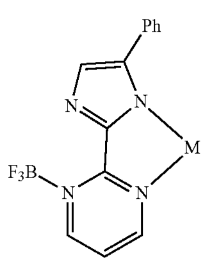
LA478
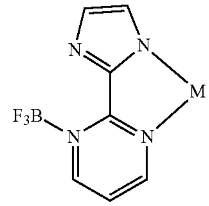
LA479
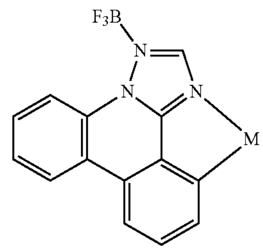
LA480
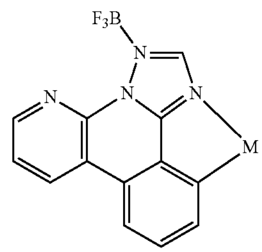
LA481
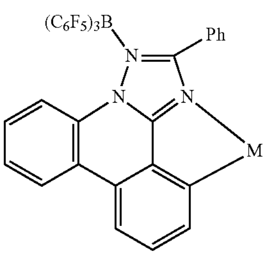
LA482
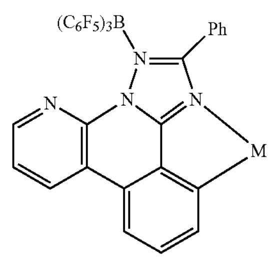
LA483
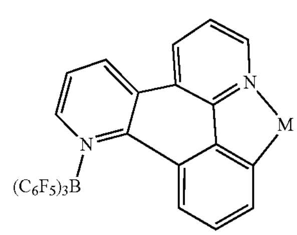
LA484

LA485
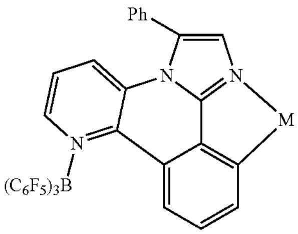
LA486
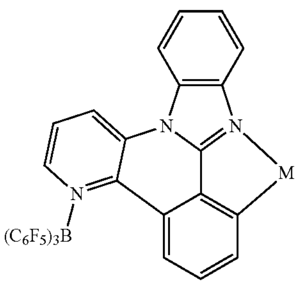
LA487
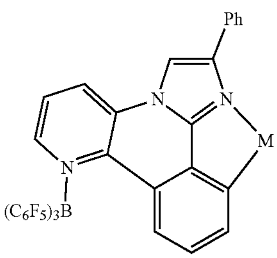
LA488
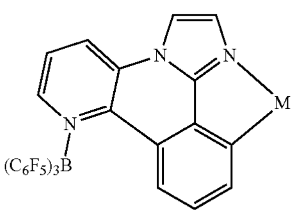
LA489
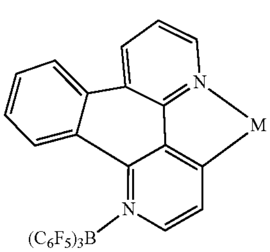
LA490
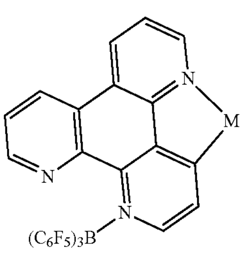
LA491
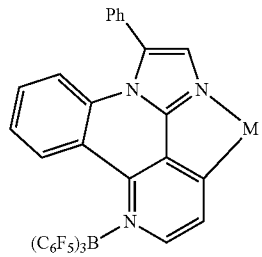
LA492
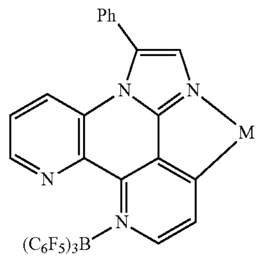
LA493
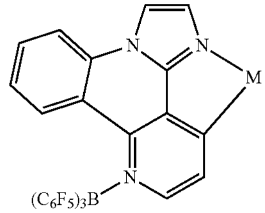
LA494
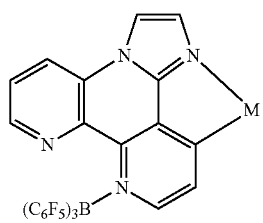
LA495
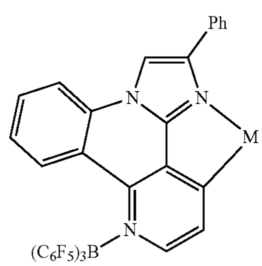
LA496
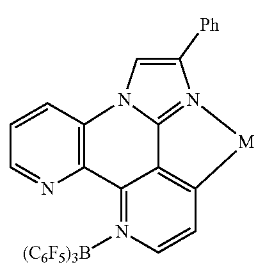

LA497
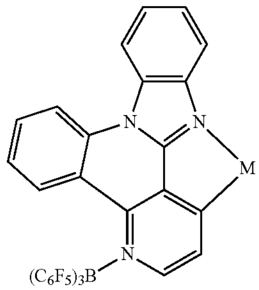
LA498
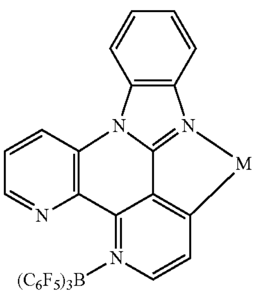
LA499
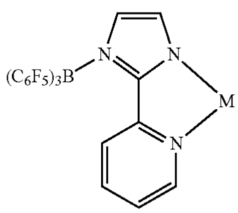
LA500
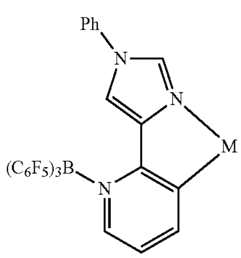
LA501
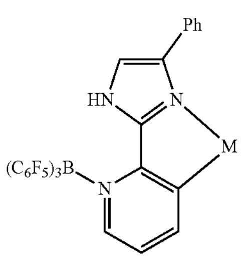
LA502
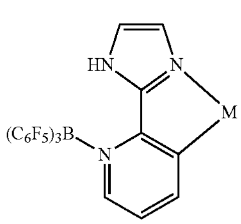
LA503
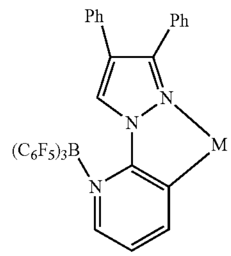
LA504
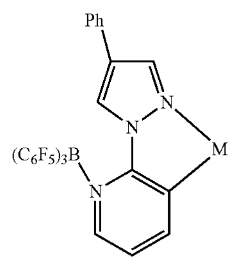
LA505
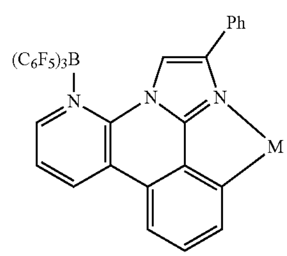
LA506
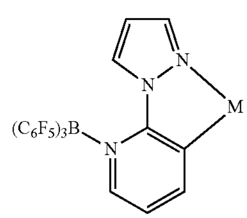
LA507
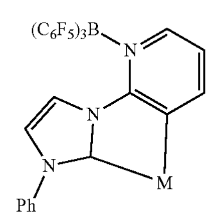
LA508
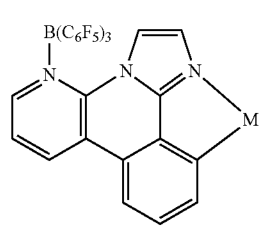

-continued
LA509
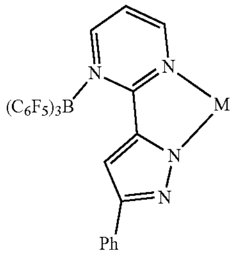
LA510
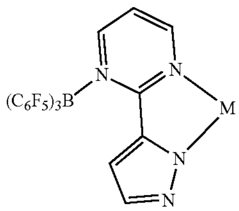
LA511
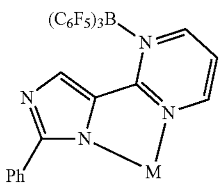
LA512
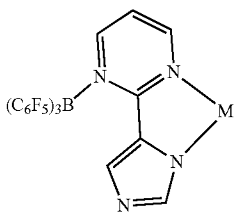
LA513
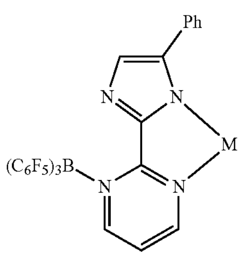
LA514
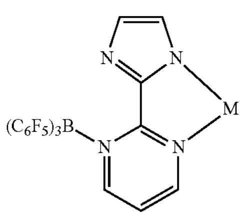
LA515
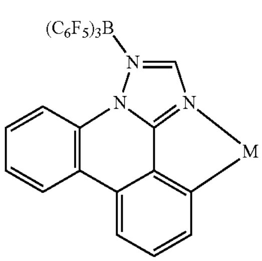
-continued
LA516
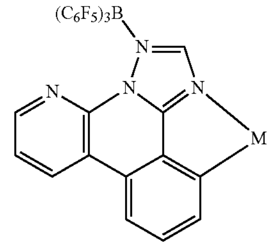
LA517
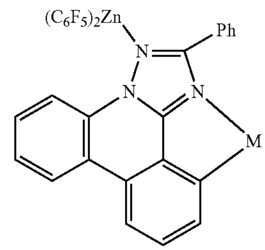
LA518
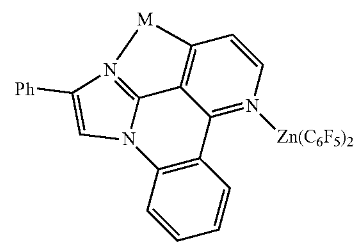
LA519
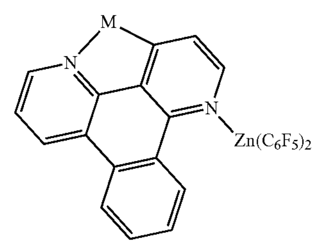
LA520
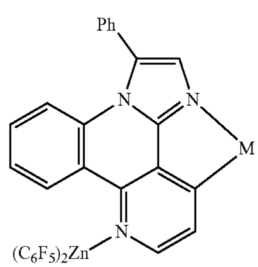
LA521
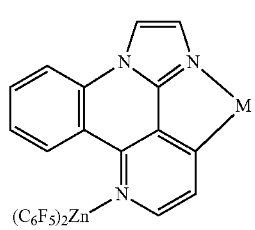

-continued
LA522
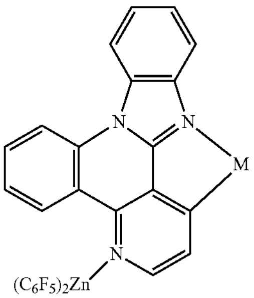
LA523
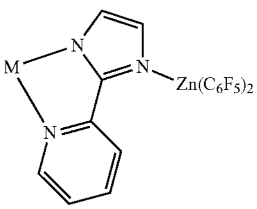
LA524
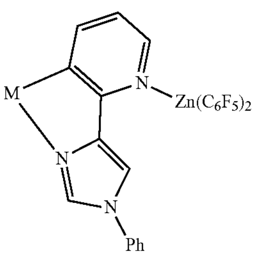
LA525
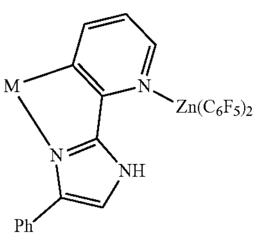
LA526
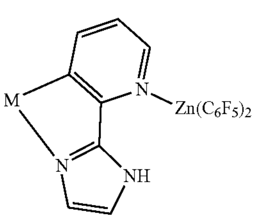
LA527
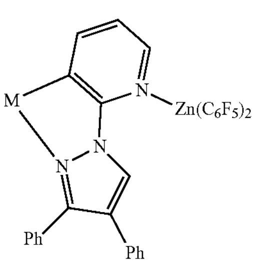
-continued
LA528
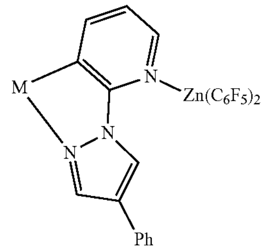
LA529
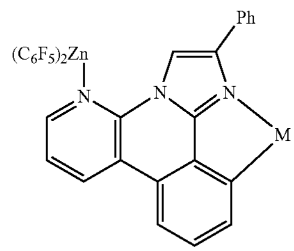
LA530
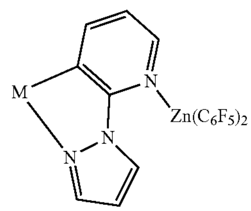
LA531
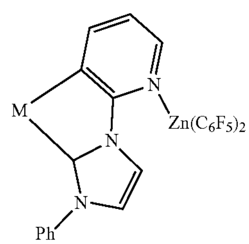
LA532
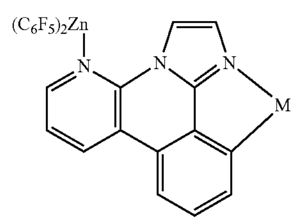
LA533
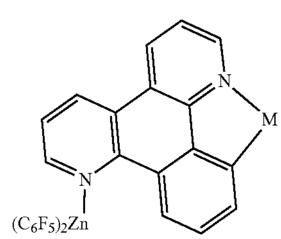

-continued
LA534
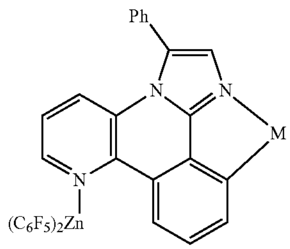
LA535
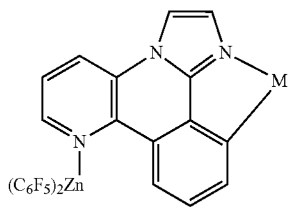
LA536
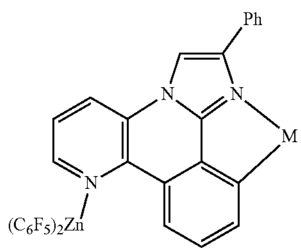
LA537
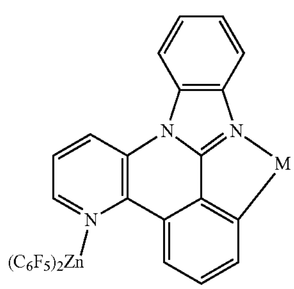
LA538
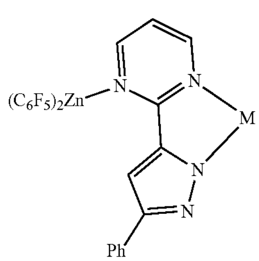
LA539
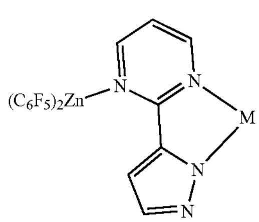
-continued
LA540
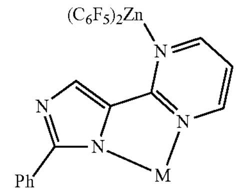
LA541
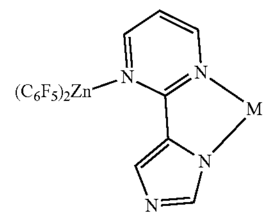
LA542
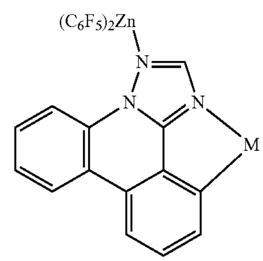
LA543
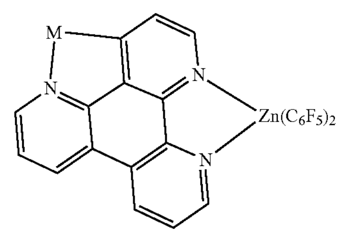
LA544
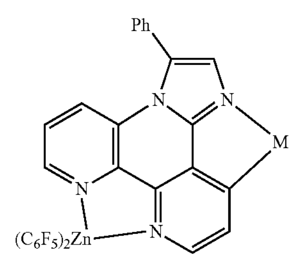
LA545
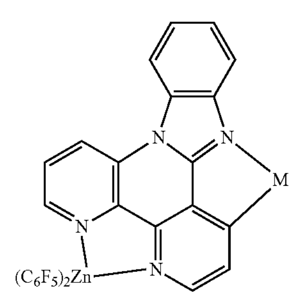

-continued
LA546
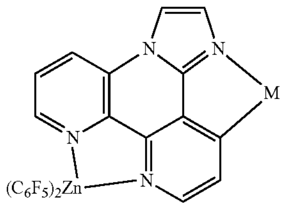
LA547
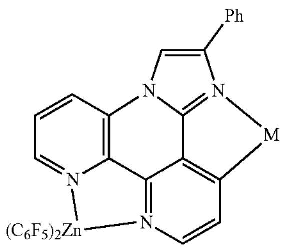
LA548
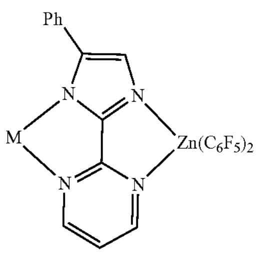
LA549
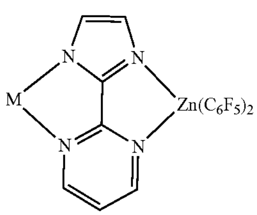
LA550
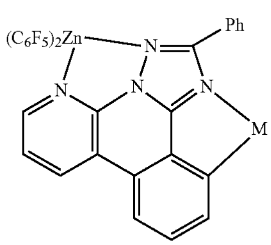
LA551
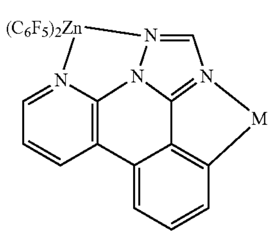
-continued
LA552
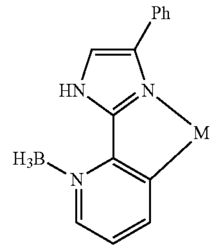
LA553
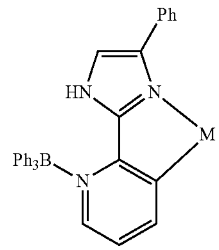
LA554
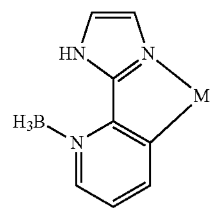
LA555
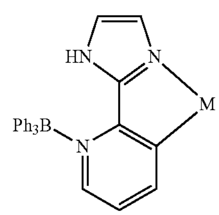
LA556
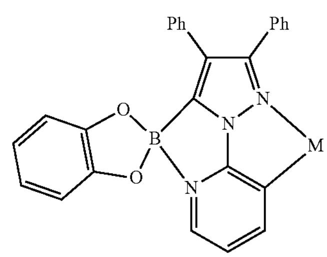
LA557
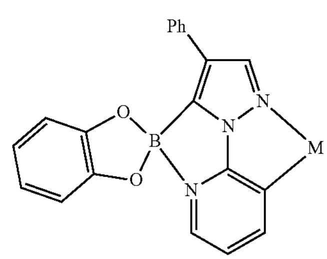

-continued
LA558
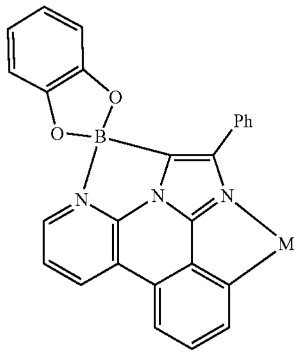
LA559
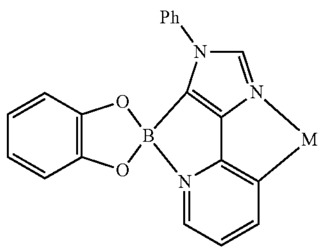
LA560
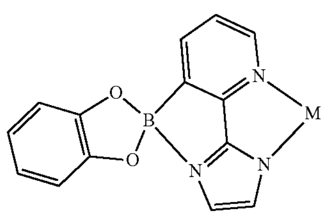
LA561
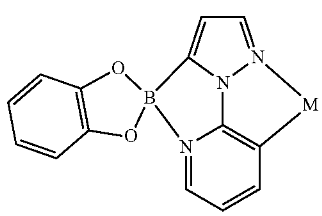
LA562
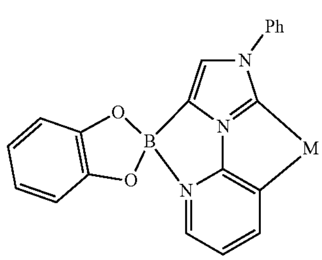
-continued
LA563
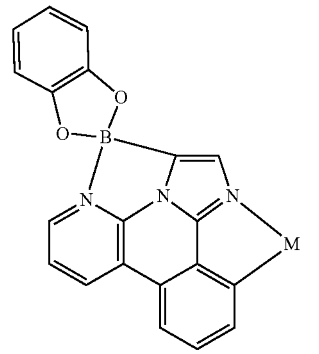
LA564
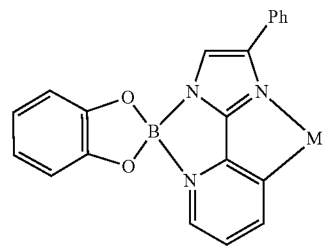
LA565
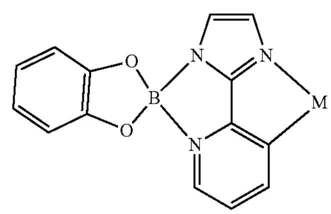
LA566
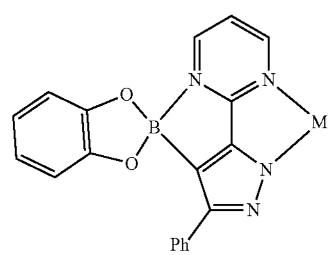
LA567
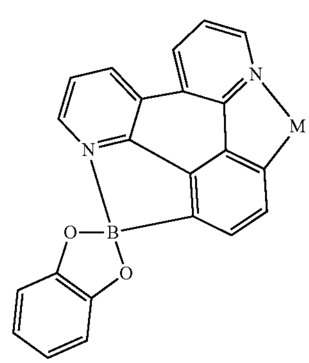

-continued
LA568
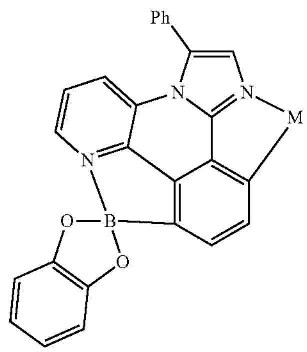
LA569
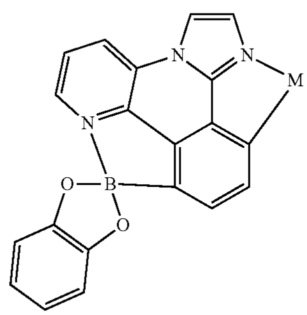
LA570
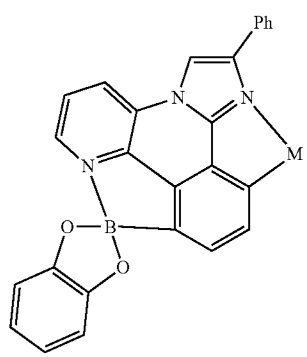
LA571
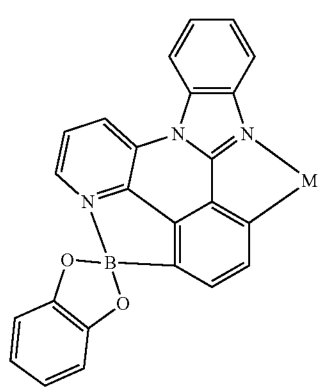
-continued
LA572
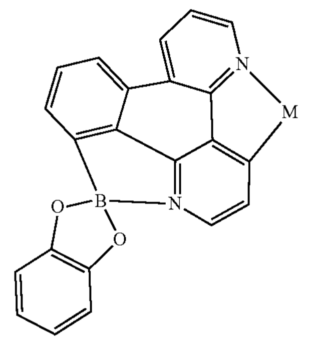
LA573
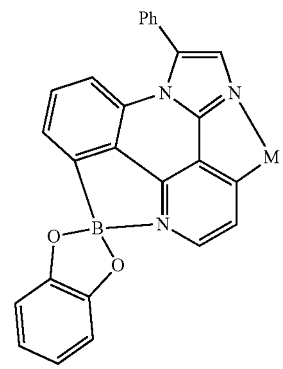
LA574
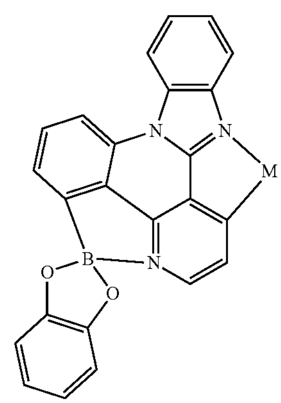
LA575
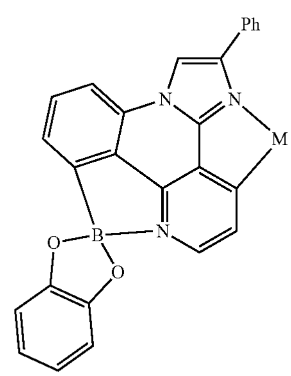

-continued
LA576
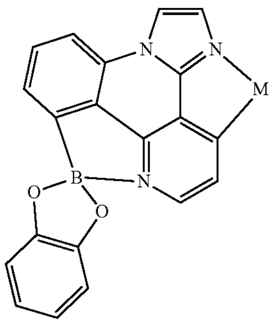
LA577
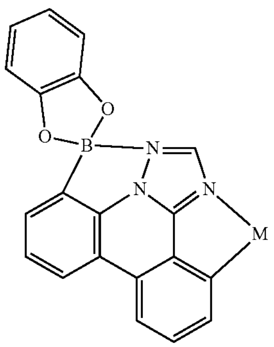
LA578
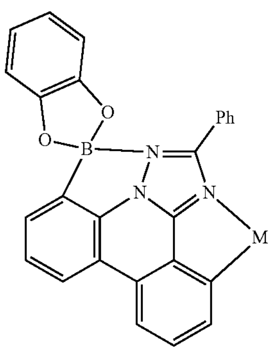
LA579
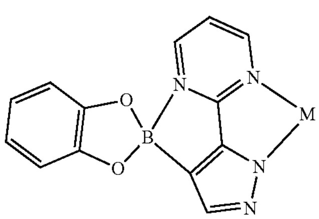
LA580
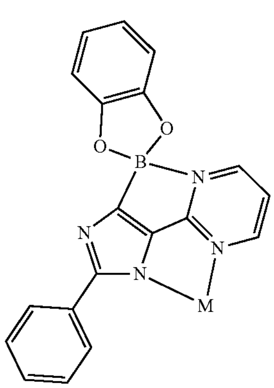
-continued
LA581
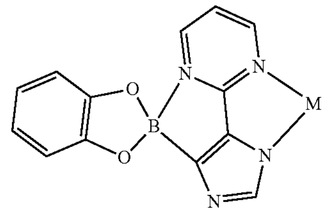
LA582
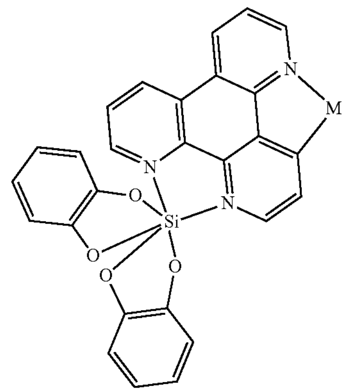
LA583
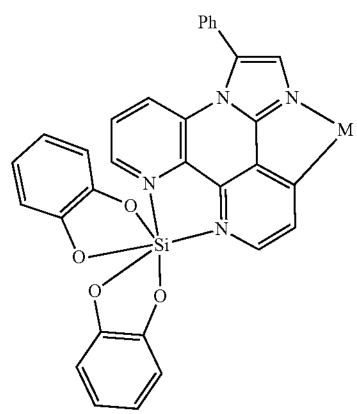
LA584
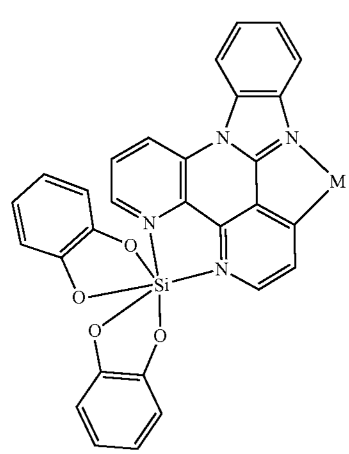

-continued
LA585
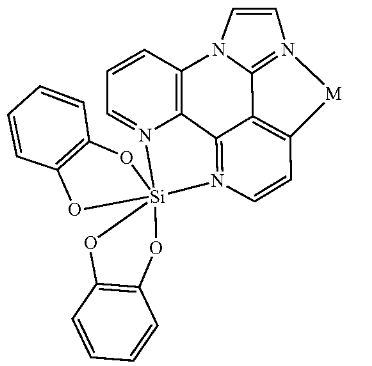
LA586
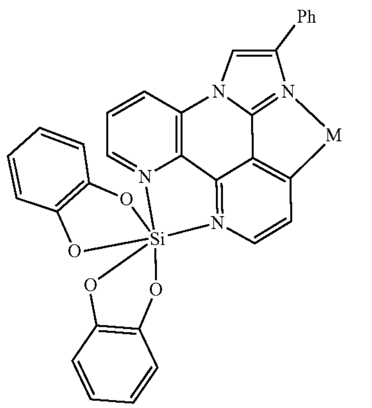
LA587
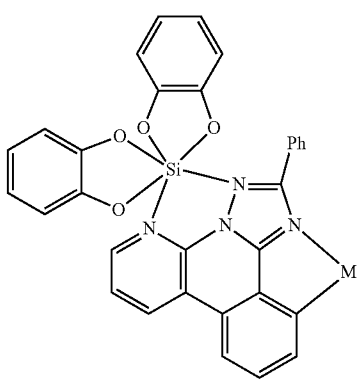
LA588
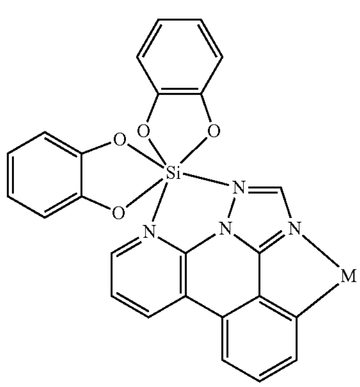
-continued
LA589
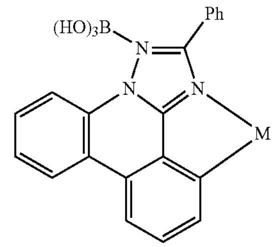
LA590
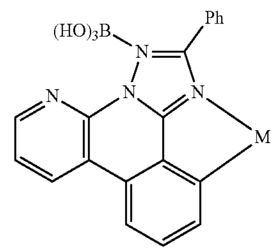
LA591
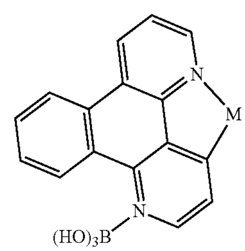
LA592
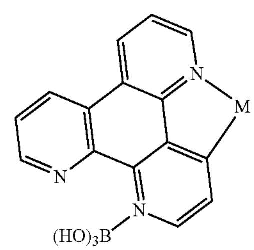
LA593
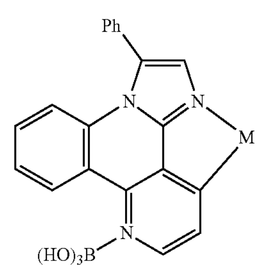
LA594
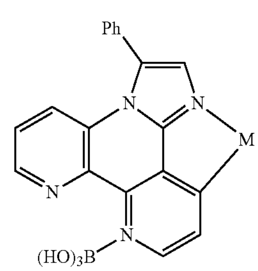

-continued
LA595
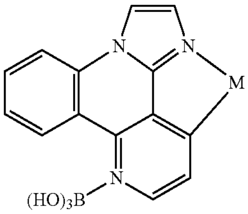
LA596
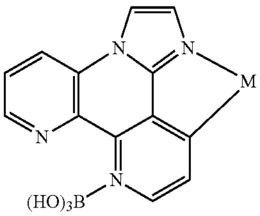
LA597
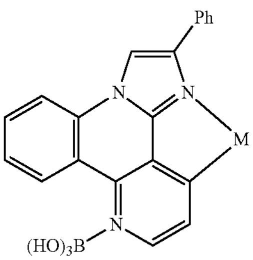
LA598
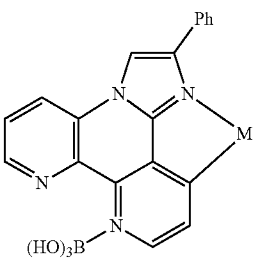
LA599
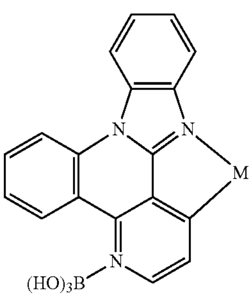
LA600
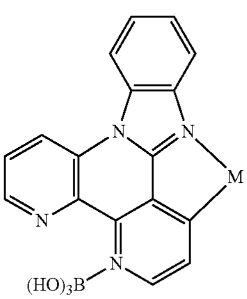
-continued
LA601
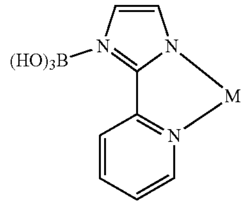
LA602
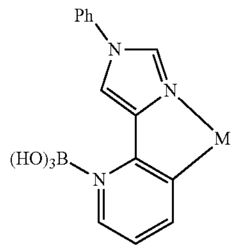
LA603
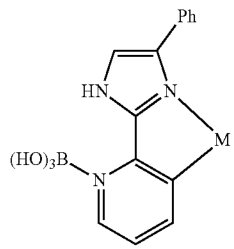
LA604
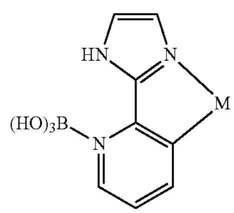
LA605
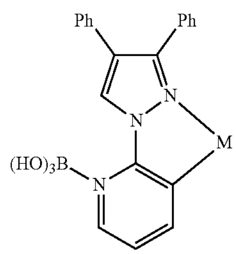
LA606
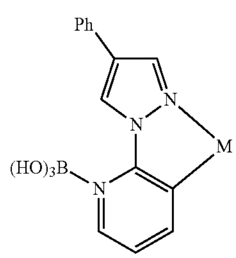

LA607
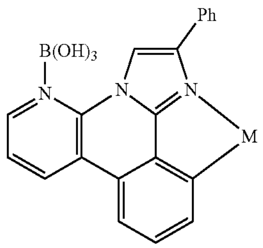
LA608
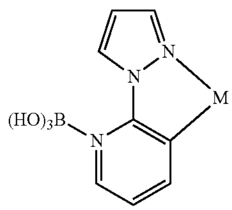
LA609
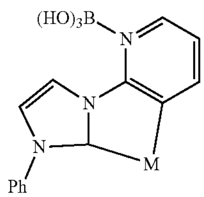
LA610
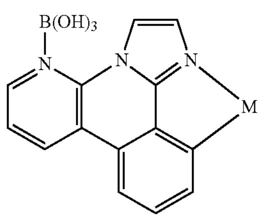
LA611
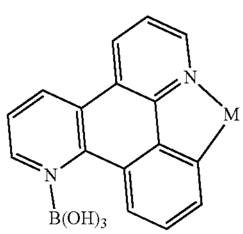
LA612
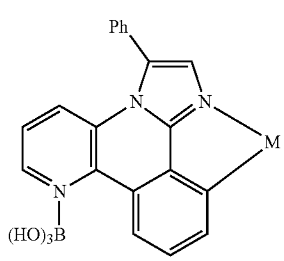
LA613
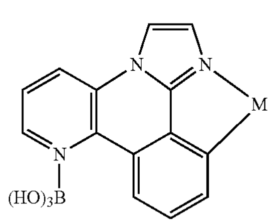
LA614
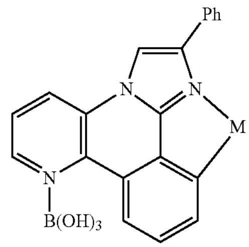
LA615
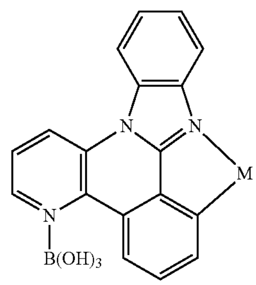
LA616
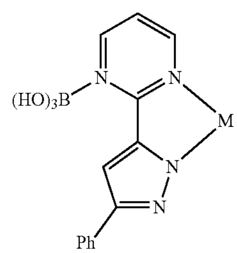
LA617
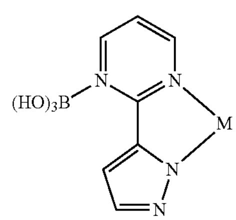
LA618
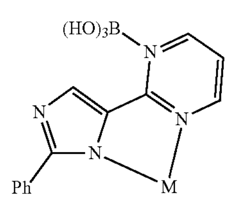
LA619
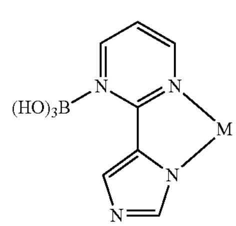

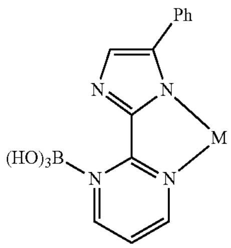
LA620
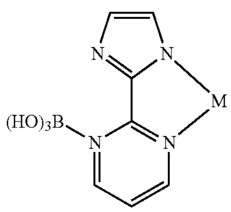
LA621
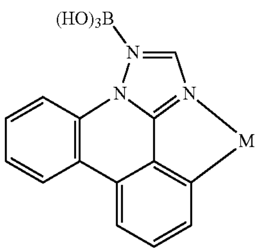
LA622
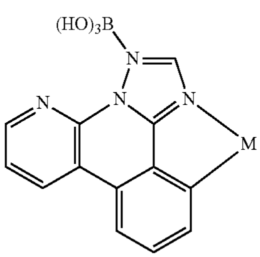
LA623
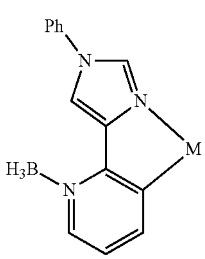
LA624
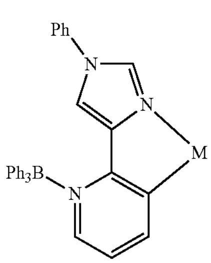
LA625
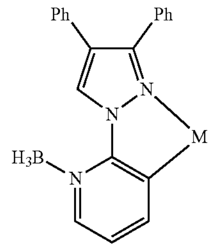
LA626
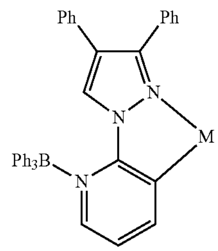
LA627
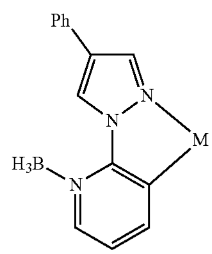
LA628
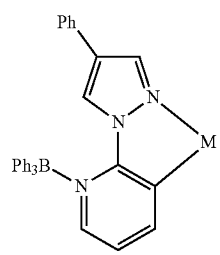
LA629
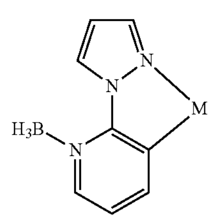
LA630
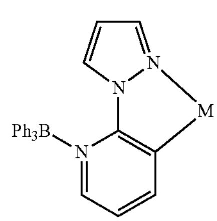
LA631

-continued
LA632
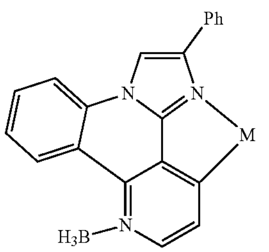
LA633
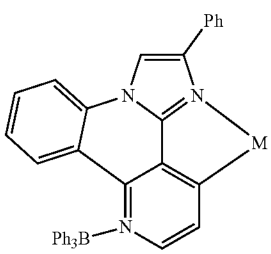
LA634
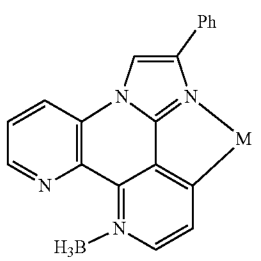
LA635
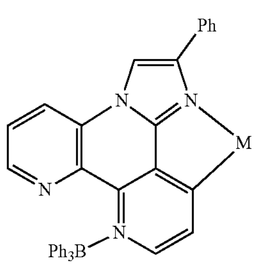
LA636
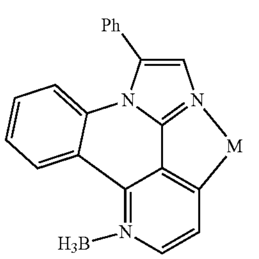
LA637
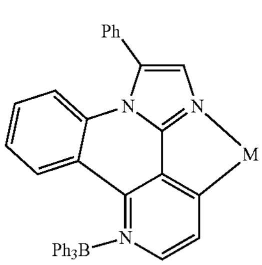
-continued
LA638
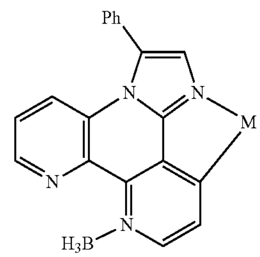
LA639
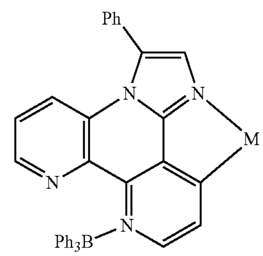
LA640
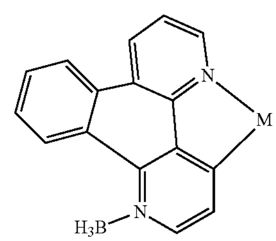
LA641
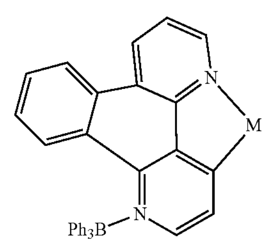
LA642
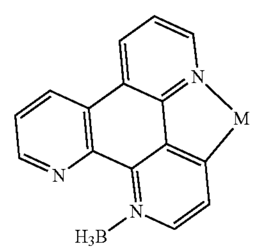
LA643
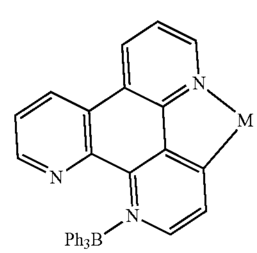

LA644
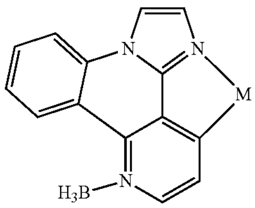
LA645
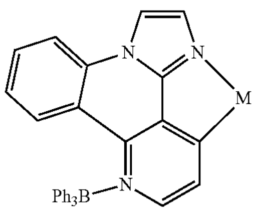
LA646
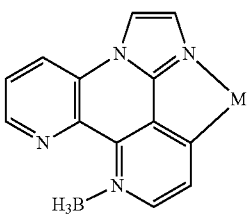
LA647
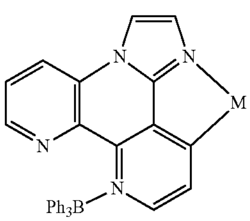
LA648
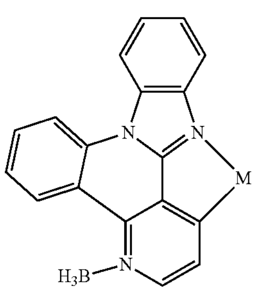
LA649
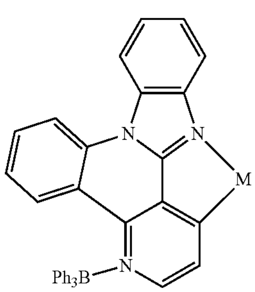
LA650
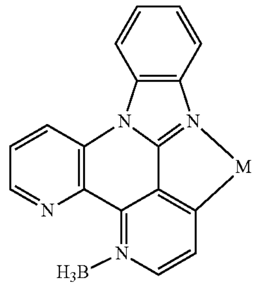
LA651
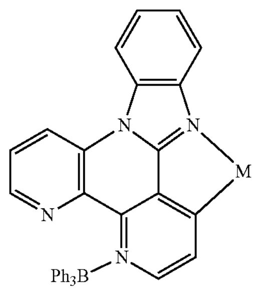
LA652
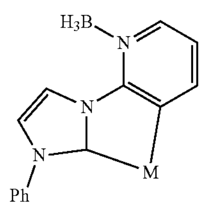
LA653
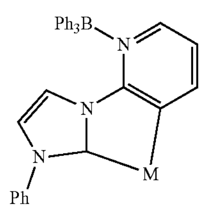
LA654
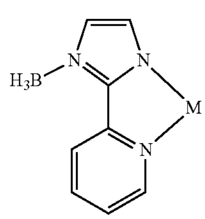
LA655
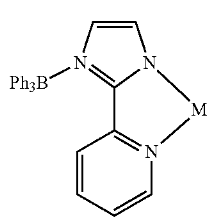

-continued
LA656
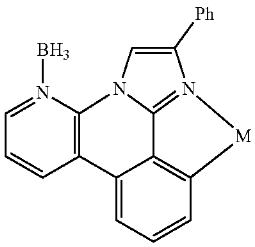
LA657
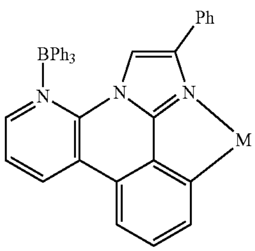
LA658
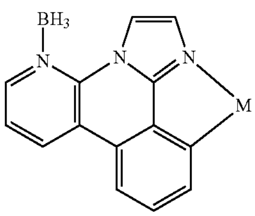
LA659
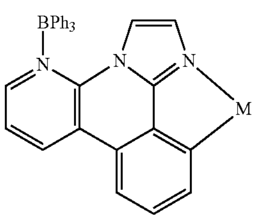
LA660
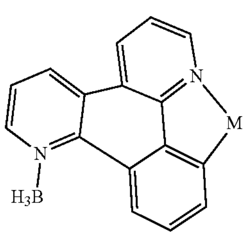
LA661
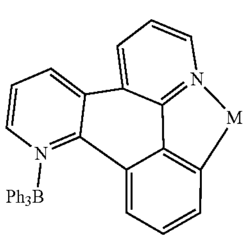
-continued
LA662
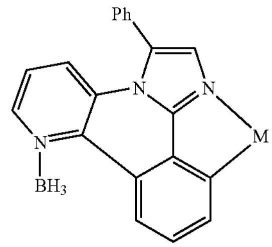
LA663
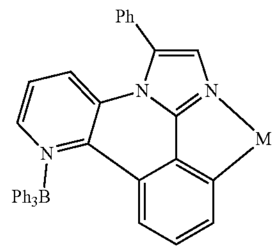
LA664
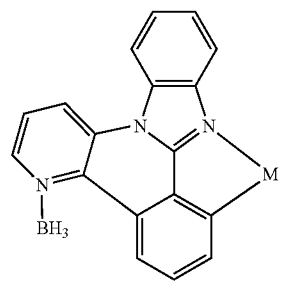
LA665
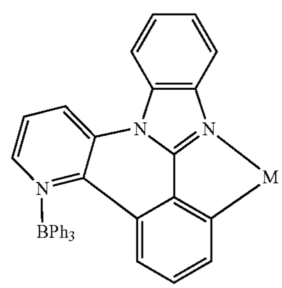
LA666
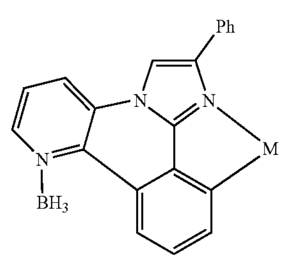
LA667
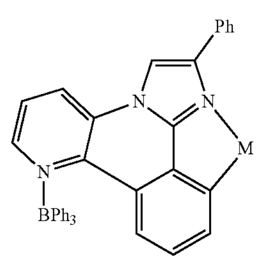

LA668
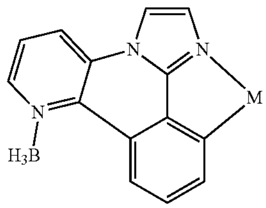
LA669
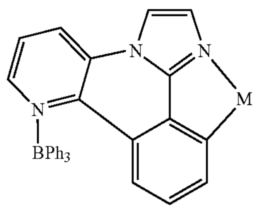
LA670
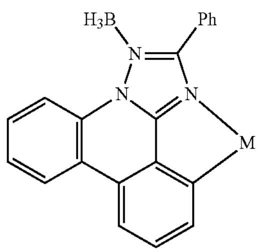
LA671
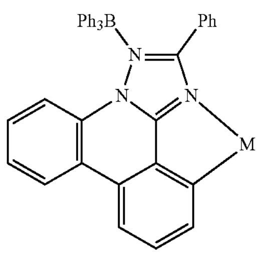
LA672
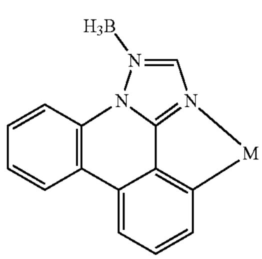
LA673
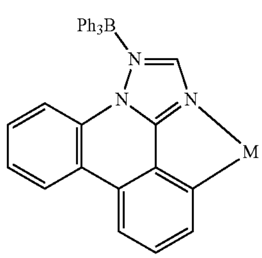
LA674
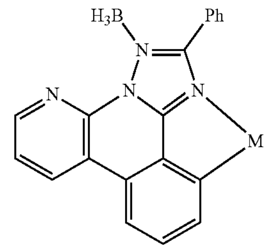
LA675
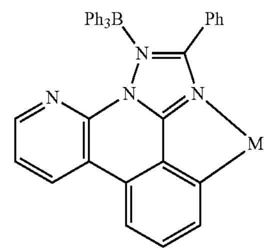
LA676
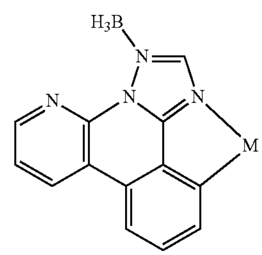
LA677
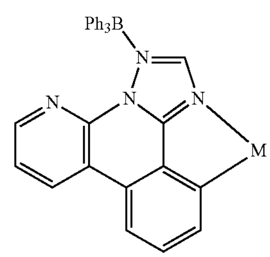
LA678
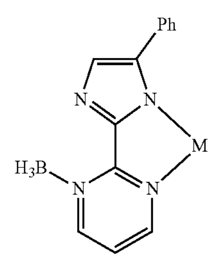
LA679
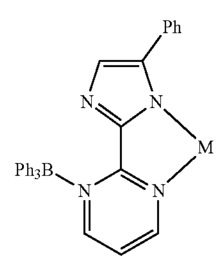

-continued
LA680
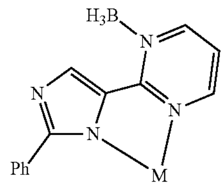
LA681
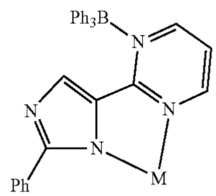
LA682
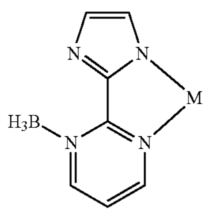
LA683
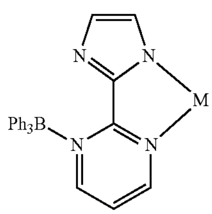
LA684
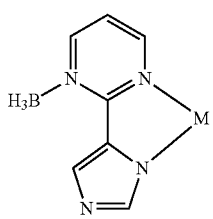
LA685
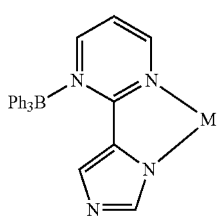
LA686
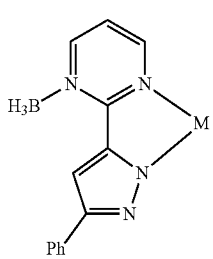
-continued
LA687
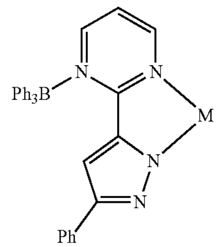
LA688
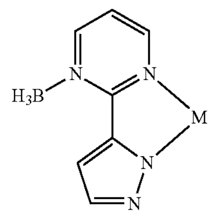
LA689
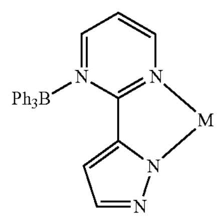
In some embodiments of the compound, each $L^1$ is independently selected from the group consisting of:
$L_{B1}$
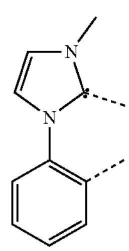
$L_{B2}$
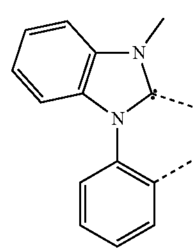

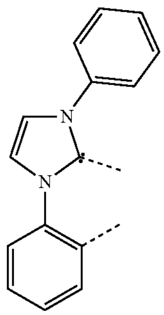
$L_{B3}$
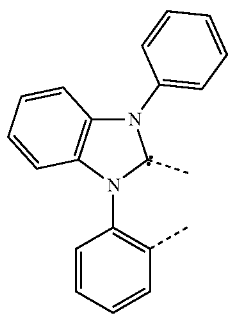
$L_{B4}$
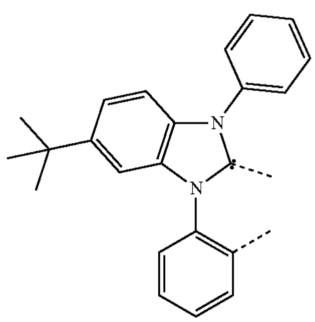
$L_{B5}$
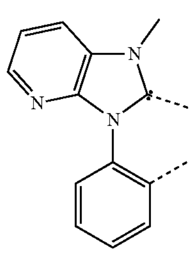
$L_{B6}$
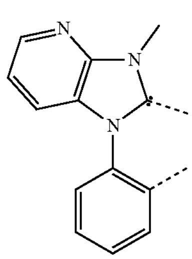
$L_{B7}$
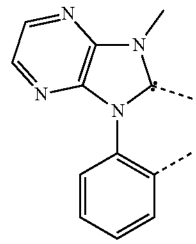
$L_{B8}$
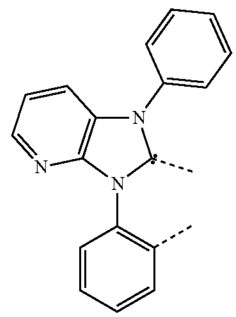
$L_{B9}$
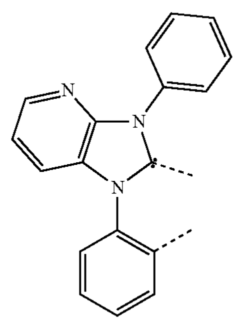
$L_{B10}$
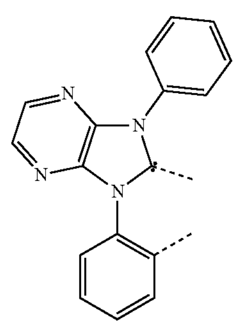
$L_{B11}$
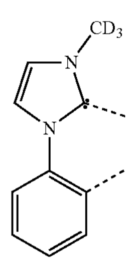
$L_{B12}$ -continued
$L_{B13}$
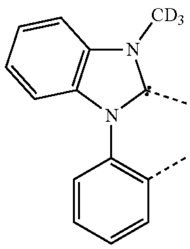
$L_{B14}$
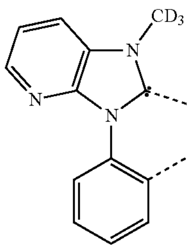
$L_{B15}$
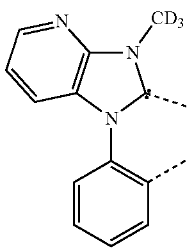
$L_{B16}$
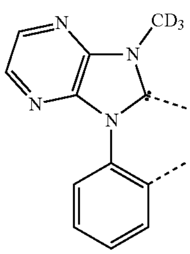
$L_{B17}$
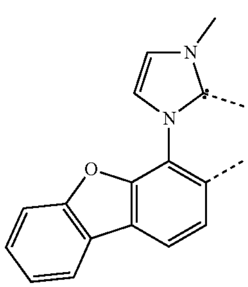
$L_{B18}$
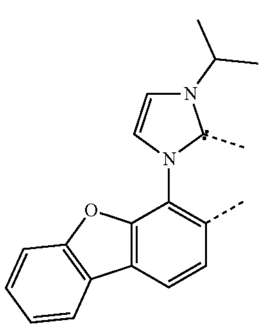
-continued
$L_{B19}$
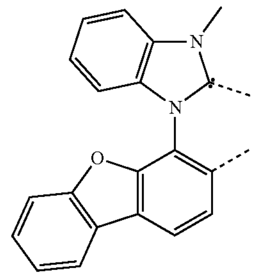
$L_{B20}$
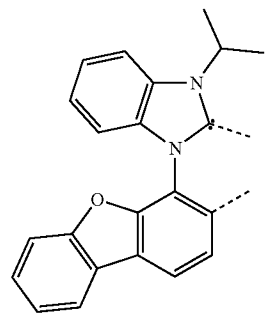
$L_{B21}$
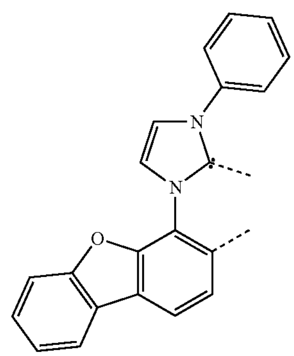
$L_{B22}$
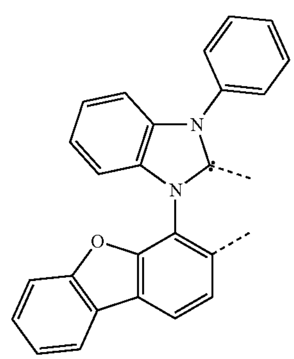
$L_{B23}$
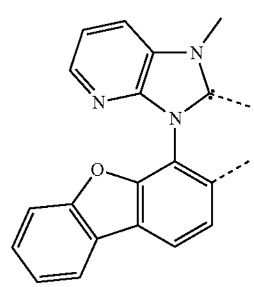

-continued
$L_{B24}$
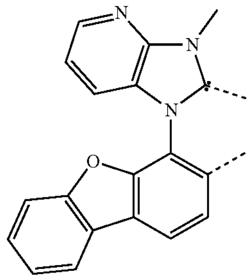
$L_{B25}$
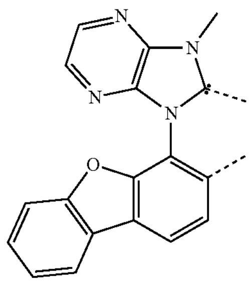
$L_{B26}$
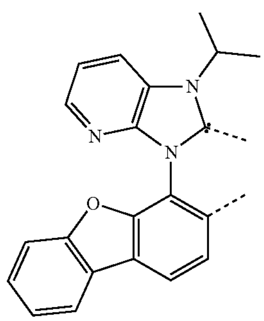
$L_{B27}$
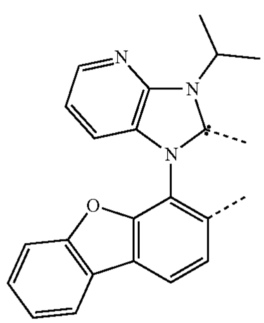
$L_{B28}$
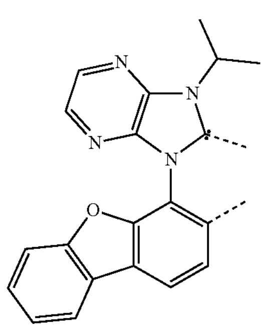
-continued
$L_{B29}$
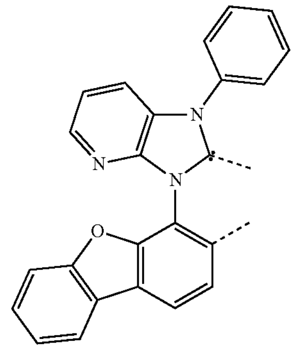
$L_{B30}$
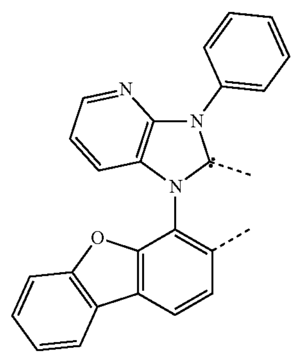
$L_{B31}$
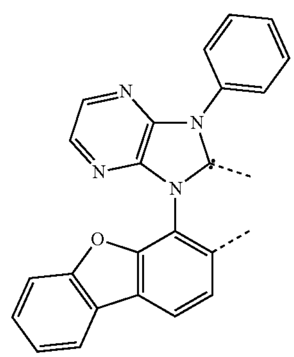
$L_{B32}$
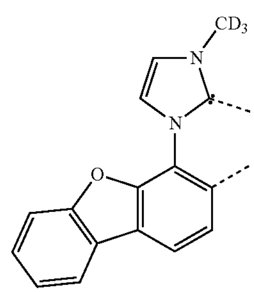

-continued
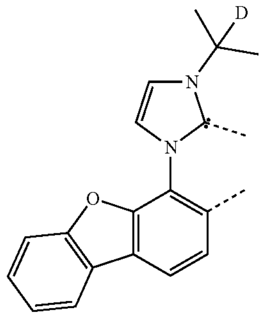
$L_{B33}$
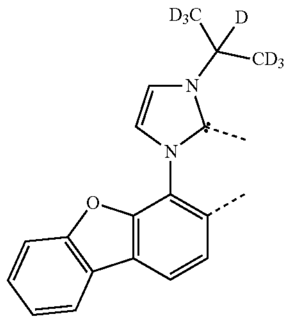
$L_{B34}$
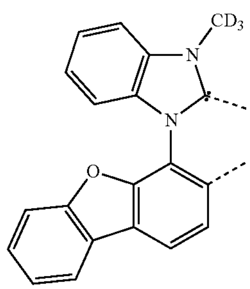
$L_{B35}$
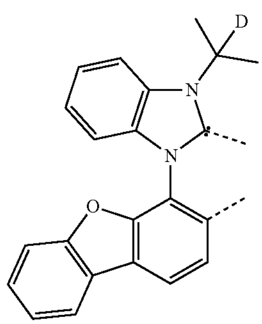
$L_{B36}$
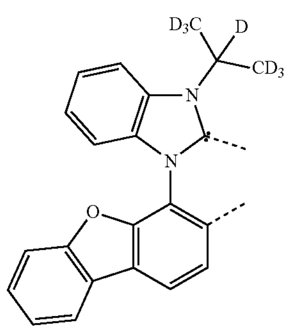
$L_{B37}$
-continued
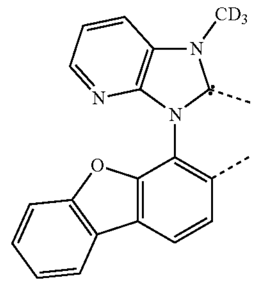
$L_{B38}$
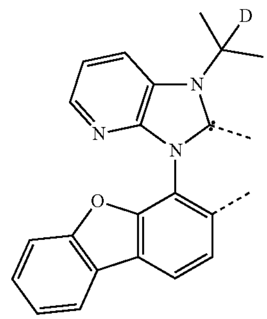
$L_{B39}$
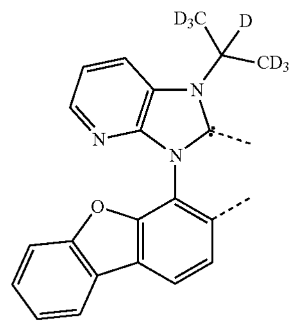
$L_{B40}$
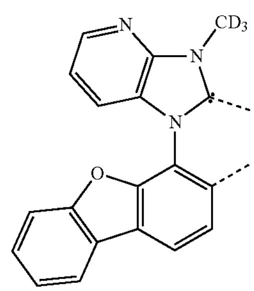
$L_{B41}$
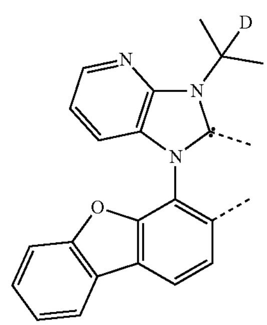
$L_{B42}$

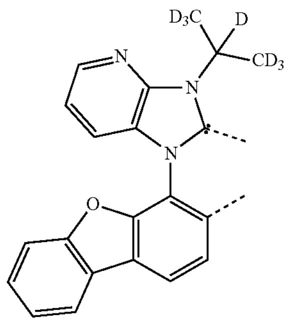
$L_{B43}$
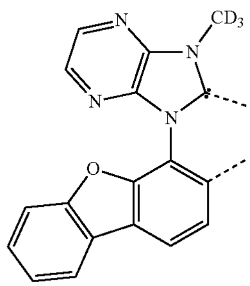
$L_{B44}$
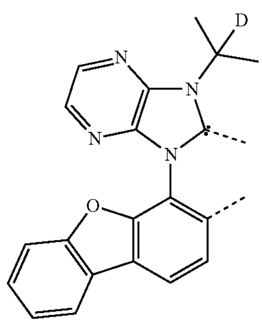
$L_{B45}$
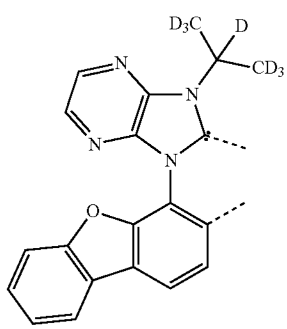
$L_{B46}$
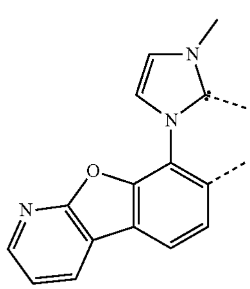
$L_{B47}$
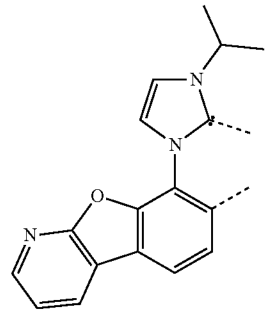
$L_{B48}$
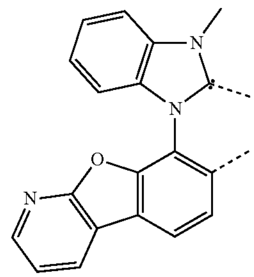
$L_{B49}$
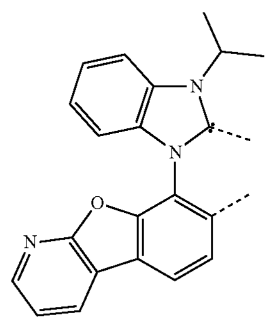
$L_{B50}$
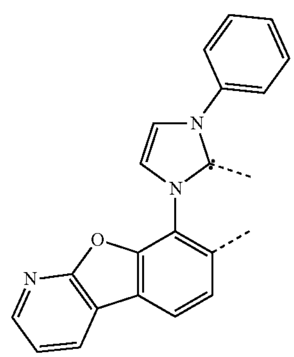
$L_{B51}$
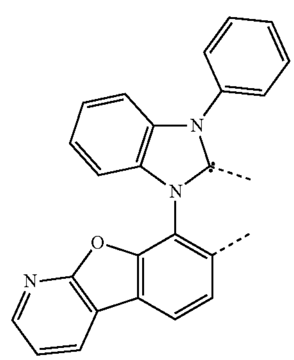
$L_{B52}$ -continued
$L_{B53}$
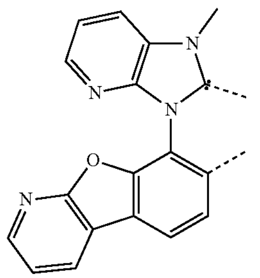
$L_{B54}$
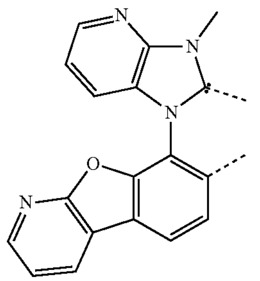
$L_{B55}$
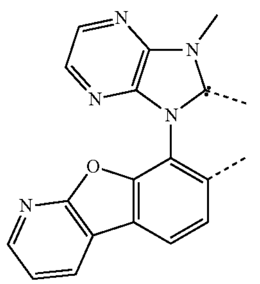
$L_{B56}$
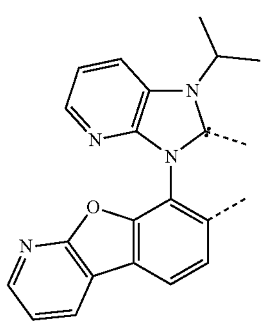
$L_{B57}$
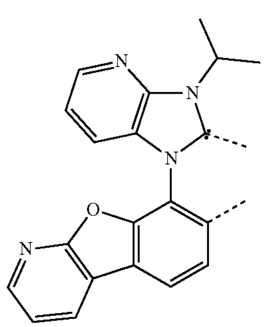
-continued
$L_{B58}$
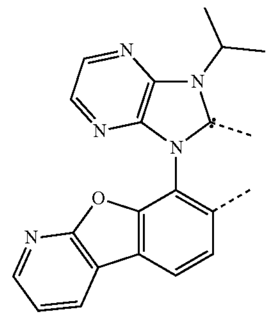
$L_{B59}$
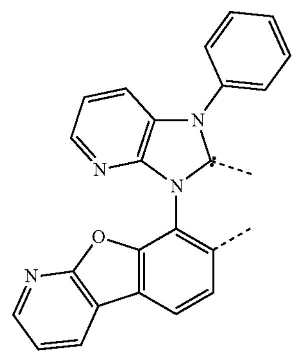
$L_{B60}$
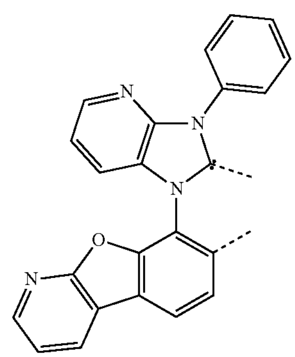
$L_{B61}$
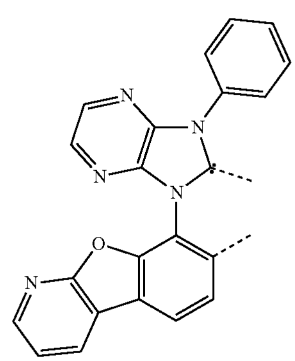

-continued
$L_{B62}$
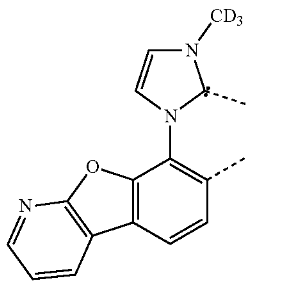
$L_{B63}$
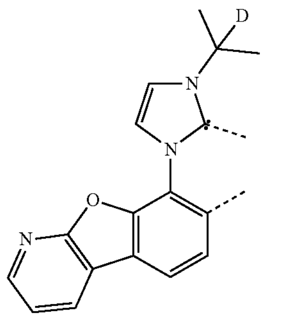
$L_{B64}$
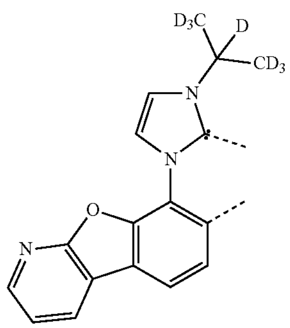
$L_{B65}$
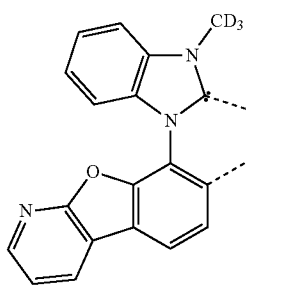
$L_{B66}$
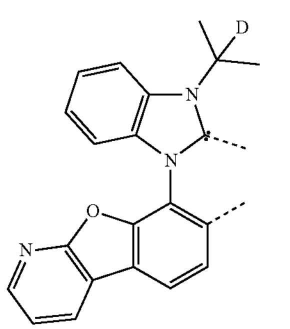
-continued
$L_{B67}$
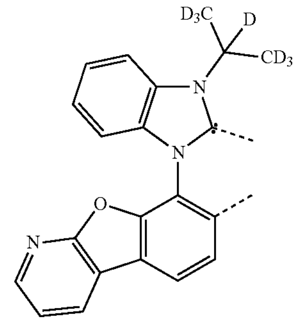
$L_{B68}$
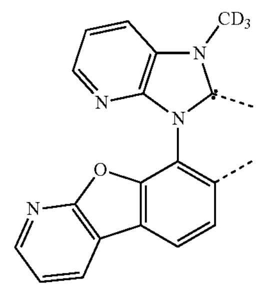
$L_{B69}$
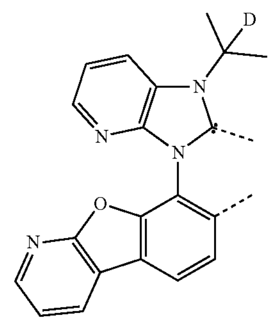
$L_{B70}$
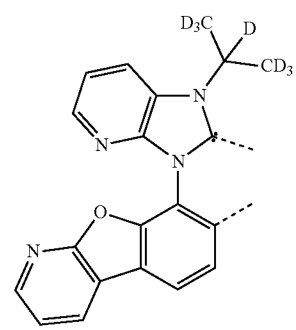
$L_{B71}$
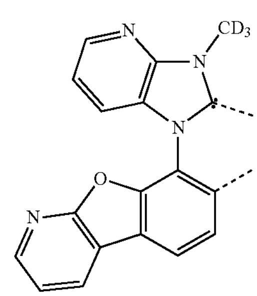

-continued
$L_{B72}$
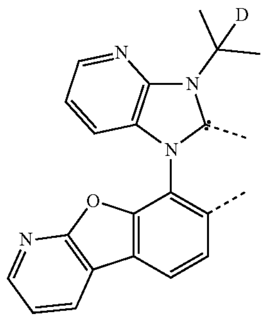
$L_{B73}$
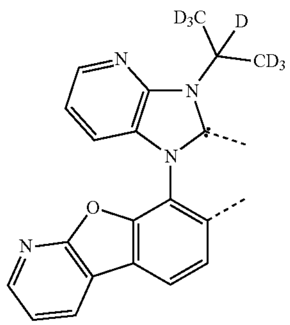
$L_{B74}$
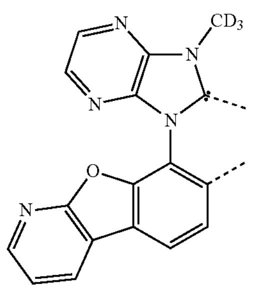
$L_{B75}$
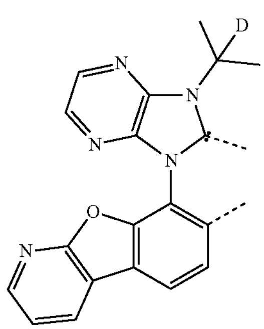
$L_{B76}$
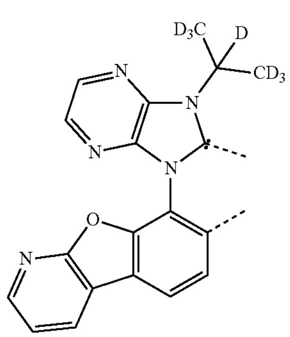
-continued
$L_{B77}$
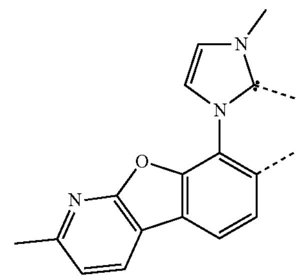
$L_{B78}$
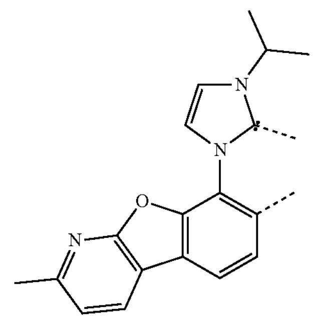
$L_{B79}$
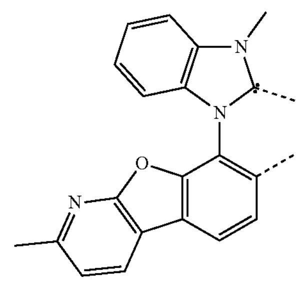
$L_{B80}$
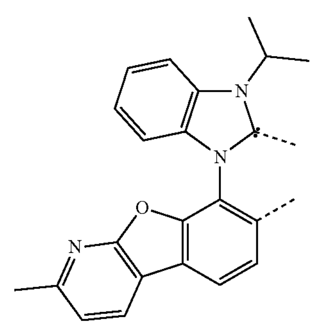
$L_{B81}$
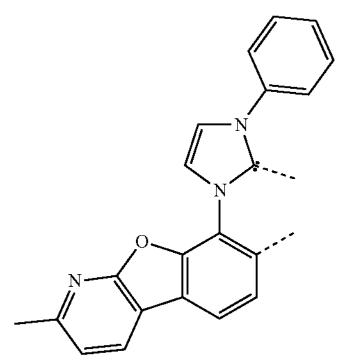

-continued
$L_{B82}$
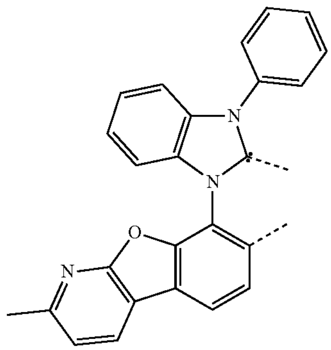
$L_{B83}$
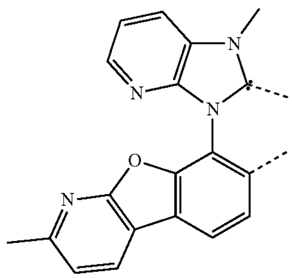
$L_{B84}$
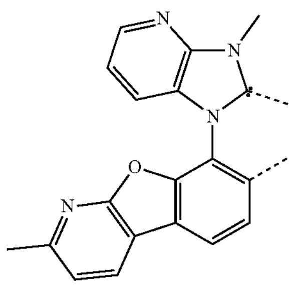
$L_{B85}$
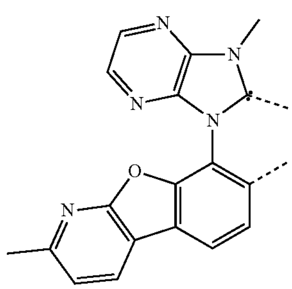
$L_{B86}$
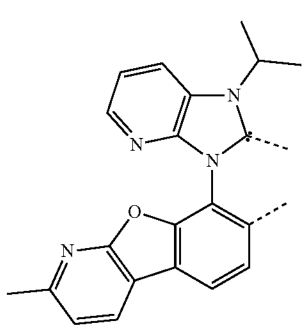
-continued
$L_{B87}$
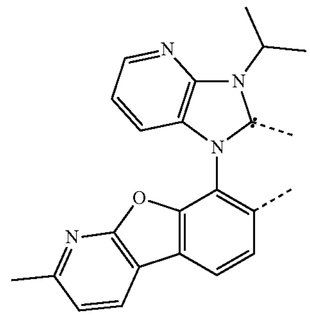
$L_{B88}$
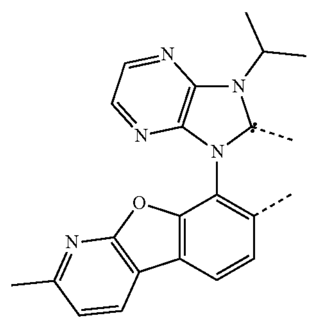
$L_{B89}$
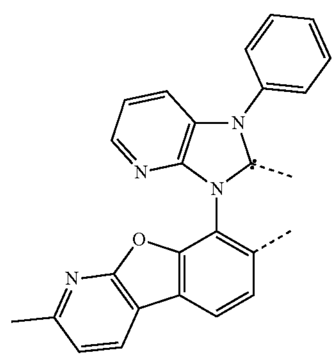
$L_{B90}$
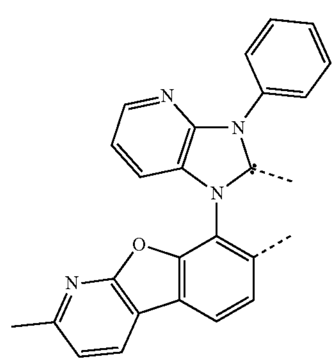

-continued
$L_{B91}$
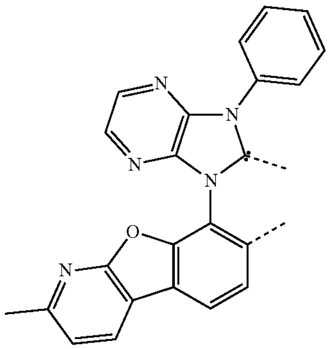
$L_{B92}$
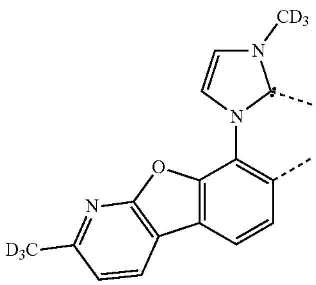
$L_{B93}$
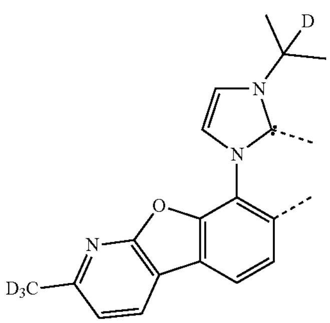
$L_{B94}$
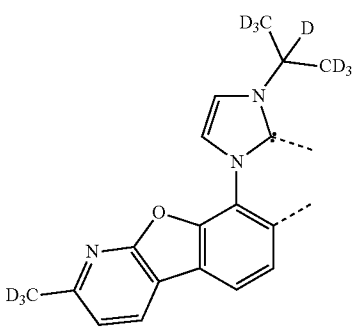
$L_{B95}$
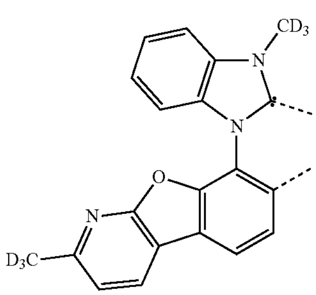
-continued
$L_{B96}$
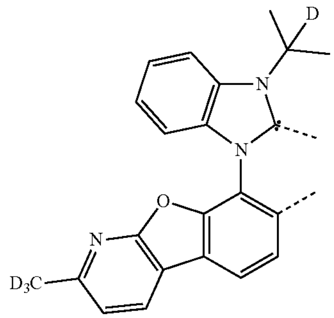
$L_{B97}$
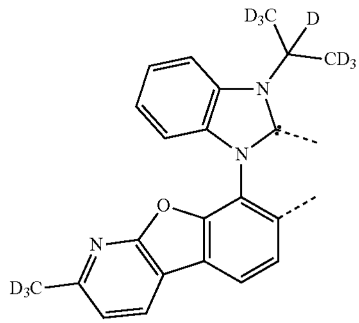
$L_{B98}$
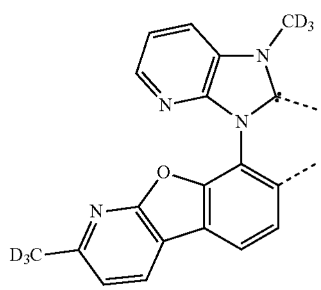
$L_{B99}$
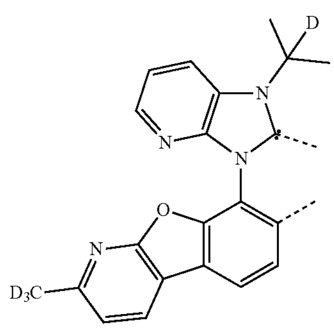
$L_{B100}$
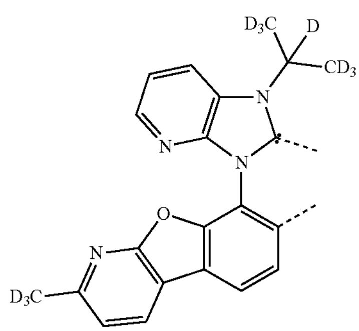

-continued
$L_{B101}$
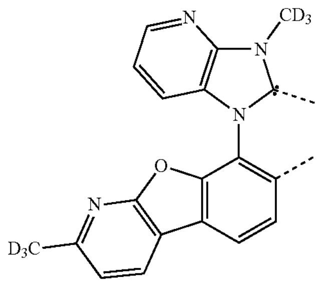
$L_{B102}$
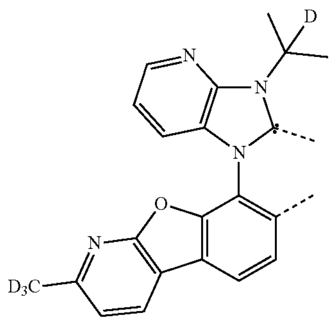
$L_{B103}$
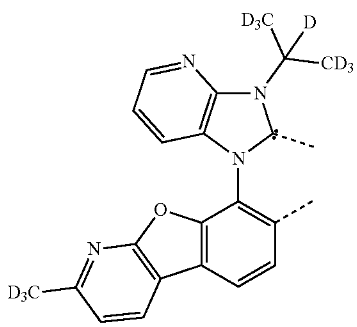
$L_{B104}$
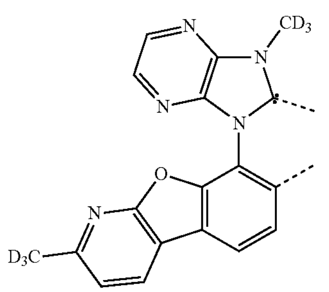
$L_{B105}$
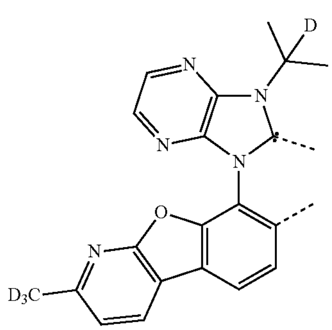
-continued
$L_{B106}$
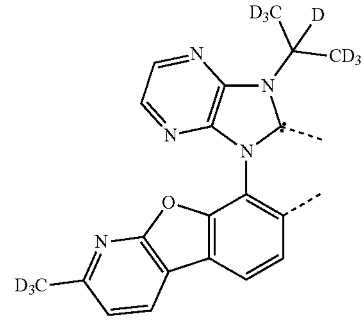
$L_{B107}$
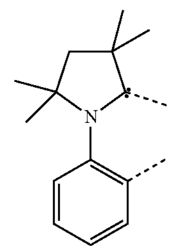
$L_{B108}$
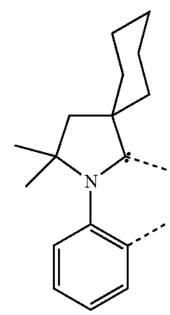
$L_{B109}$
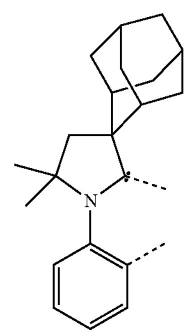
$L_{B110}$
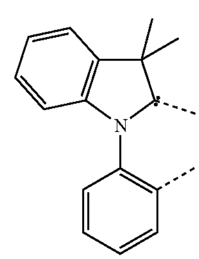

-continued
$L_{B111}$
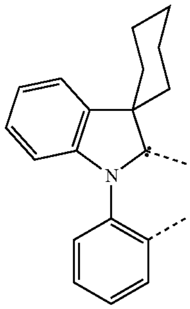
$L_{B112}$
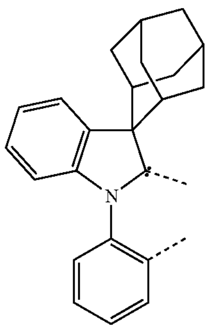
$L_{B113}$
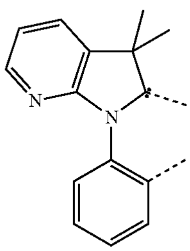
$L_{B114}$
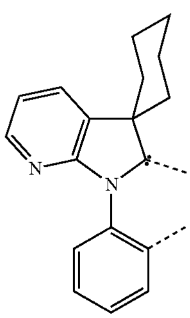
$L_{B115}$
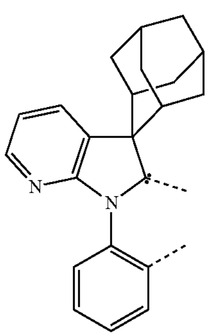
-continued
$L_{B116}$
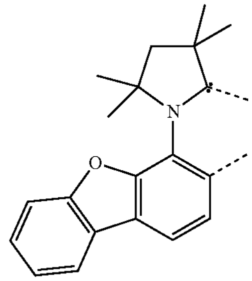
$L_{B117}$
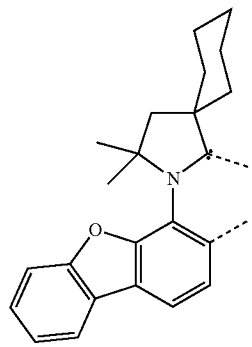
$L_{B118}$
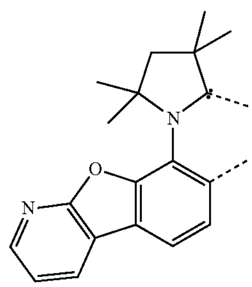
$L_{B119}$
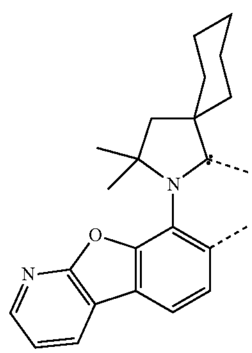
$L_{B120}$
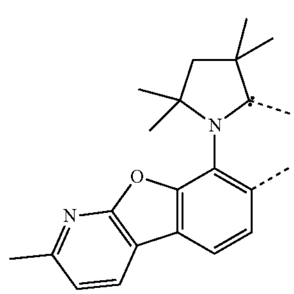

-continued
$L_{B121}$
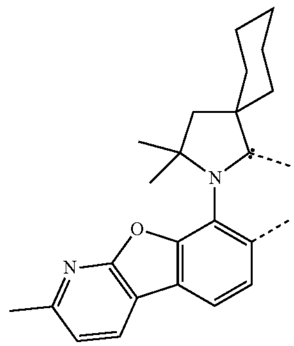
$L_{B122}$
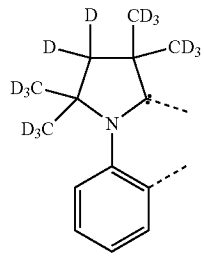
$L_{B123}$
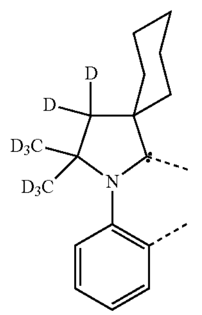
$L_{B124}$
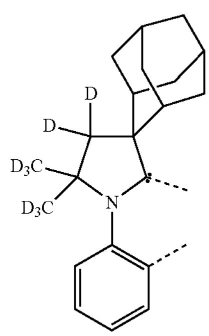
$L_{B125}$
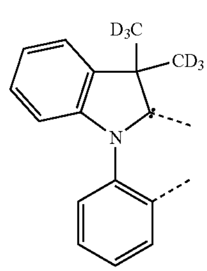
-continued
$L_{B126}$
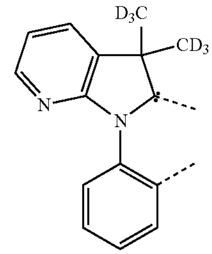
$L_{B127}$
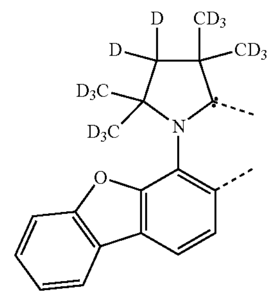
$L_{B128}$
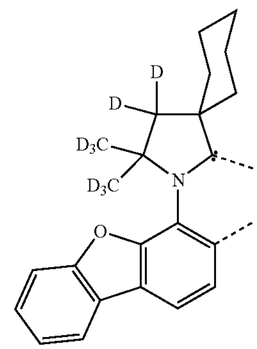
$L_{B129}$
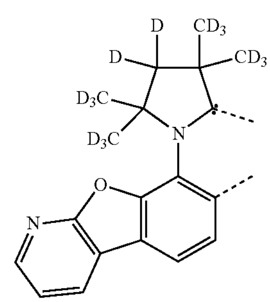
$L_{B130}$
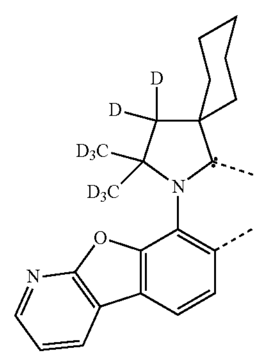

-continued
L$_{B131}$
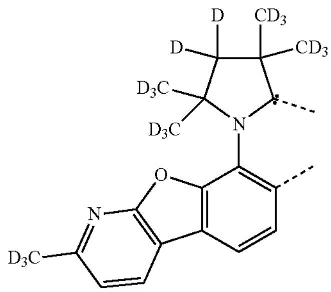
L$_{B132}$
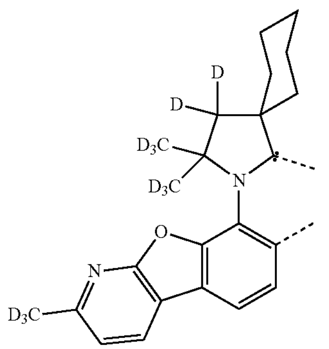
L$_{B133}$
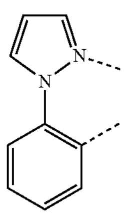
L$_{B134}$
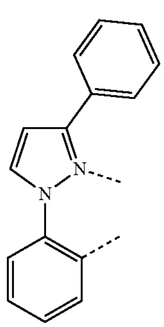
L$_{B135}$
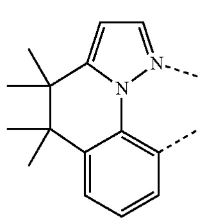
-continued
L$_{B136}$
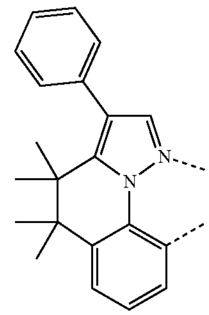
L$_{B137}$
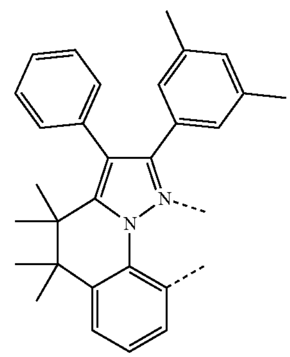
L$_{B138}$
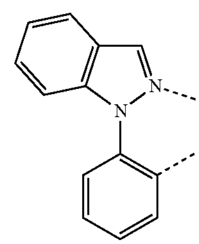
L$_{B139}$
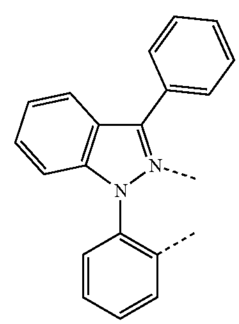
L$_{B140}$
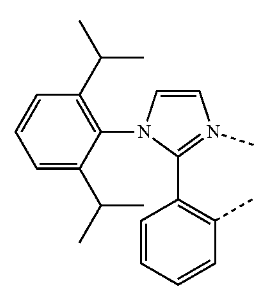

-continued
$L_{B141}$
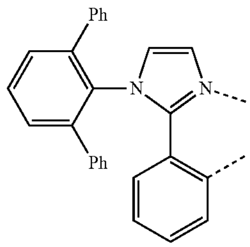
$L_{B142}$
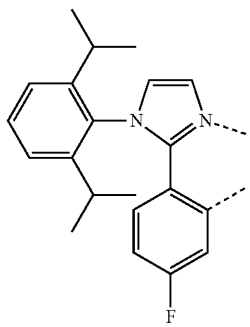
$L_{B143}$
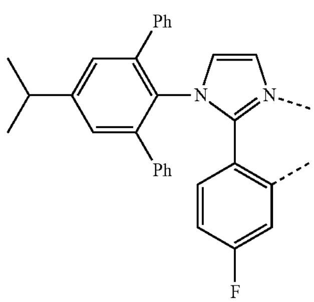
$L_{B144}$
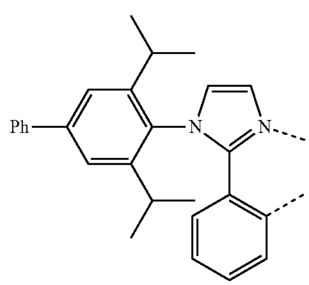
$L_{B145}$
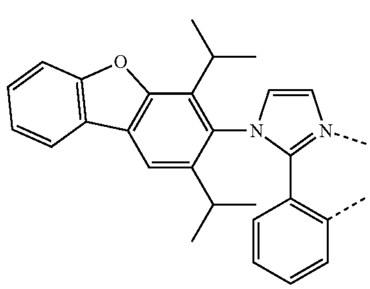
-continued
$L_{B146}$
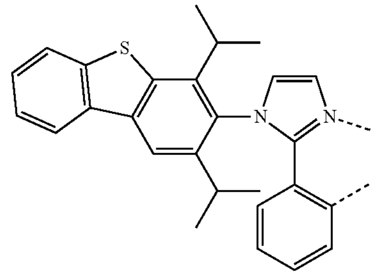
$L_{B147}$
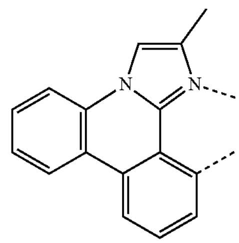
$L_{B148}$
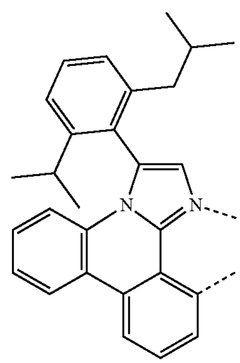
$L_{B149}$
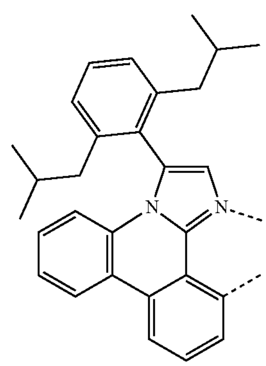
$L_{B150}$
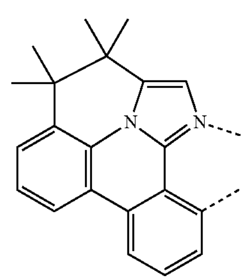

L_{B151}
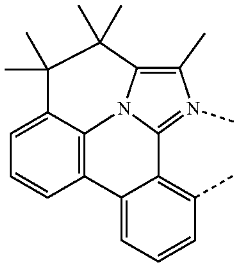
L_{B152}
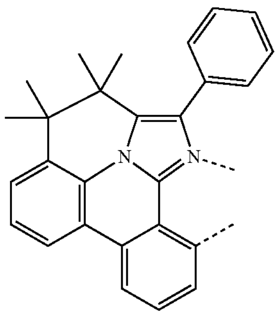
L_{B153}
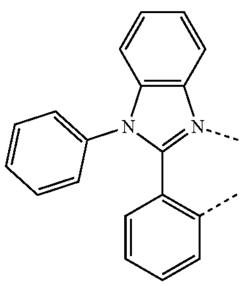
L_{B154}
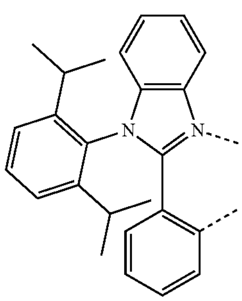
L_{B155}
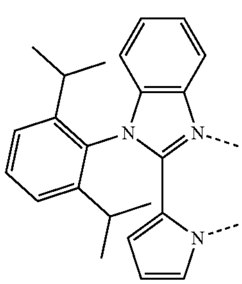
L_{B156}
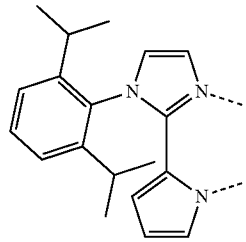
L_{B157}
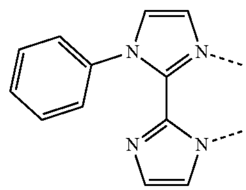
L_{B158}
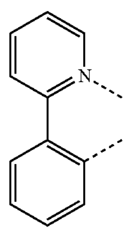
L_{B159}
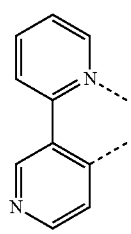
L_{B160}
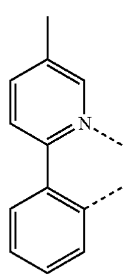
L_{B161}
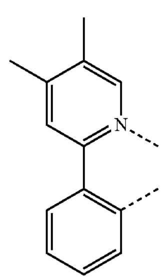

-continued
$L_{B162}$
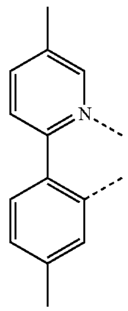
$L_{B163}$
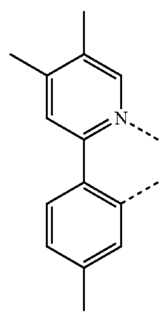
$L_{B164}$
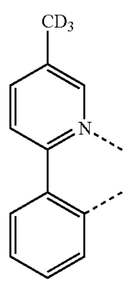
$L_{B165}$
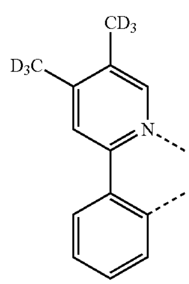
$L_{B166}$
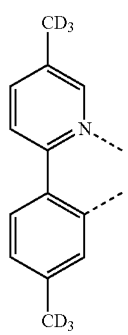
-continued
$L_{B167}$
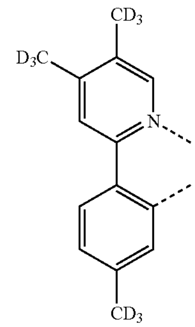
$L_{B168}$
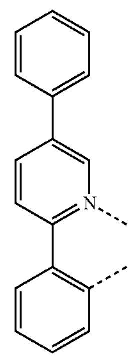
$L_{B169}$
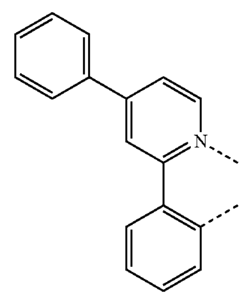
$L_{B170}$
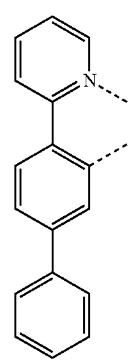
$L_{B171}$
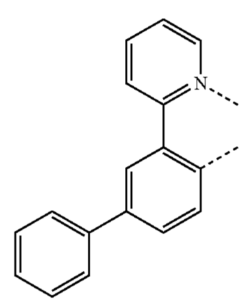

-continued
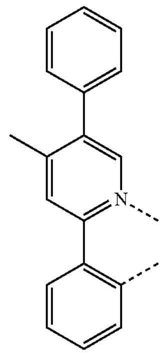
$L_{B172}$
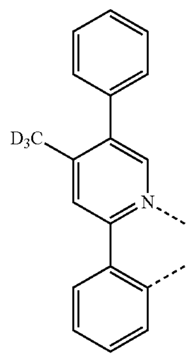
$L_{B173}$
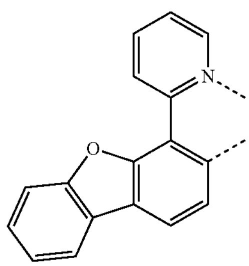
$L_{B174}$
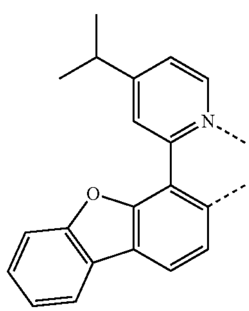
$L_{B175}$
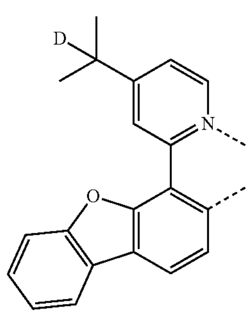
$L_{B176}$
-continued
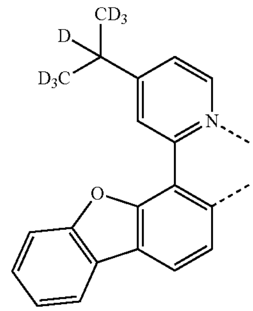
$L_{B177}$
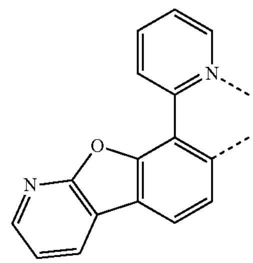
$L_{B178}$
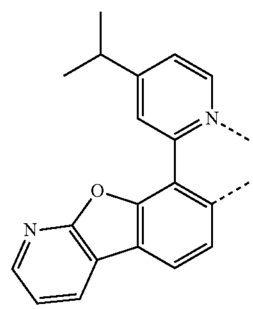
$L_{B179}$
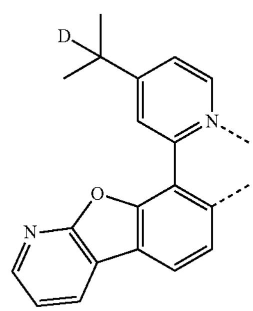
$L_{B180}$
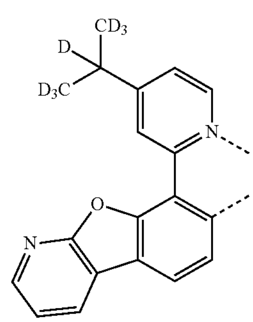
$L_{B181}$ -continued
L$_{B182}$
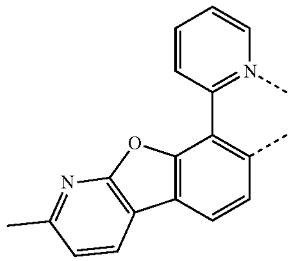
L$_{B183}$
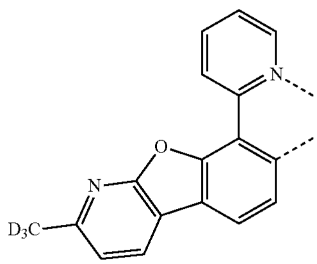
L$_{B184}$
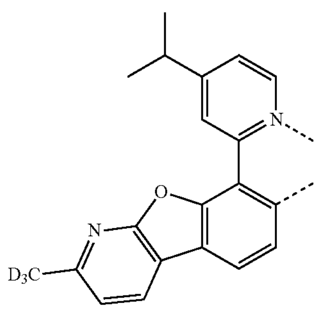
L$_{B185}$
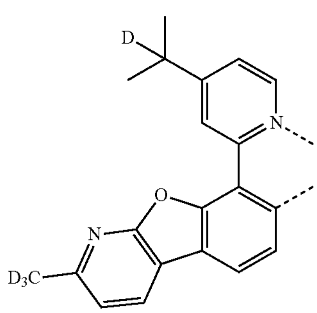
L$_{B186}$
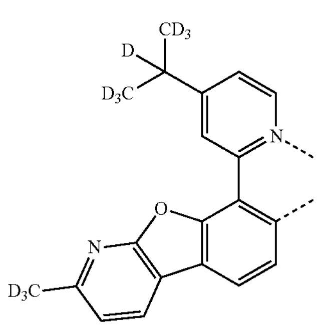
-continued
L$_{B187}$
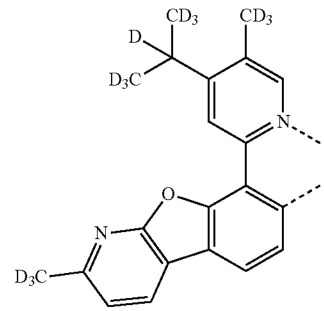
L$_{B188}$
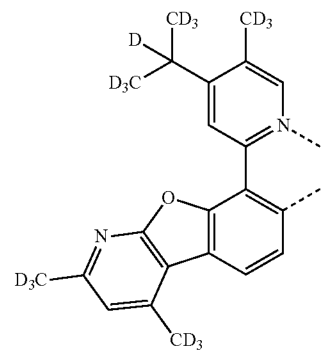
L$_{B189}$
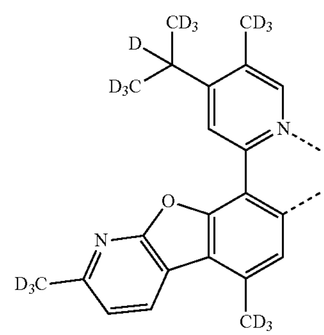
L$_{B190}$
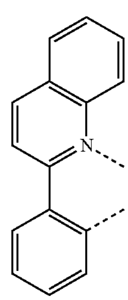
L$_{B191}$
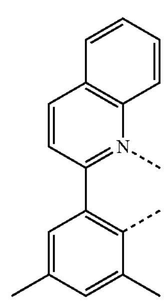

-continued
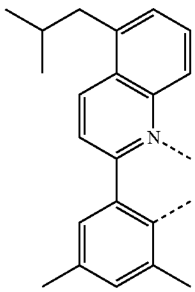
$L_{B192}$
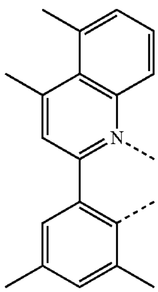
$L_{B193}$
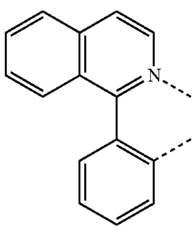
$L_{B194}$
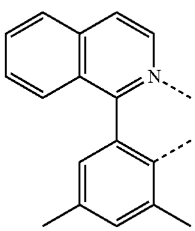
$L_{B195}$
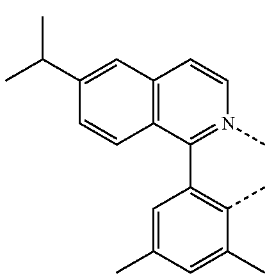
$L_{B196}$
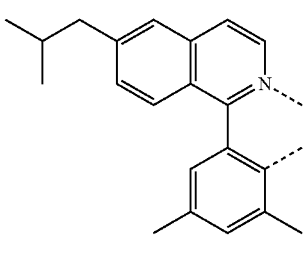
$L_{B197}$
-continued
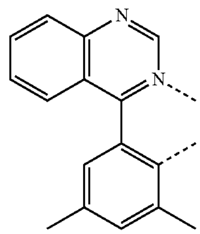
$L_{B198}$
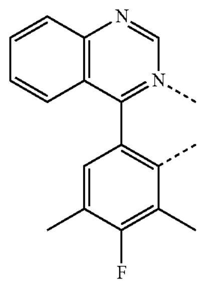
$L_{B199}$
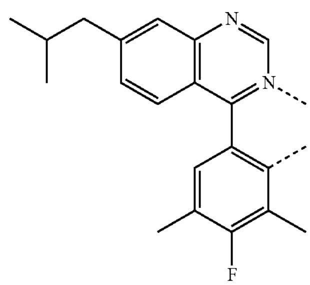
$L_{B200}$
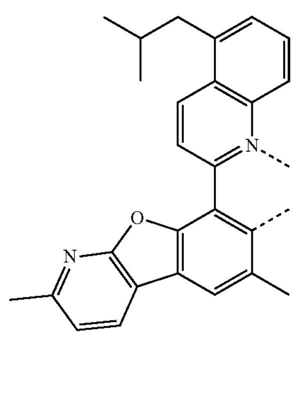
$L_{B201}$
An organic light emitting device (OLED) is also disclosed. The OLED comprises: an anode; a cathode; and an organic layer, disposed between the anode and the cathode, comprising a compound having a structure selected from the group consisting of:

Formula I

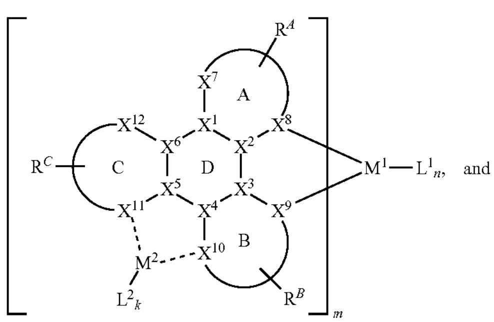

Formula II

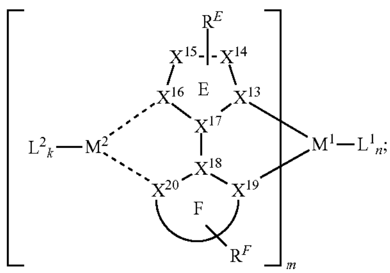

where $X^1$ to $X^{20}$ are each independently selected from the group consisting of carbon and nitrogen; where in Formula I, the rings A, B, and C are each independently a 5- or 6-membered aromatic ring, and all are fused to ring D and form a first ligand having an 18-π electronic system; where in Formula II, ring E is a 5-membered aromatic ring, ring F is a 5- or 6-membered aromatic ring, the structure formed by ring E and ring F connected together forms a first ligand in Formula II; where $R^A$, $R^B$, $R^C$, $R^E$, and $R^F$ each independently represents none to a maximum possible number of substitutions; where $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any substitutions in $R^A$, $R^B$, $R^C$, $R^E$, and $R^F$ are optionally joined or fused into a ring; where $M^1$ is a metal having atomic weight greater than 40; where $M^2$ is selected from the group consisting of B, Al, Ga, Si, Ge, Sn, Zn, Cd, Pd, Pt, Co, Rh, Ir, Re, Ru, Os, Cu, Ag, and Au; where in Formula I, $M^2$ coordinates to at least one of $X^{10}$ and $X^{11}$, and in Formula II, $M^2$ coordinates to at least one of $X^{16}$ and $X^{20}$; where m has a value of at least 1 and m+n is the maximum number of ligands that are attached to $M^1$; where k has a value of at least 1; where each $L^1$ can be a monodentate or multidentate ligand; and where the first ligand is optionally linked with $L^1$ to comprise a multidentate ligand.

In some embodiments of the OLED, the organic layer further comprises a host, wherein the host comprises a metal complex.

A consumer product comprising an OLED is also disclosed where the OLED comprises: an anode; a cathode; and an organic layer, disposed between the anode and the cathode, comprising a compound having a structure selected from the group consisting of:

Formula I

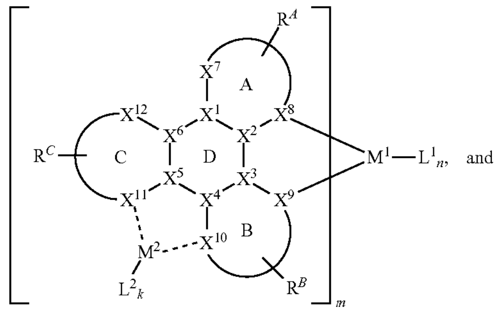

Formula II

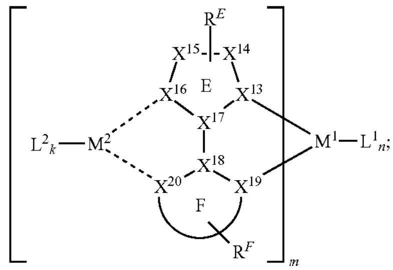

where $X^1$ to $X^{20}$ are each independently selected from the group consisting of carbon and nitrogen; where in Formula I, rings A, B, and C are each independently a 5- or 6-membered aromatic ring, and all are fused to ring D and form a first ligand having an 18-π electronic system; where in Formula II, ring E is a 5-membered aromatic ring, ring F is a 5- or 6-membered aromatic ring, the structure formed by ring E and ring F connected together forms a first ligand in Formula II; where $R^A$, $R^B$, $R^C$, $R^E$, and $R^F$ each independently represents none to a maximum possible number of substitutions; where $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any substitutions in $R^A$, $R^B$, $R^C$, $R^E$, and $R^F$ are optionally joined or fused into a ring; where is a metal having atomic weight greater than 40; where $M^2$ is selected from the group consisting of B, Al, Ga, Si, Ge, Sn, Zn, Cd, Pd, Pt, Co, Rh, Ir, Re, Ru, Os, Cu, Ag, and Au; where in Formula I, $M^2$ coordinates to at least one of $X^{10}$ and $X^{11}$, and in Formula II, $M^2$ coordinates to at least one of $X^{16}$ and $X^{20}$; where m has a value of at least 1 and m+n is the maximum number of ligands that are attached to $M^1$; where k has a value of at least 1; where each $L^1$ can be a monodentate or multidentate ligand; and where the first ligand is optionally linked with $L^1$ to comprise a multidentate ligand.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises a compound having a structure selected from the group consisting of:

Formula I

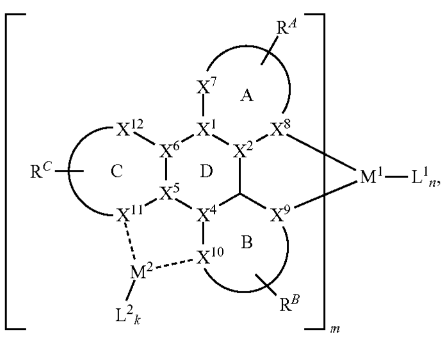

Formula II

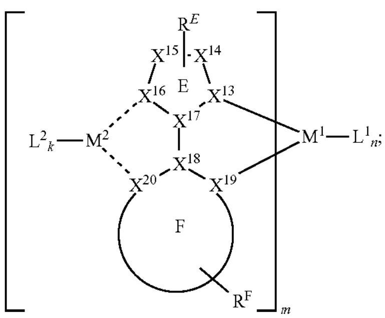

where $X^1$ to $X^{20}$ are each independently selected from the group consisting of carbon and nitrogen; where in Formula I, the rings A, B, and C are each independently a 5- or 6-membered aromatic ring, and all are fused to ring D and form a first ligand having an 18-π electronic system; where in Formula II, ring E is a 5-membered aromatic ring, ring F is a 5- or 6-membered aromatic ring, the structure formed by ring E and ring F connected together forms a first ligand in Formula II; where $R^A$, $R^B$, $R^C$, $R^E$, and $R^F$ each independently represents none to a maximum possible number of substitutions; where $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any substitutions in $R^A$, $R^B$, $R^C$, $R^E$, and $R^F$ are optionally joined or fused into a ring; where $M^1$ is a metal having atomic weight greater than 40; where $M^2$ is selected from the group consisting of B, Al, Ga, Si, Ge, Sn, Zn, Cd, Pd, Pt, Co, Rh, Ir, Re, Ru, Os, Cu, Ag, and Au; where in Formula I, $M^2$ coordinates to at least one of $X^{10}$ and $X^{11}$, and in Formula II, $M^2$ coordinates to at least one of $X^{16}$ and $X^{20}$; where m has a value of at least 1 and m+n is the maximum number of ligands that are attached to $M^1$; where k has a value of at least 1; where each $L^1$ can be a monodentate or multidentate ligand; and where the first ligand is optionally linked with $L^1$ to comprise a multidentate ligand.

In some embodiments of the emissive region, the compound is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments of the emissive region, the emissive region further comprises a host, wherein the host is selected from the group consisting of:

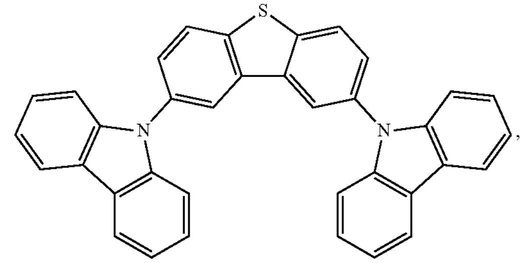

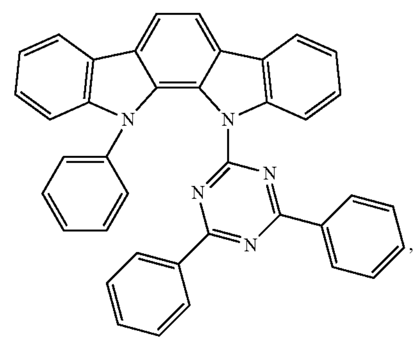

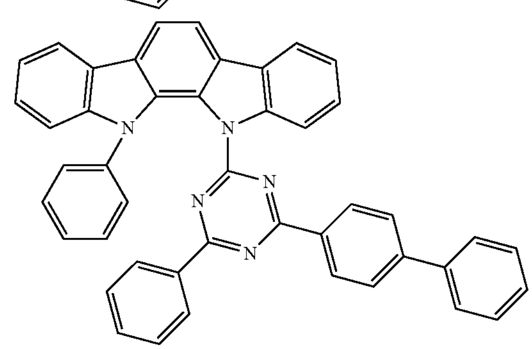

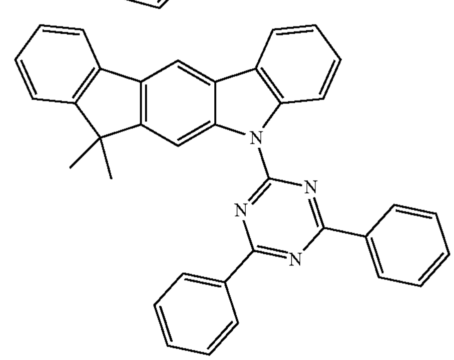

-continued
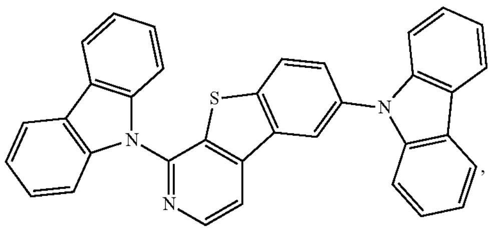
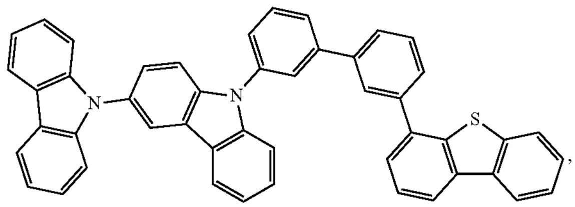
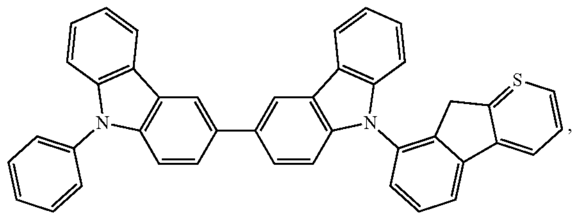
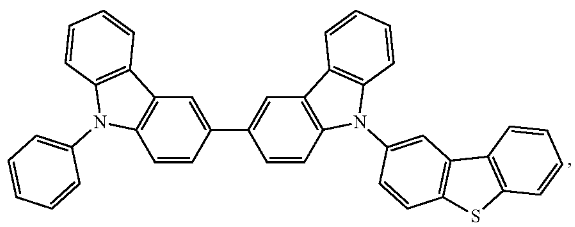
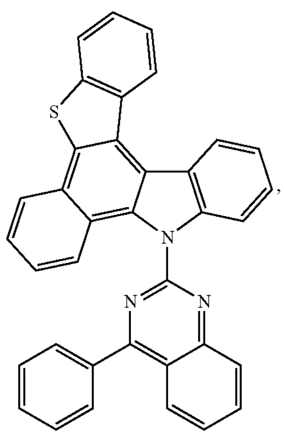
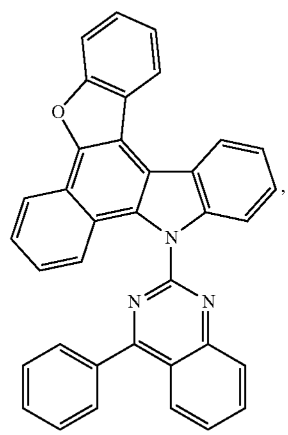
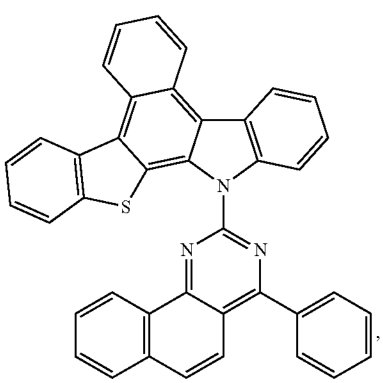
-continued
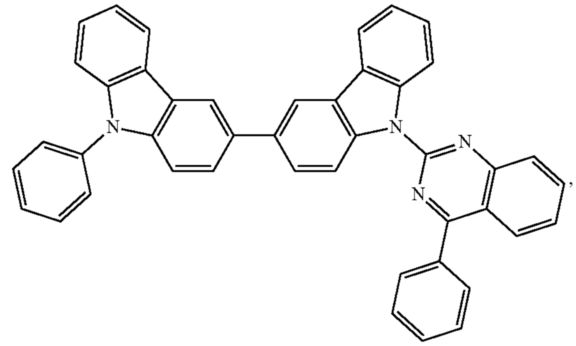
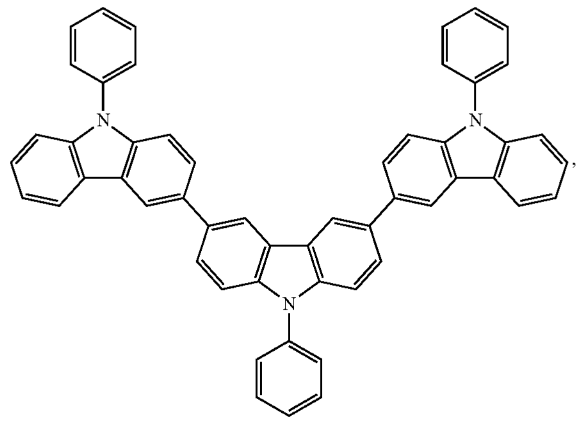
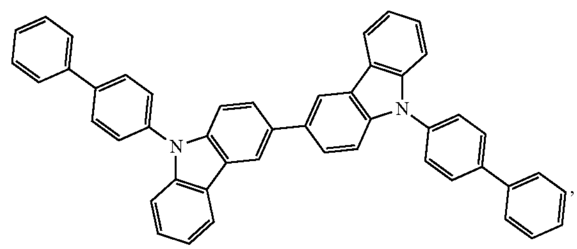
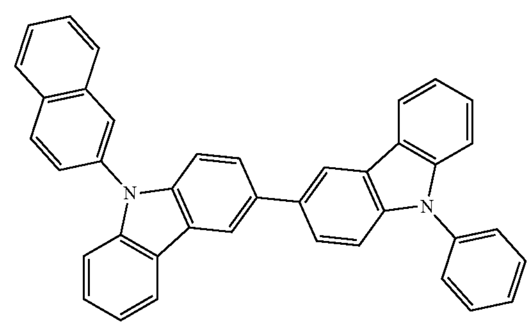
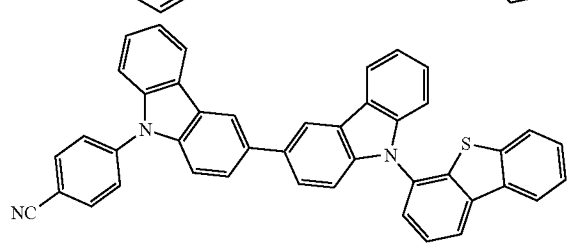

-continued

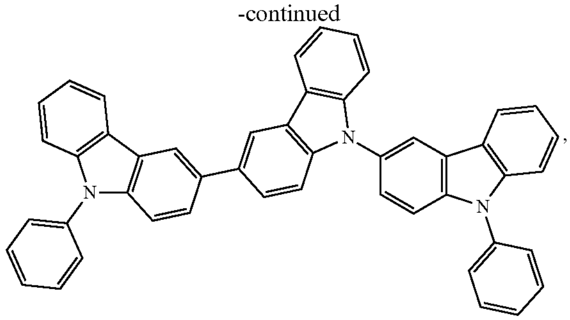

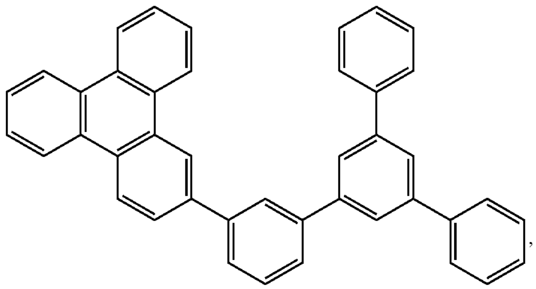

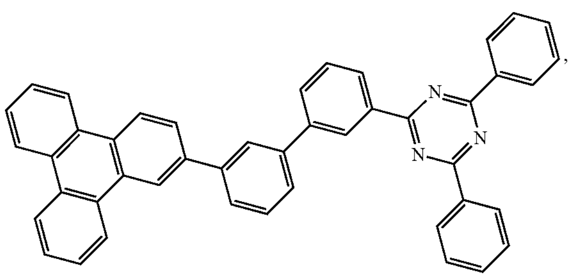

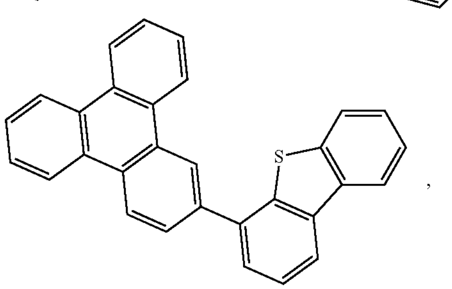

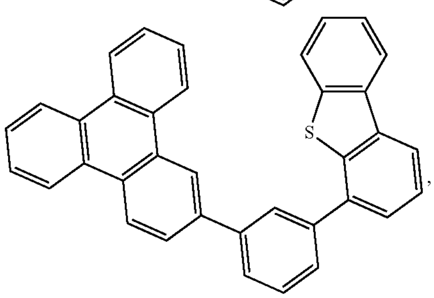

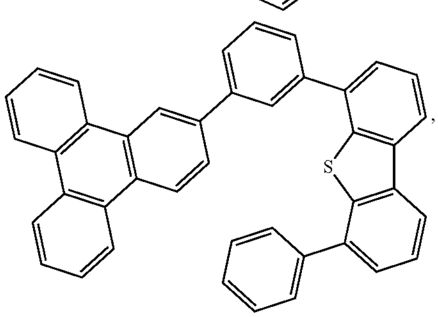

-continued

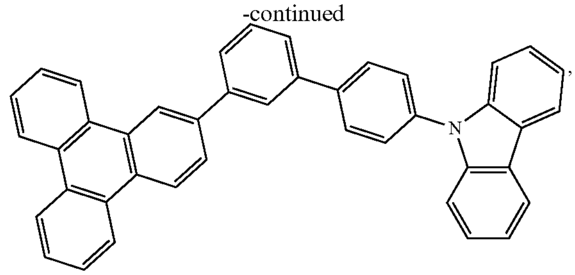

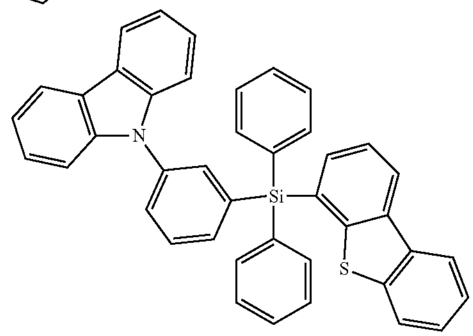

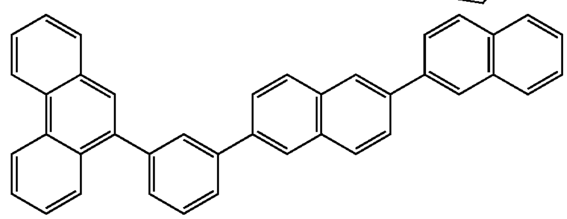

and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

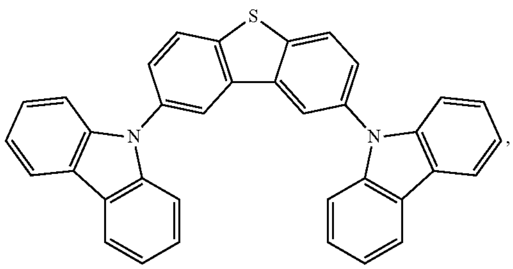

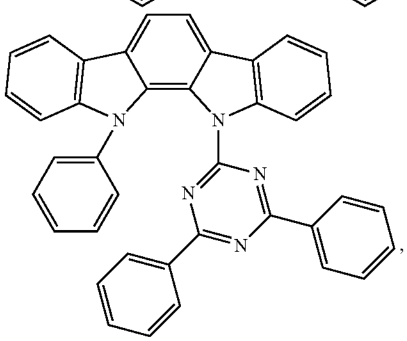

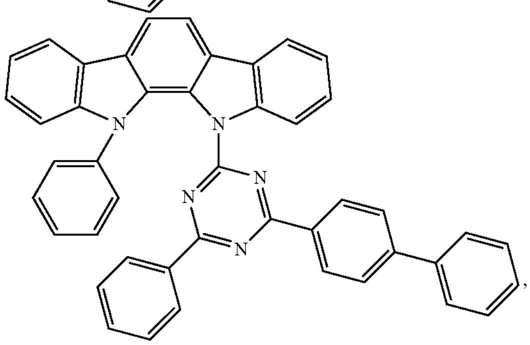

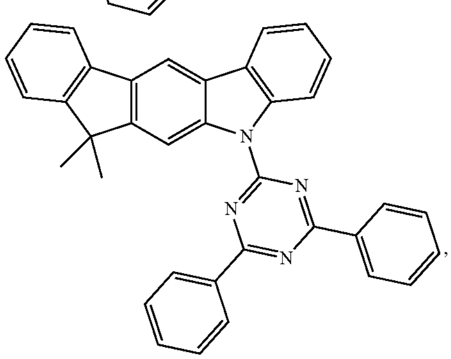

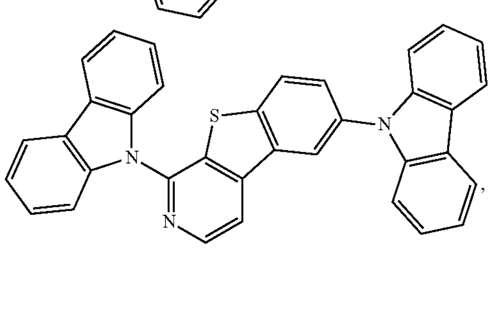

-continued

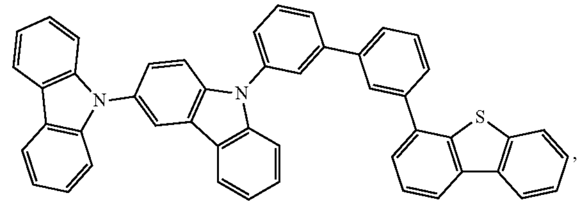

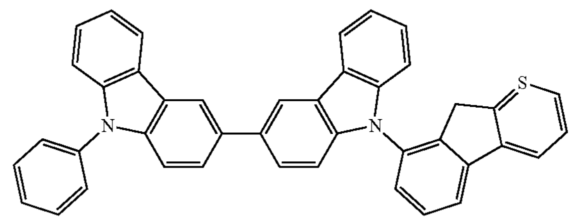

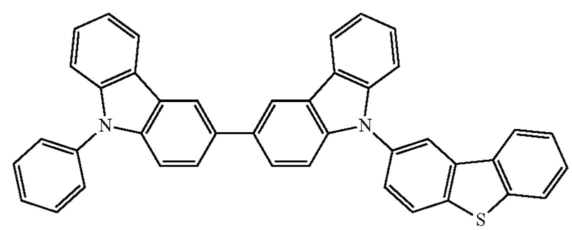

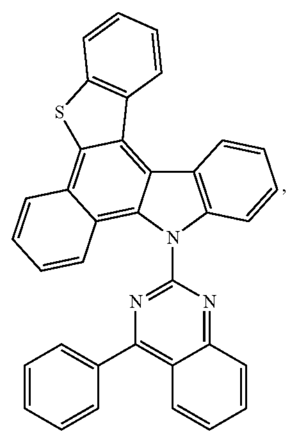

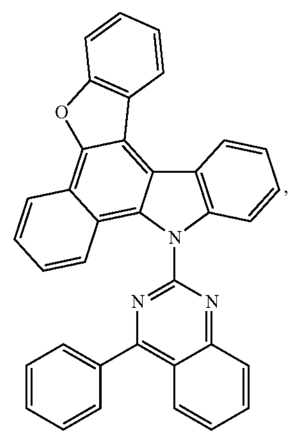

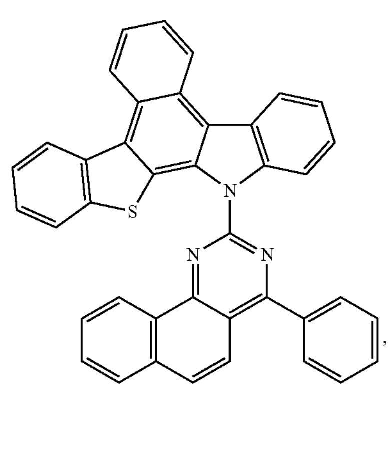

-continued
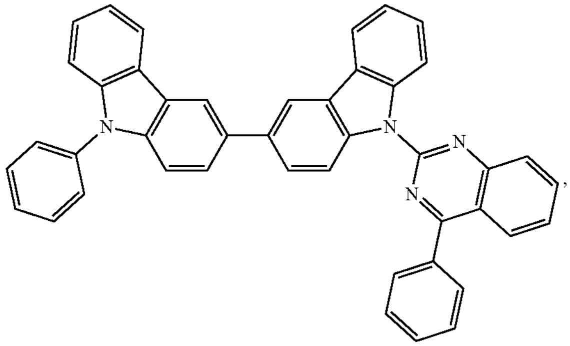
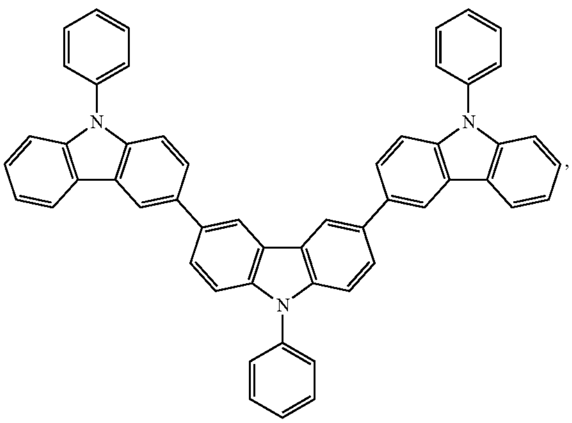
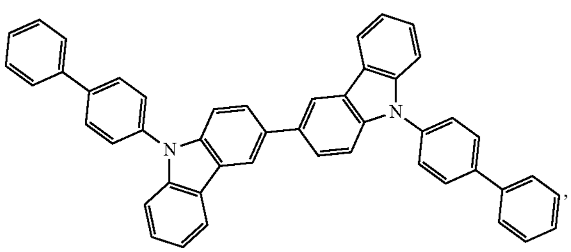
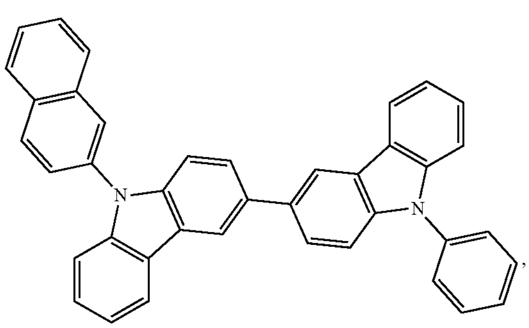
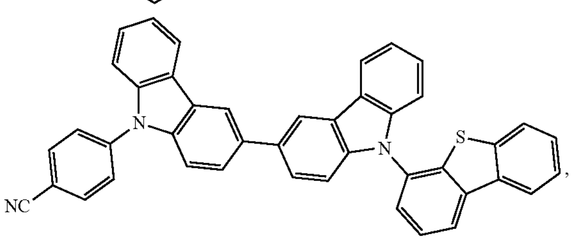
-continued
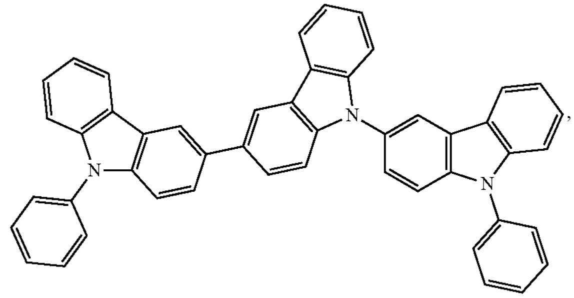
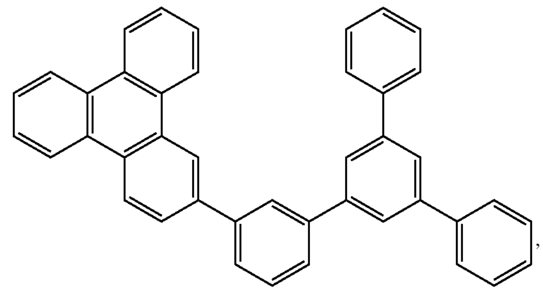
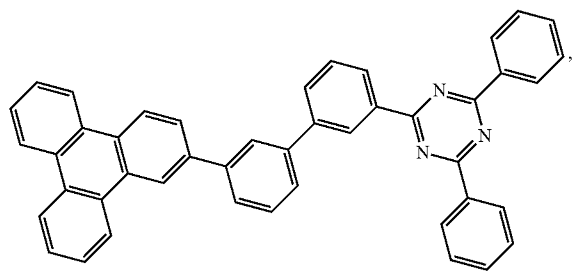
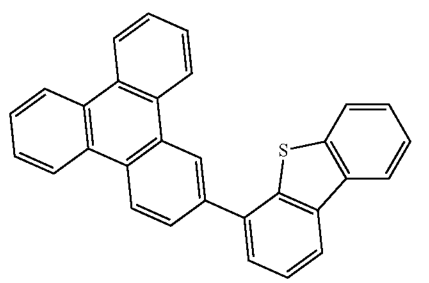
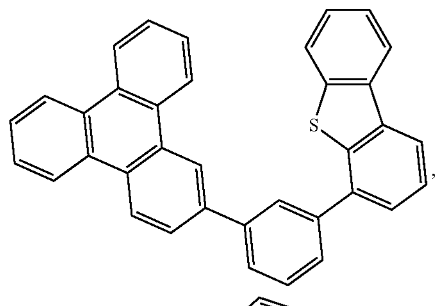
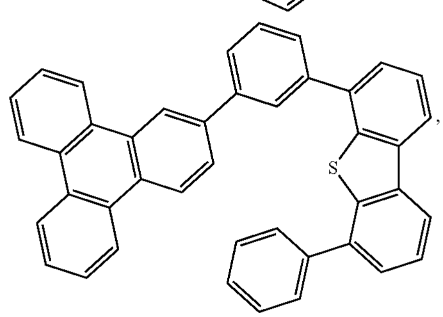

-continued

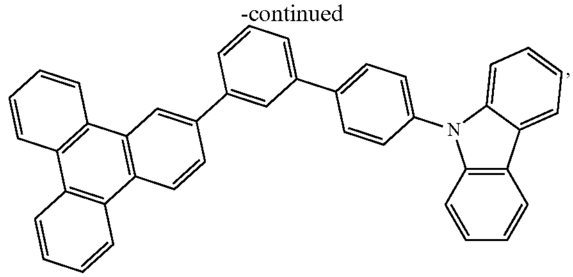

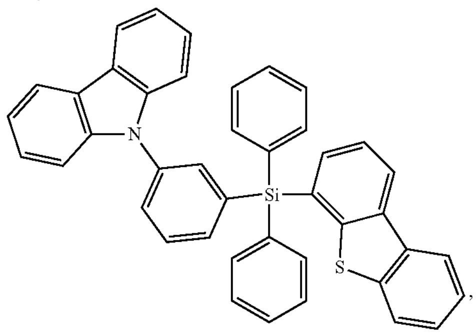

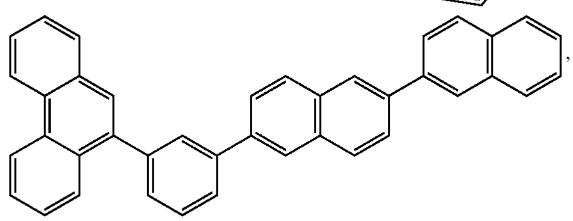

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

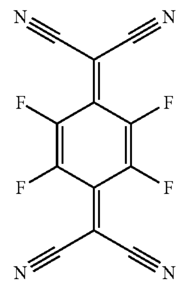

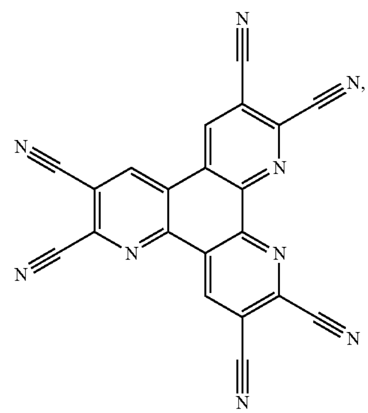

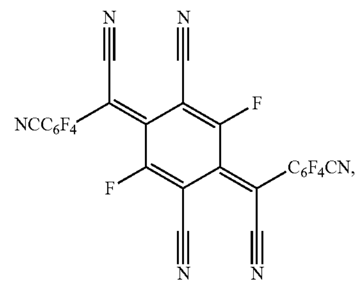

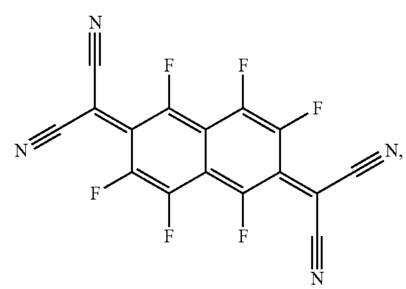

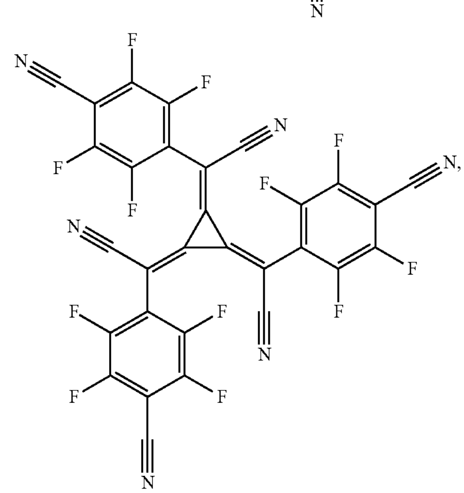

-continued

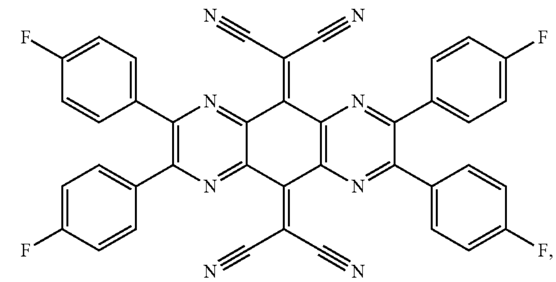

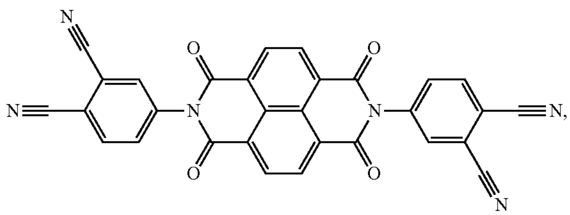

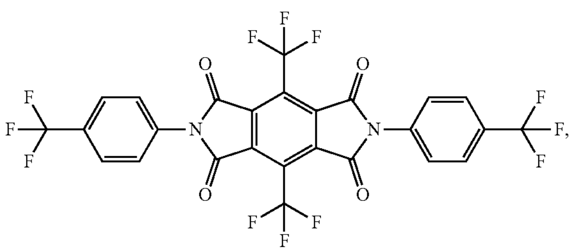

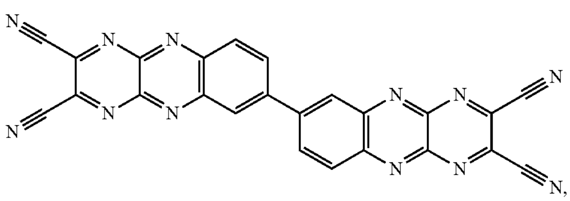

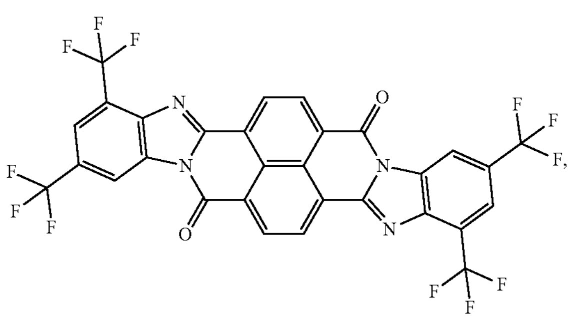

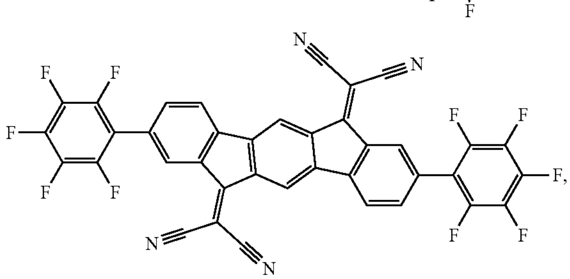

-continued

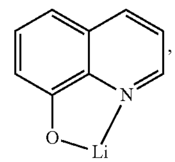

and

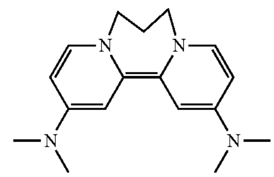

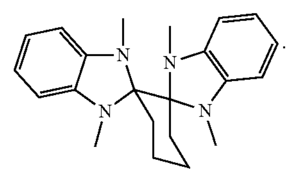

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

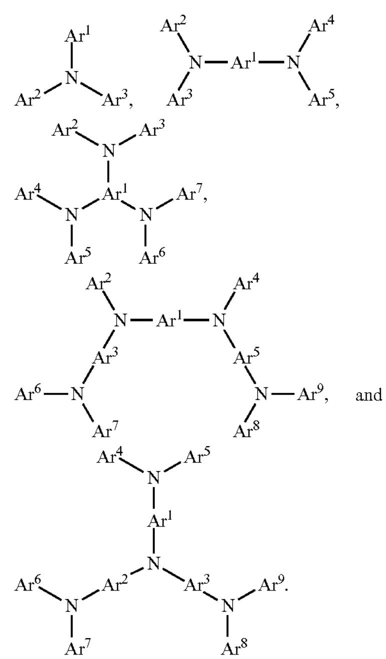

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimi Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

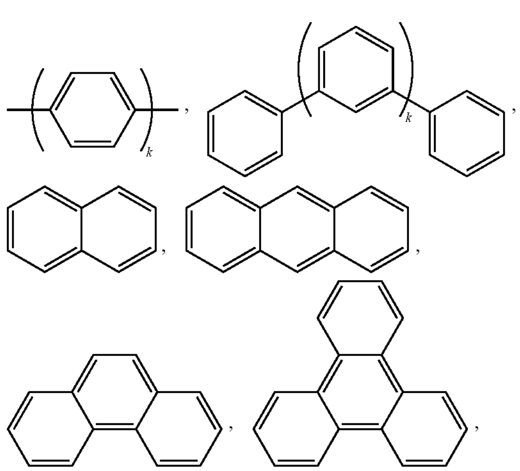

-continued

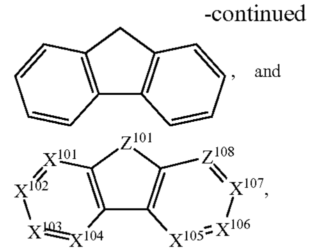

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

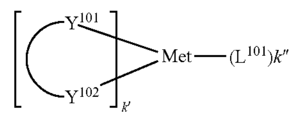

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

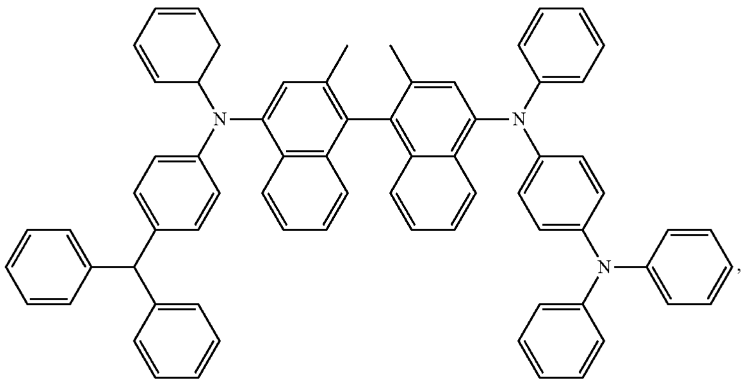
,
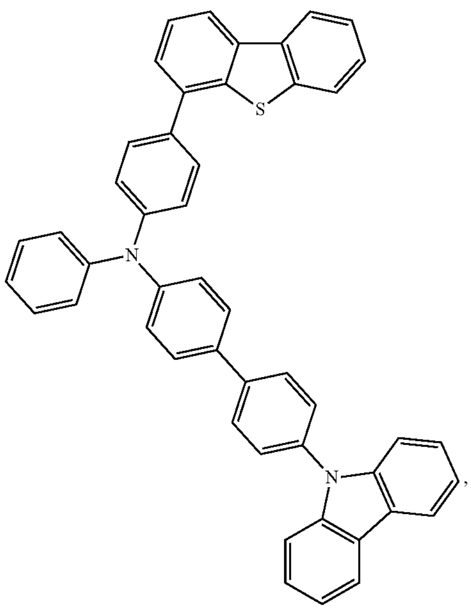
,
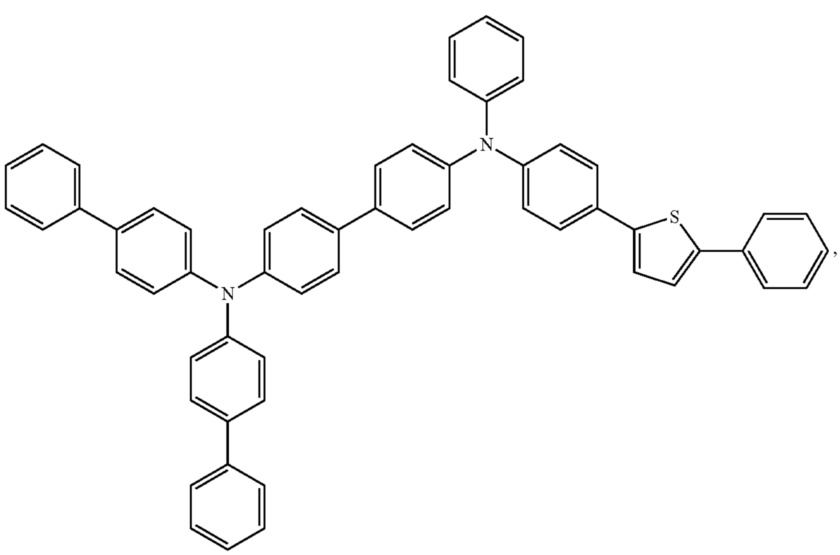
,

-continued
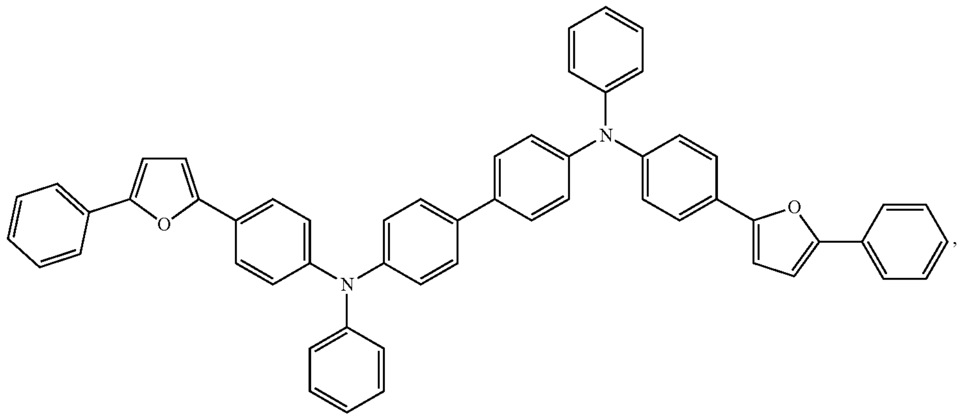
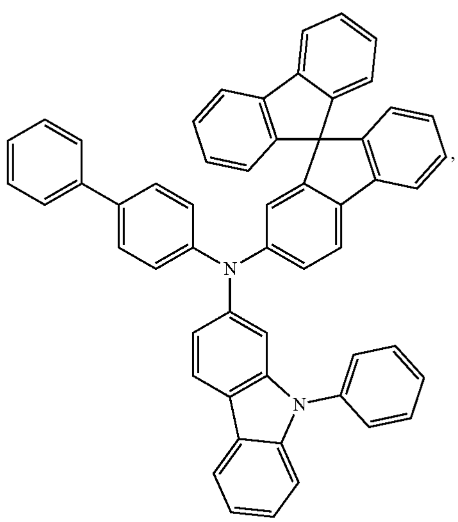
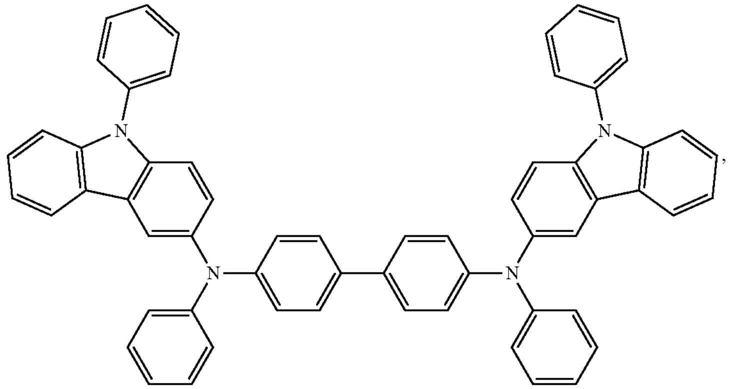

-continued
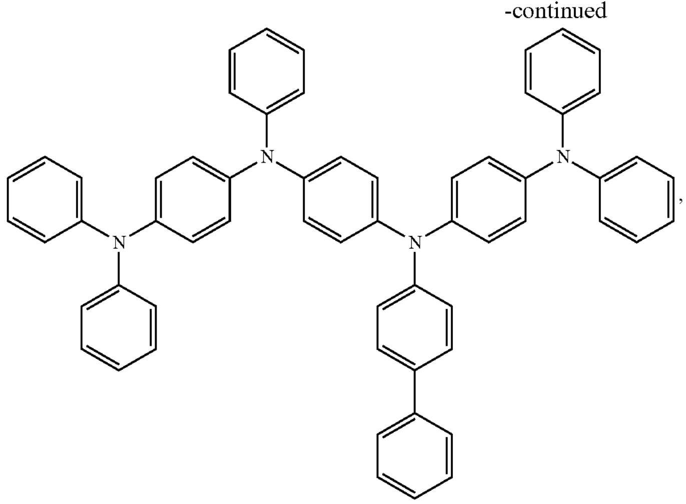
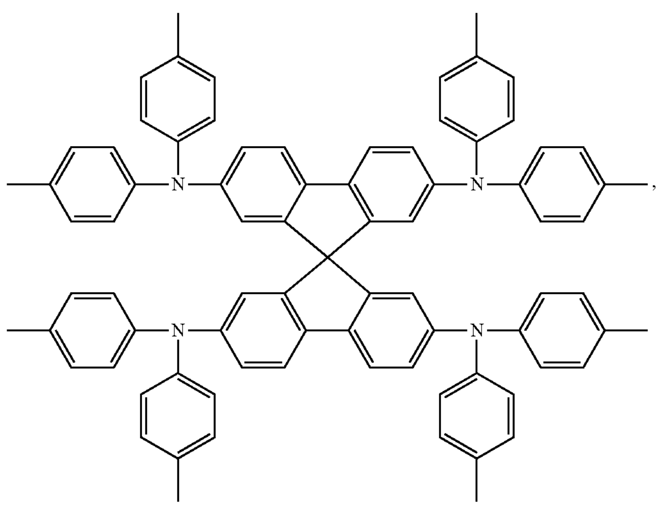
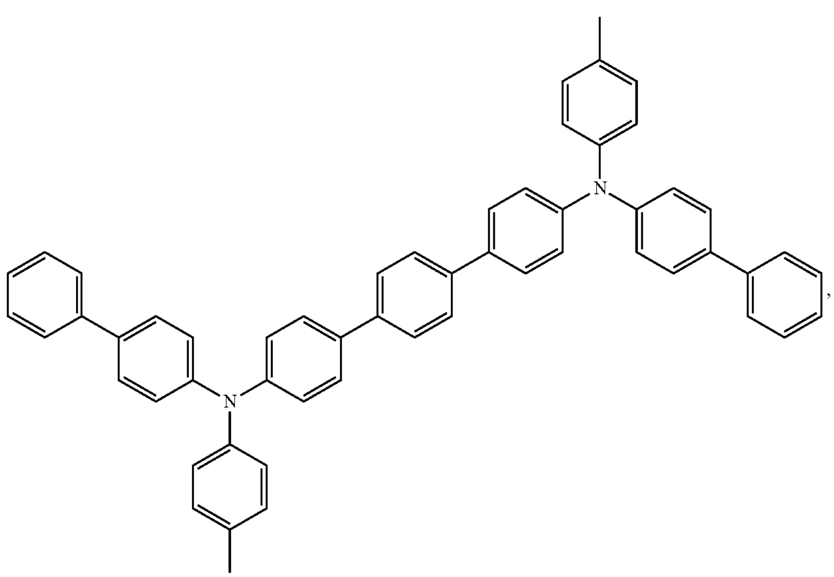

-continued
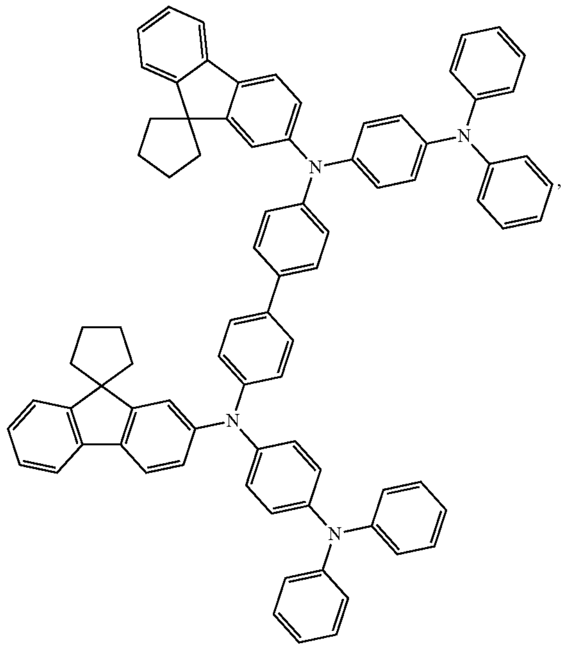
,
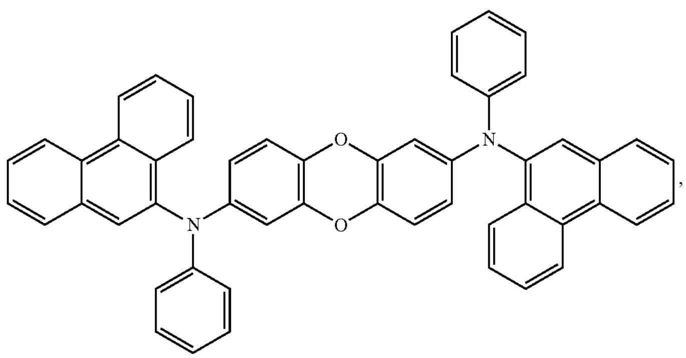
,
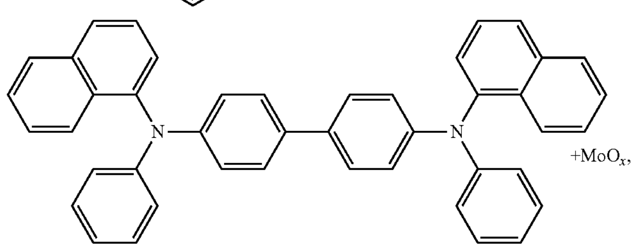
$+MoO_x$,
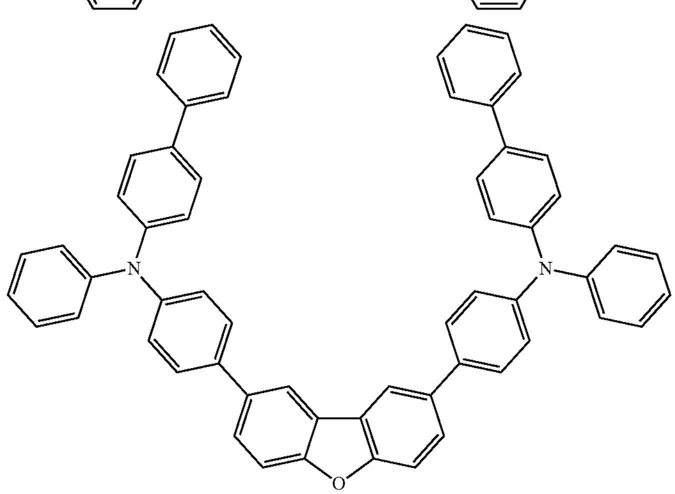
,
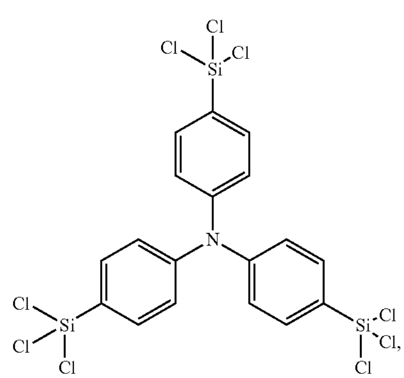

-continued
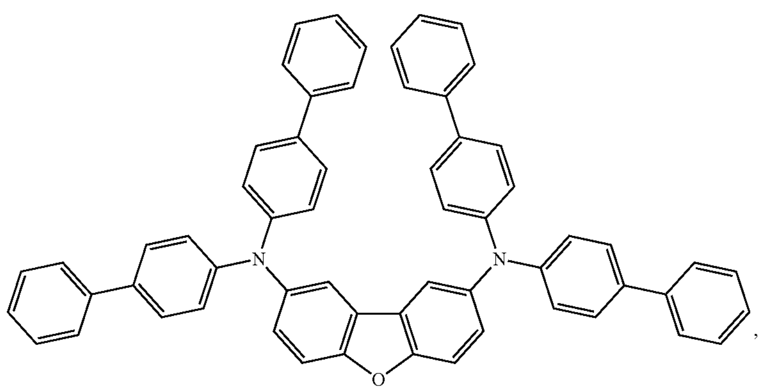
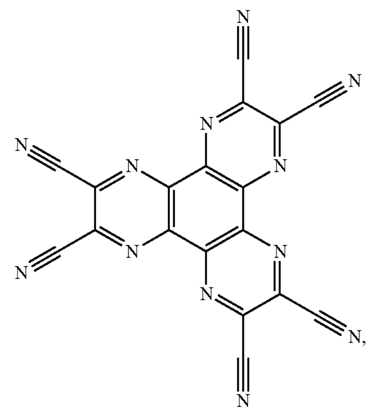
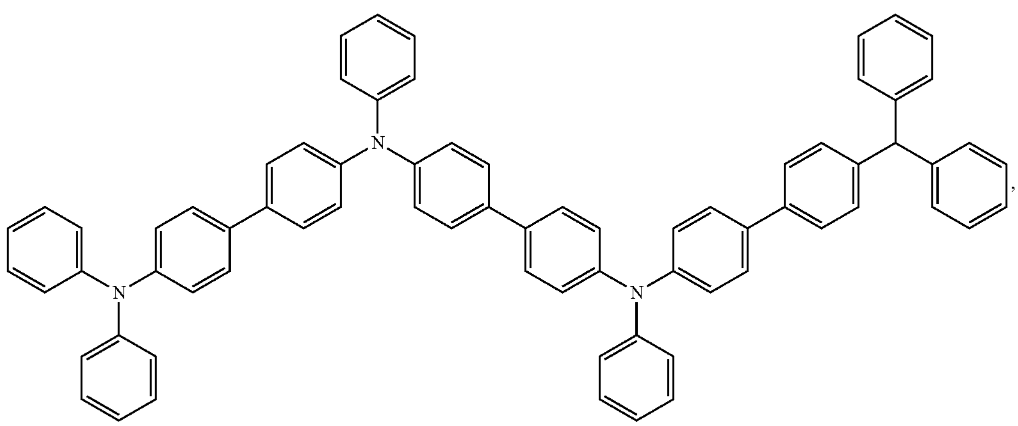
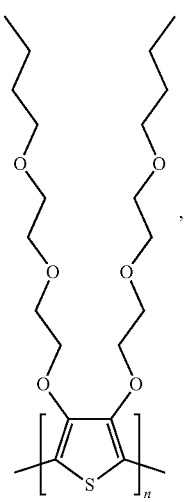
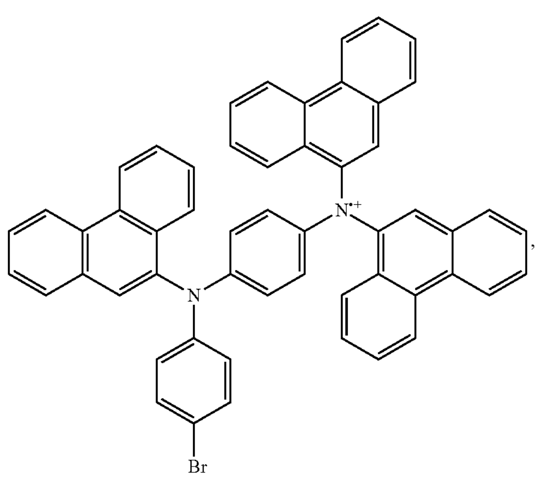

-continued
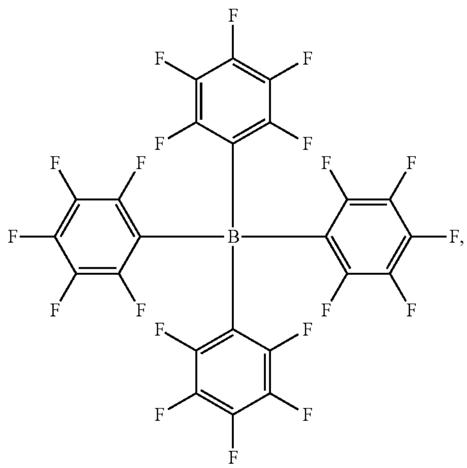
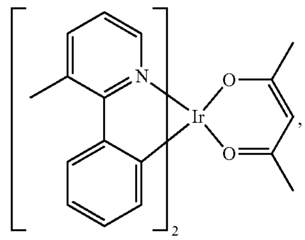
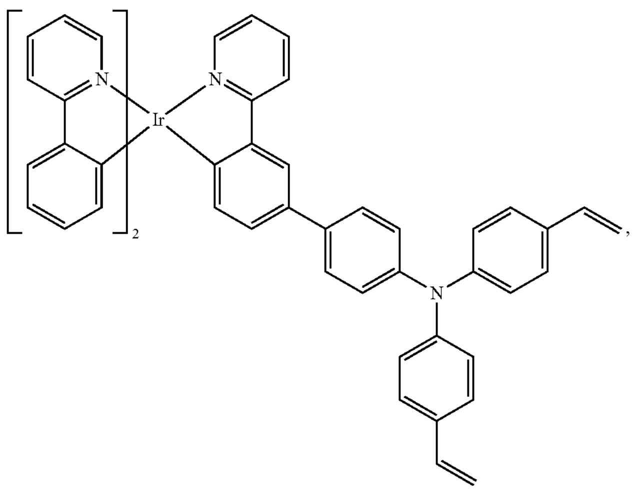
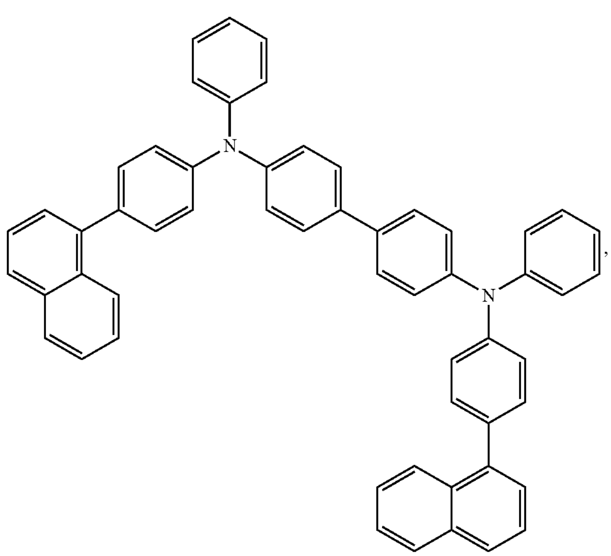

-continued
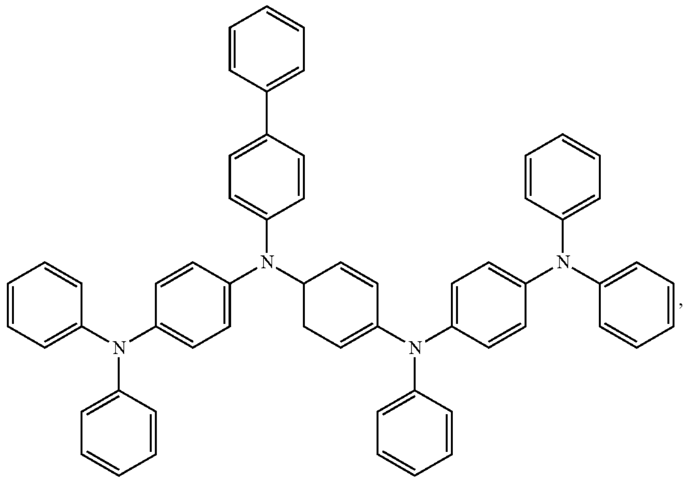
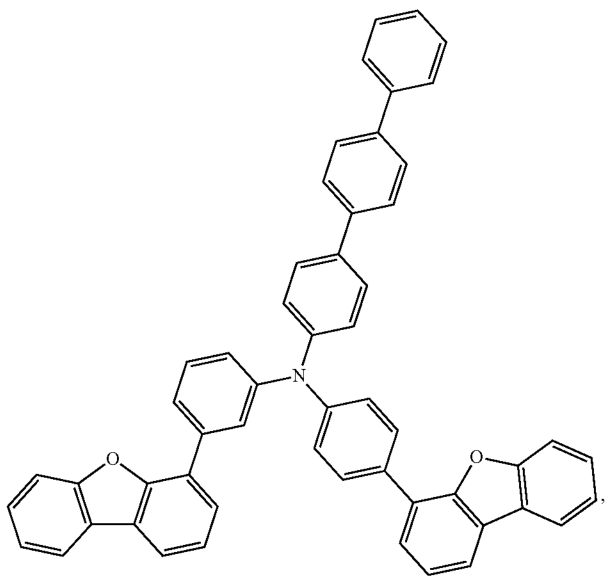
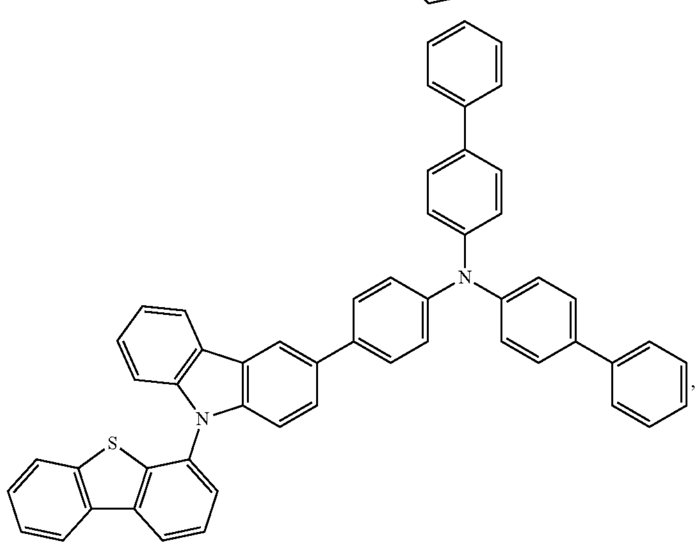

-continued
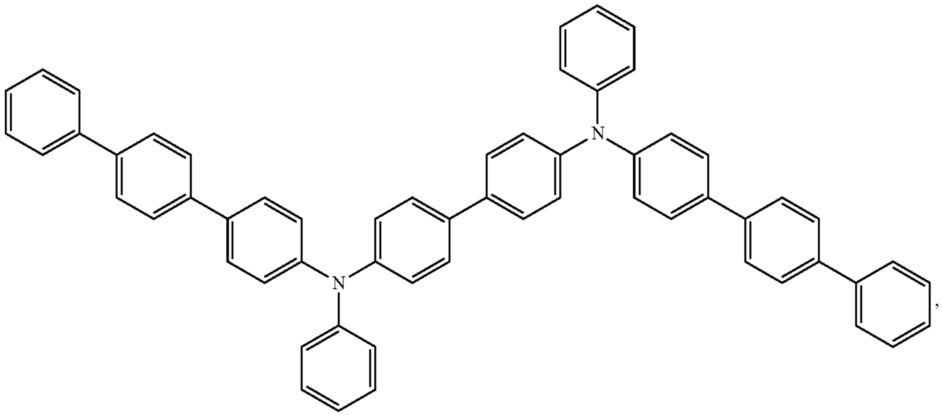
,
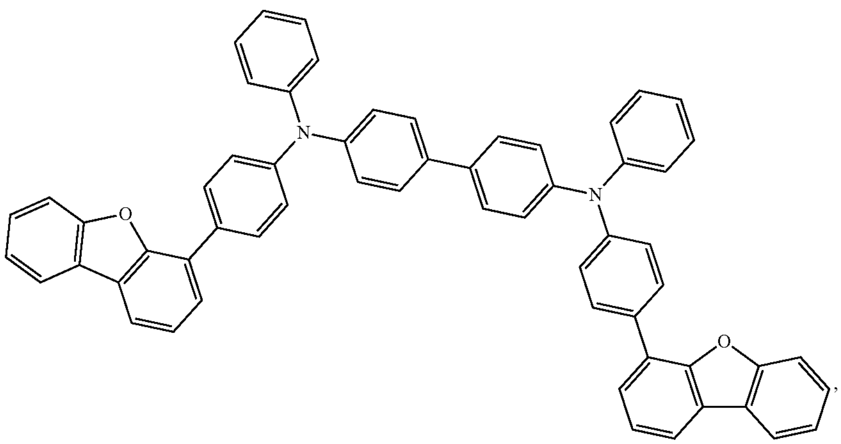
,
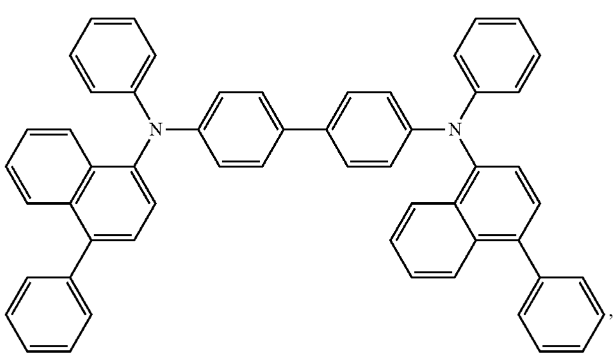
,

-continued
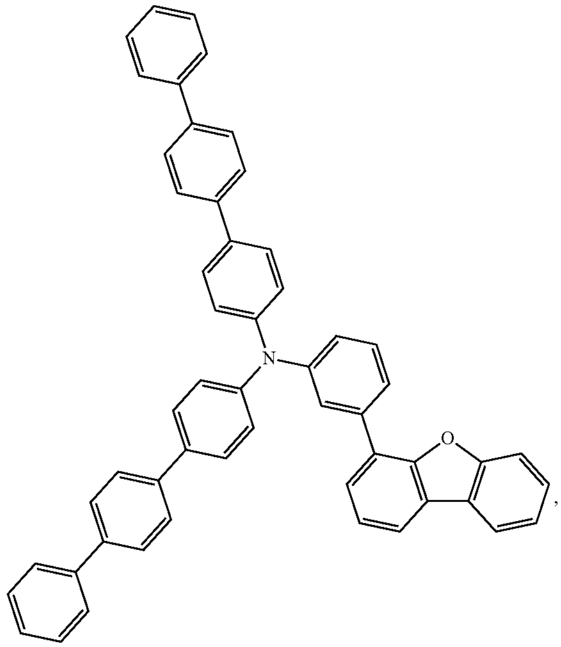
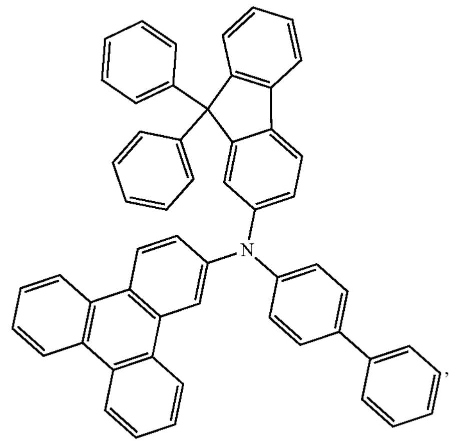
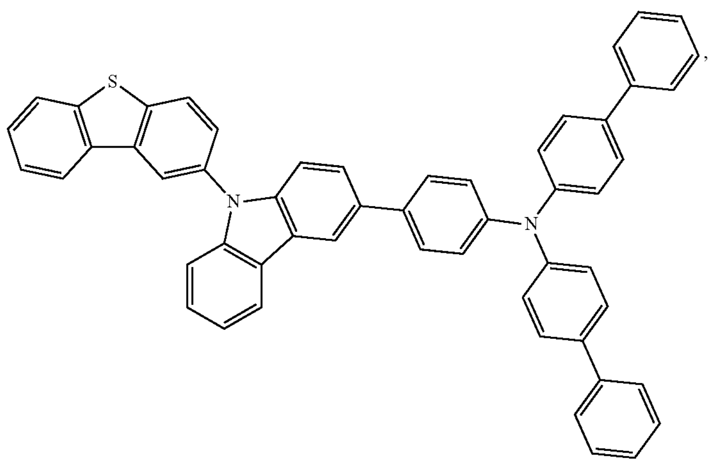
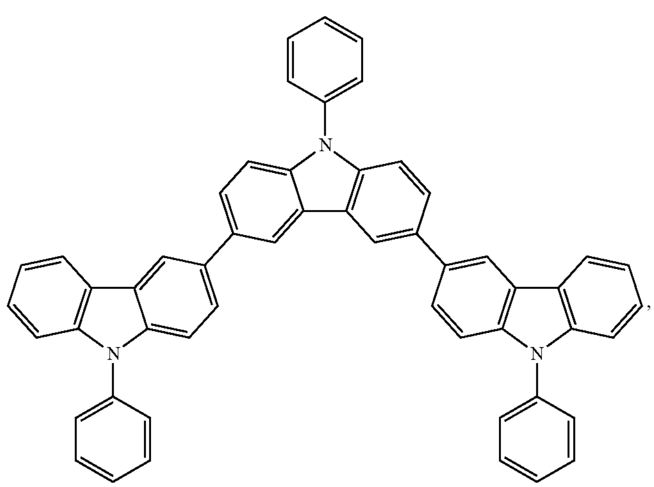

-continued
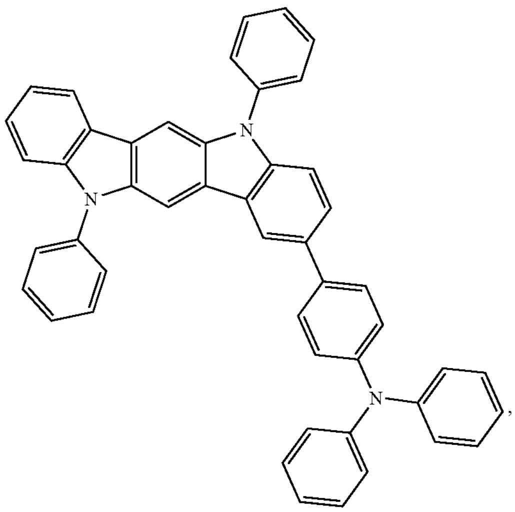
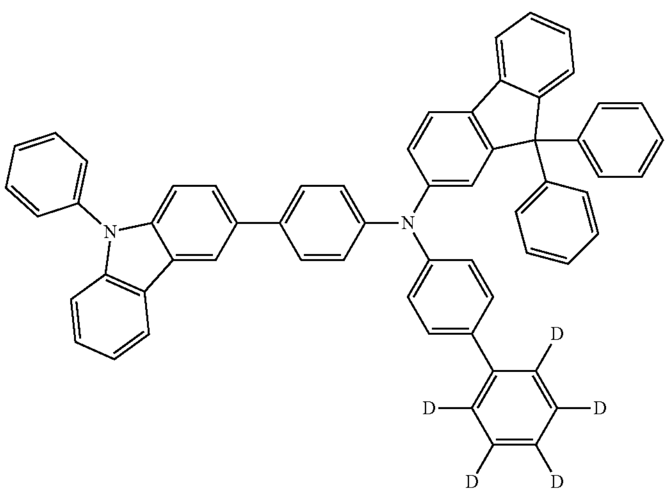
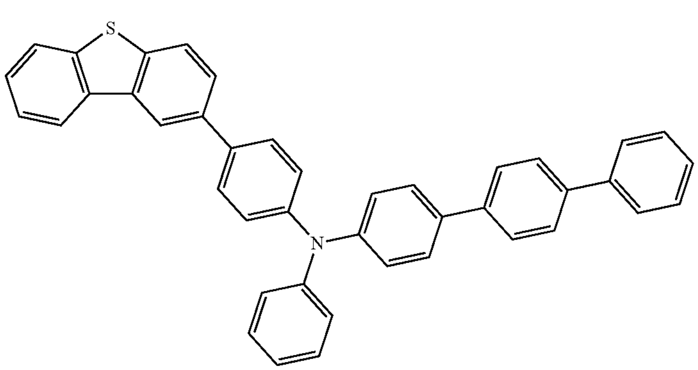

-continued
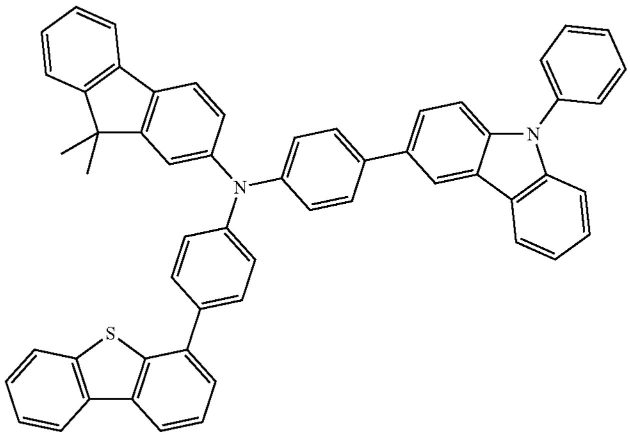
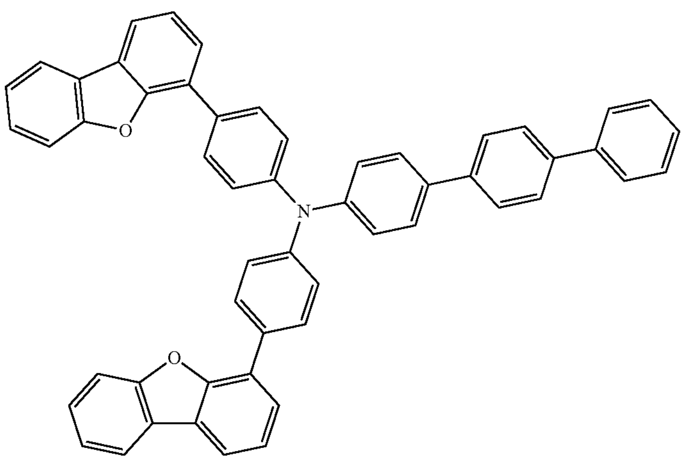
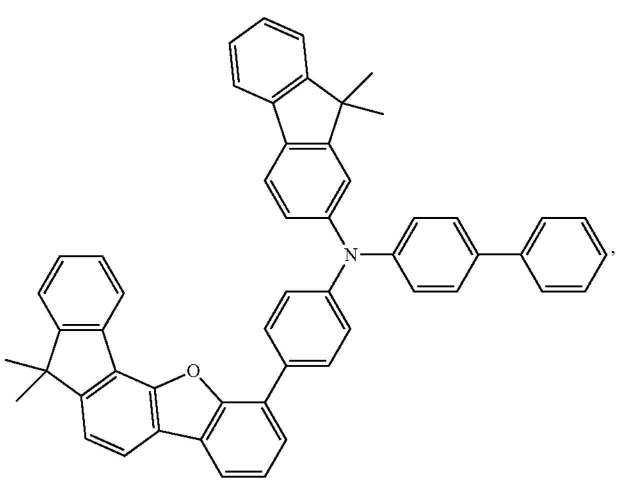
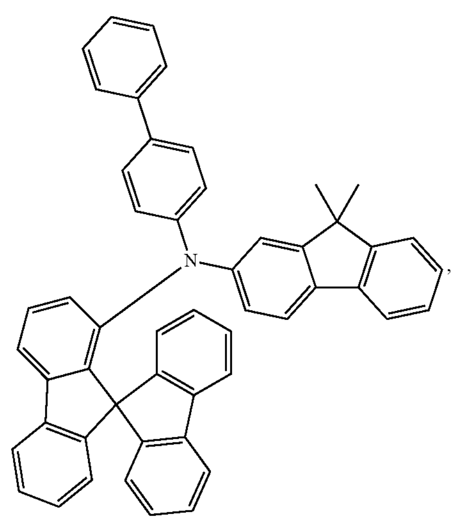

-continued
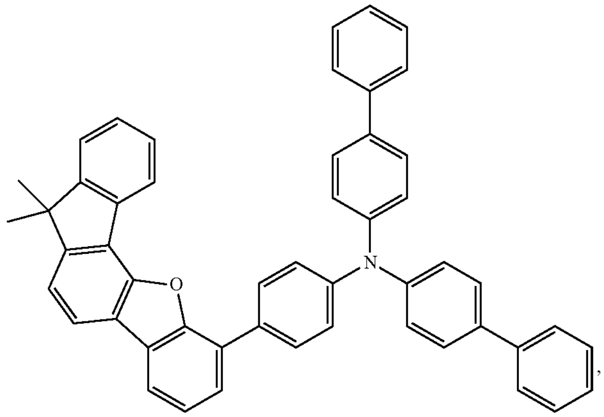
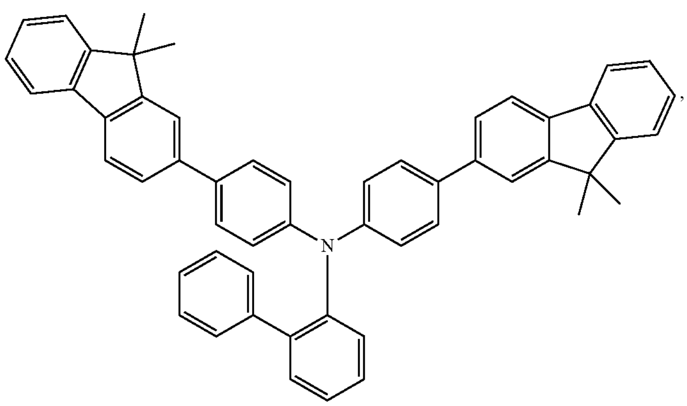
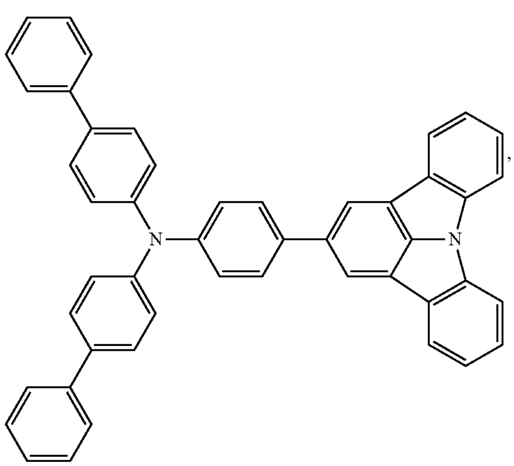

-continued
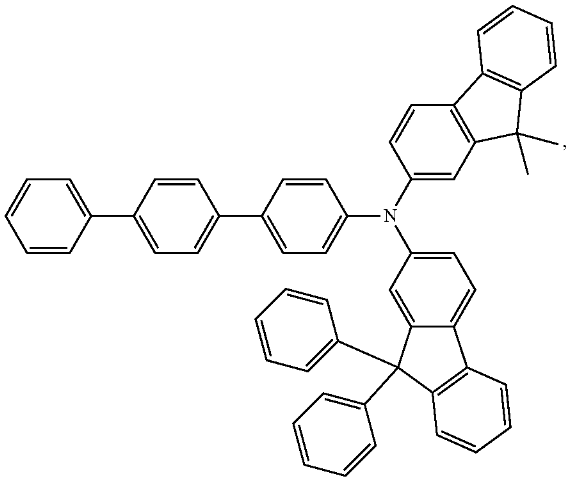
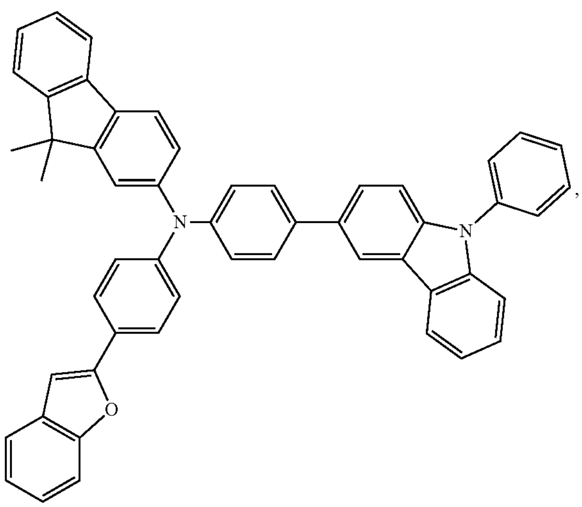
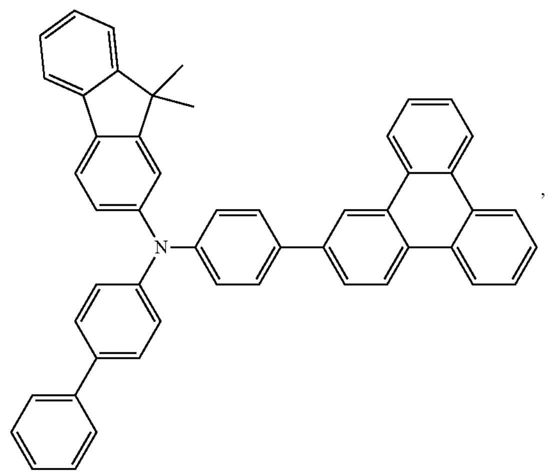
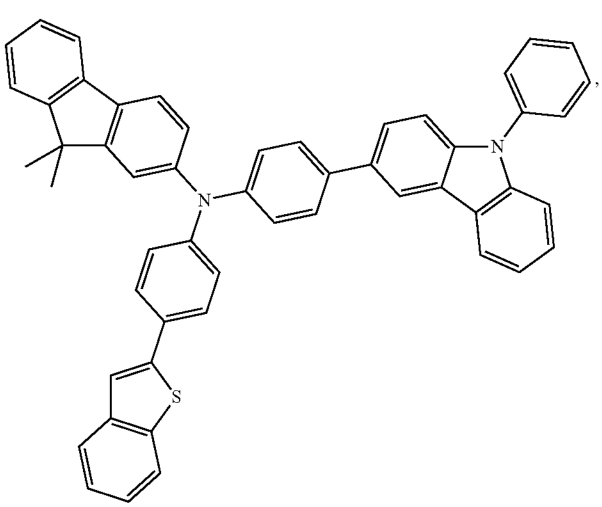

-continued
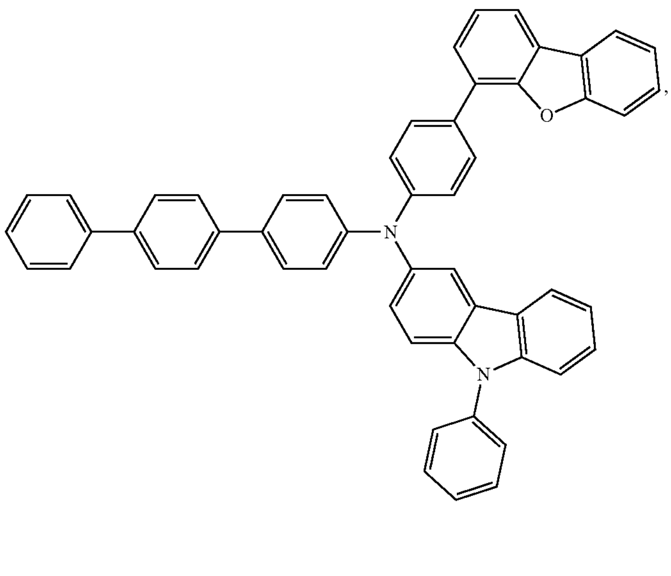
,
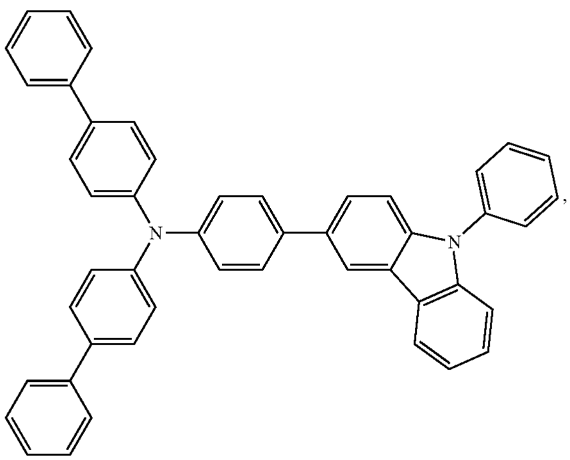
,
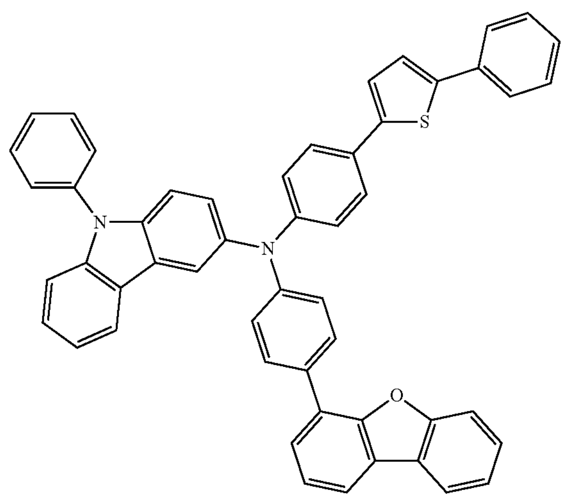
,
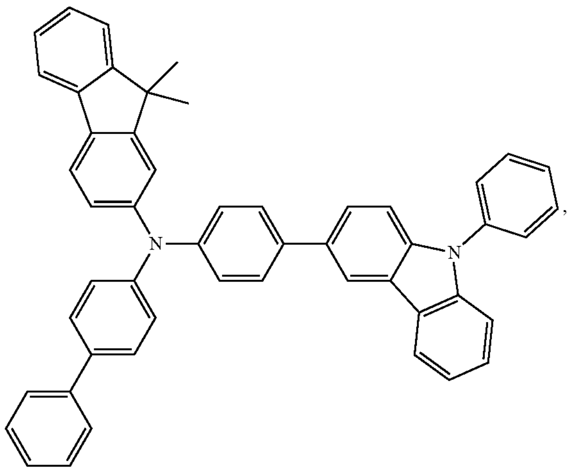
,
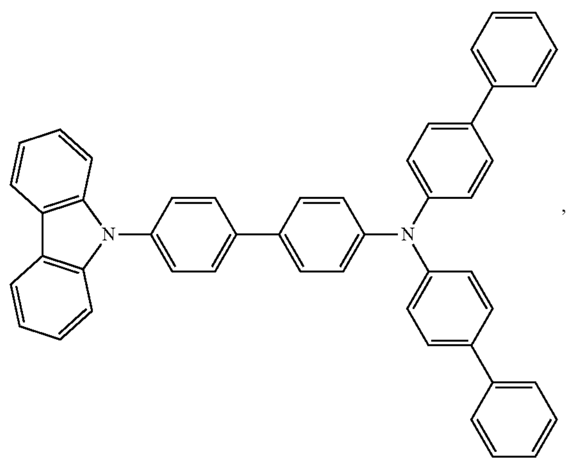
, -continued
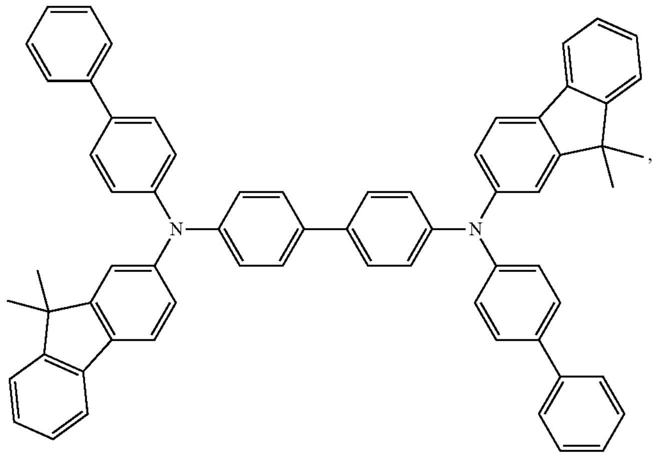
,
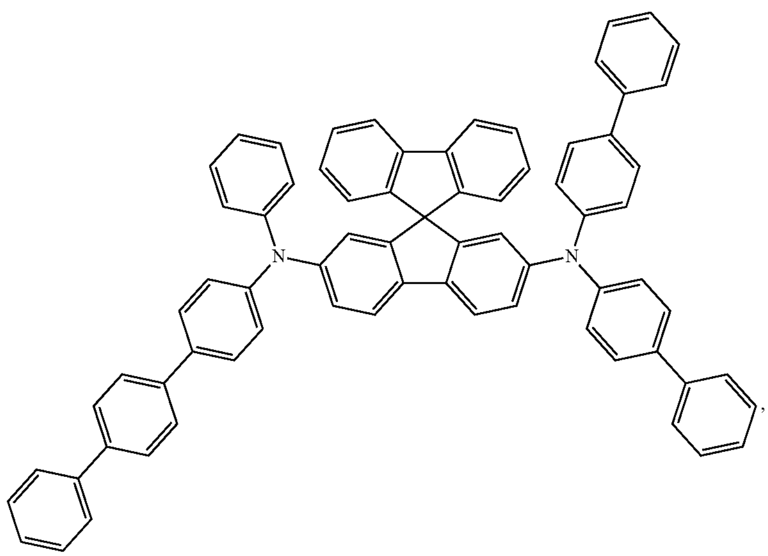
,
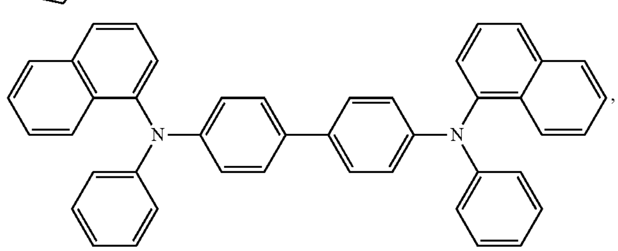
,
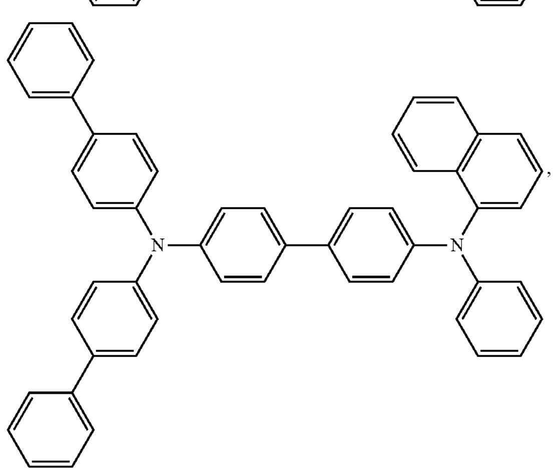
, -continued
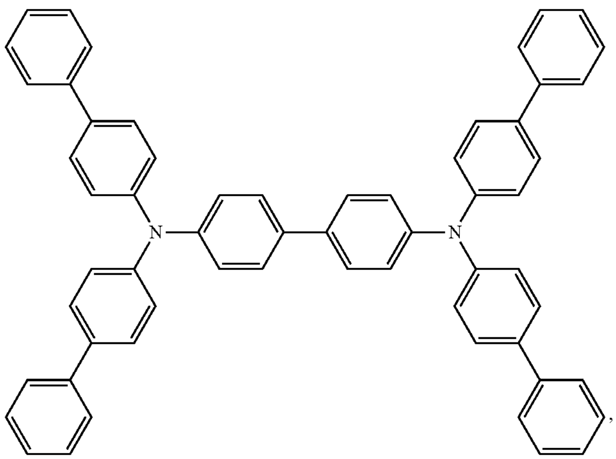
,
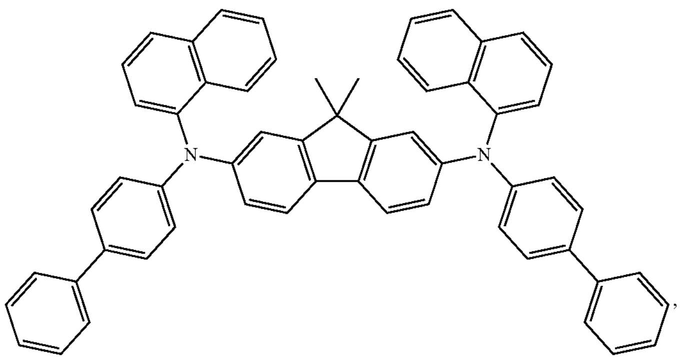
,
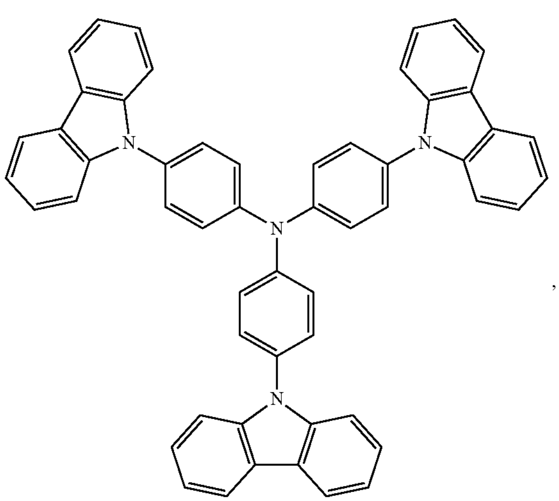
,
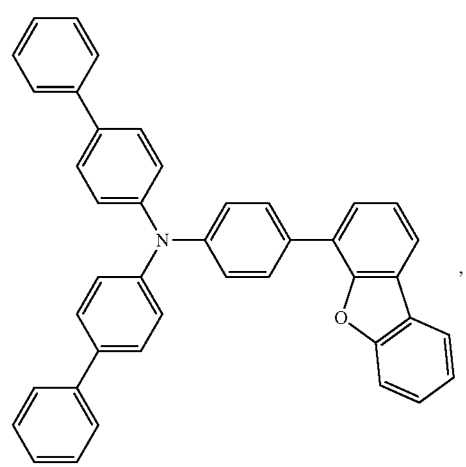
, -continued

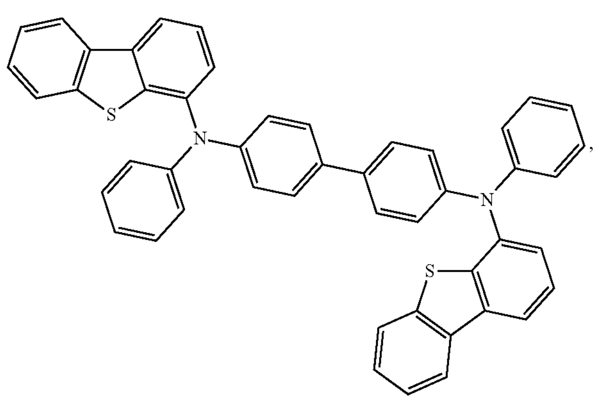

,

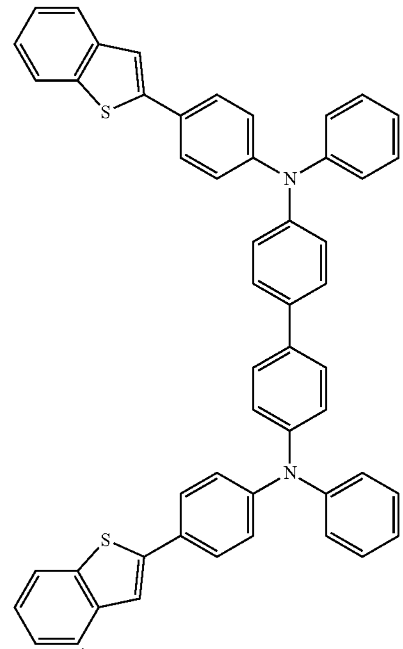

, and

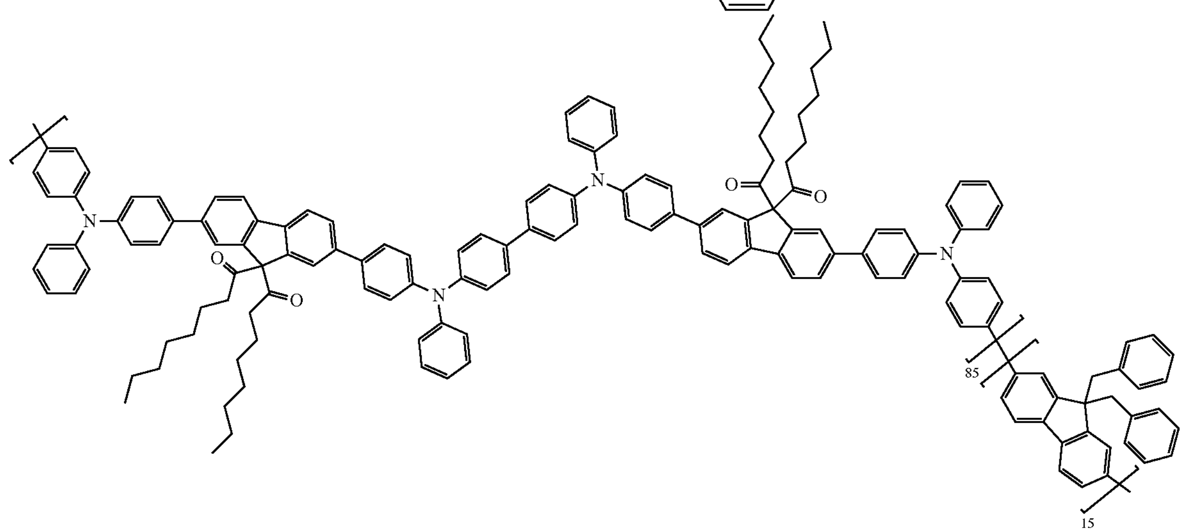

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

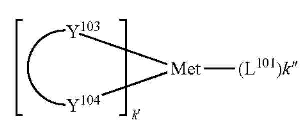

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

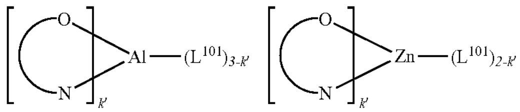

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

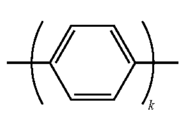,
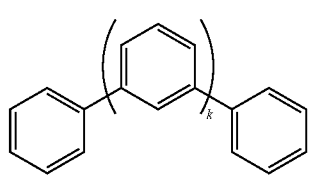,
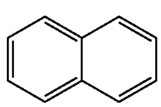,
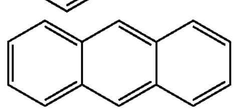,
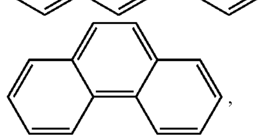,

-continued

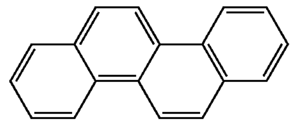,
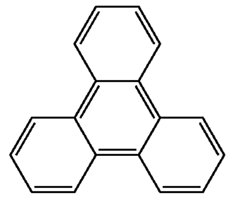,
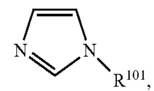
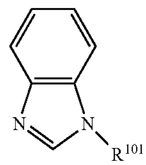,
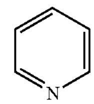,
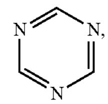
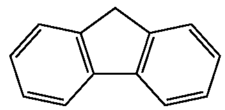,
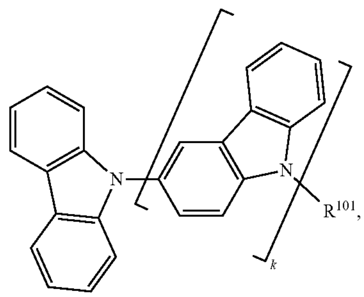
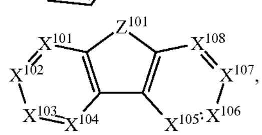
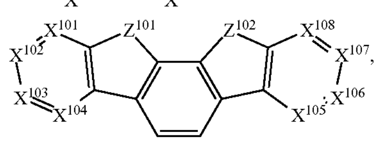
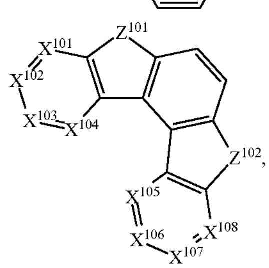
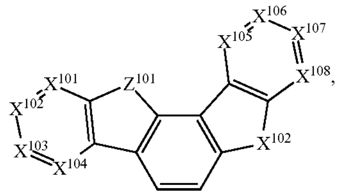
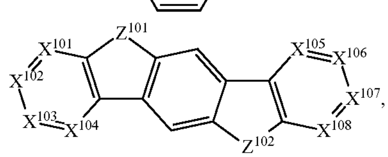 and -continued

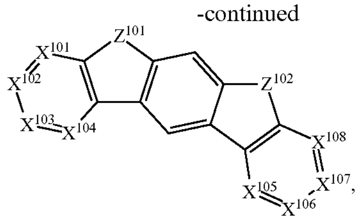

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $Y^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

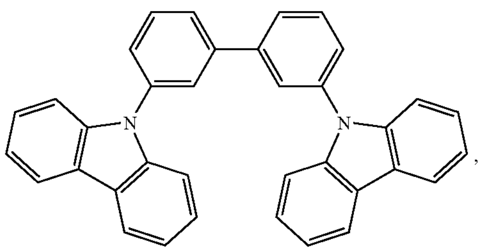

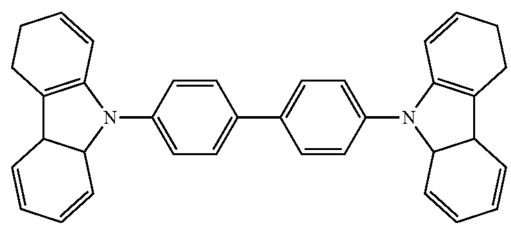

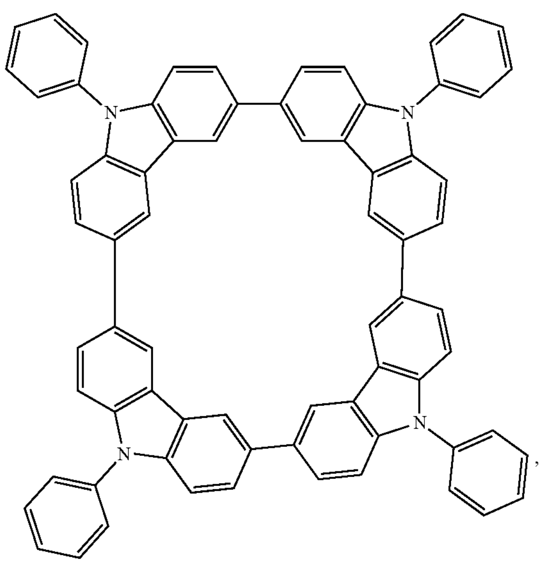

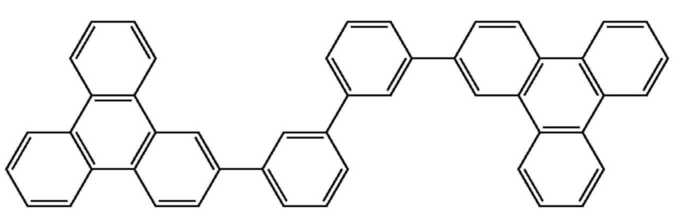

-continued
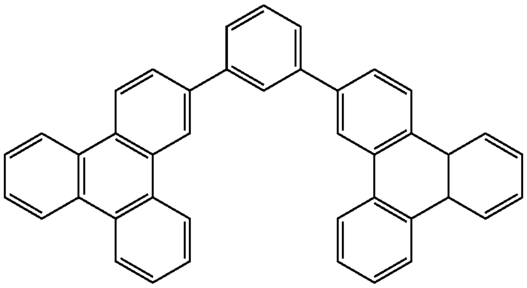
,
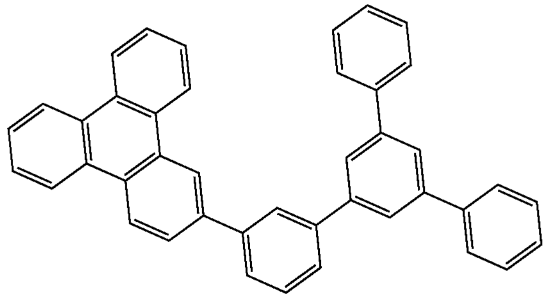
,
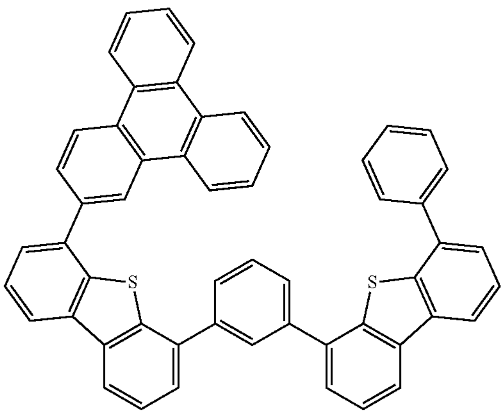
,
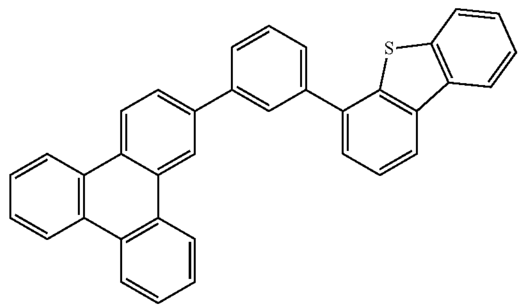
,
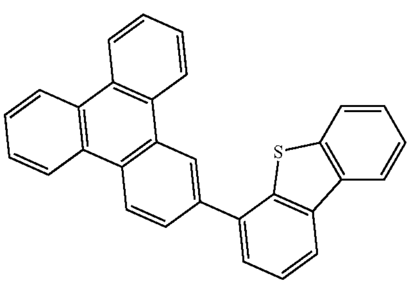
,
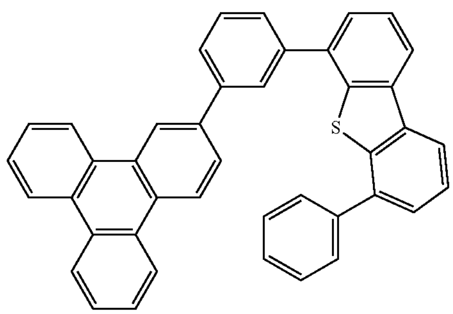
,
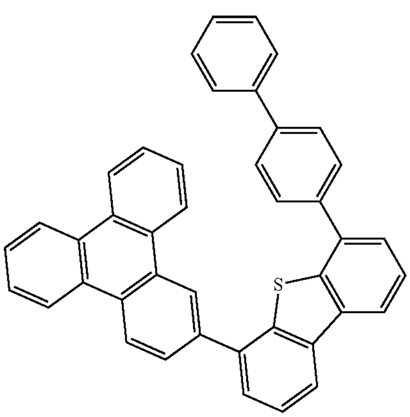
,
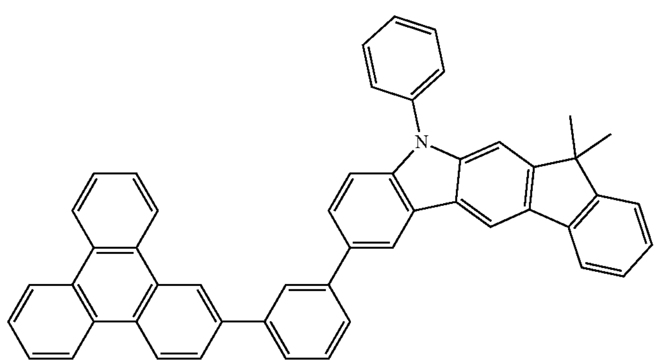
, -continued
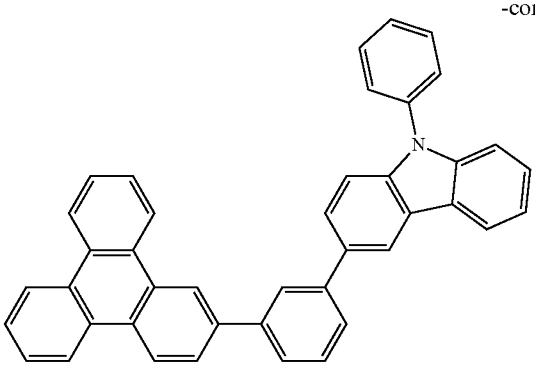
,
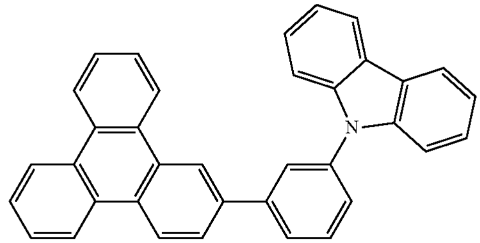
,
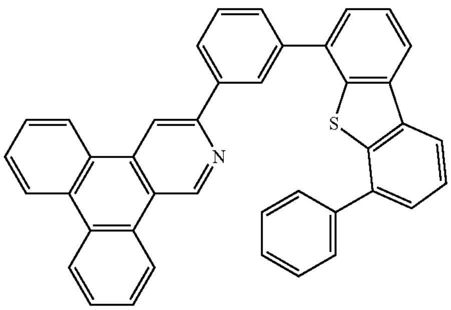
,
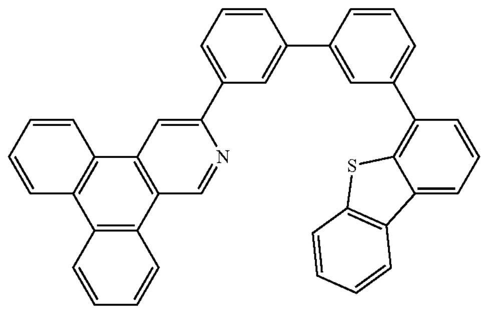
,
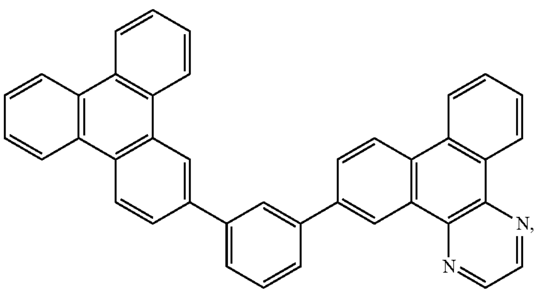
,
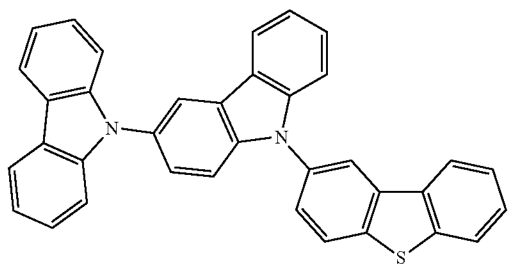
,
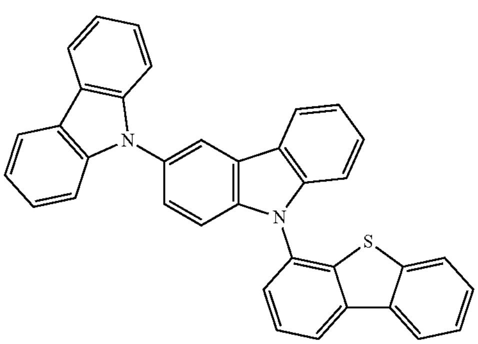
,
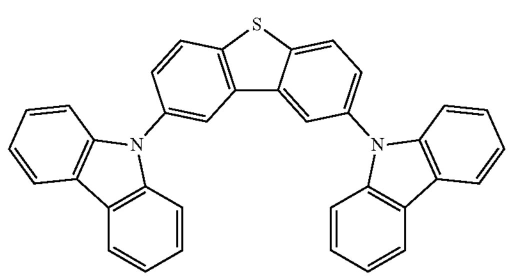
,
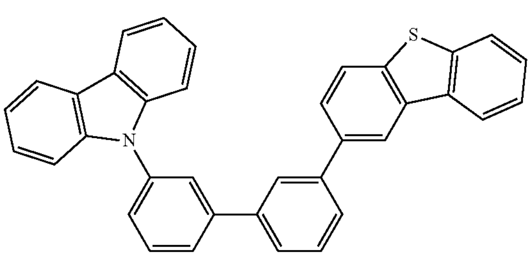
,
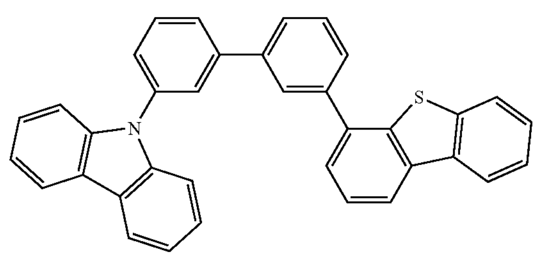
, -continued
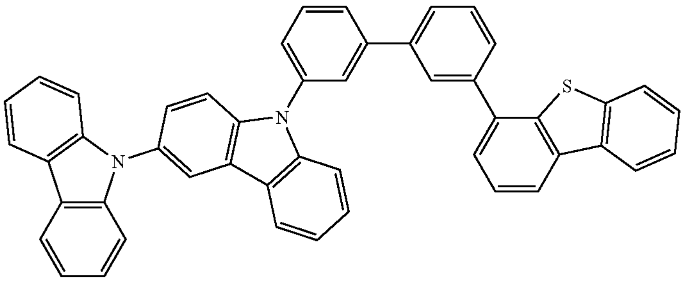
,
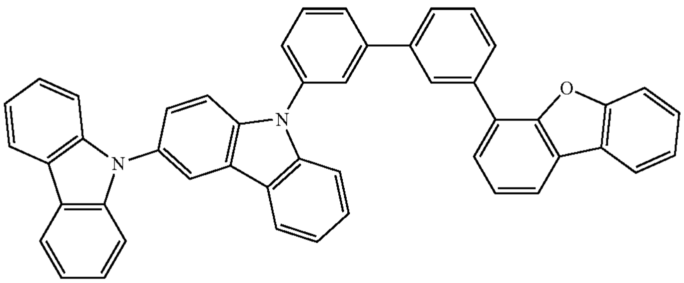
,
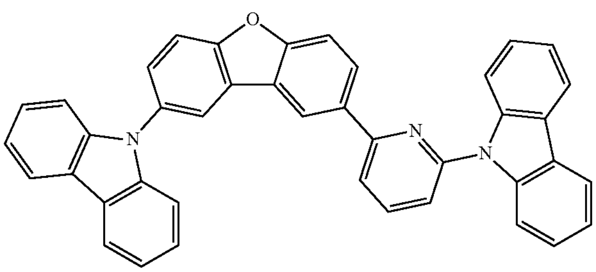
,
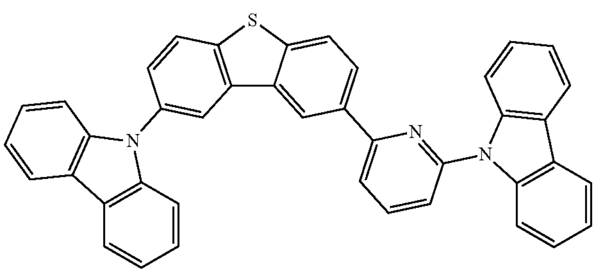
,
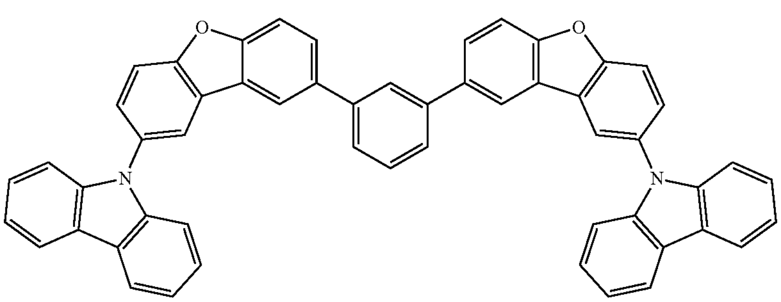
,
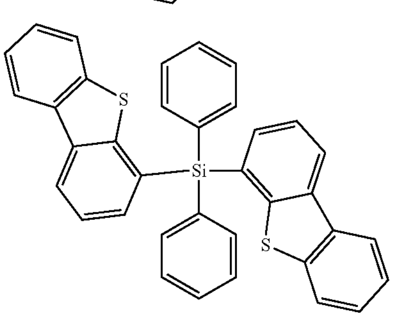
,
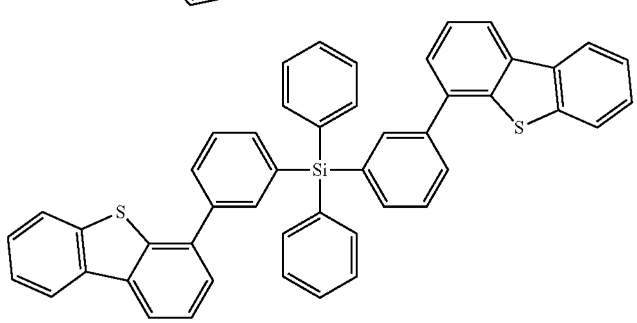
, -continued
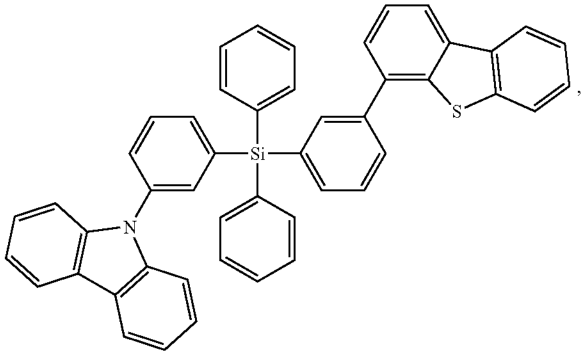
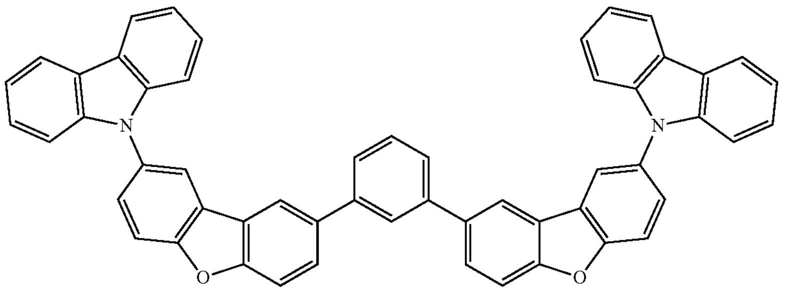
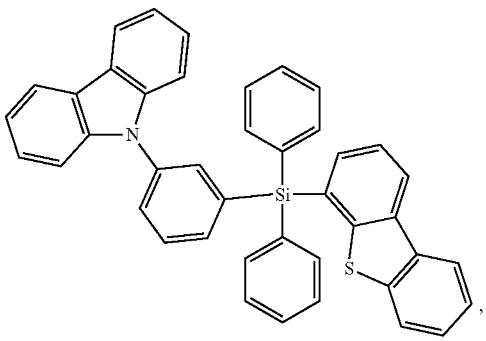
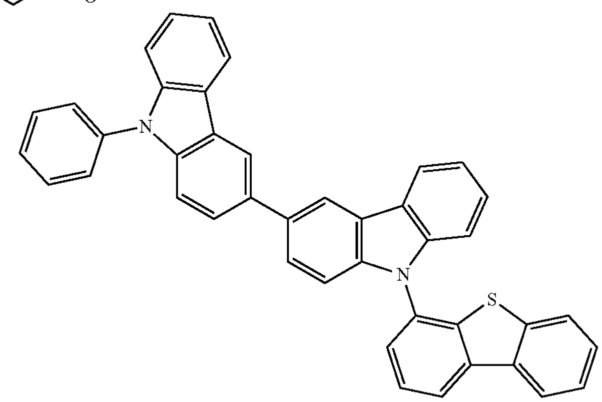
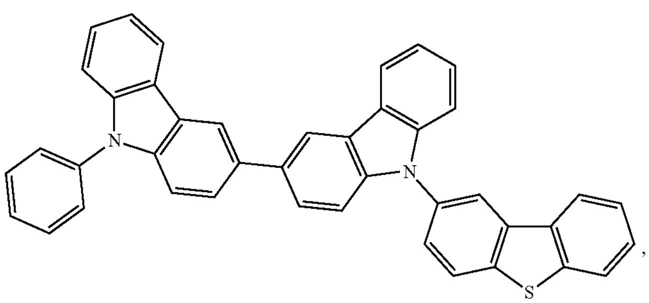
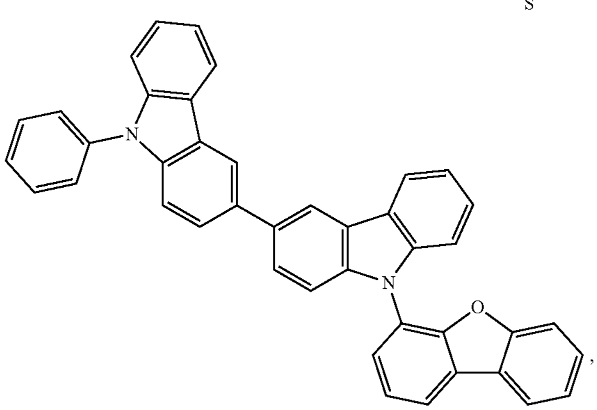

-continued
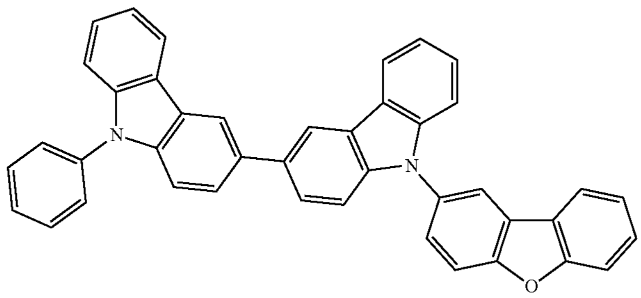
,
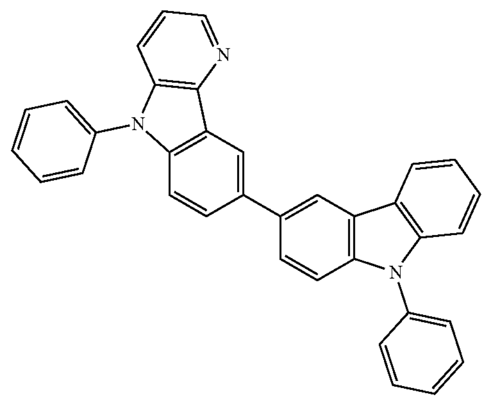
,
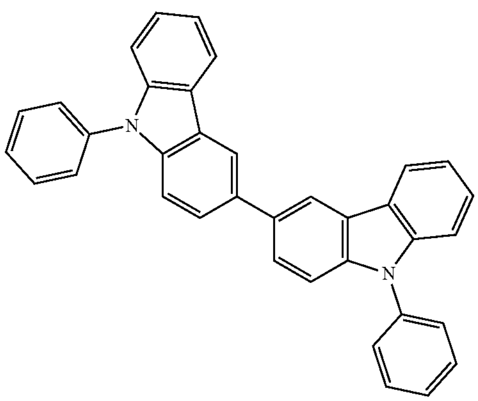
,
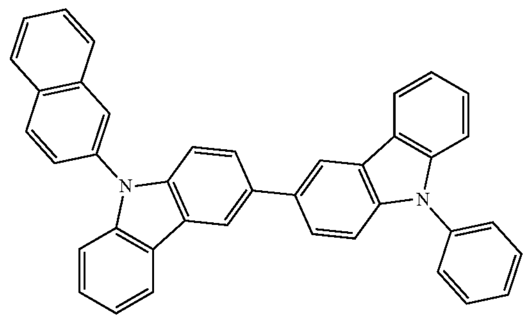
,
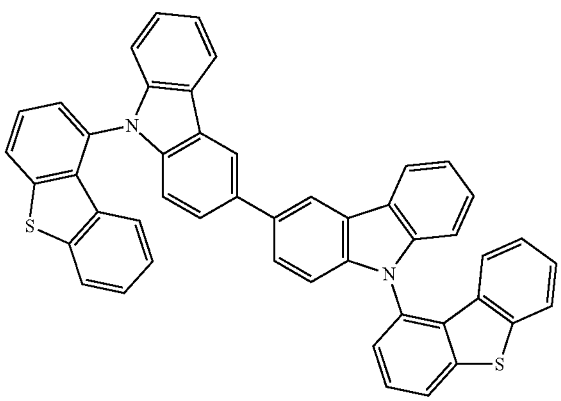
,
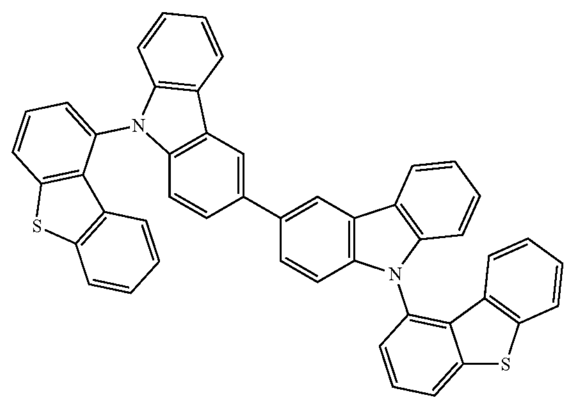
,
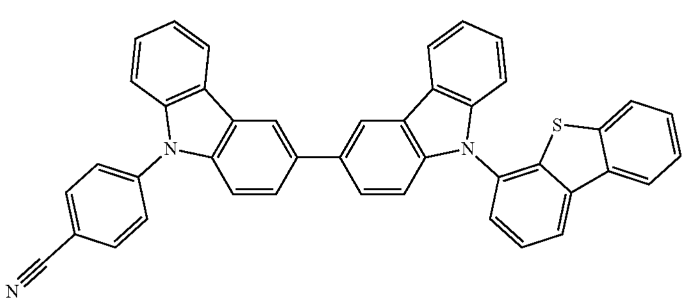
, -continued
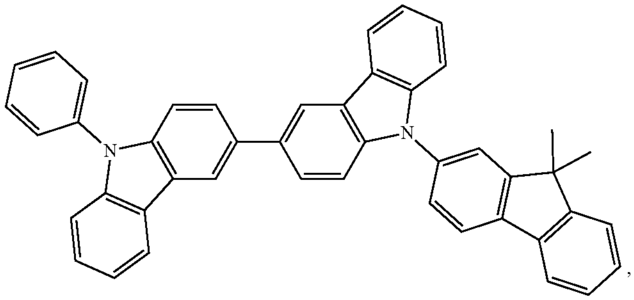
,
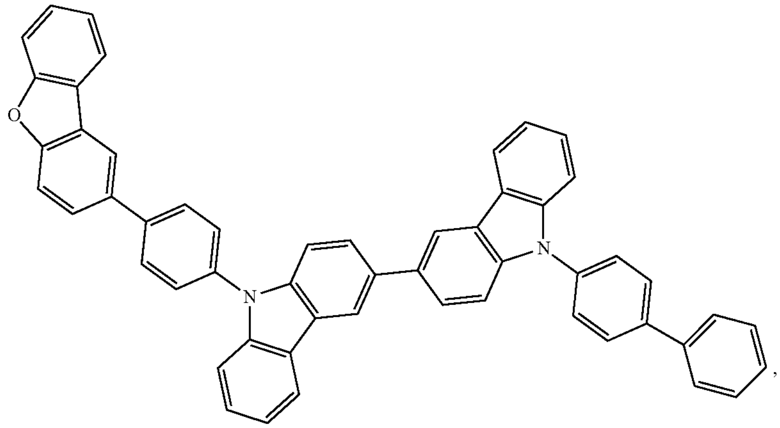
,
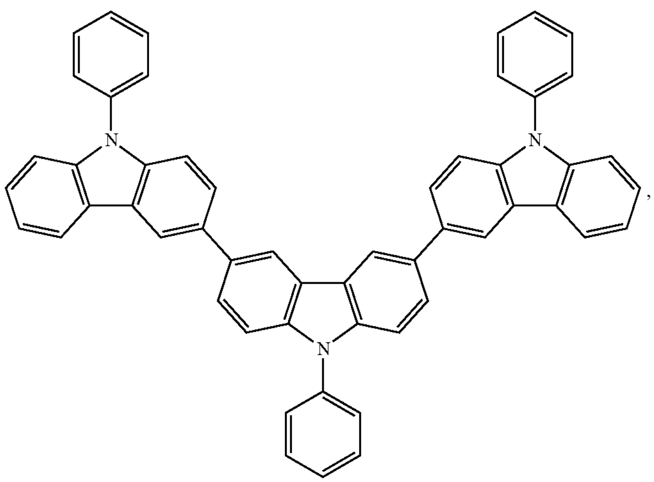
,
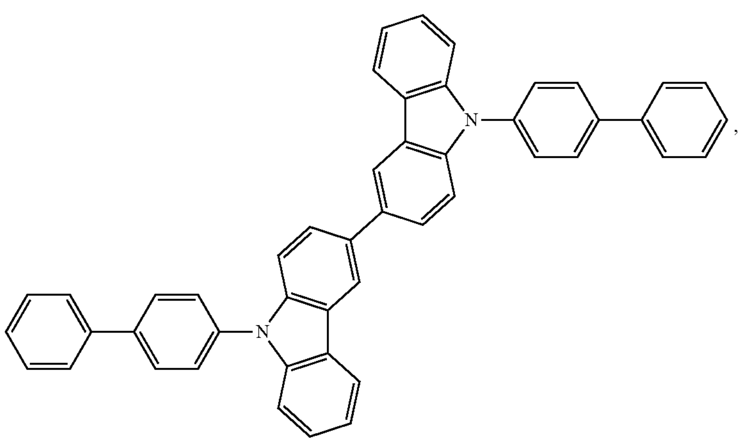
, -continued
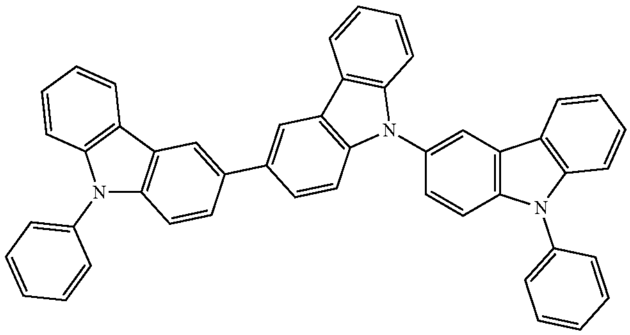
,
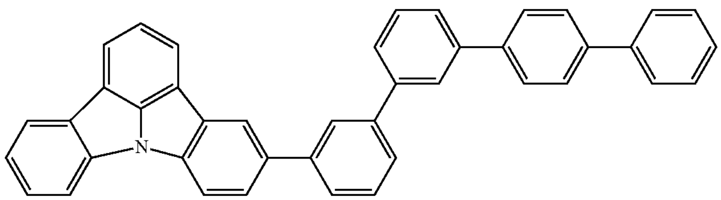
,
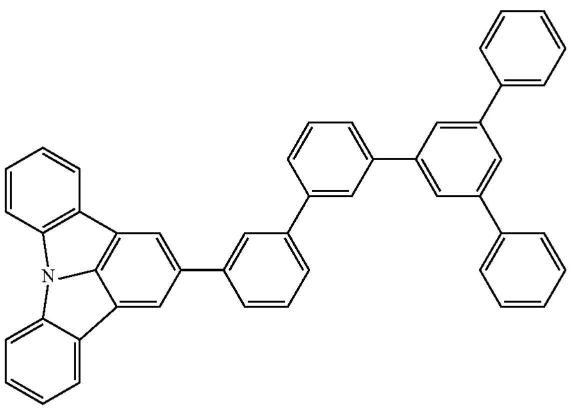
,
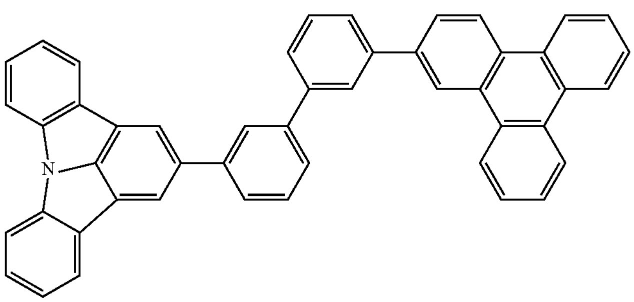
,
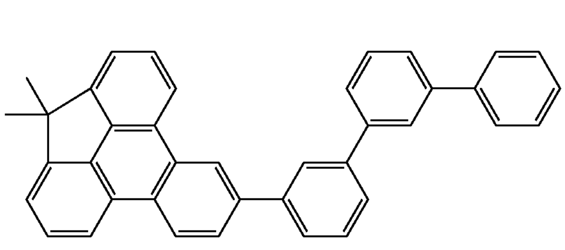
,
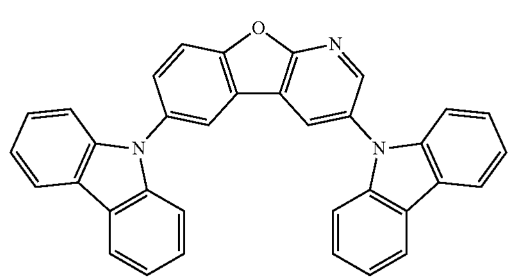
, -continued
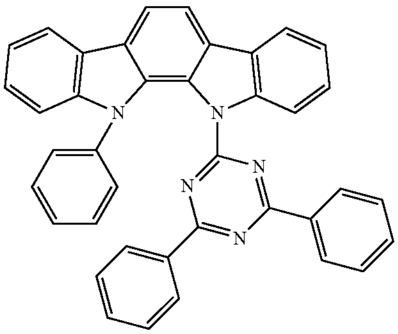
,
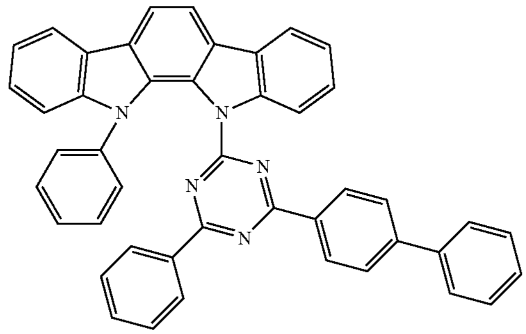
,
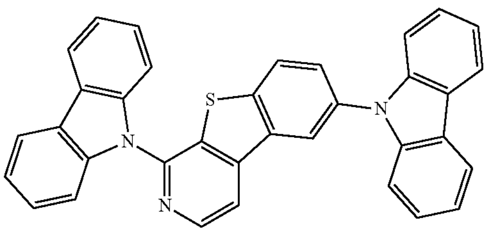
,
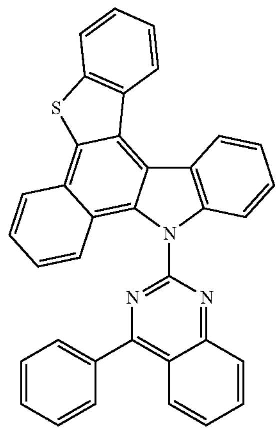
,
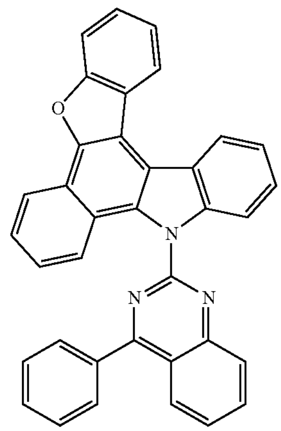
,
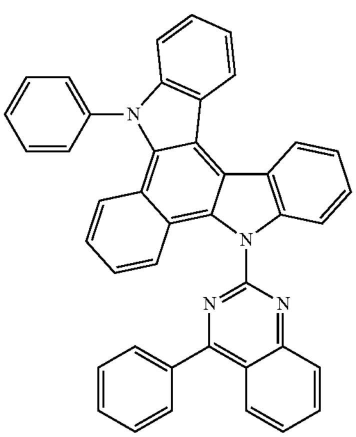
,
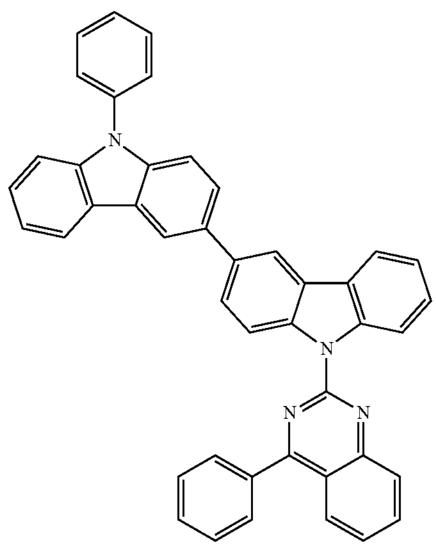
,
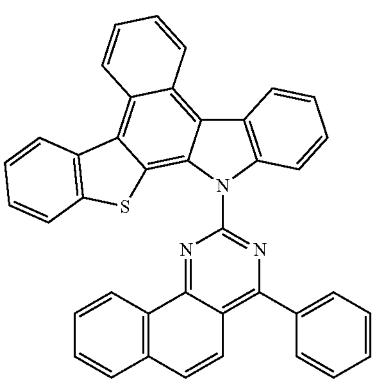
,
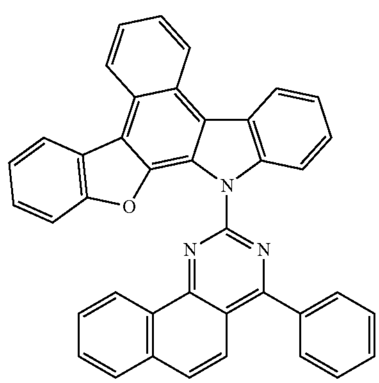
, -continued
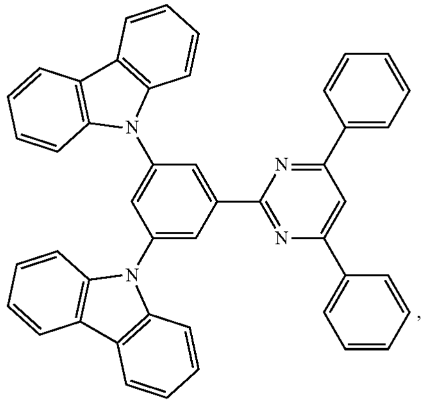,
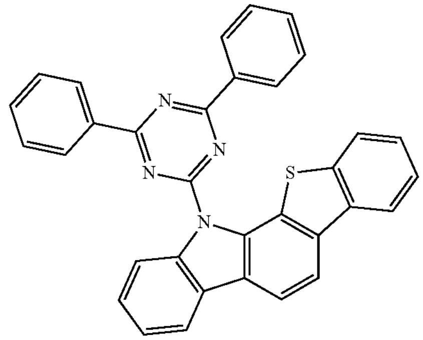,
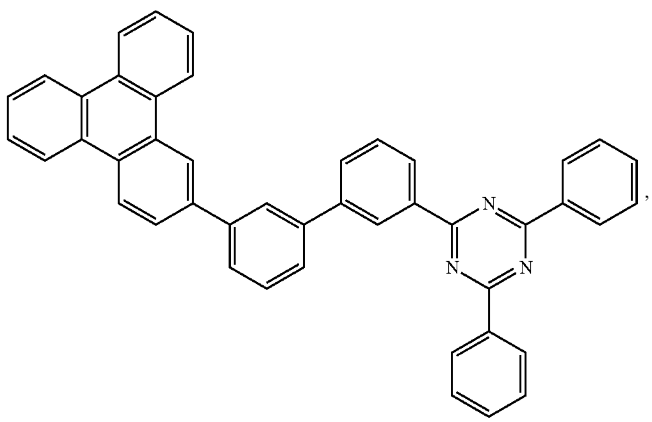,
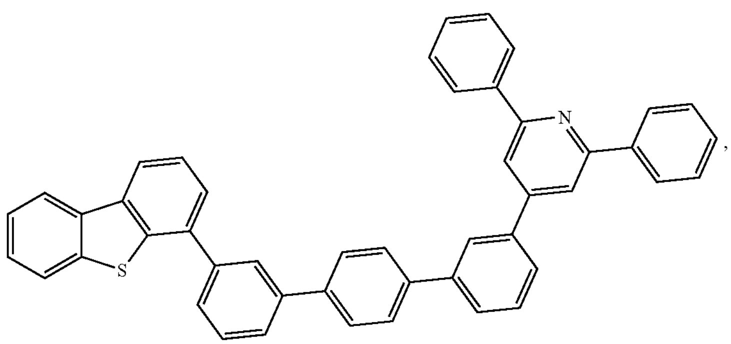,
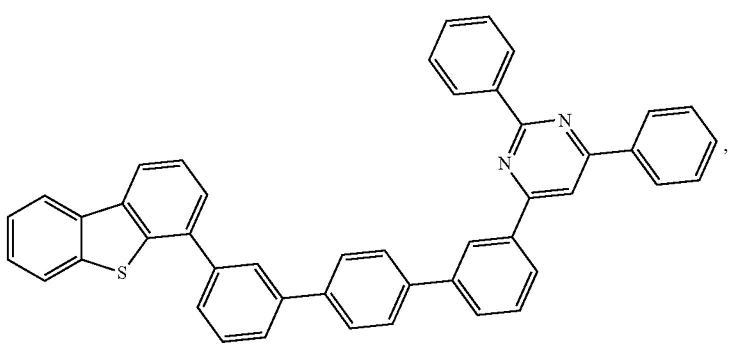, -continued
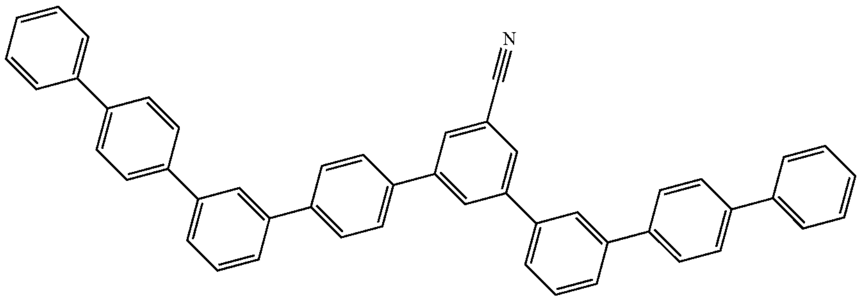
,
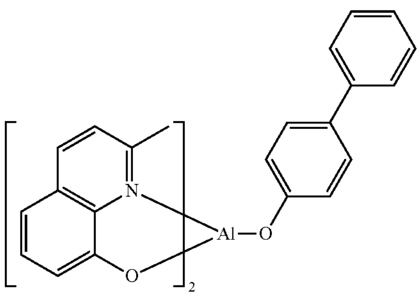
,
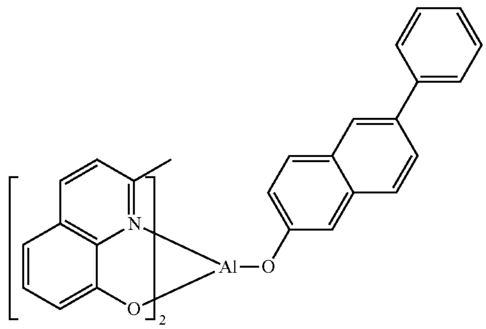
,
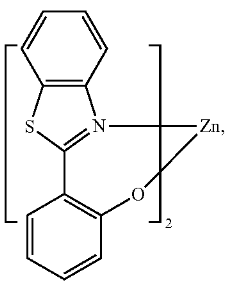
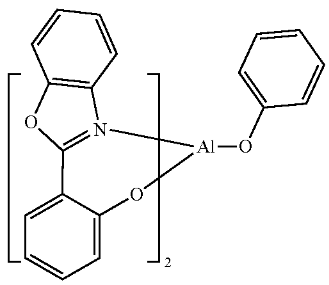
,
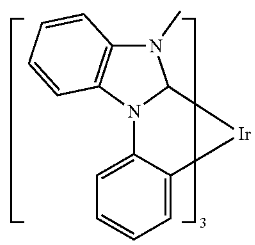
,
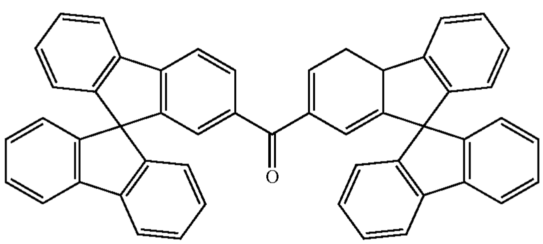
,
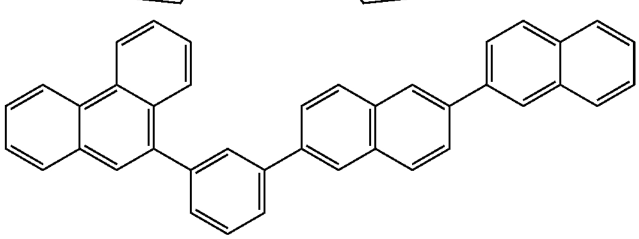
,
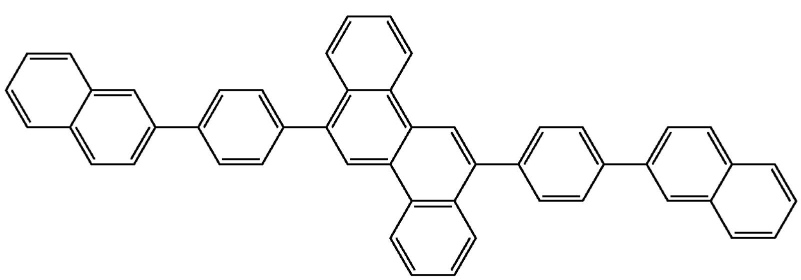
, and -continued

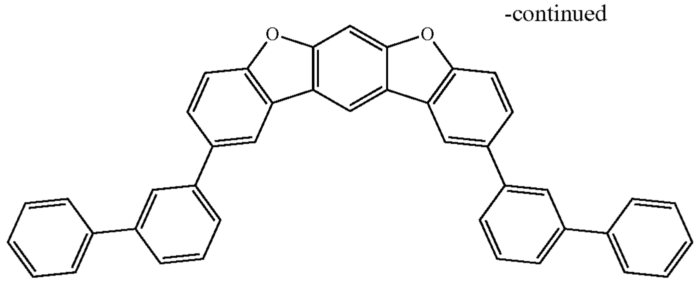

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

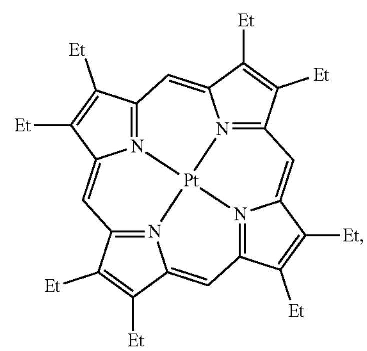

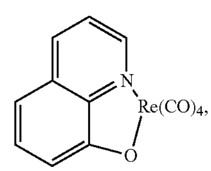

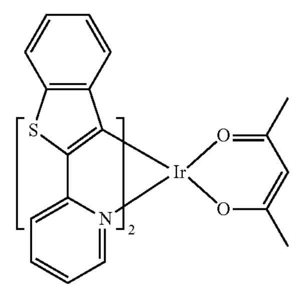

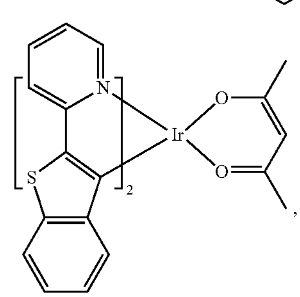

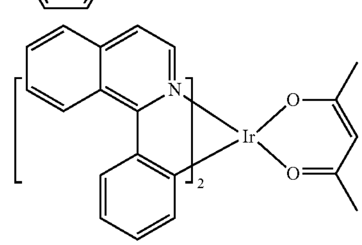

-continued
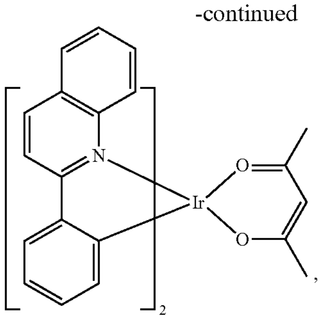
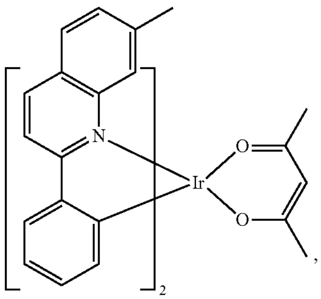
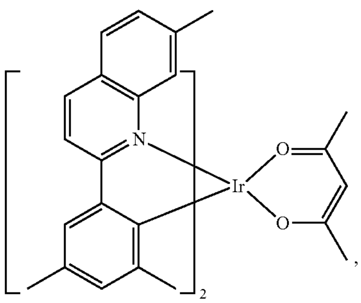
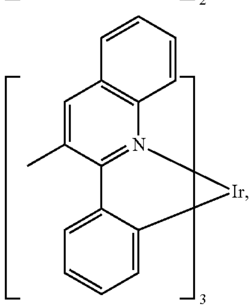
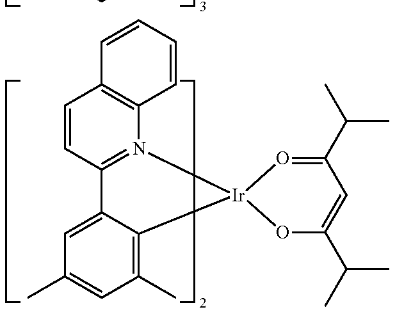
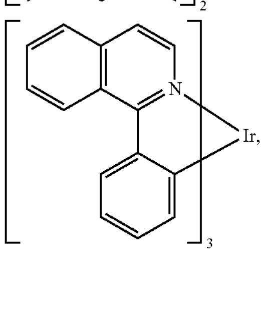
-continued
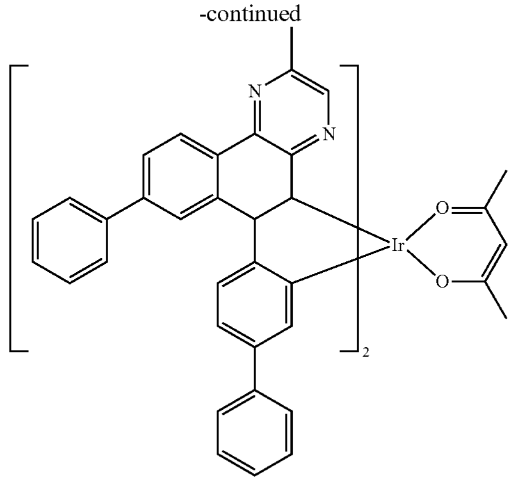
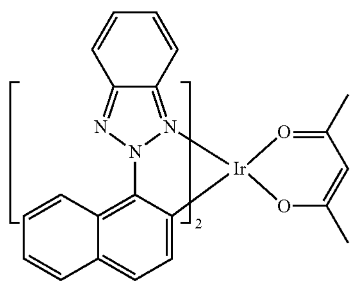
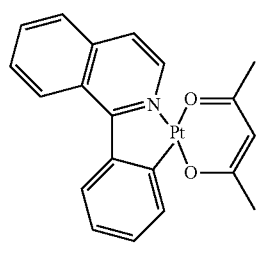
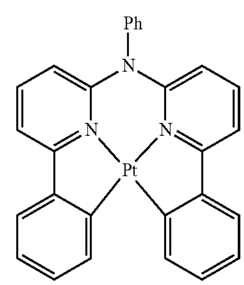
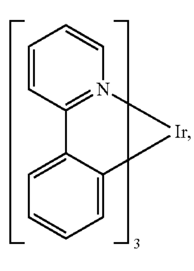
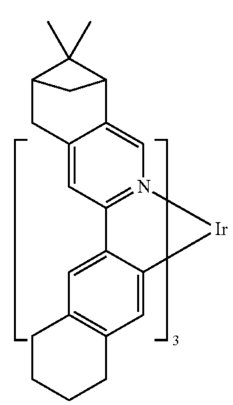

-continued
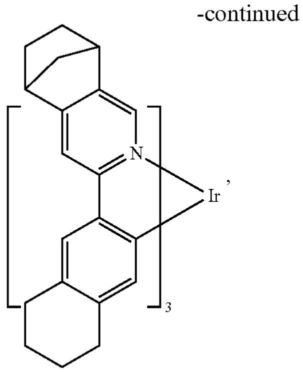
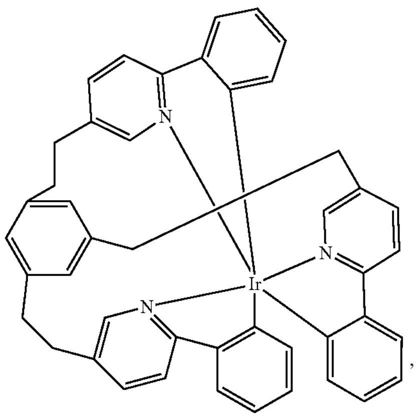
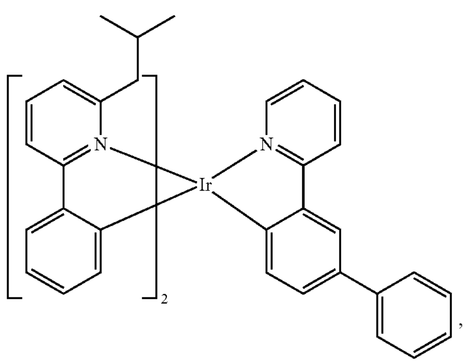
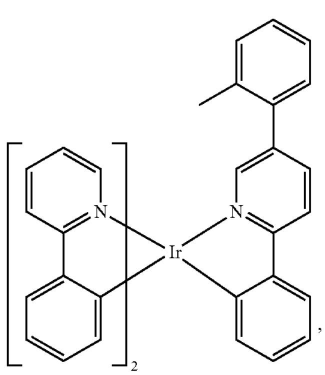
-continued
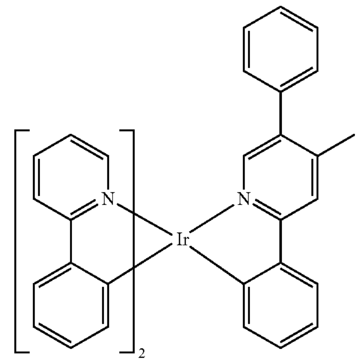
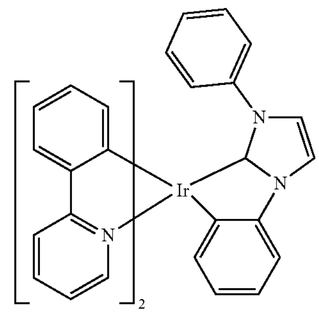
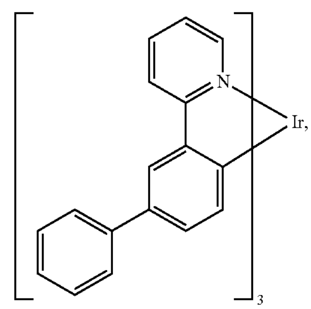
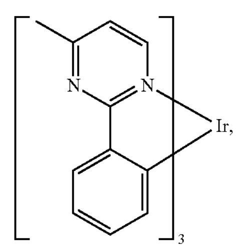
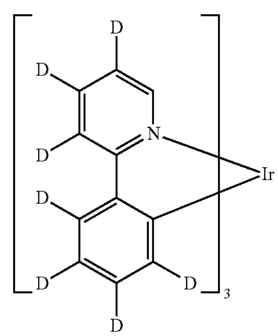
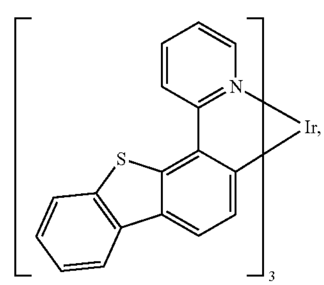

-continued
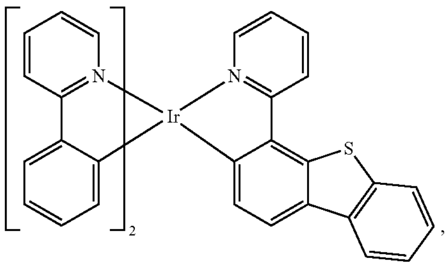
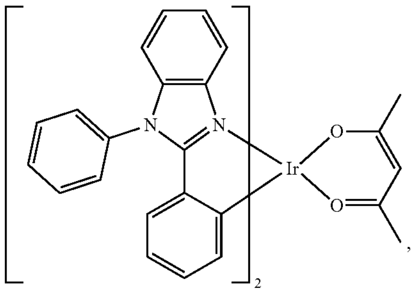
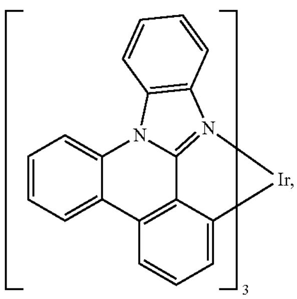
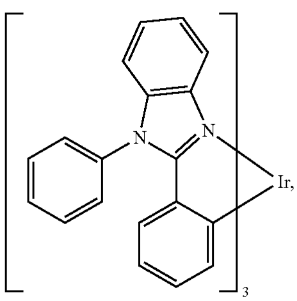
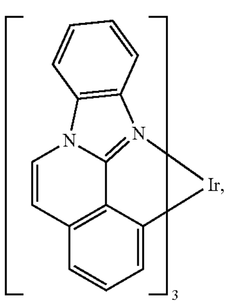
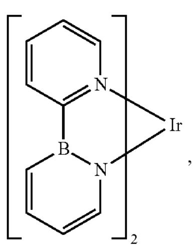
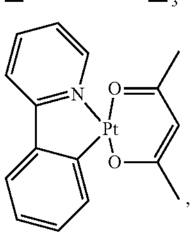
-continued
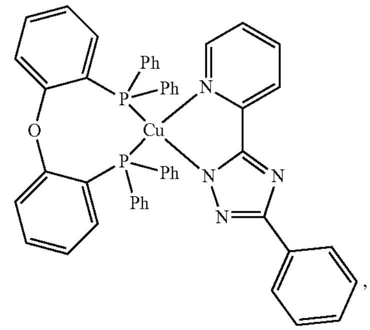
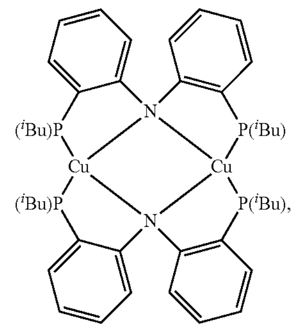
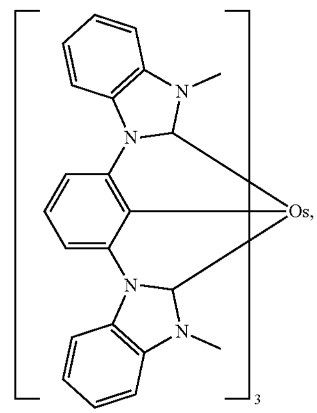
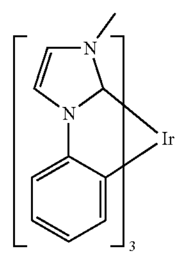
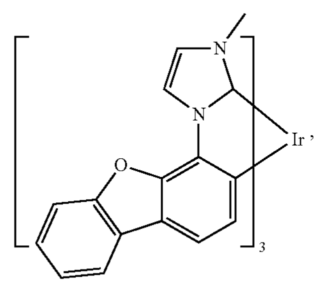
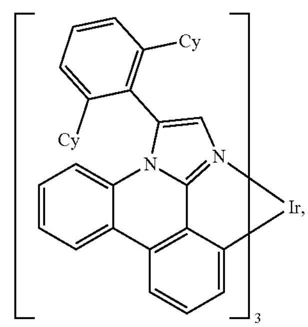

-continued
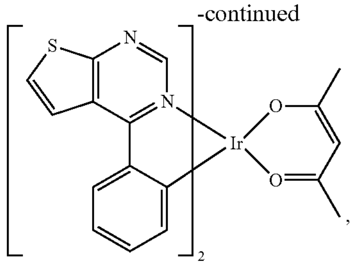
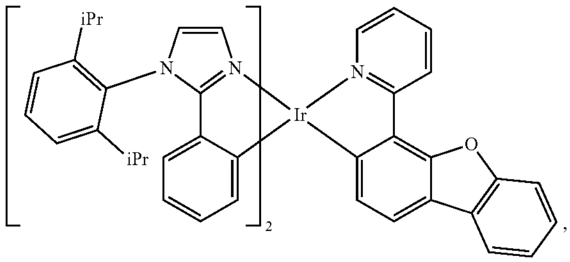
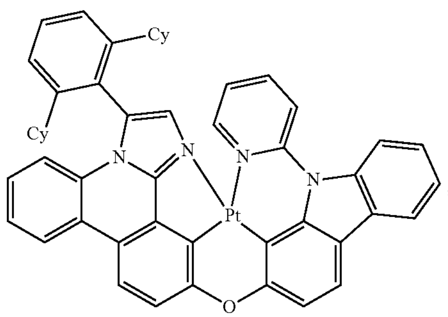
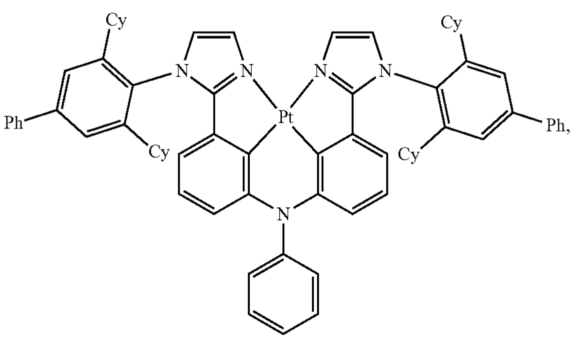
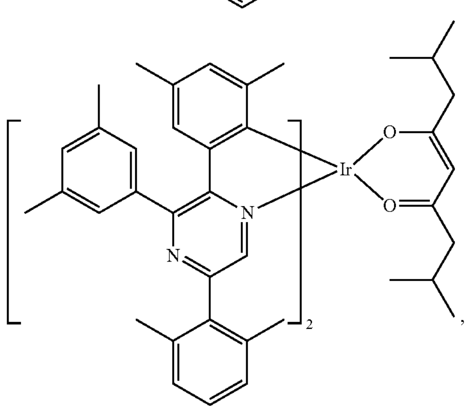
-continued
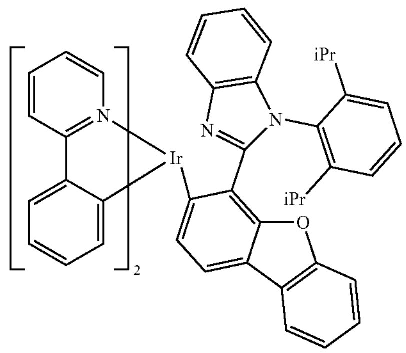
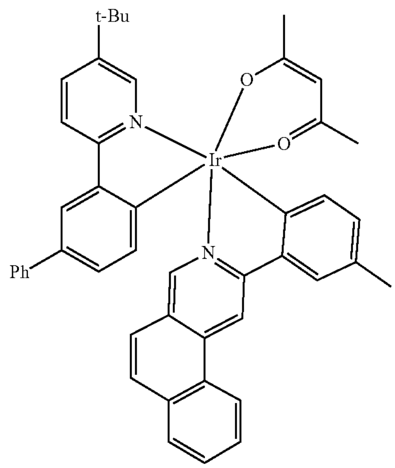
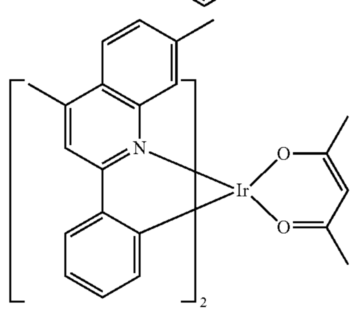
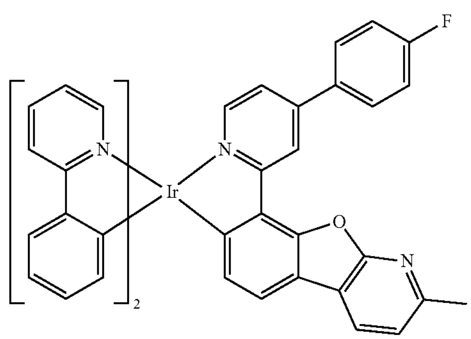
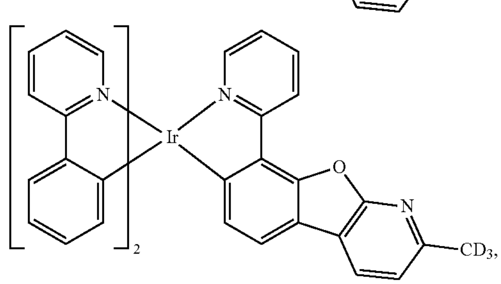

-continued
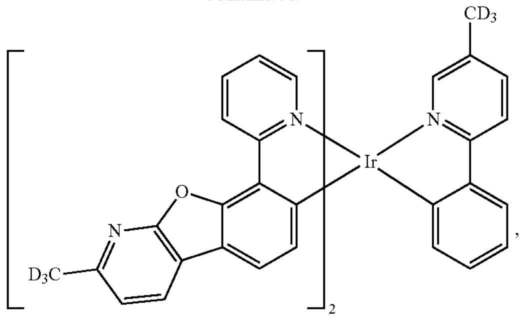
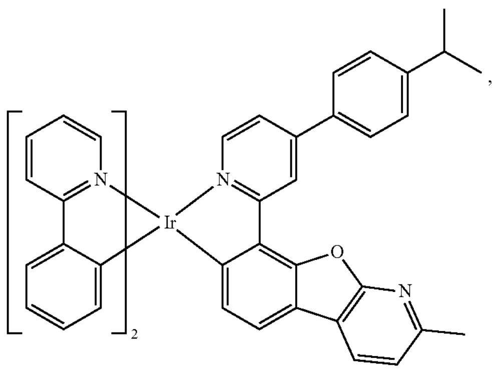
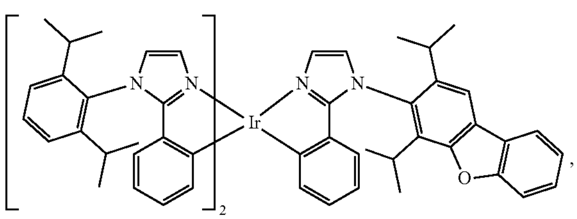
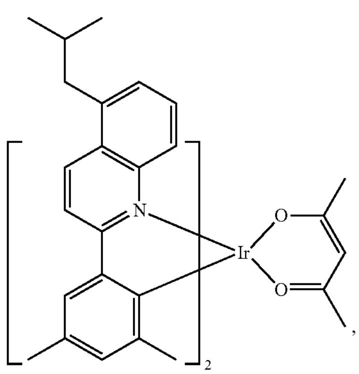
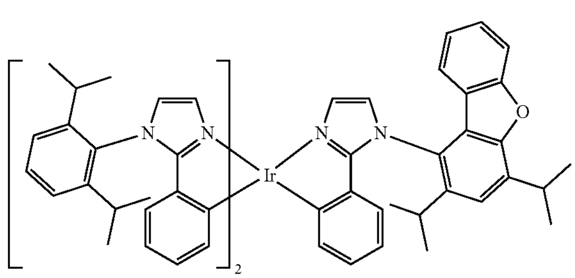
-continued
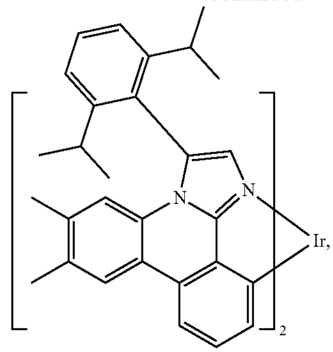
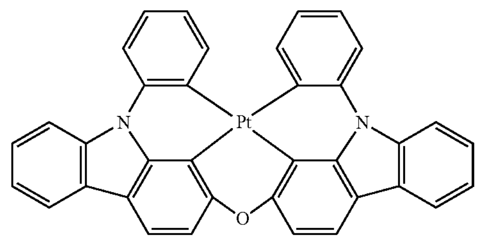
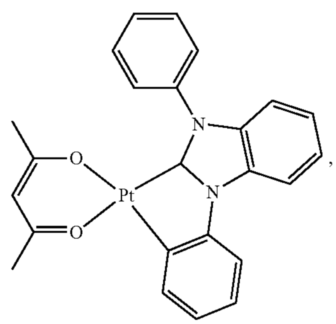
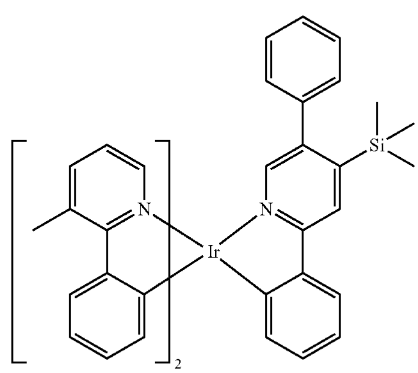
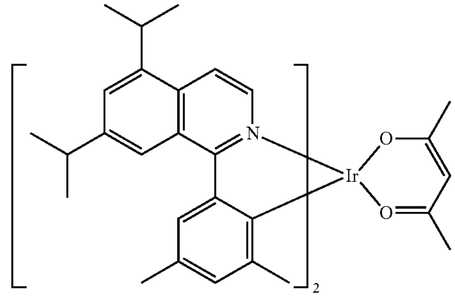

-continued
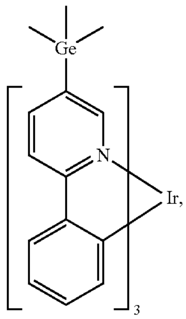
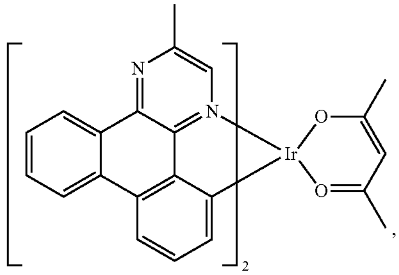
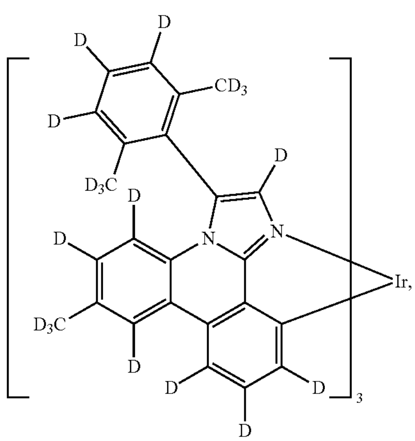
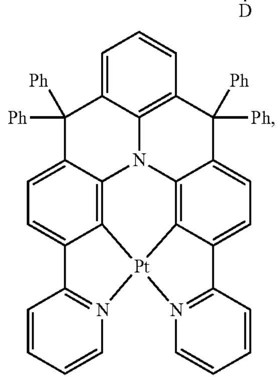
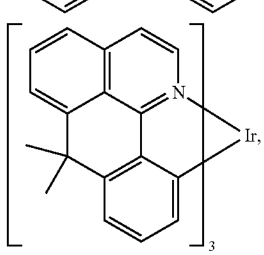
-continued
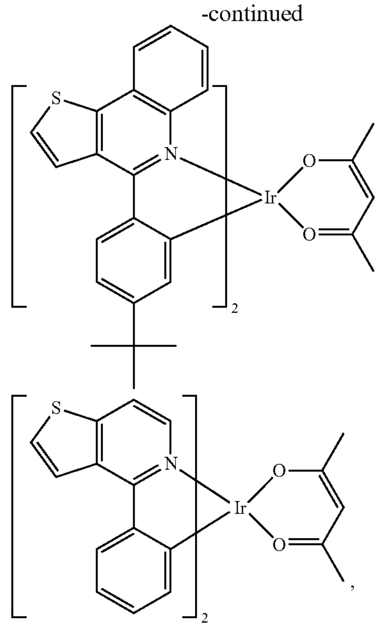
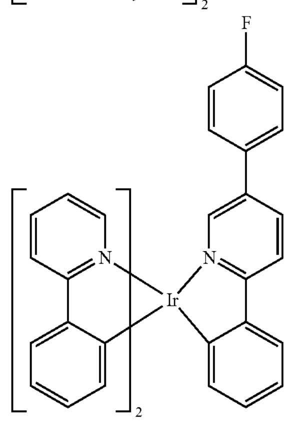
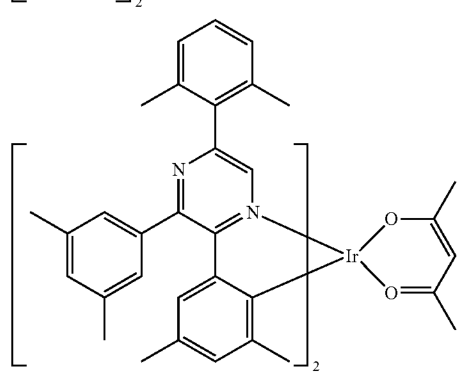
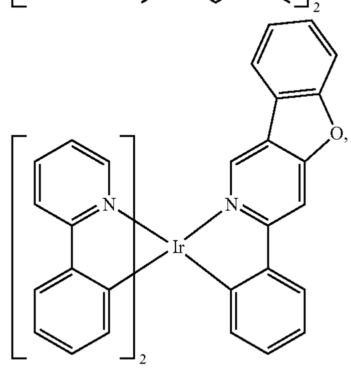

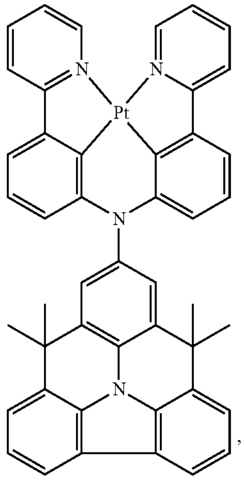
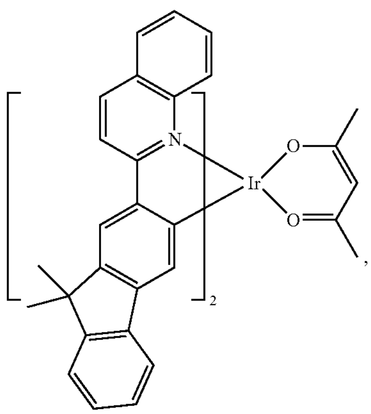
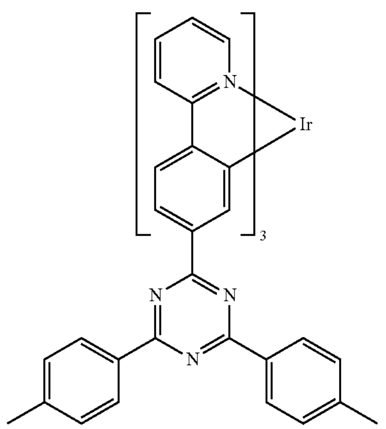
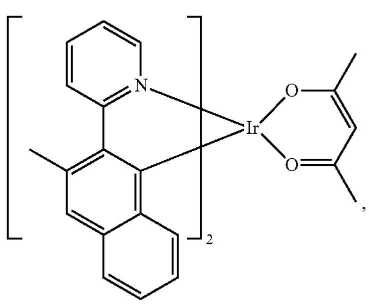
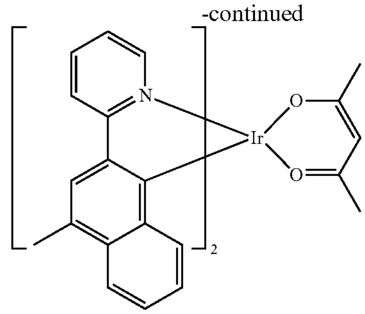
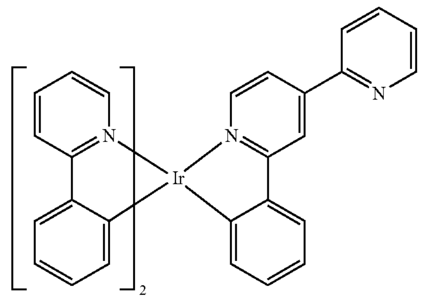
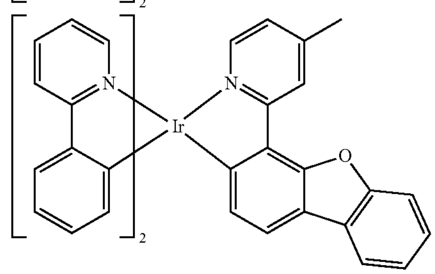
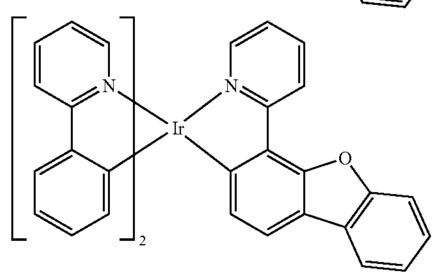
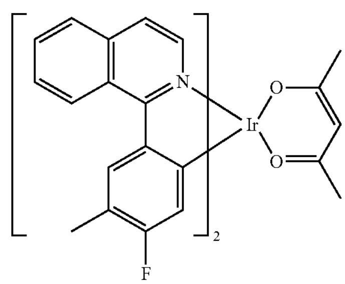
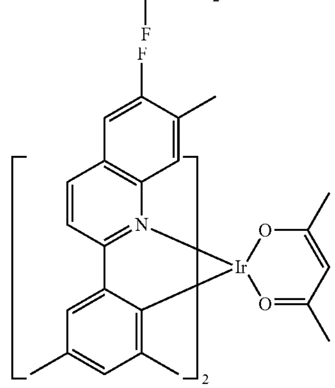

-continued
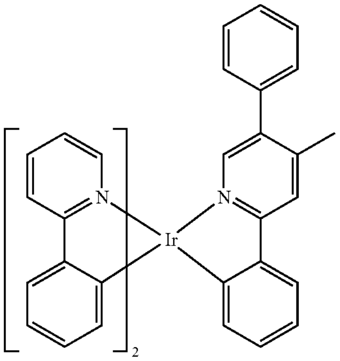
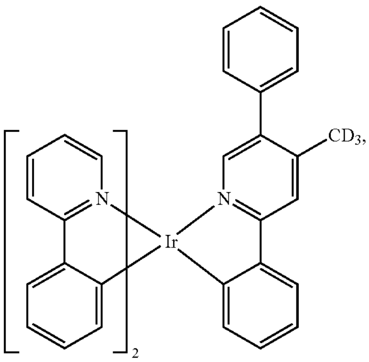
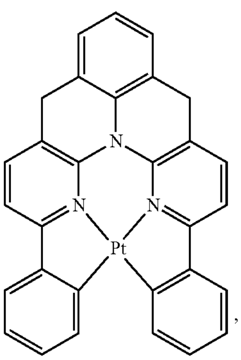
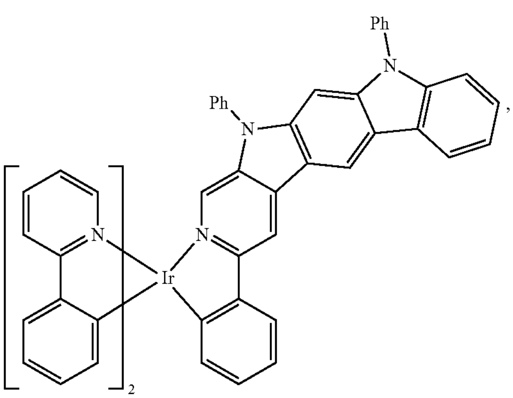
-continued
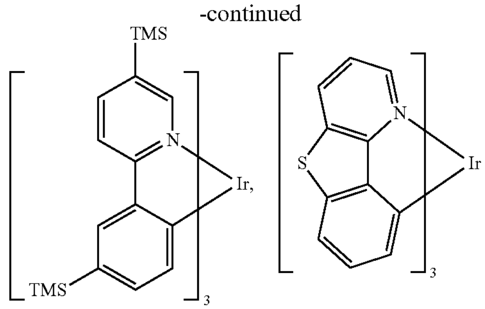
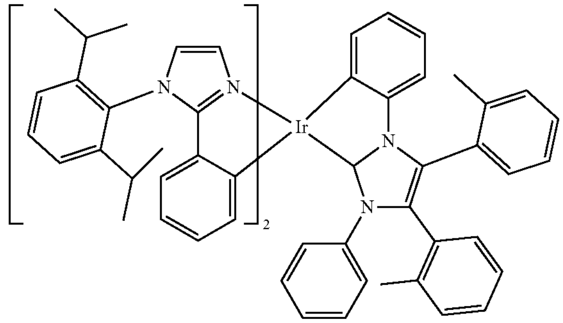
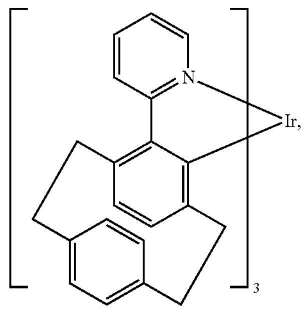
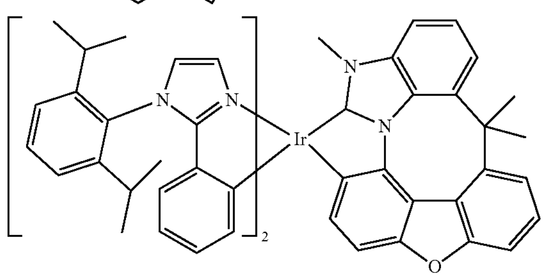
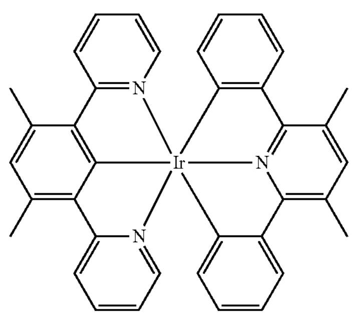
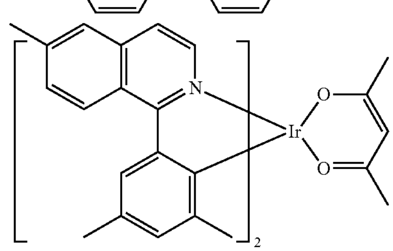

-continued
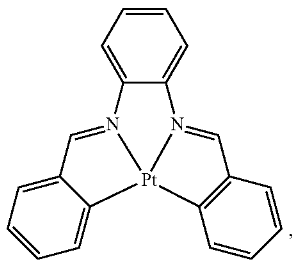
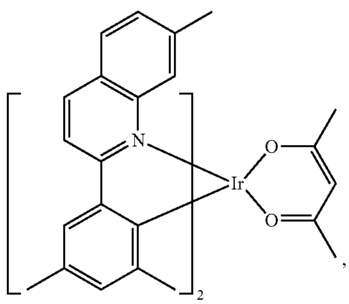
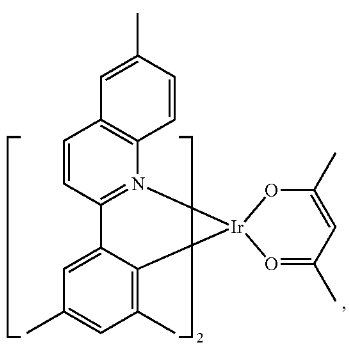
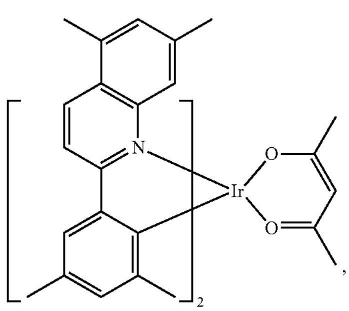
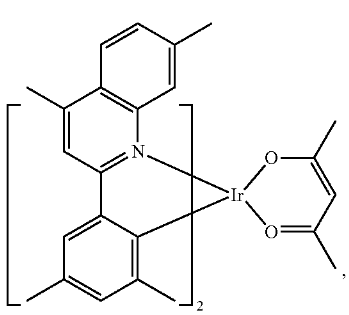
-continued
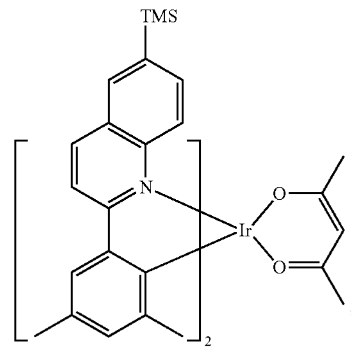
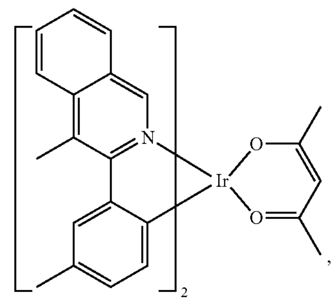
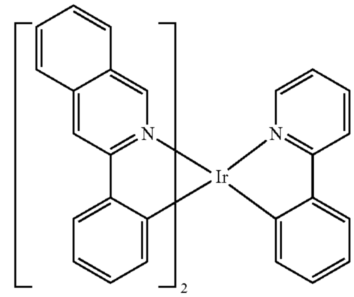
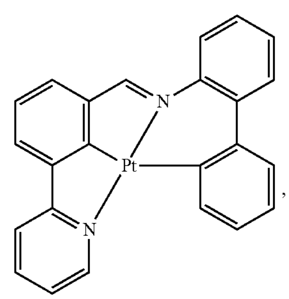
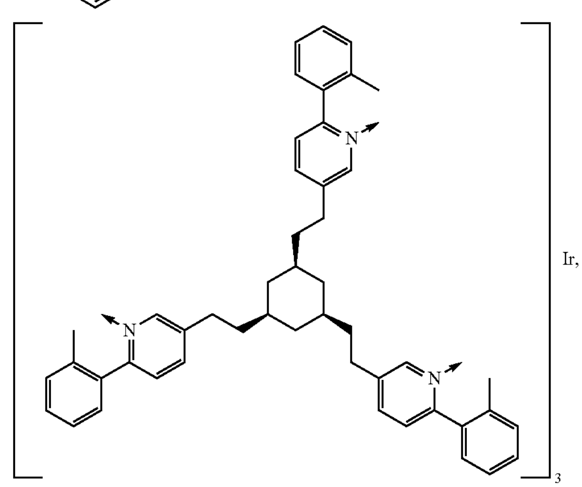

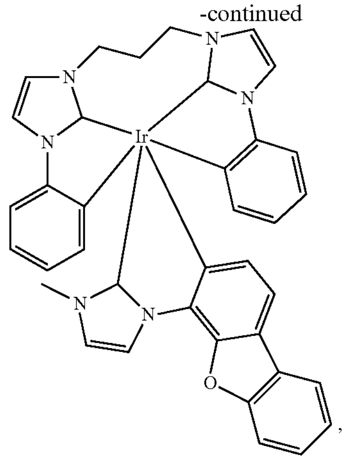
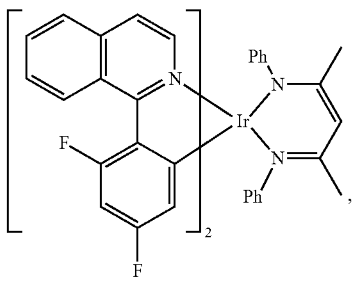
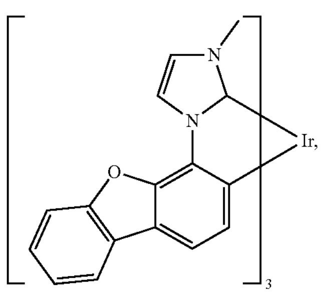
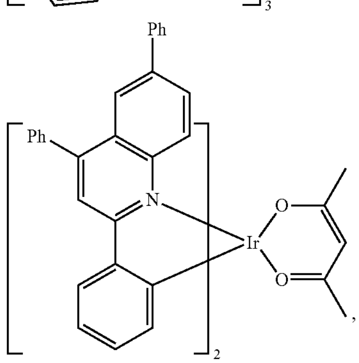
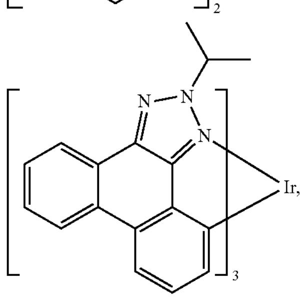
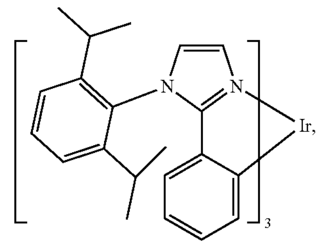
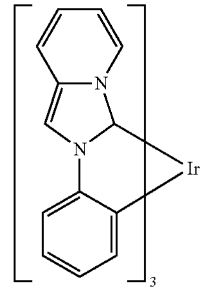
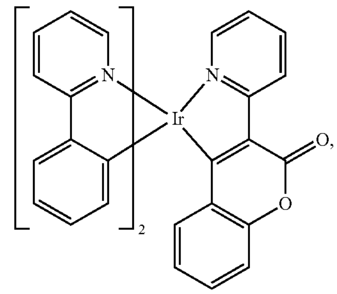
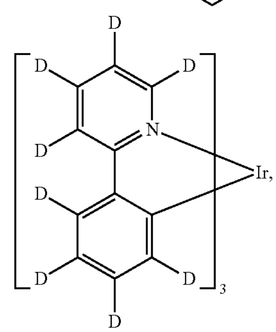
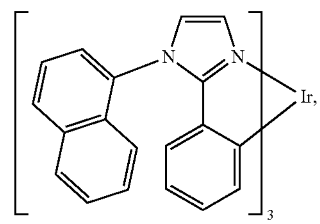
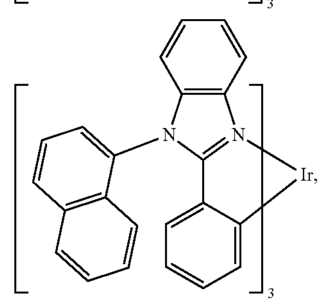
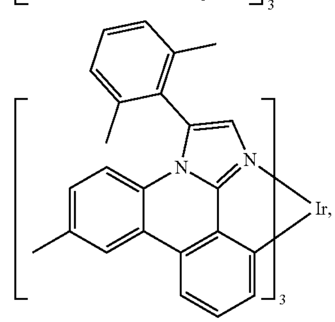

-continued

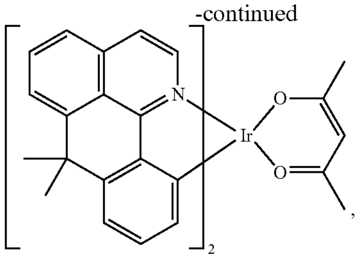

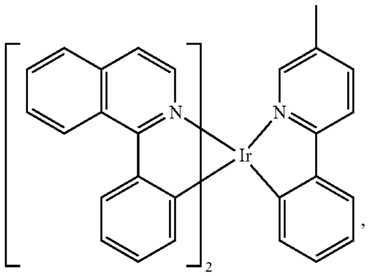

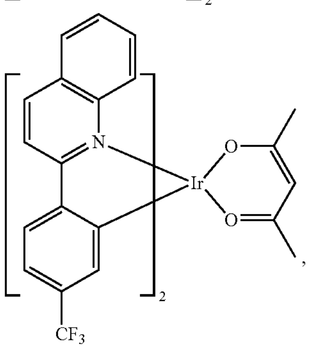

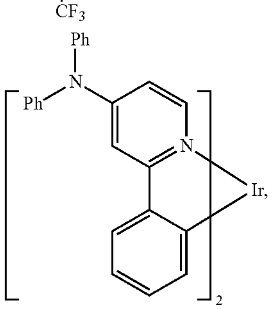

and

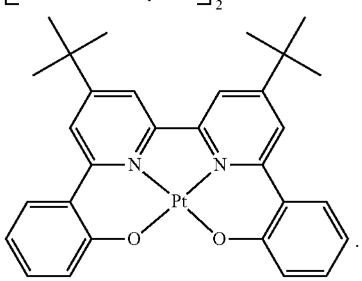

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

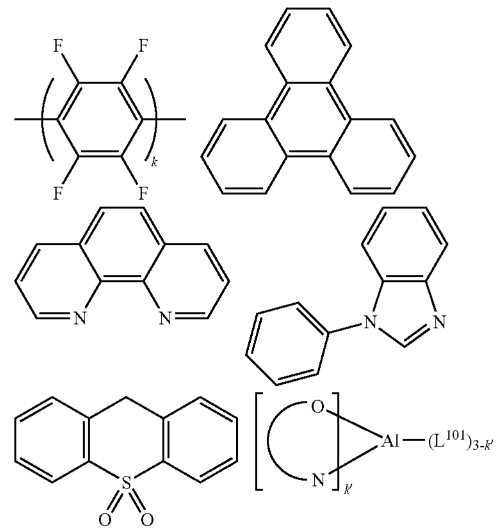

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

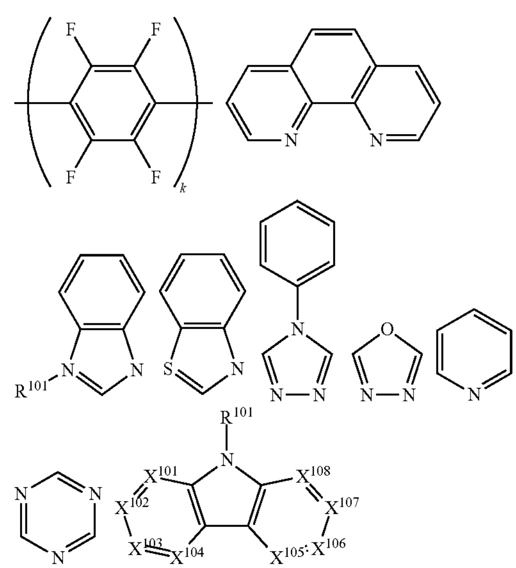

-continued

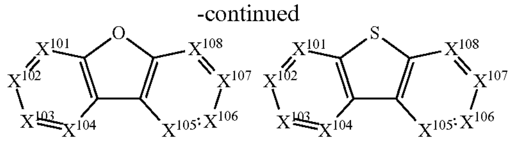

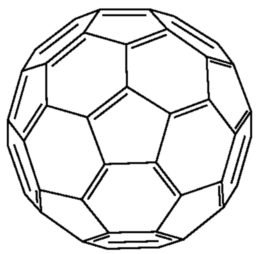

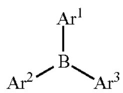

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

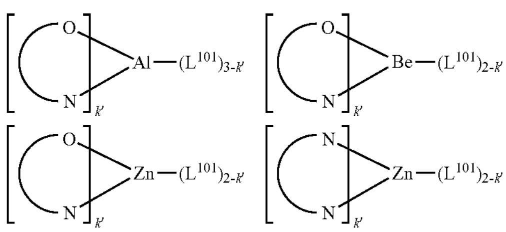

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

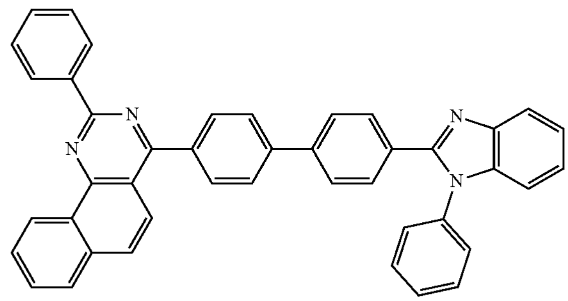

,

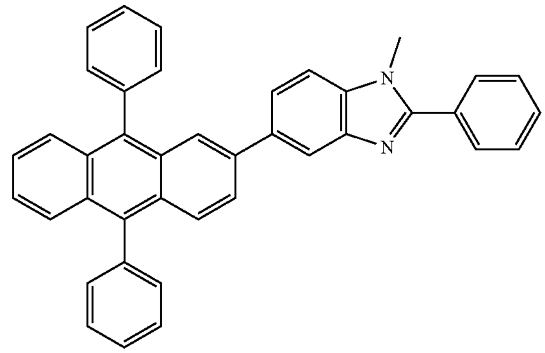

,

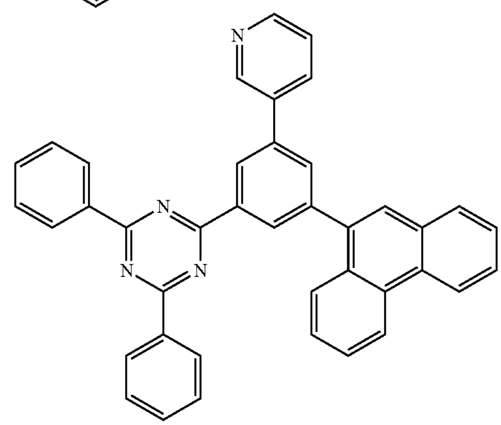

,

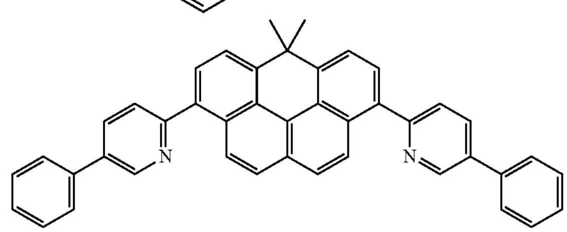

,

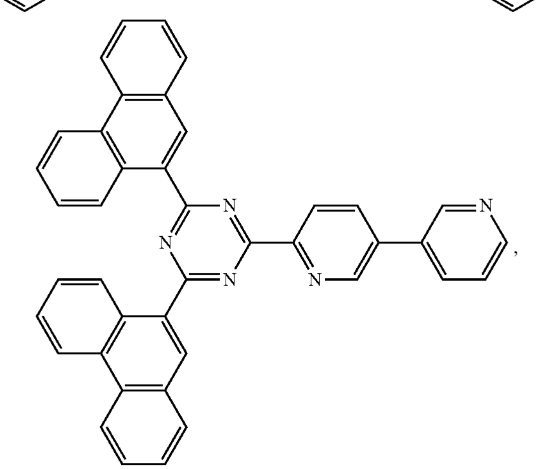

,

-continued
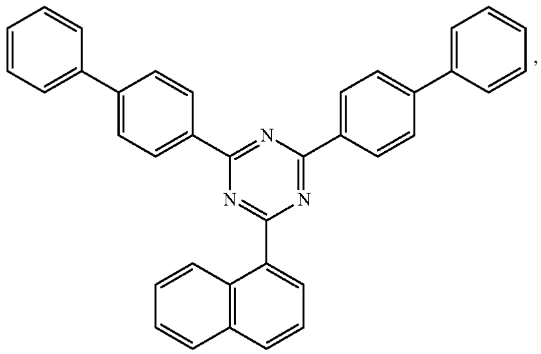
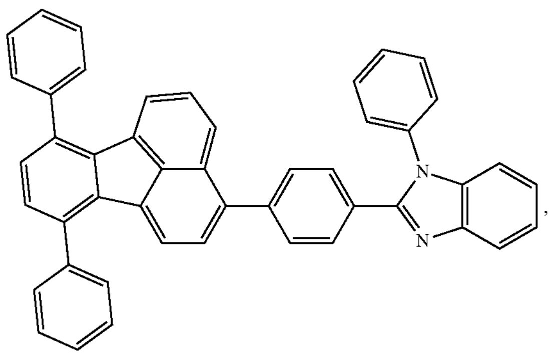
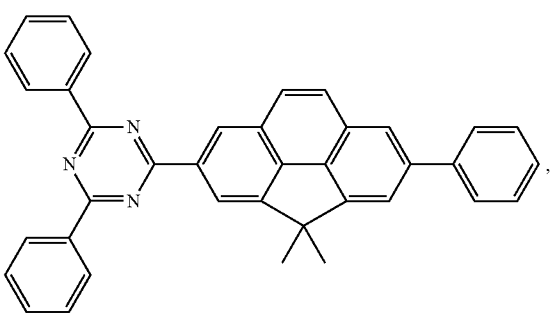
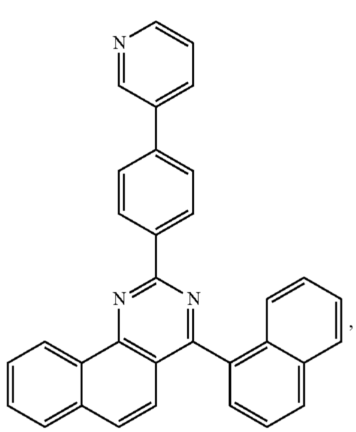
-continued
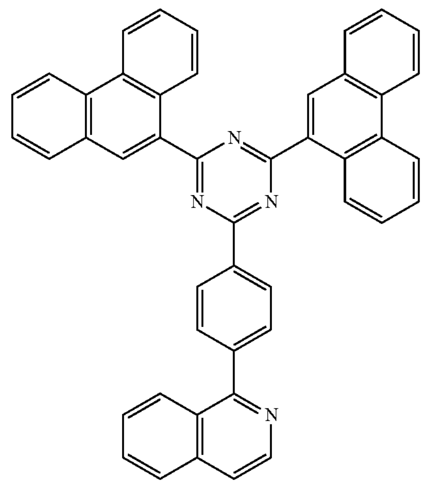
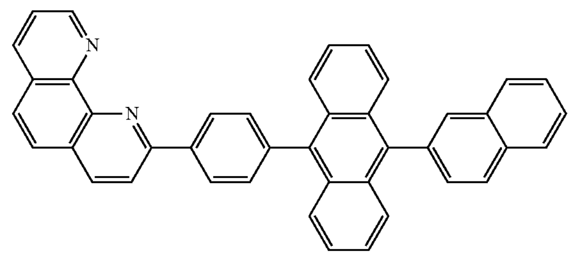
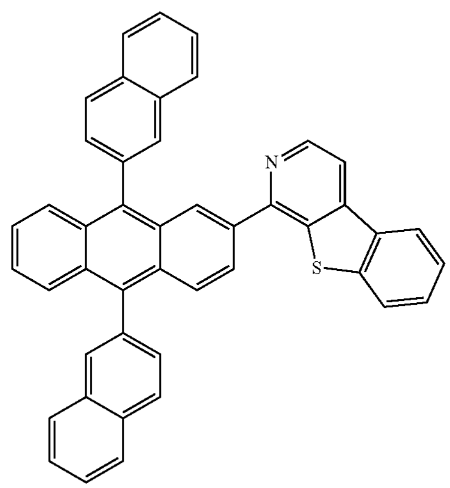
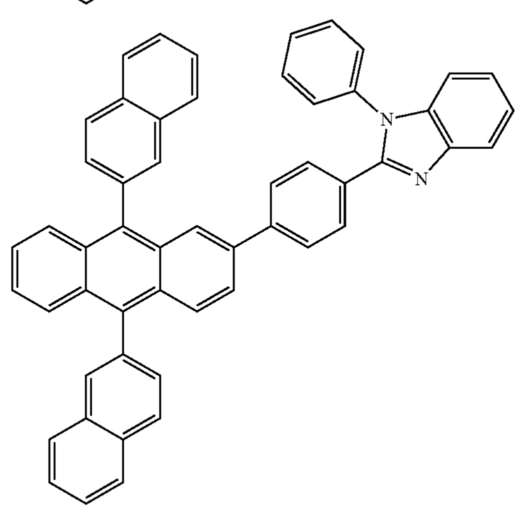

-continued
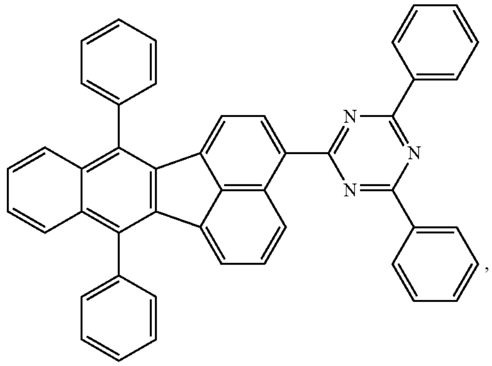
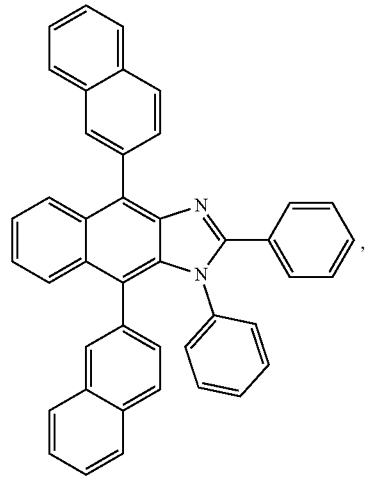
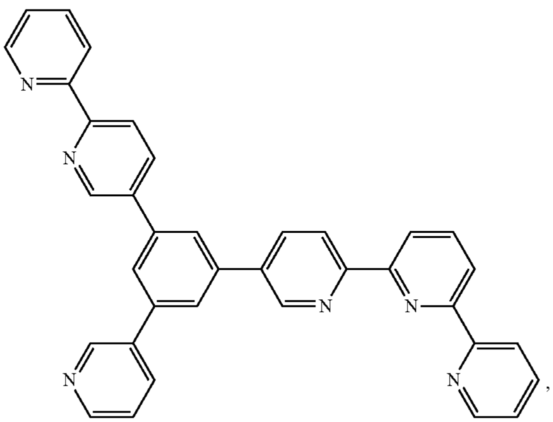
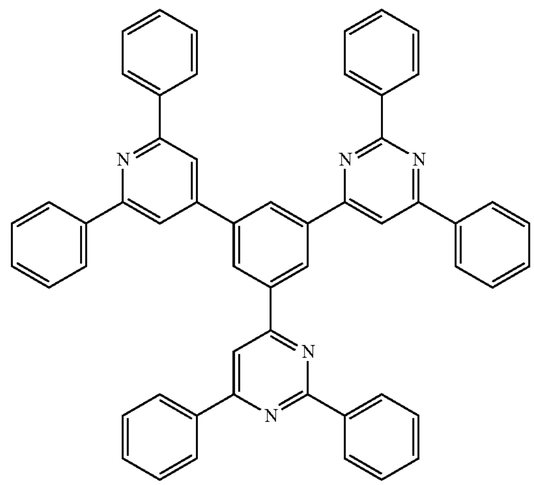
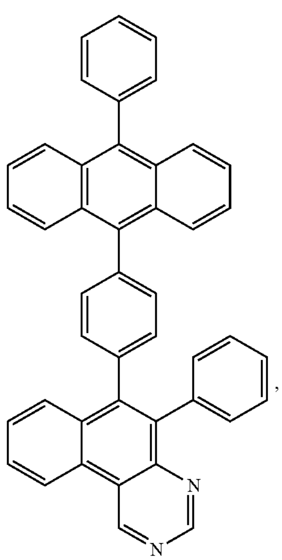
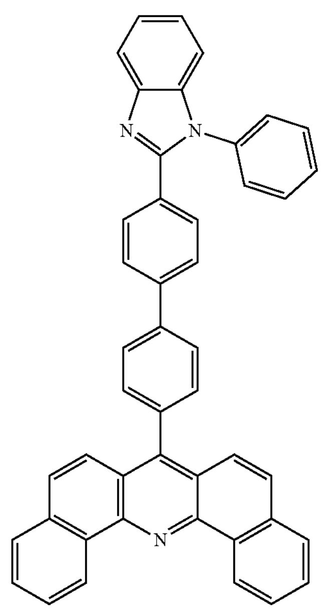

-continued
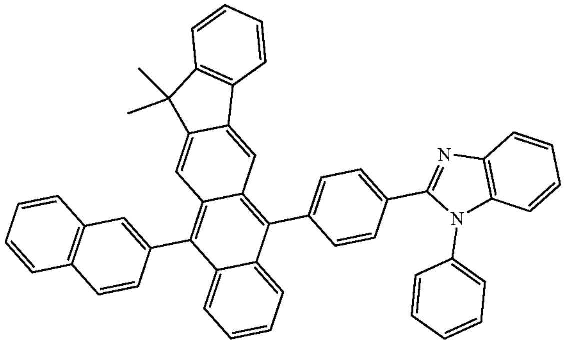
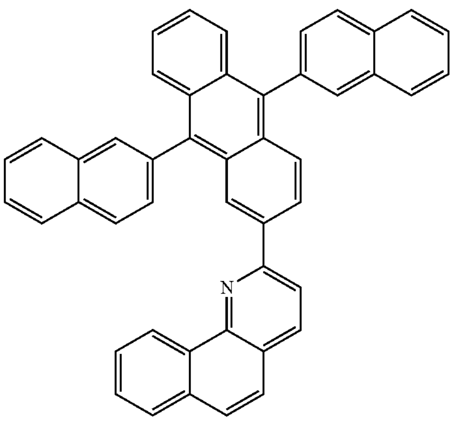
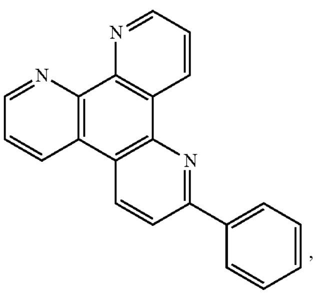
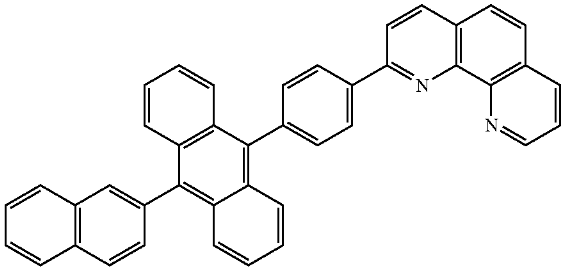
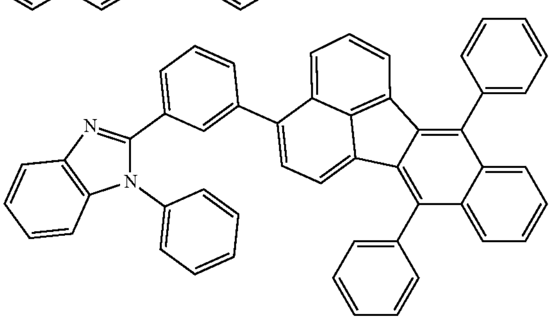
-continued
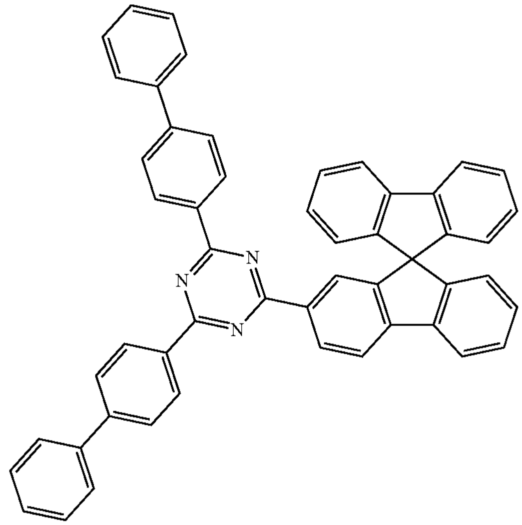
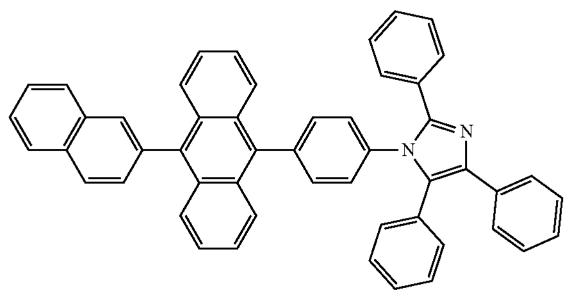
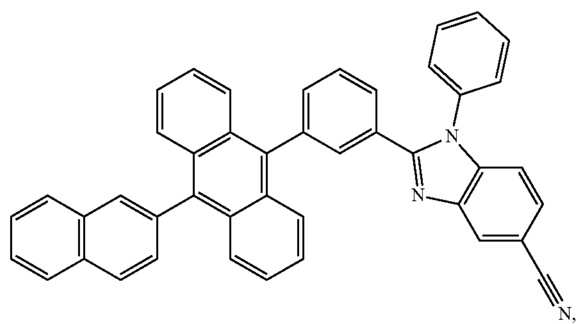
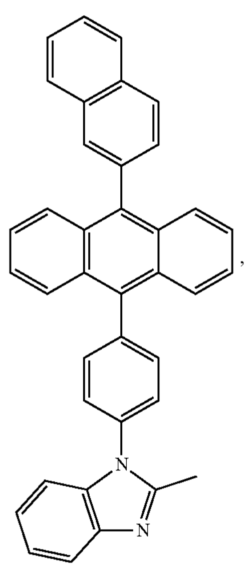

-continued

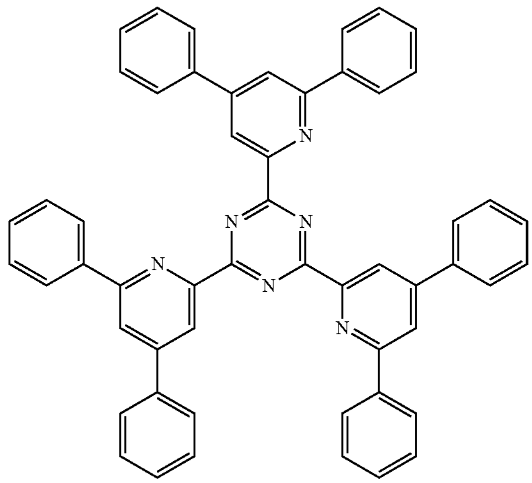

,

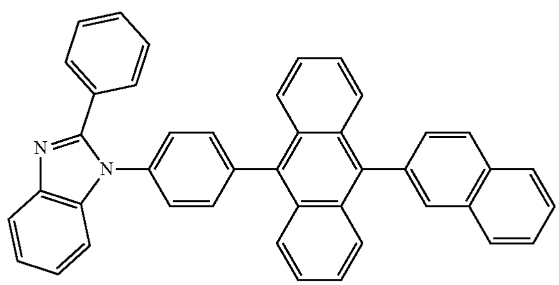

,

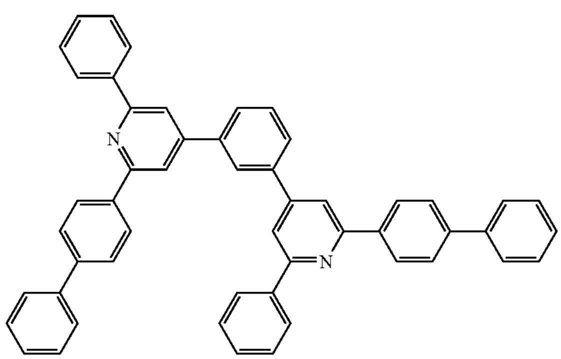

,

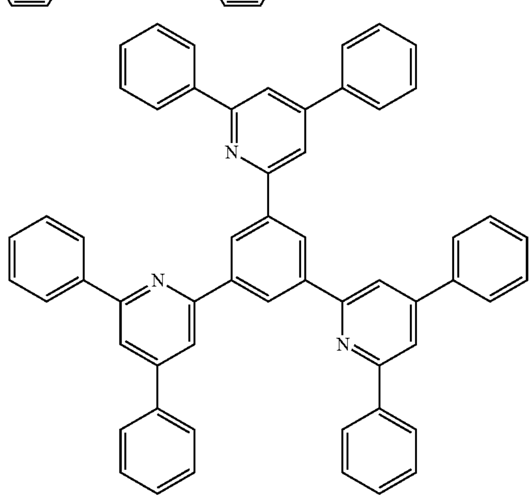

,

-continued

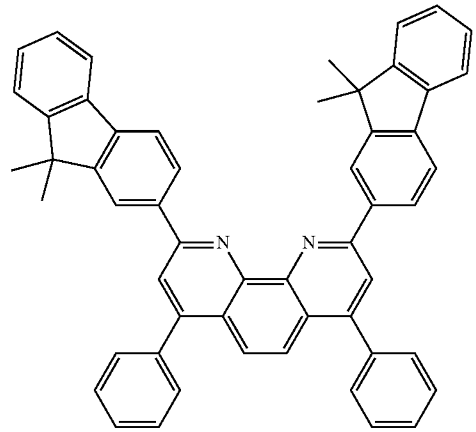

, and

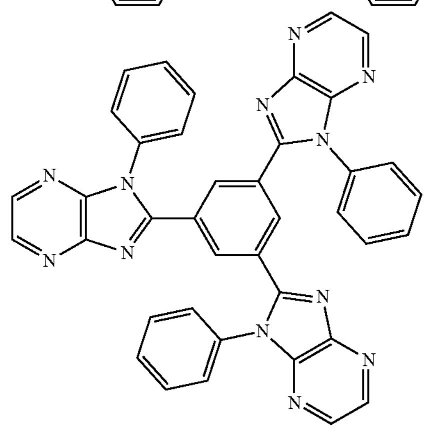

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

It is known that adding aza-Nitrogens to aromatic rings can blue-shift the color of emissive OLED ligands. Calculations indicate, however, that these Nitrogen atoms are quite basic. Without being bound by theory, such nitrogen atoms extract H+ ions from molecules in the OLED device and may contribute to device degradation. It is anticipated that presence of a more benign Lewis acid near the nitrogen will protect it from attack by H+ without adversely affecting optoelectronic properties. This has been confirmed by the DFT calculation of the Proton Affinities of tris-Iridium complexes in which one ligand has been protonated, i.e., the energy of $$H^{+}+Ir(L)_3 \rightarrow Ir(LH^{+})L_2$$

Proton Affinities were calculated by using Density Functional Theory (DFT) employing the B3LYP exchange-correlation functional and a LACVP* basis set. All calculations were performed in the ground electronic state. As can be seen from the table below, the presence of the Lewis Acid stabilizes the aza-Nitrogen, i.e., makes it energetically more difficult for the H+ to attach by more than 20 kcal/mol in each example. This stabilization will, in turn, stabilize the OLED device from degradation.

| Molecule | Label | Proton Affinity (kcal/mol) | Stabilization (kcal/mol) |
|---|---|---|---|
| 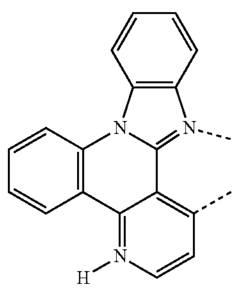 | Comparative Example 1 | 257.6 | n/a |
| 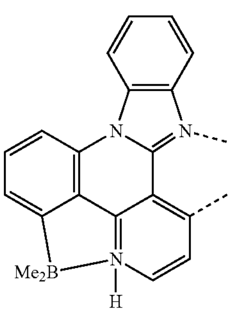 | LA33 | 234.0 | −23.6 |
| 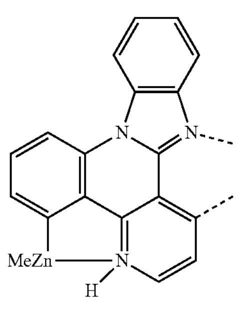 | LA397 | 236.0 | −21.6 |
| 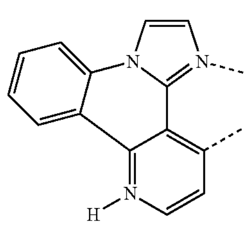 | Comparative Example 2 | 258.8 | n/a |

-continued

| Molecule | Label | Proton Affinity (kcal/mol) | Stabilization (kcal/mol) |
|---|---|---|---|
| 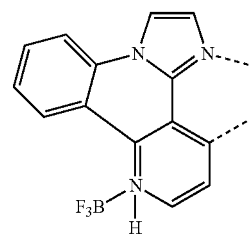 | LA458 | 234.9 | −23.9 |
| 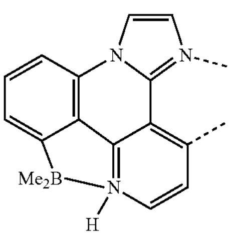 | LA36 | 235.5 | −23.3 |

Compound LA24 of the invention may be synthesized via two possible routes as shown in the schemes below. The synthesis of compounds 1, 2, and 6 are described in U.S. Patent Application publication No. 2015/0295189 A1. In the first step, the Pd-catalyzed reaction between 2-(4,4,5,5-tetramethyl-1,3,2-dioxaborolan-2-yl)aniline and 2-chloronicotinonitrile yields benzo[h][1,6]naphthyridin-5-amine, 1, which is then closed down with ortho-diiodobenzene to give benzo[h]benzo[4,5]imidazo[2,1-f][1,6]naphthytidine, 2. This can be reacted with Ir(acac)3 to give metal complex 6. This can be converted to the dimethylborane metal complex 5 as outlined in J. Org. Chem. 2010, 75, 8709. Compound 6 is reacted with $BBr_3$ and base to give 7 which is then reacted with $AlMe_3$ to give complex LA24. Alternatively, the borylated ligand 4 can be synthesized prior to metalation via the same reaction pathway.

Scheme 1. Synthesis of compound 2.

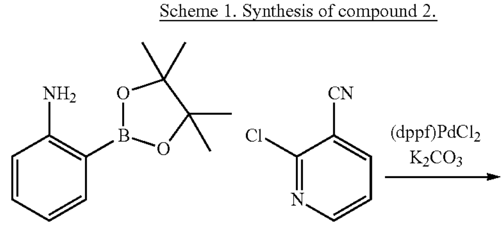

-continued
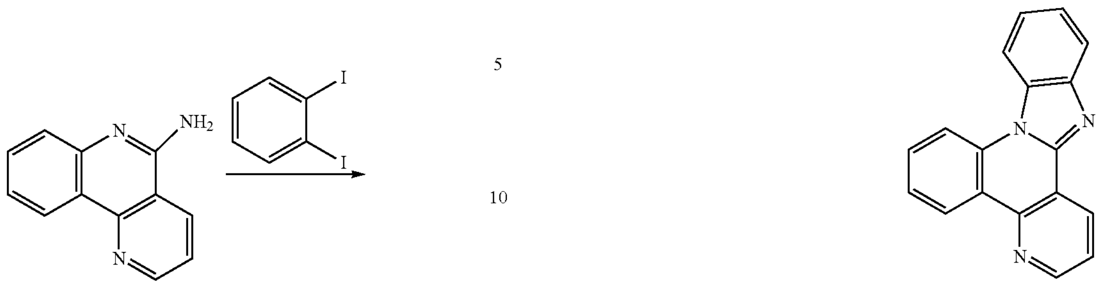
1 2
Scheme 2. Possible synthetic pathways to complex LA24.
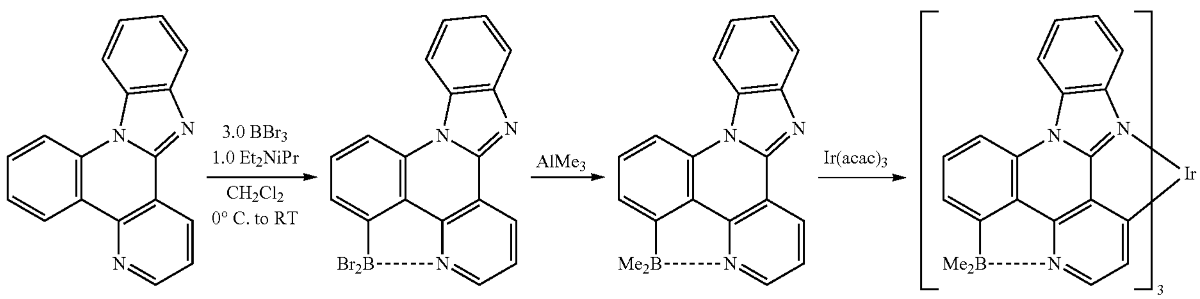
2 3 4 LA24
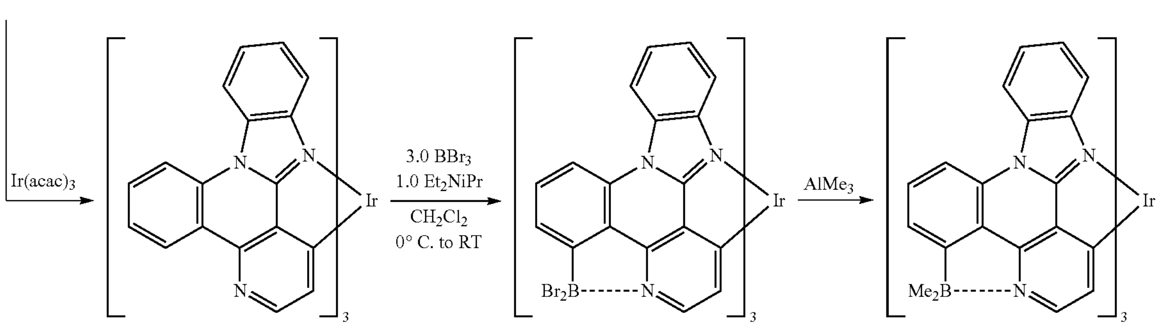
6 7 LA24

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a structure selected from the group consisting of:

Formula I

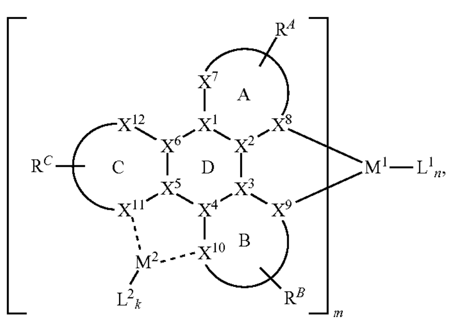

and

Formula II

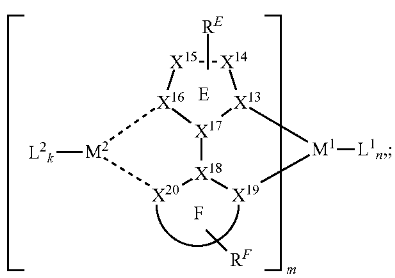

wherein $X^1$ to $X^{20}$ are each independently selected from the group consisting of carbon and nitrogen;

wherein in Formula I, rings A, B, and C are each independently a 5- or 6-membered aromatic ring, and all are fused to ring D and form a first ligand having an 18-π electronic system;

wherein one of the rings A, B, and C is a 5-membered aromatic ring, and the remaining rings A, B, and C are each independently a 6-membered aromatic ring;

wherein in Formula II, ring E is a 5-membered aromatic ring, ring F is a 5- or 6-membered aromatic ring, the structure formed by ring E and ring F connected together forms a first ligand in Formula II;

wherein $R^A$, $R^B$, $R^C$, $R^E$, and $R^F$ each independently represents none to a maximum possible number of substitutions;

wherein $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein any substitutions in $R^A$, $R^B$, $R^C$, $R^E$, and $R^F$ are optionally joined or fused into a ring;

wherein $M^1$ is a metal having atomic weight greater than 40;

wherein $M^2$ is selected from the group consisting of B, Al, Ga, Si, Ge, Sn, Zn, Cd, Pd, Pt, Co, Rh, Ir, Re, Ru, Os, Cu, Ag, and Au;

wherein $M^1$ and $M^2$ are different;

wherein in Formula I, $M^2$ coordinates to at least one of $X^{10}$ and $X^{11}$, and in Formula II, $M^2$ coordinates to at least one of $X^{16}$ and $X^{20}$;

wherein when the compound has the structure of Formula I and $M^2$ is B, $L^2$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, heteroaryl, acyl, carboxylic acid, ether, ester, nitrile, isonitrile, sulfanyl, sulfinyl, sulfonyl, phosphino, and combinations thereof;

wherein m and n have a value of at least 1 and m+n is the maximum possible number of ligands that are attached to $M^1$;

wherein k has a value of at least 1 and is the maximum possible number of ligands $L^2$ that can be attached to $M^2$;

wherein each $L^1$ is a bidentate ligand; and wherein the first ligand is optionally linked with $L^1$ to comprise a mutidentate ligand.

2. The compound of claim 1, wherein $R^A$, $R^B$, $R^C$, $R^E$, $R^F$, and $L^2$ are each independently selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

3. The compound of claim 1, wherein $M^1$ is selected from the group consisting of Ir, Rh, Re, Ru, Os, Pt, Au, and Cu.

4. The compound of claim 1, wherein $M^1$ is Ir or Pt.

5. The compound of claim 1, wherein $M^2$ is selected from the group consisting of B, Al, Zn, Si, and Ge.

6. The compound of claim 1, wherein the first ligand-$M^1$ is selected from the group consisting of:

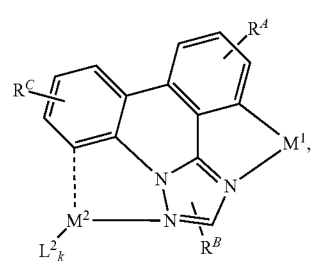

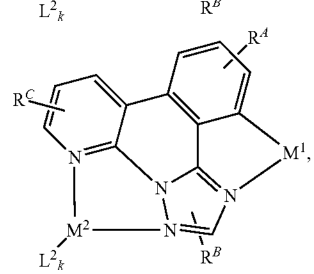

-continued
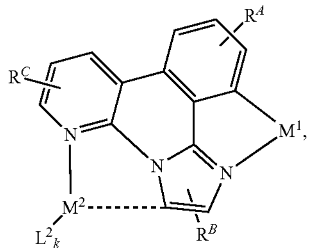
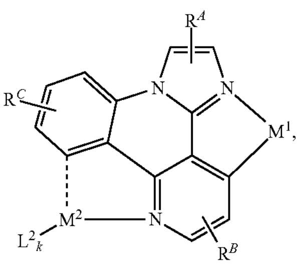
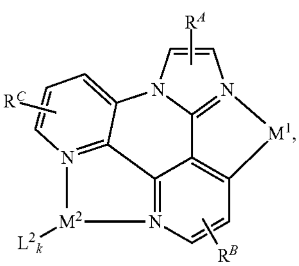
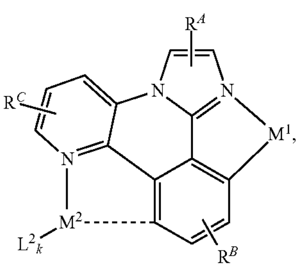
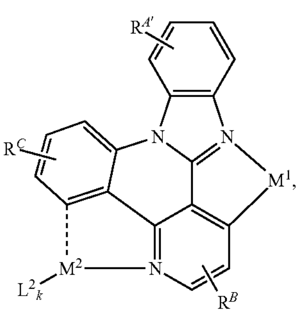
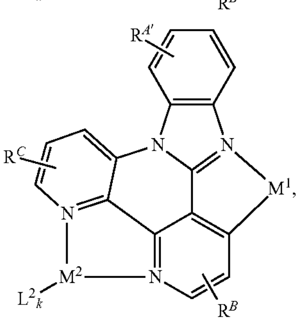
-continued
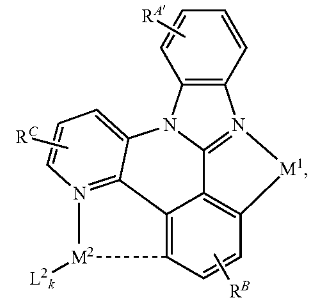
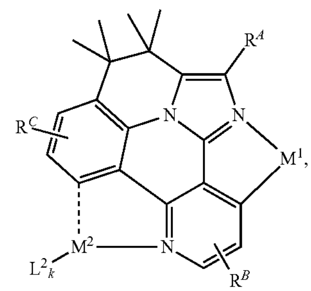
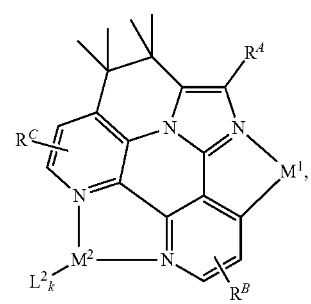
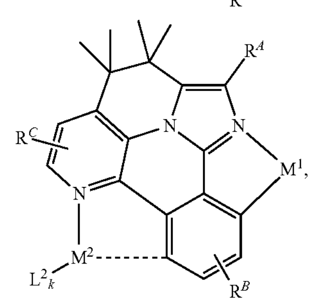
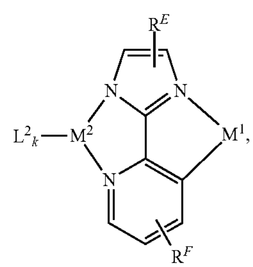
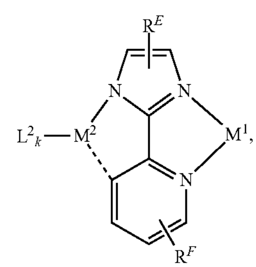
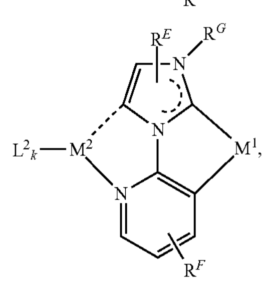
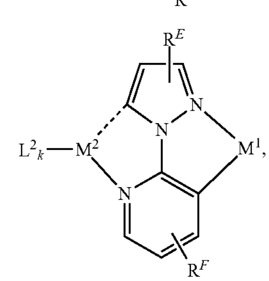

-continued
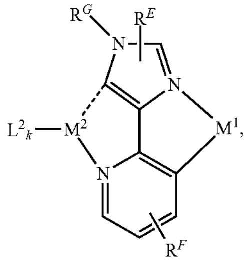
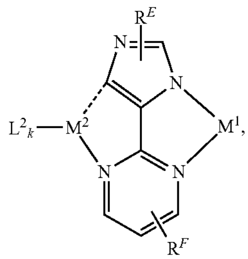
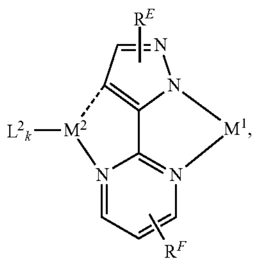
and
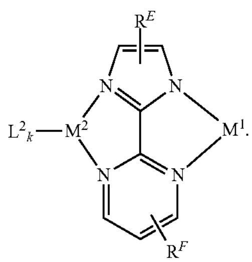
7. The compound of claim 1, wherein the first ligand-$M^1$ structure is selected from the group consisting of:
LA1
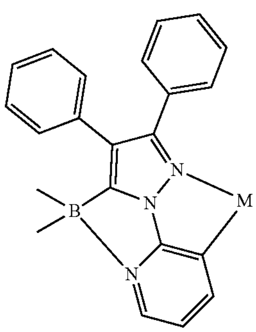
LA2
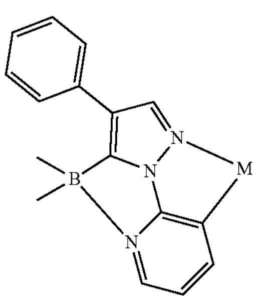
-continued
LA3
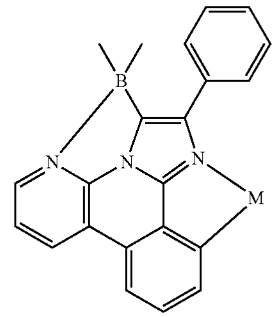
LA4
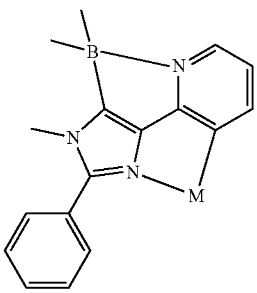
LA5
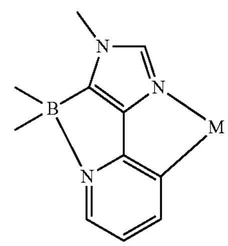
LA6
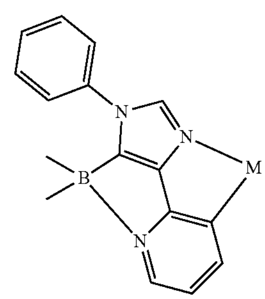
LA7
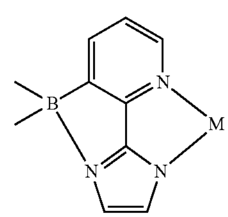
LA8
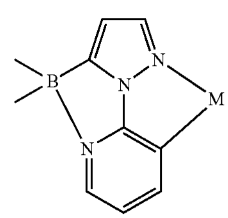

LA9
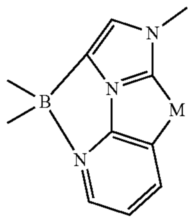
LA10
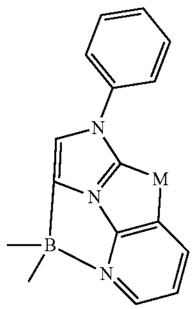
LA11
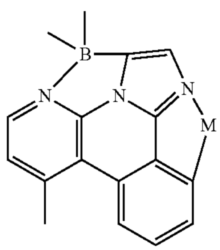
LA12
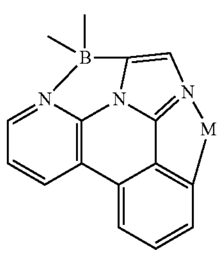
LA13
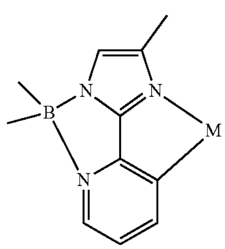
LA14
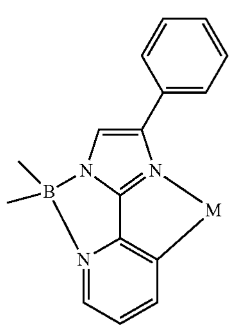
LA15
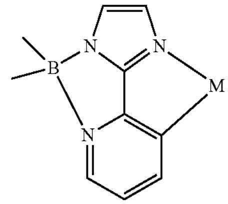
LA16
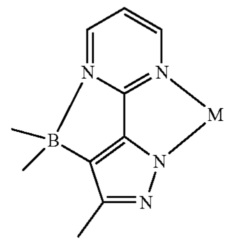
LA17
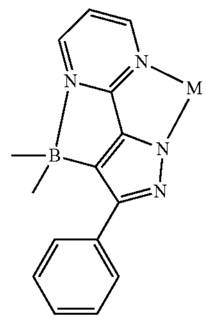
LA18
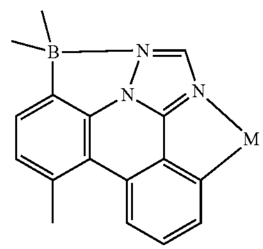
LA20
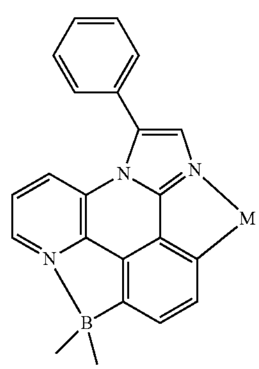
LA21
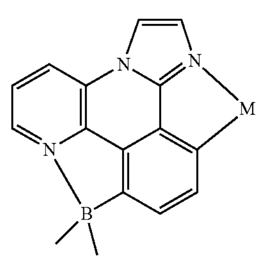

-continued
LA22
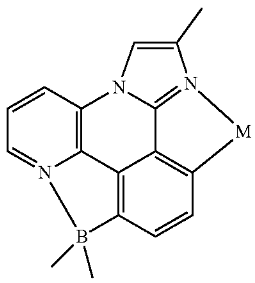
LA23
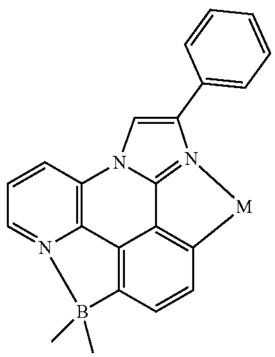
LA24
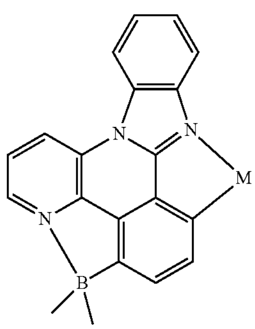
LA25
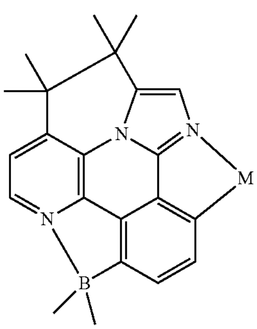
LA26
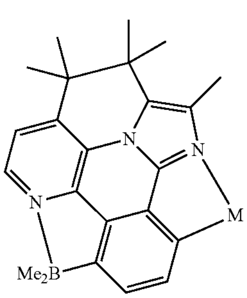
-continued
LA27
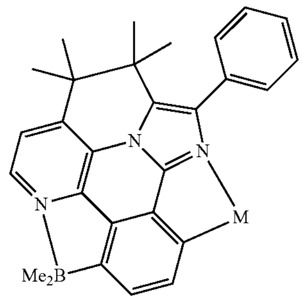
LA28
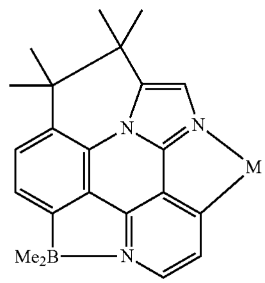
LA29
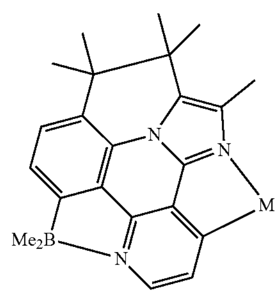
LA30
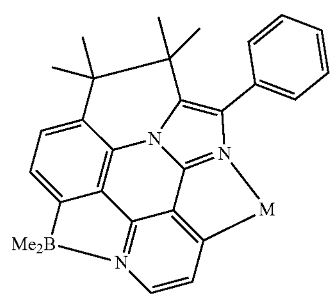
LA32
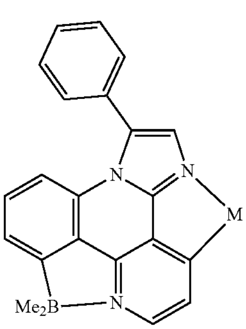

LA33
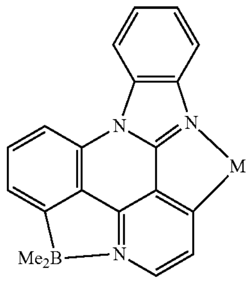
LA34
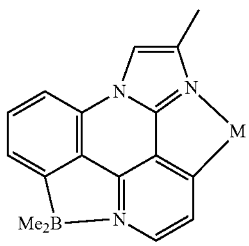
LA35
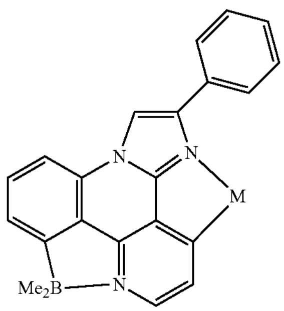
LA36
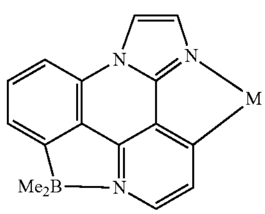
LA37
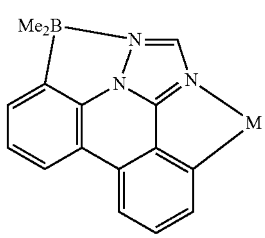
LA38
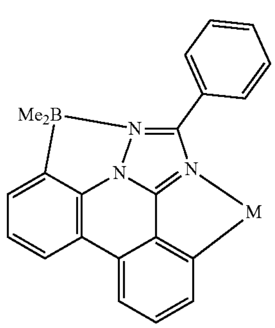
LA39
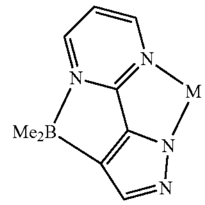
LA40
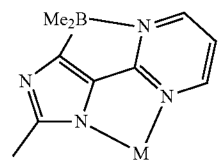
LA41
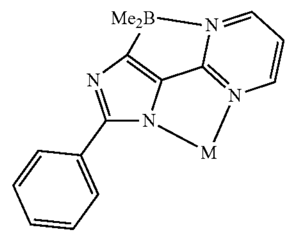
LA42
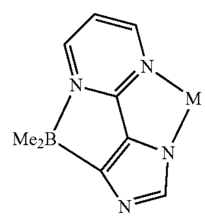
LA43
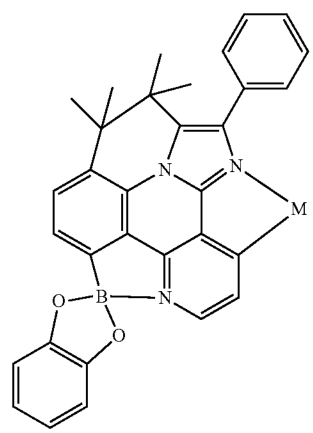
LA44
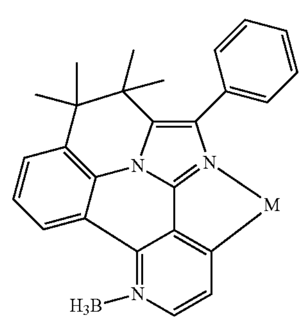

-continued
LA45
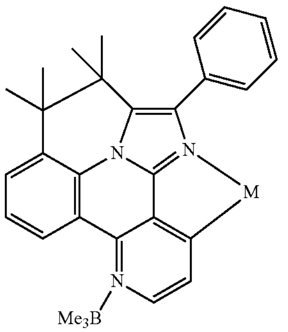
LA46
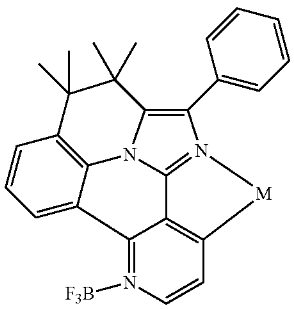
LA47
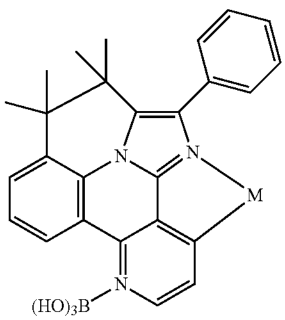
LA48
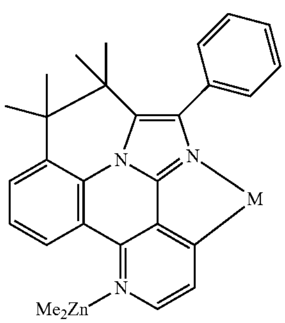
LA51
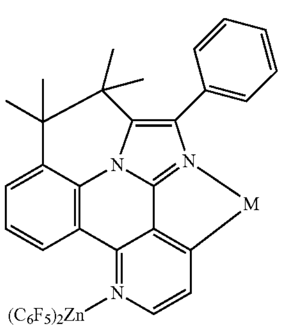
-continued
LA52
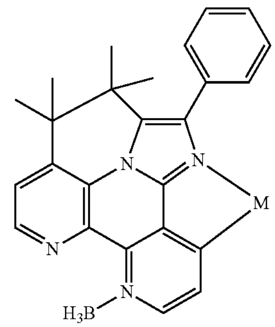
LA53
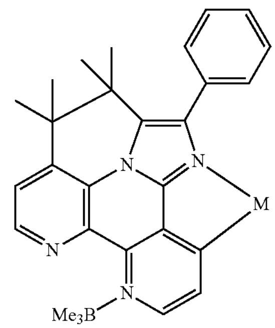
LA54
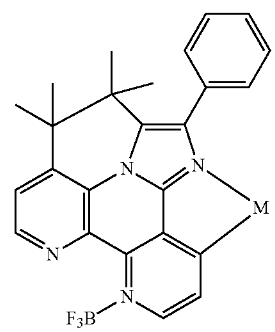
LA55
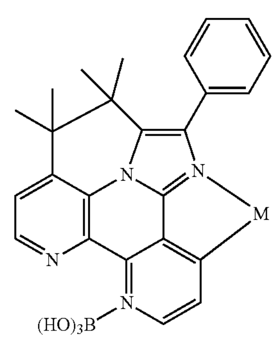

LA58
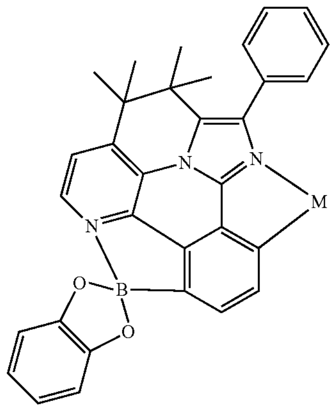
LA59
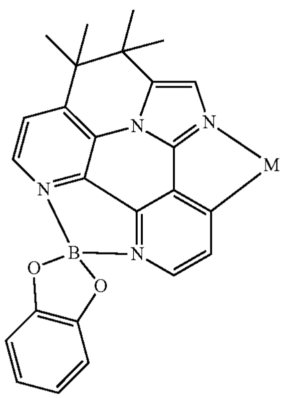
LA60
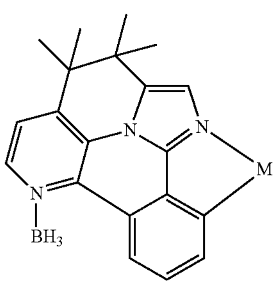
LA62
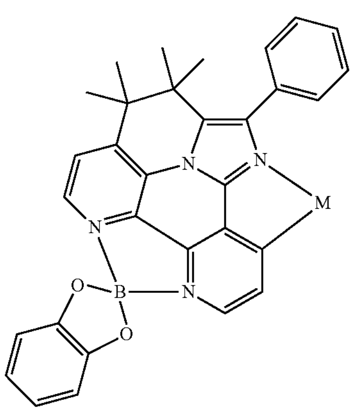
LA63
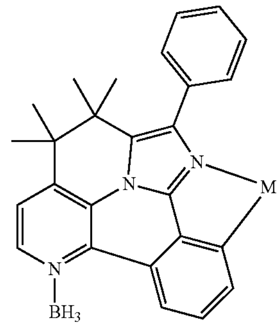
LA64
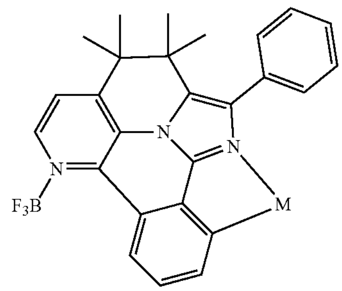
LA67
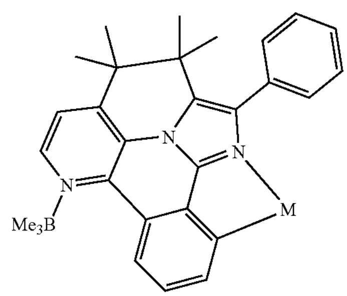
LA68
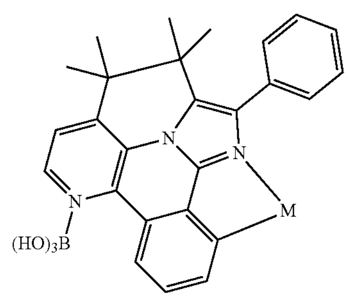
LA69
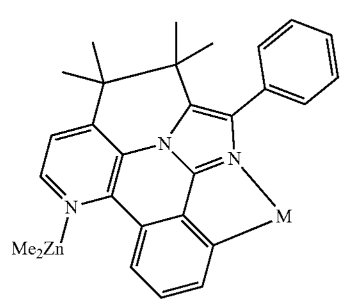

-continued
LA70
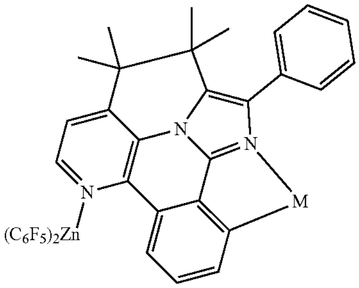
LA71
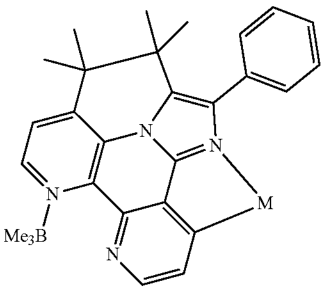
LA72
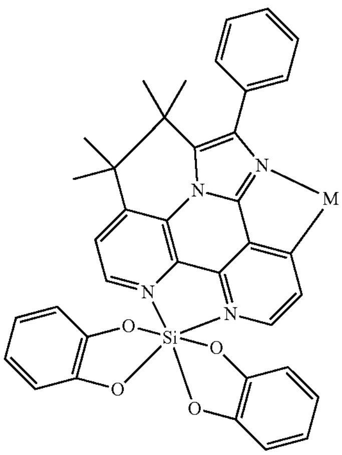
LA73
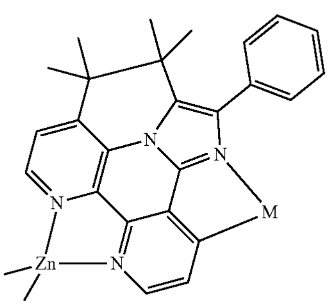
LA74
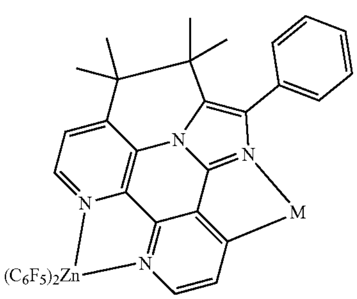
-continued
LA75
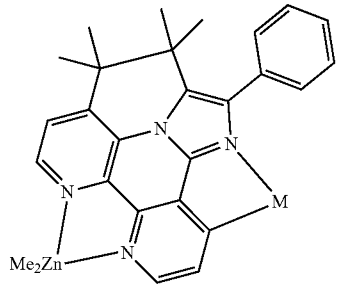
LA76
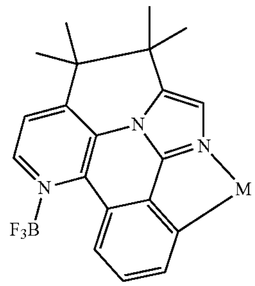
LA78
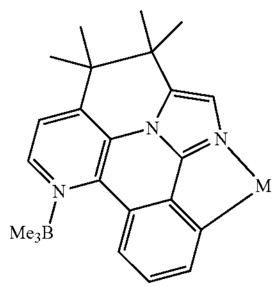
LA79
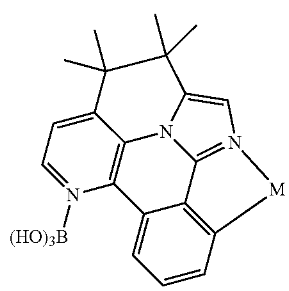
LA80
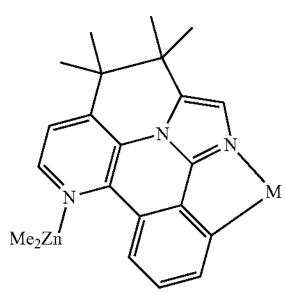

-continued
LA81
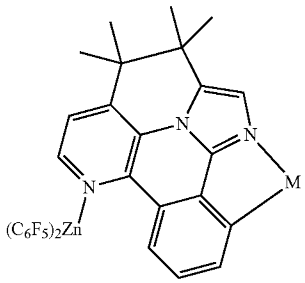
LA82
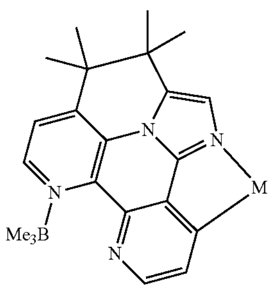
LA83
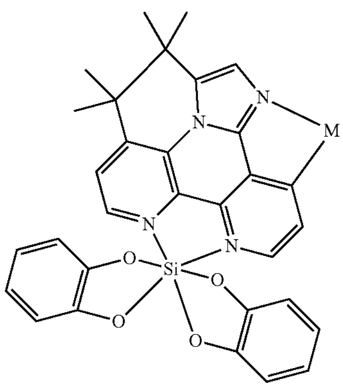
LA84
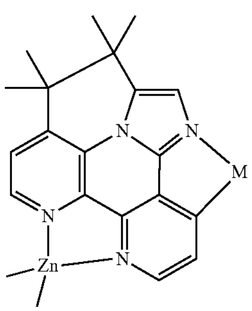
LA85
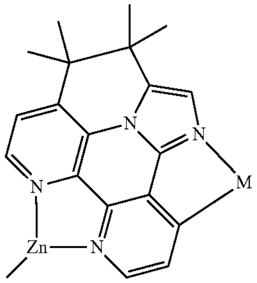
-continued
LA86
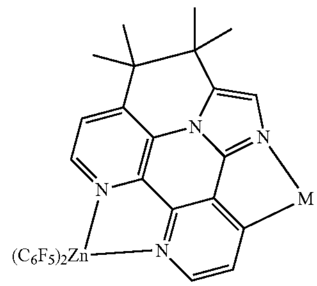
LA87
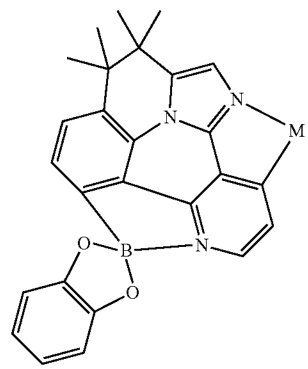
LA88
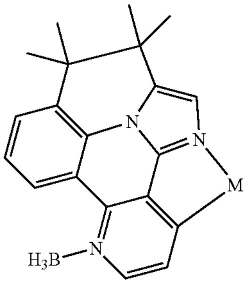
LA89
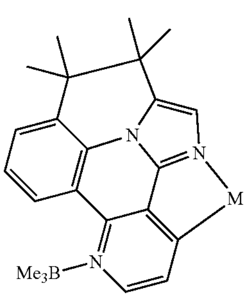
LA90
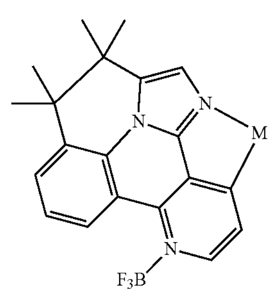

-continued
LA92
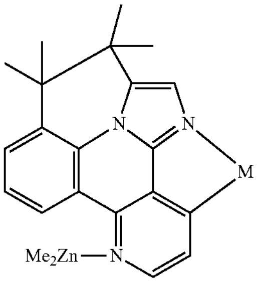
LA93
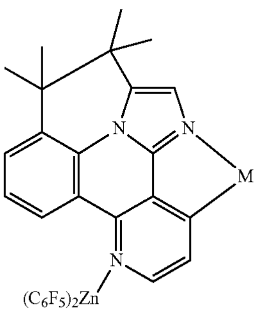
LA94
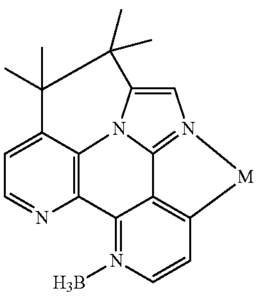
LA95
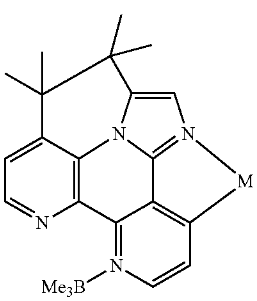
LA96
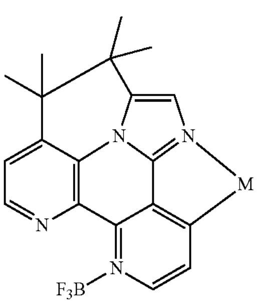
-continued
LA97
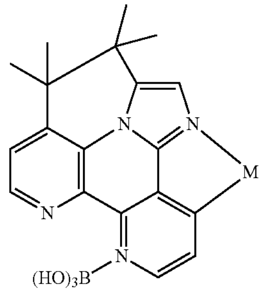
LA100
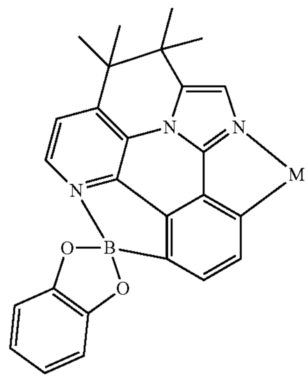
LA101
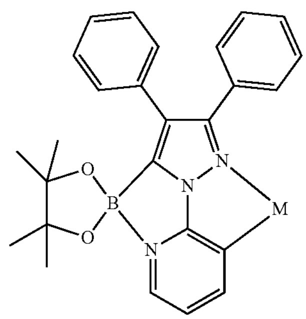
LA102
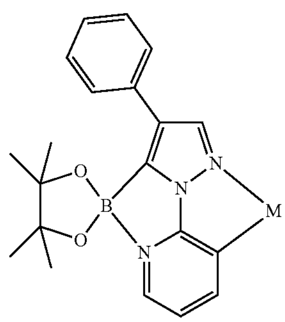
LA103
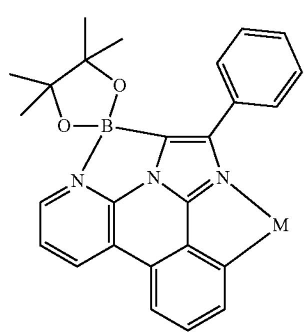

-continued
LA104
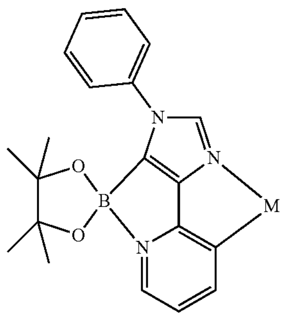
LA105
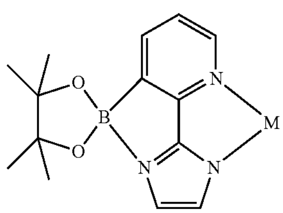
LA106
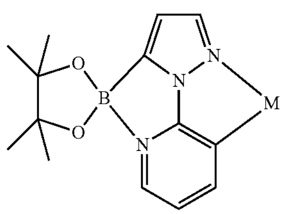
LA107
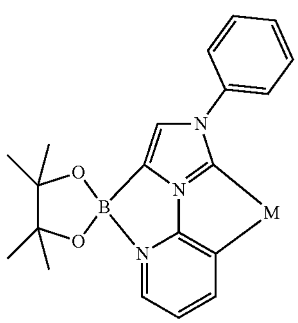
LA108
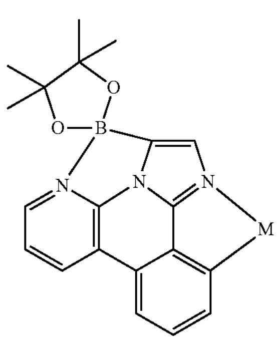
-continued
LA109
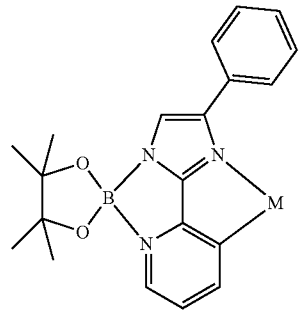
LA110
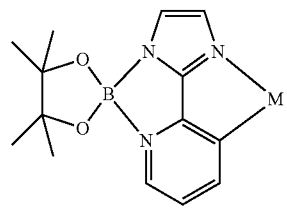
LA111
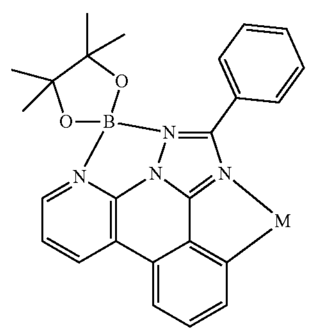
LA112
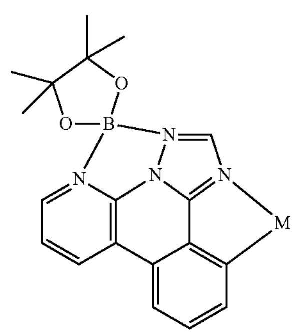
LA113
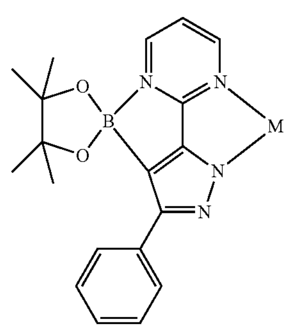

LA115
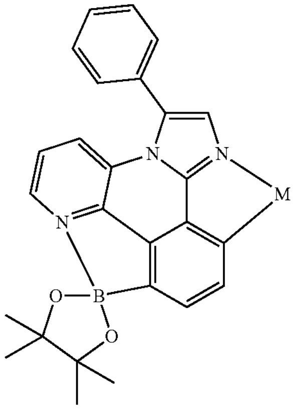
LA116
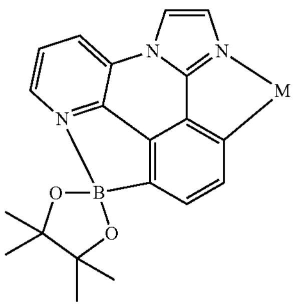
LA117
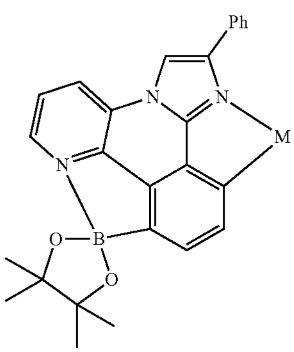
LA118
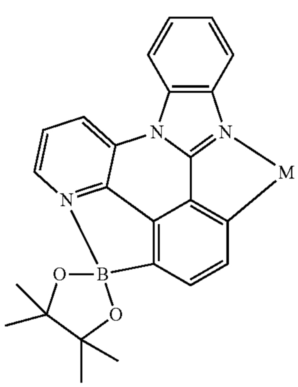
LA119
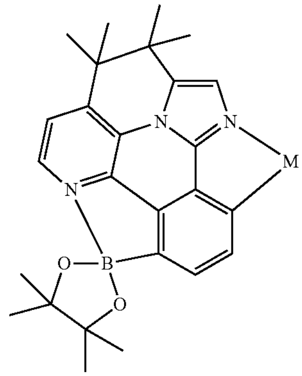
LA120
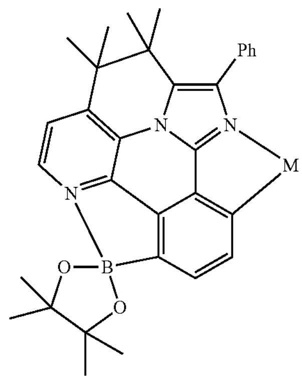
LA121
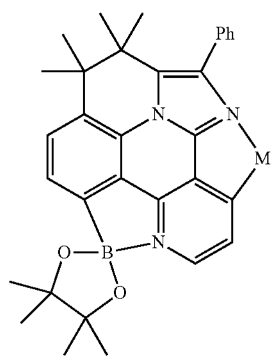
LA122
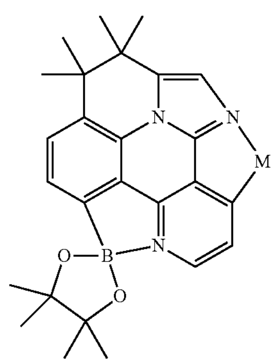

-continued
LA124
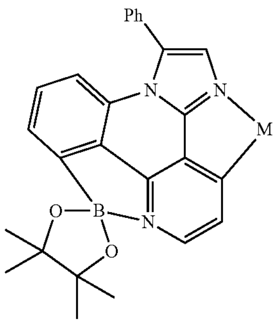
LA125
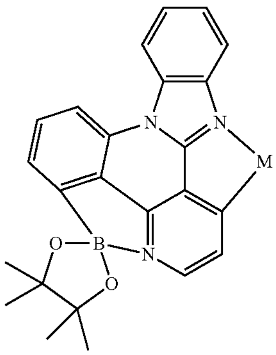
LA126
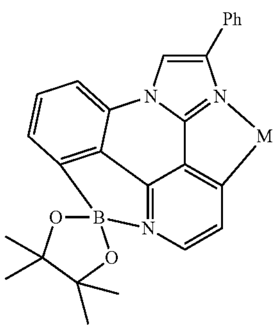
LA127
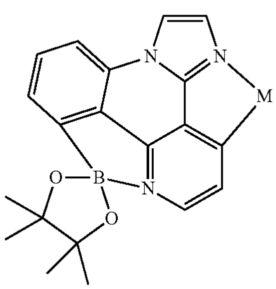
LA128
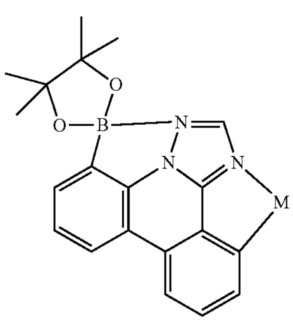
-continued
LA129
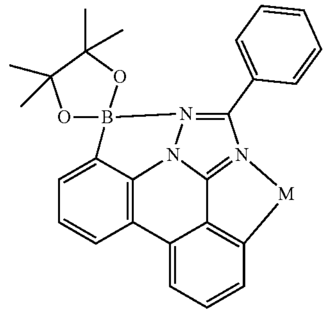
LA130
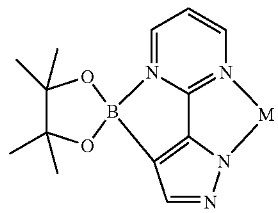
LA131
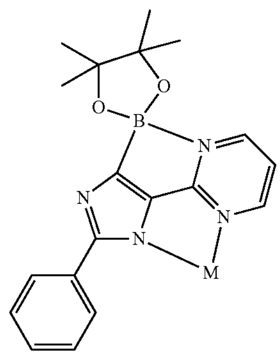
LA132
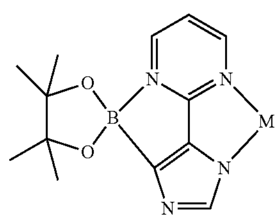
LA133
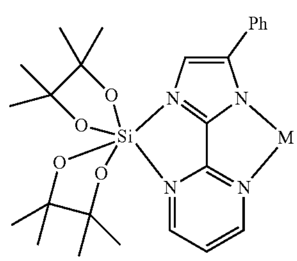
LA134
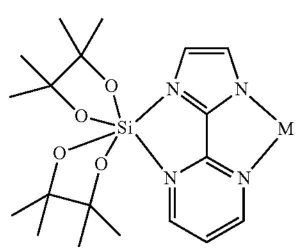

-continued
LA135
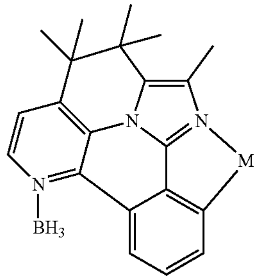
LA136
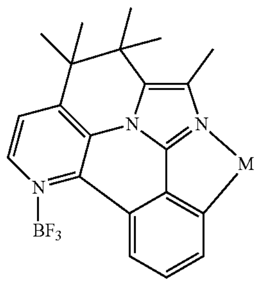
LA139
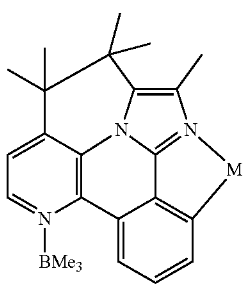
LA140
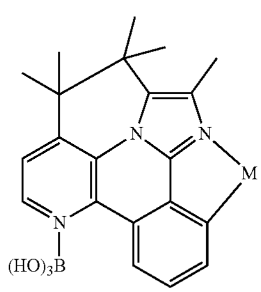
LA141
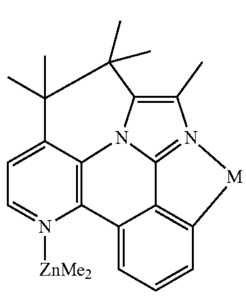
-continued
LA142
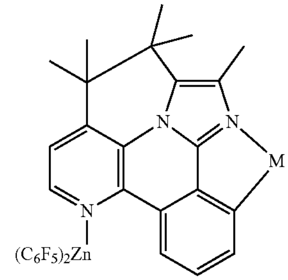
LA142
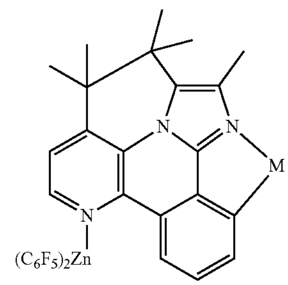
LA143
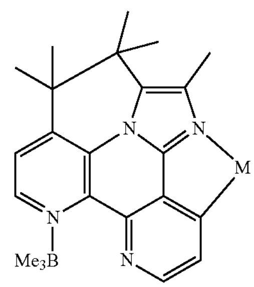
LA144
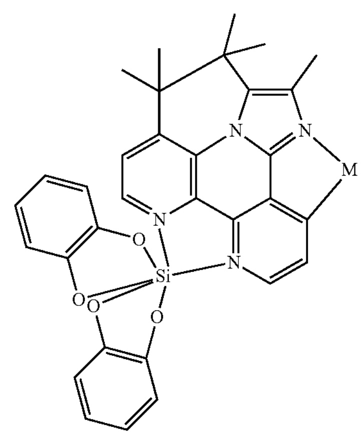
LA145
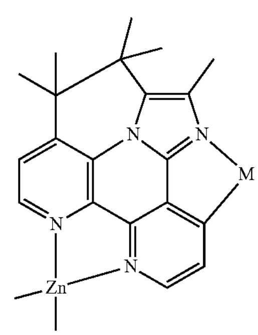

-continued
LA146
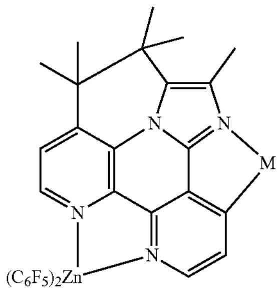
LA147
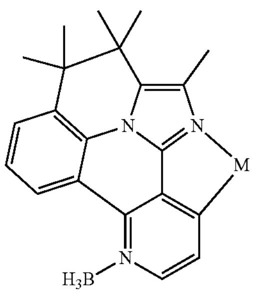
LA148
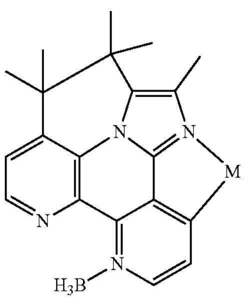
LA149
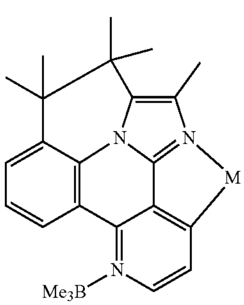
LA150
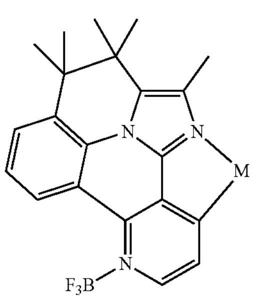
-continued
LA151
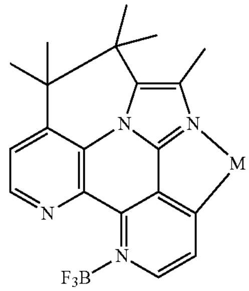
LA152
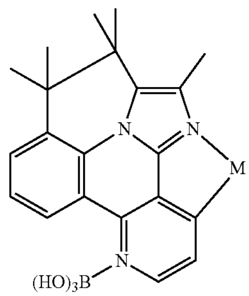
LA153
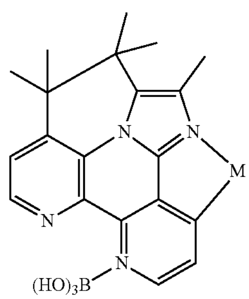
LA158
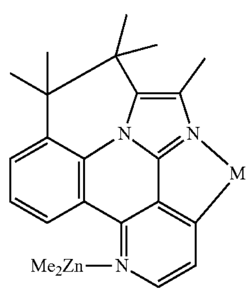
LA159
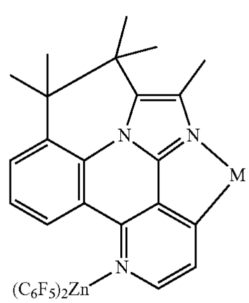

-continued
LA160
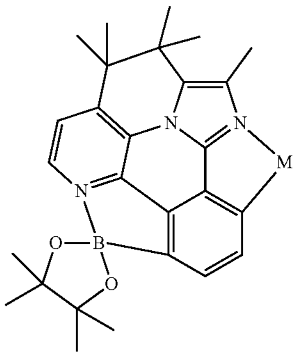
LA161
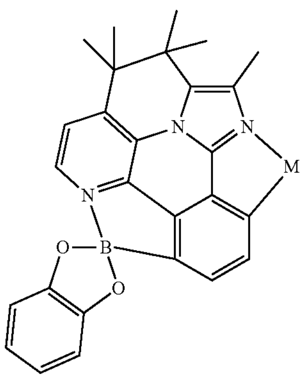
LA162
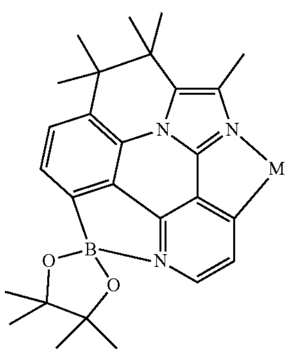
LA163
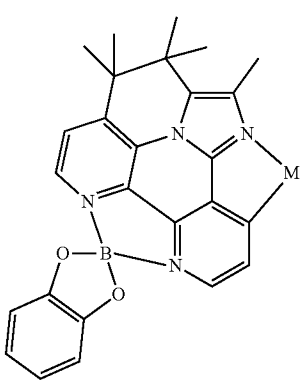
-continued
LA164
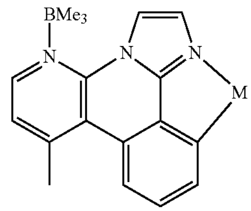
LA165
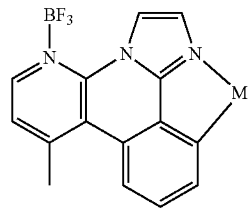
LA166
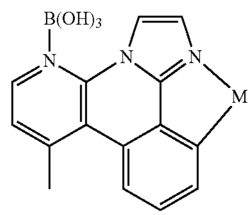
LA169
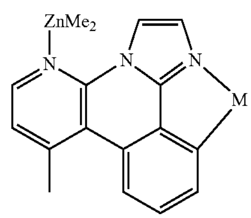
LA170
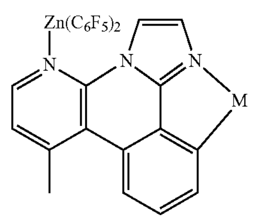
LA171
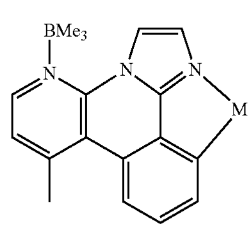

-continued
LA172
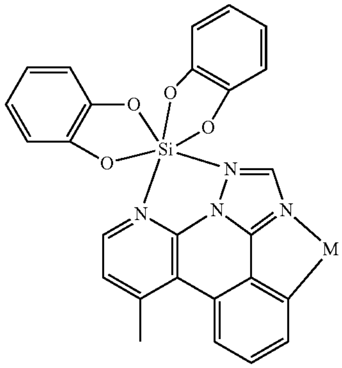
LA173
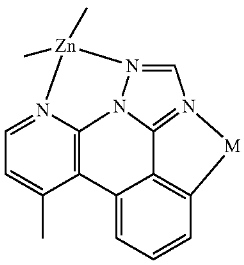
LA174
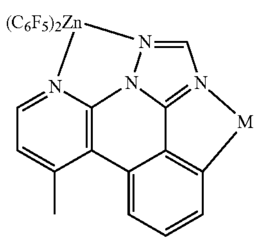
LA175
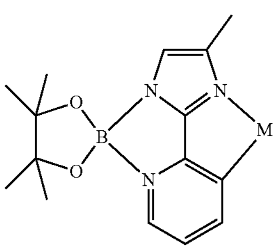
LA176
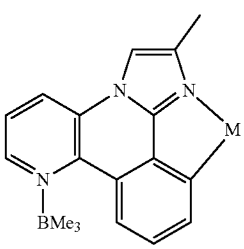
LA177
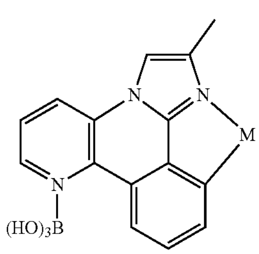
-continued
LA178
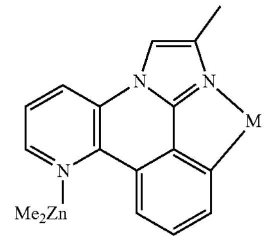
LA179
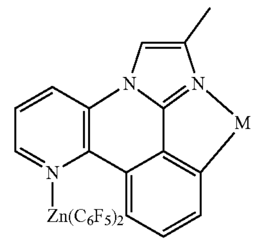
LA180
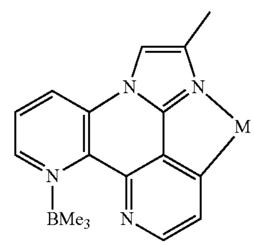
LA181
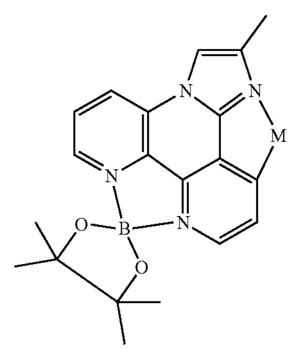
LA182
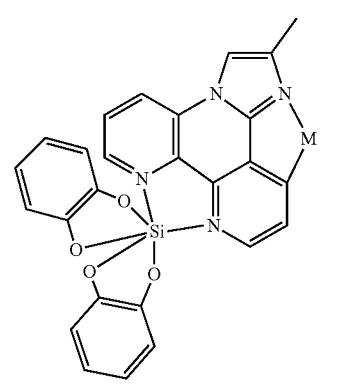

LA183
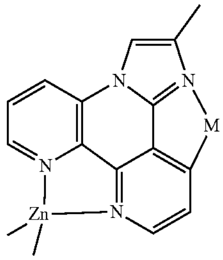
LA184
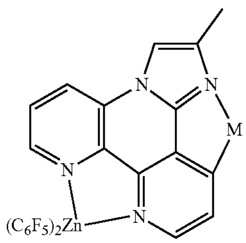
LA185
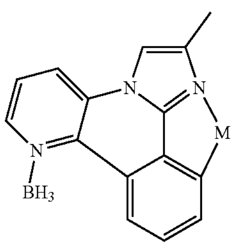
LA186
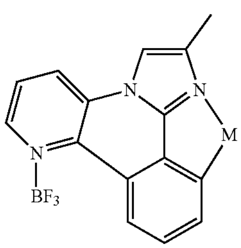
LA189
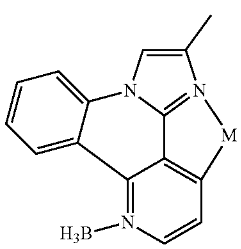
LA190
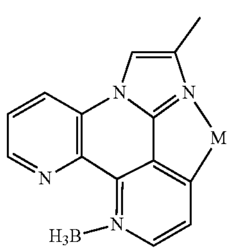
LA191
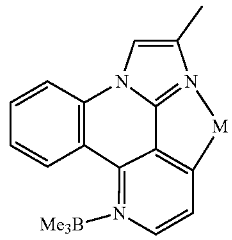
LA192
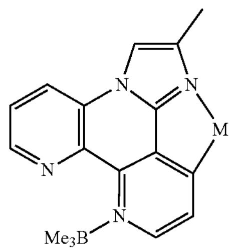
LA193
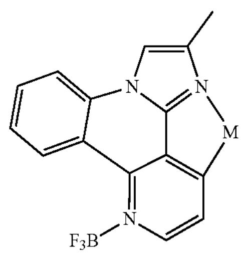
LA194
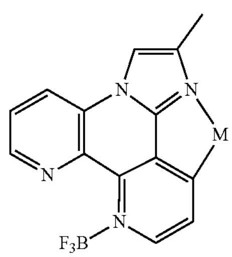
LA195
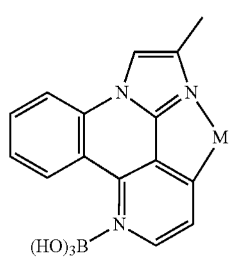
LA196
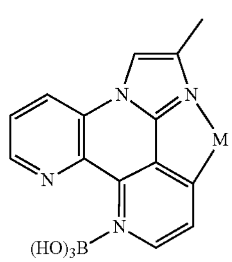

-continued
LA201
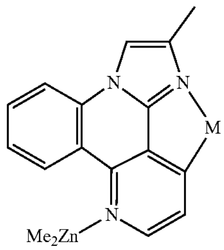
LA202
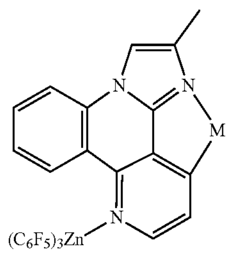
LA203
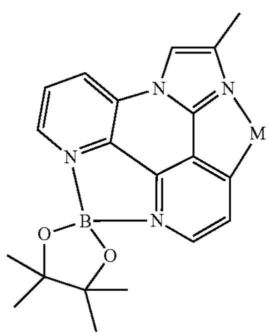
LA204
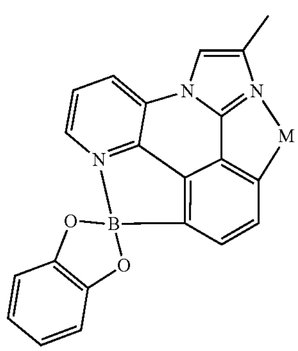
LA205
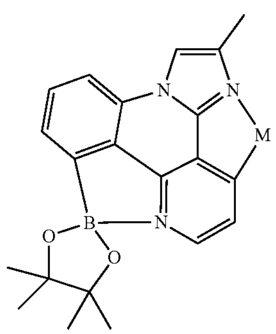
-continued
LA206
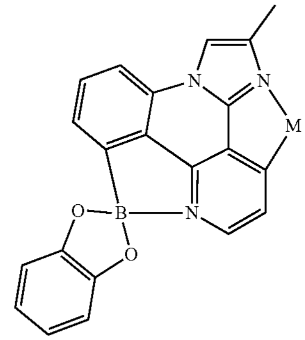
LA207
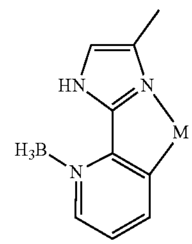
LA208
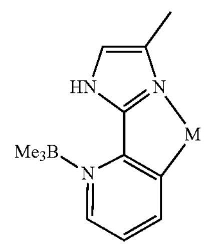
LA209
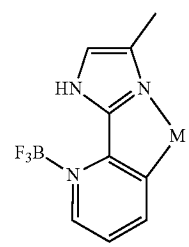
LA210
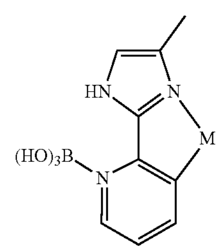
LA211
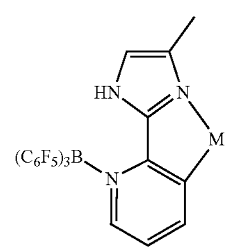

-continued
LA212
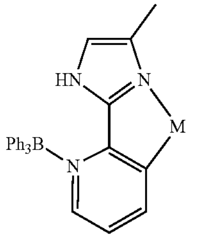
LA213
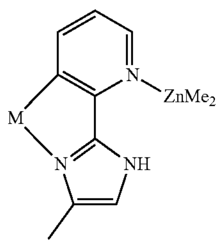
LA214
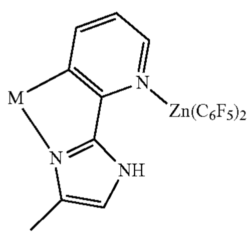
LA215
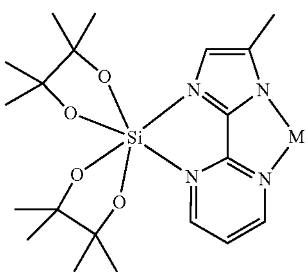
LA216
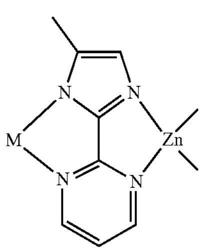
LA217
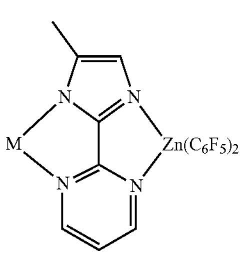
-continued
LA218
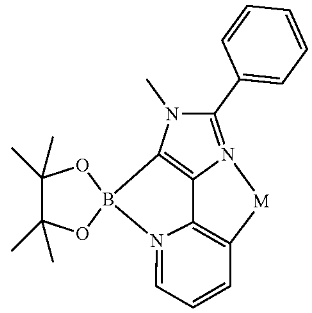
LA219
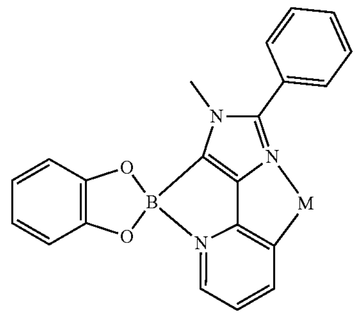
LA220
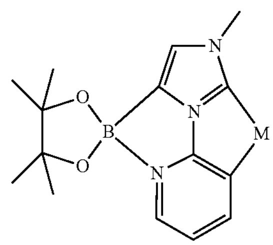
LA221
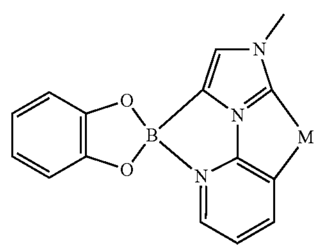
LA222
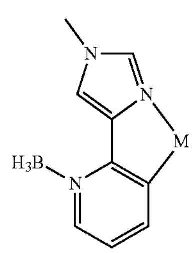
LA223
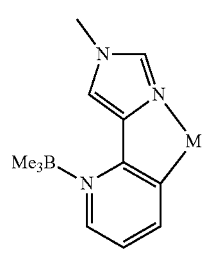

-continued
LA224
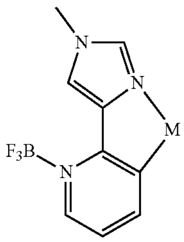
LA225
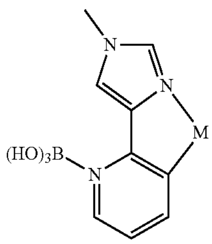
LA226
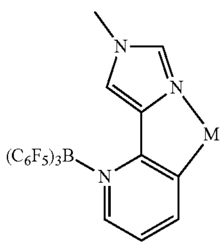
LA227
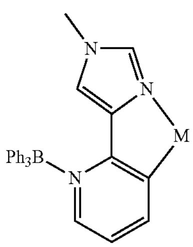
LA228
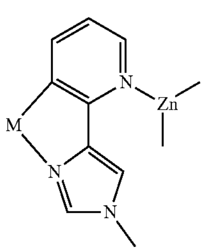
LA229
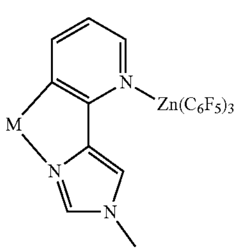
-continued
LA230
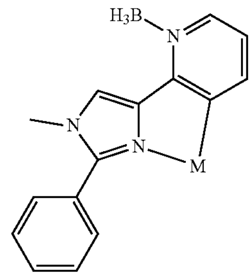
LA231
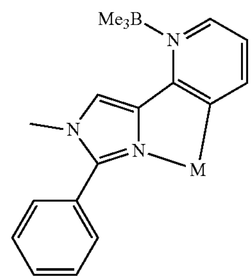
LA232
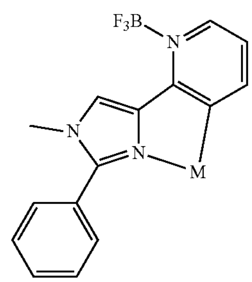
LA233
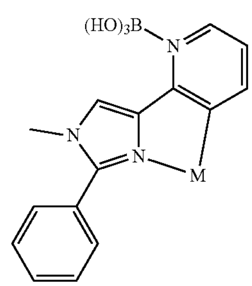
LA234
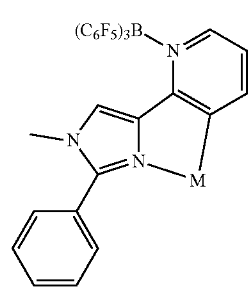

LA235
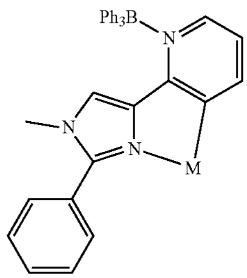
LA236
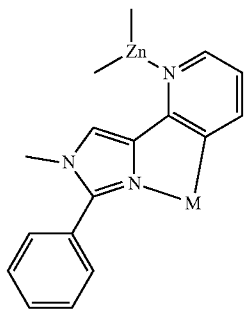
LA237
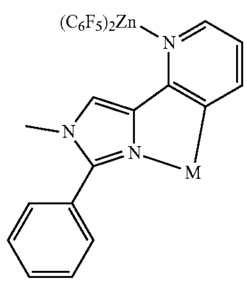
LA238
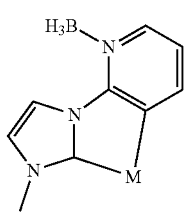
LA239
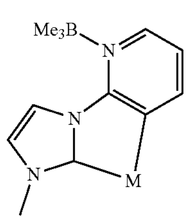
LA240
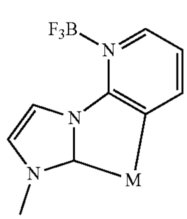
LA241
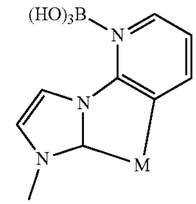
LA242
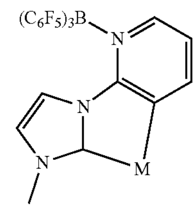
LA243
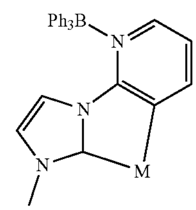
LA244
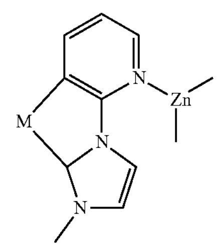
LA245
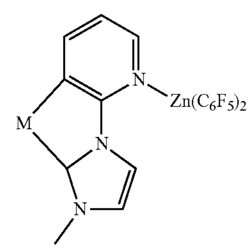
LA246
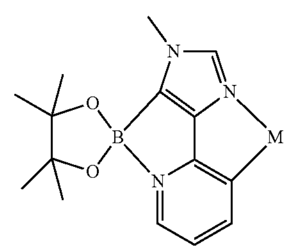
LA247
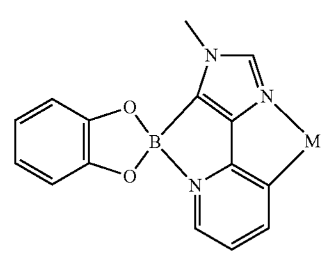

-continued
LA248
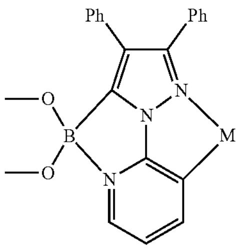
LA249
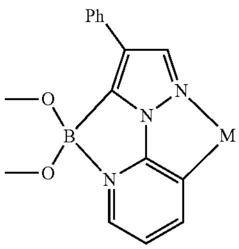
LA250
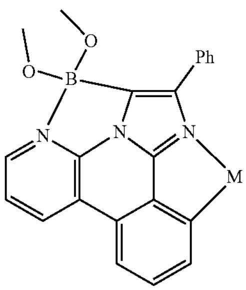
LA251
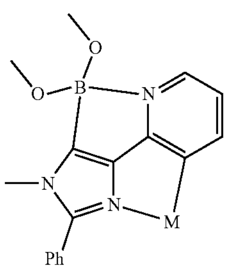
LA252
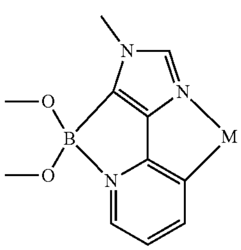
LA253
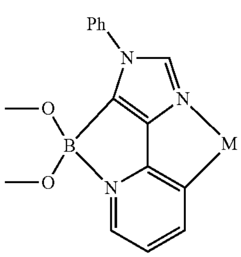
-continued
LA254
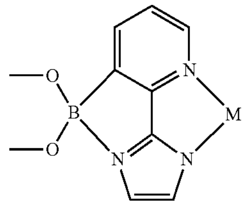
LA255
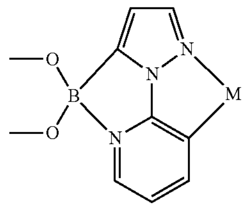
LA256
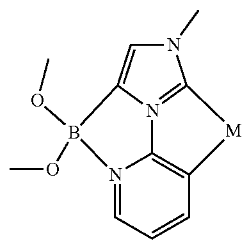
LA257
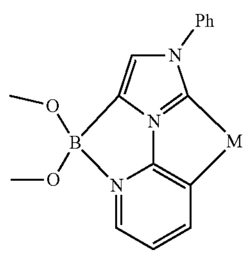
LA258
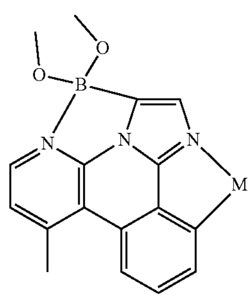
LA259
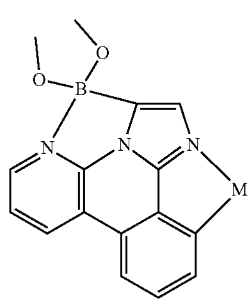

-continued
LA260
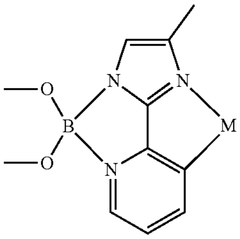
LA261
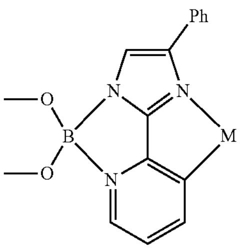
LA262
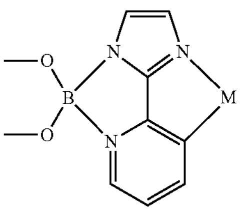
LA263
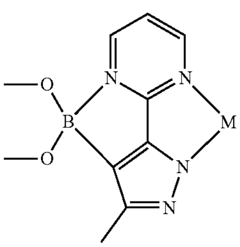
LA264
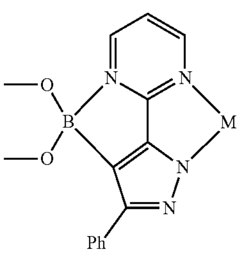
LA265
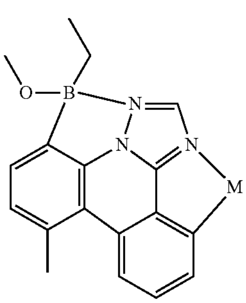
-continued
LA267
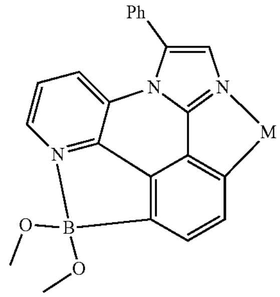
LA268
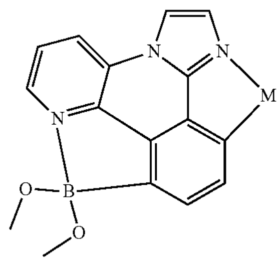
LA269
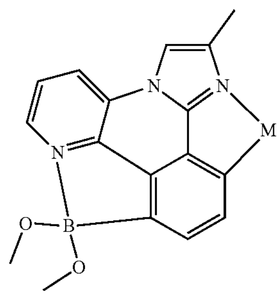
LA270
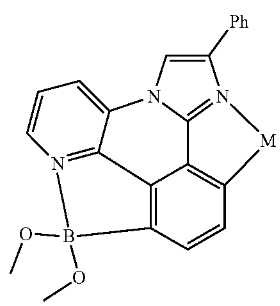
LA271
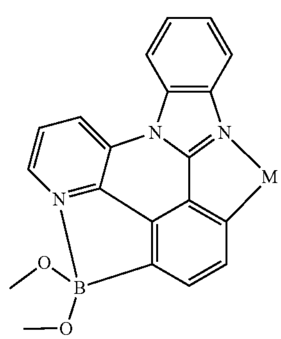

LA272
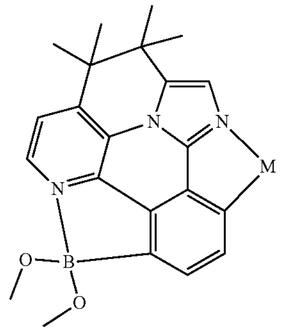
LA273
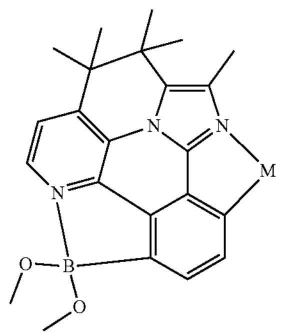
LA274
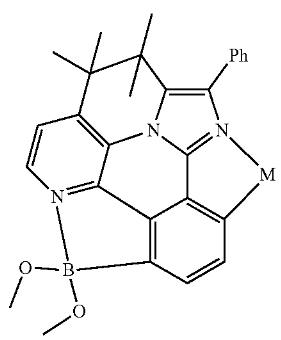
LA275
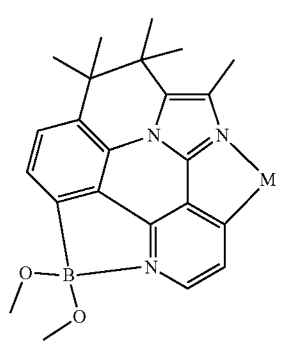
LA276
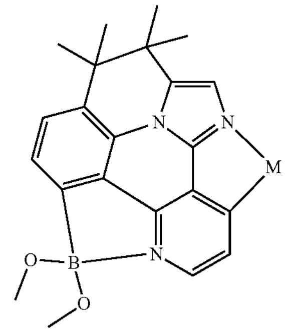
LA277
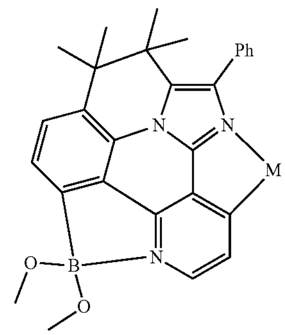
LA279
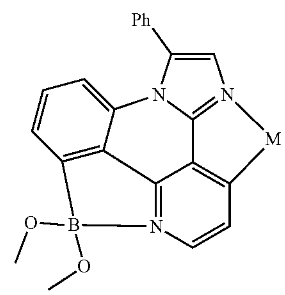
LA280
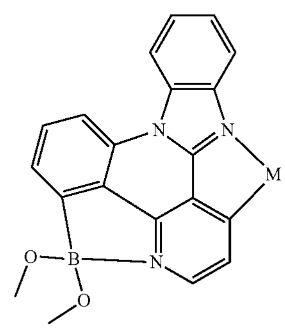
LA281
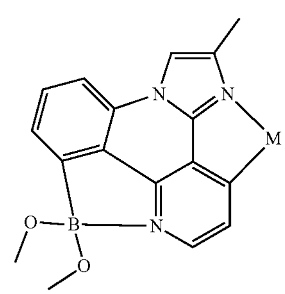

-continued
LA282
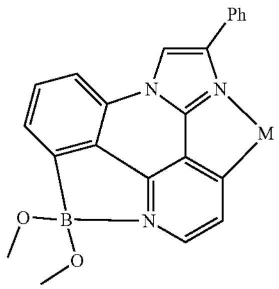
LA283
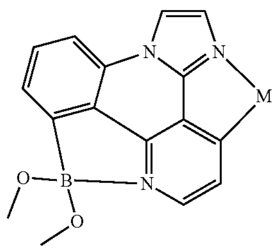
LA284
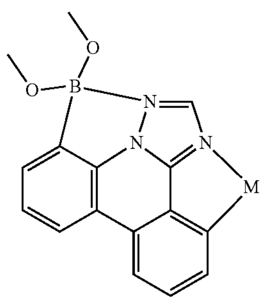
LA285
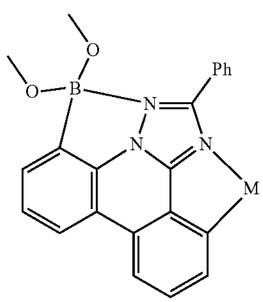
LA286
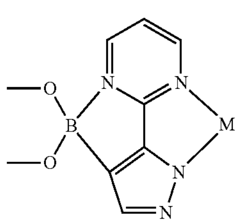
LA287
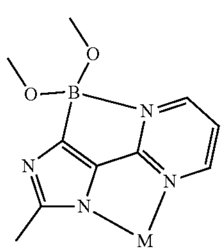
-continued
LA288
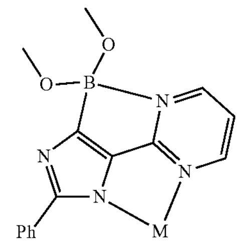
LA289
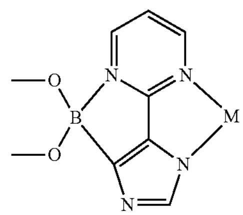
LA290
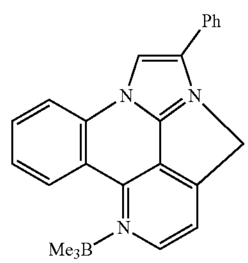
LA293
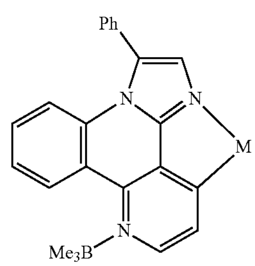
LA294
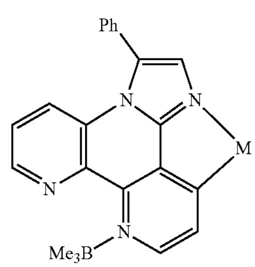
LA295
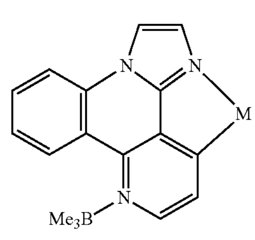

-continued
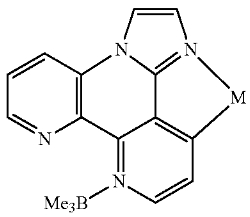
LA296
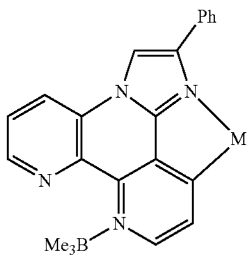
LA297
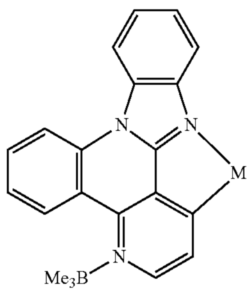
LA298
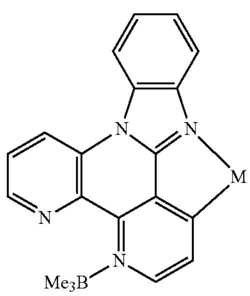
LA299
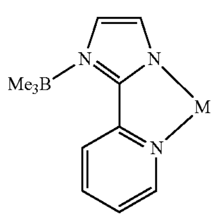
LA300
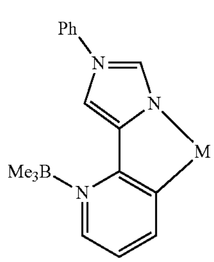
LA301
-continued
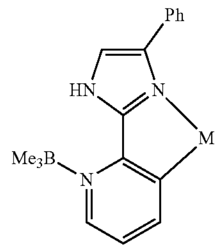
LA302
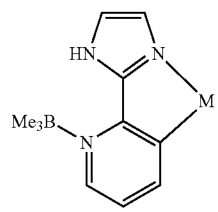
LA303
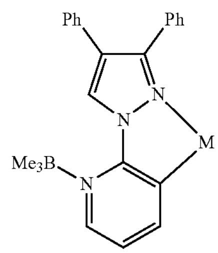
LA304
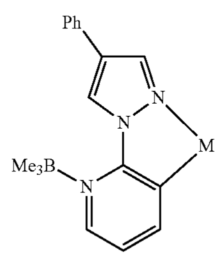
LA305
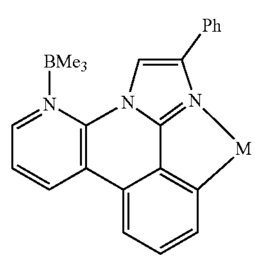
LA306
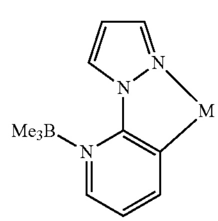
LA307

-continued
LA308
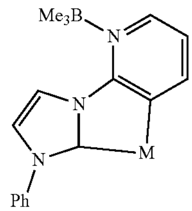
LA309
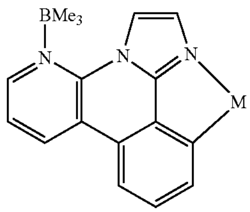
LA310
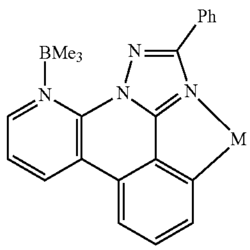
LA311
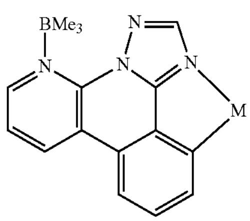
LA313
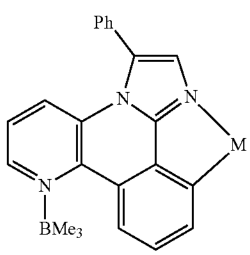
LA314
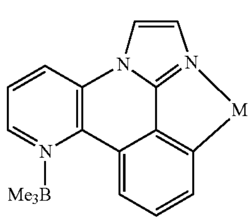
LA315
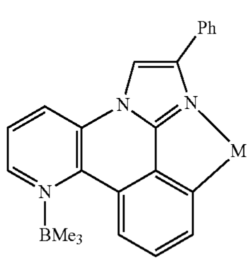
-continued
LA316
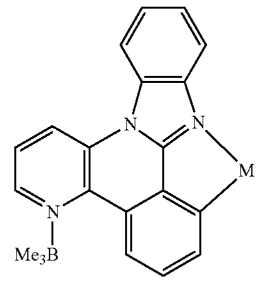
LA318
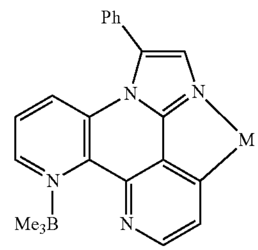
LA319
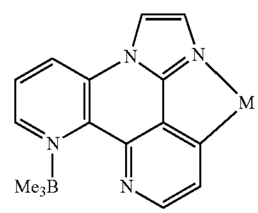
LA320
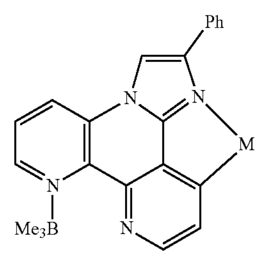
LA321
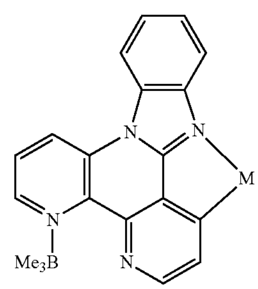
LA322
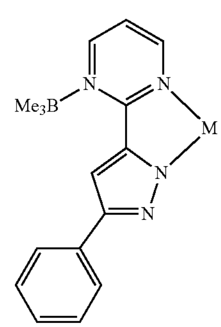

-continued
LA323
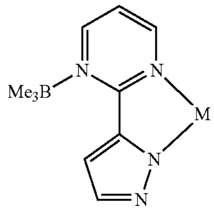
LA324
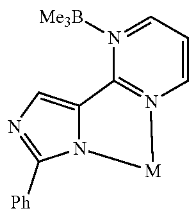
LA325
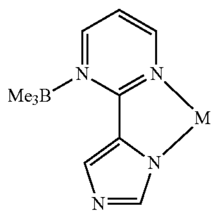
LA326
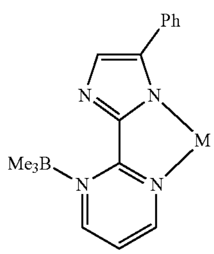
LA327
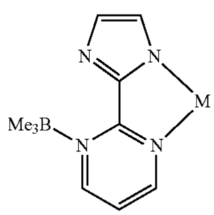
LA328
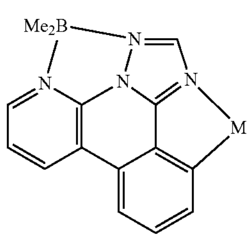
LA329
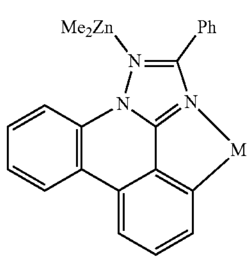
-continued
LA330
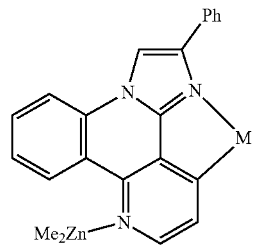
LA332
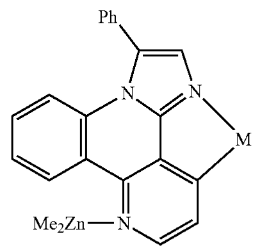
LA333
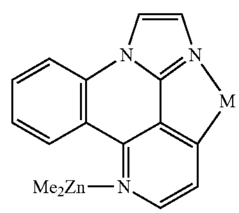
LA334
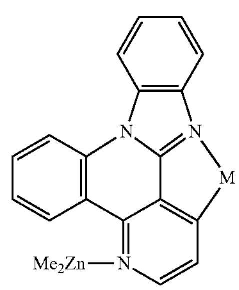
LA335
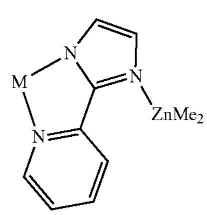
LA336
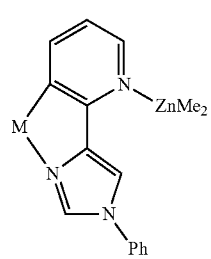

LA337
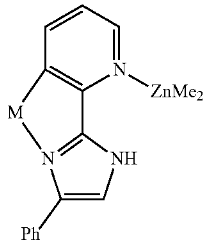
LA338
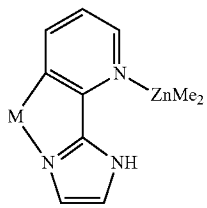
LA339
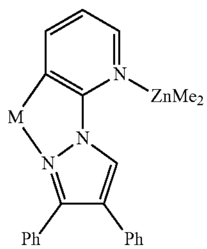
LA340
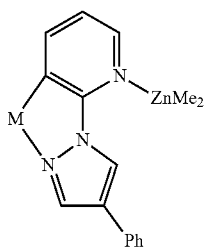
LA341
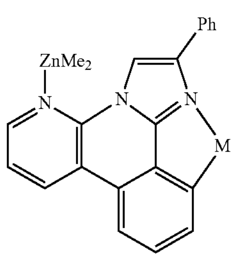
LA342
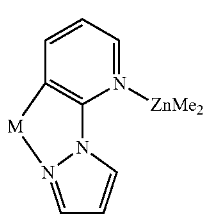
LA343
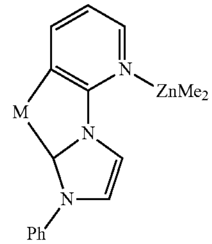
LA344
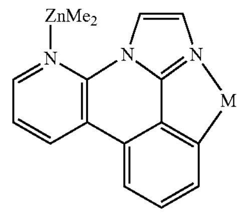
LA346
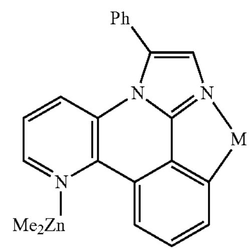
LA347
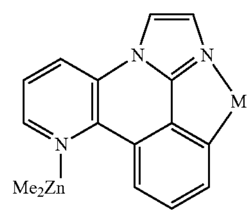
LA348
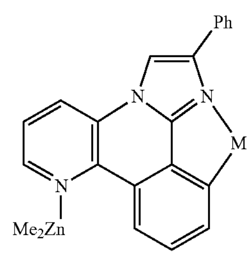
LA349
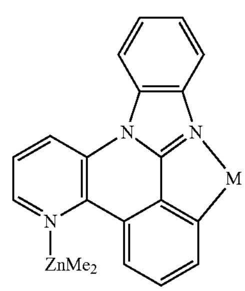

-continued
LA350
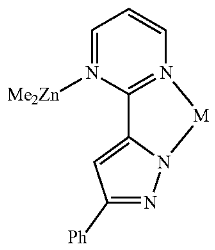
LA351
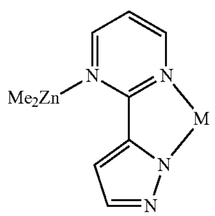
LA352
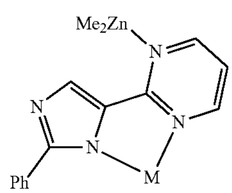
LA353
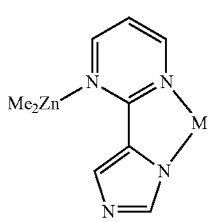
LA354
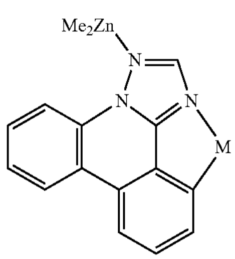
LA356
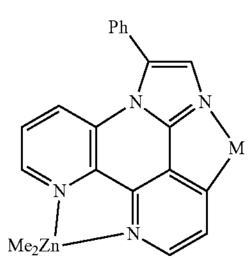
-continued
LA357
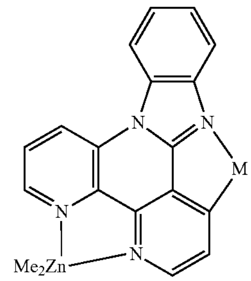
LA358
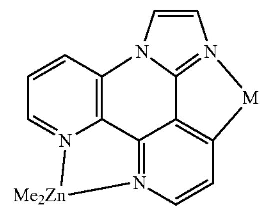
LA359
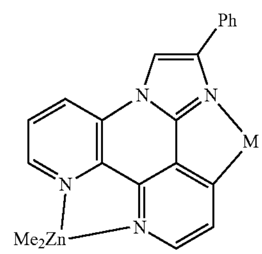
LA360
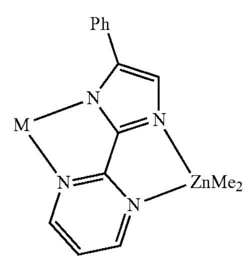
LA361
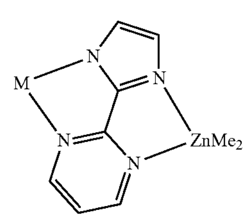
LA362
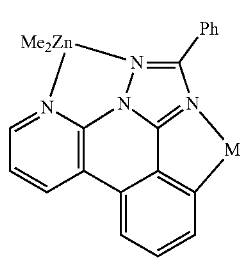

-continued
LA363
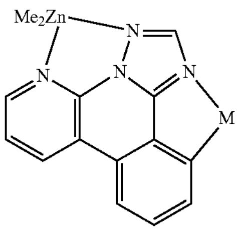
LA365
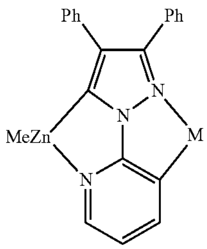
LA366
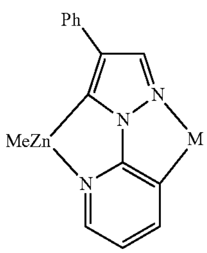
LA367
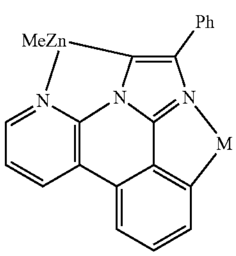
LA368
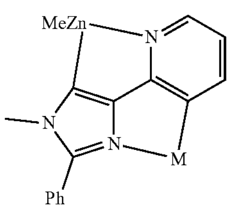
LA369
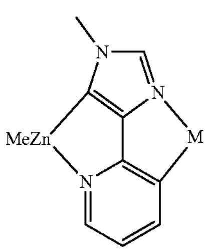
-continued
LA370
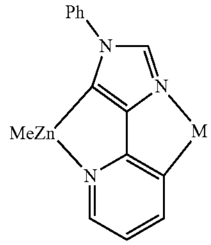
LA371
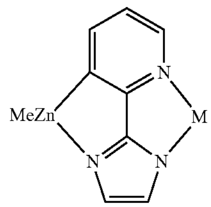
LA372
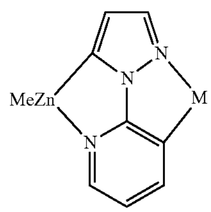
LA373
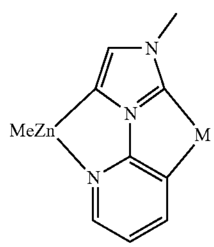
LA374
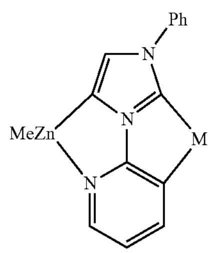
LA375
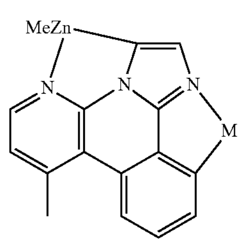

-continued
LA376
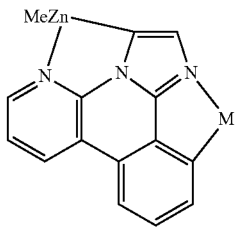
LA377
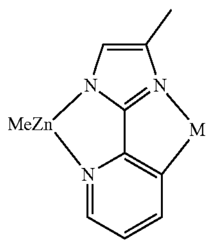
LA378
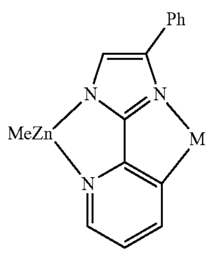
LA379
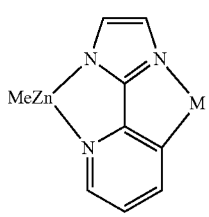
LA380
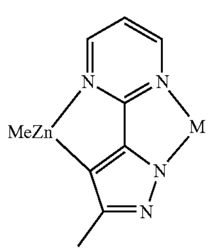
LA381
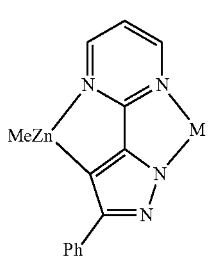
-continued
LA382
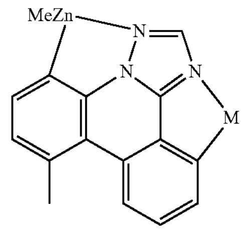
LA384
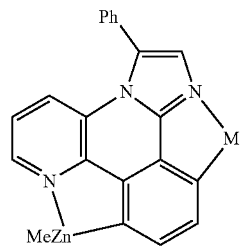
LA385
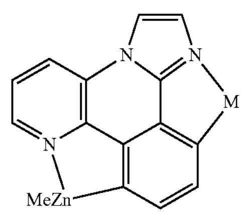
LA386
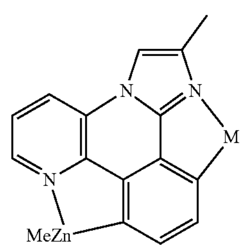
LA387
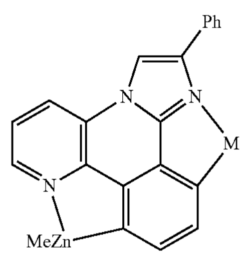
LA388
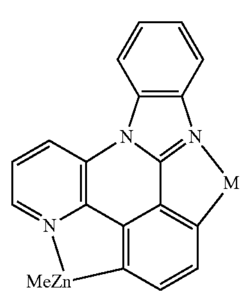

-continued
LA389
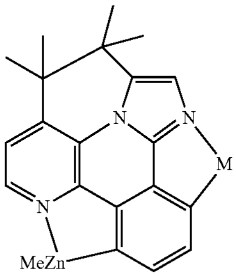
LA390
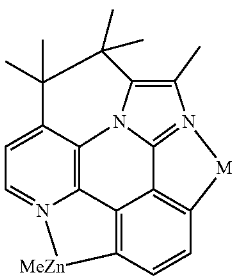
LA391
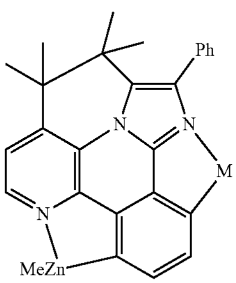
LA392
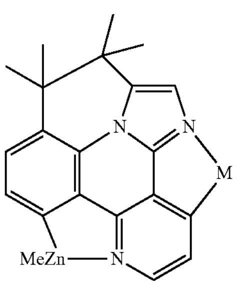
LA393
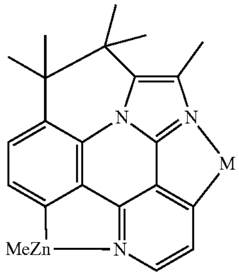
-continued
LA394
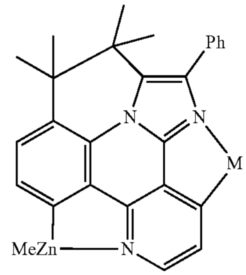
LA396
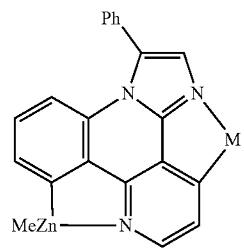
LA397
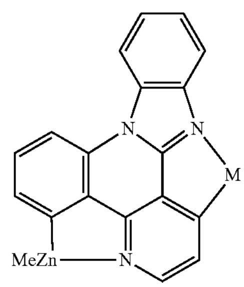
LA398
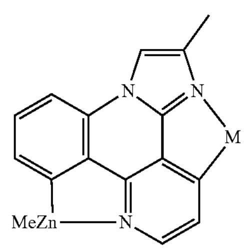
LA399
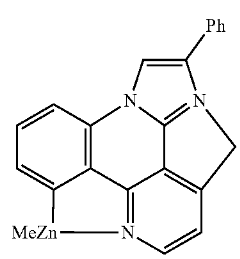
LA400
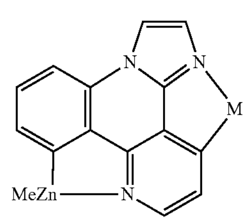

-continued
LA401
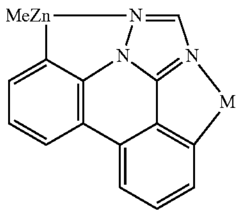
LA402
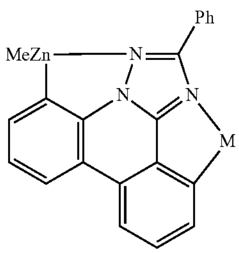
LA403
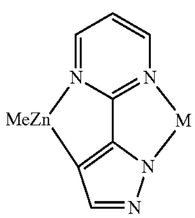
LA404
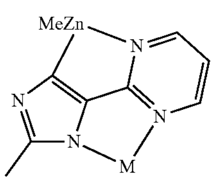
LA405
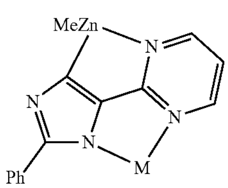
LA406
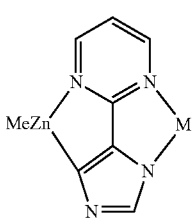
LA407
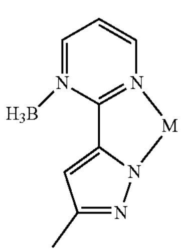
-continued
LA408
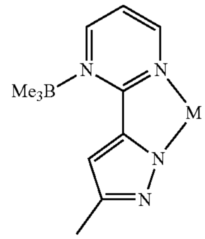
LA409
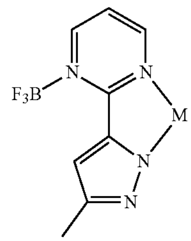
LA410
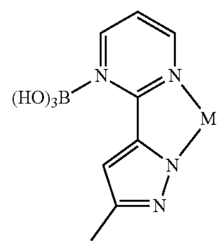
LA411
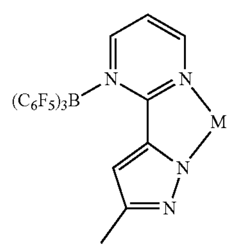
LA412
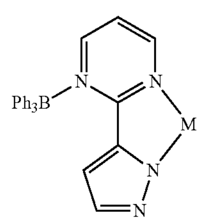
LA413
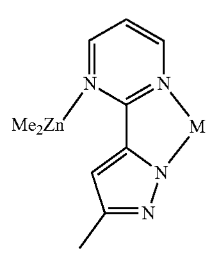

-continued
LA414
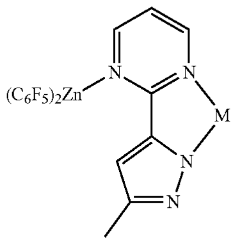
LA415
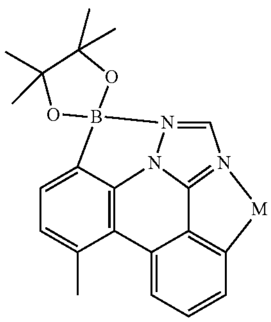
LA416
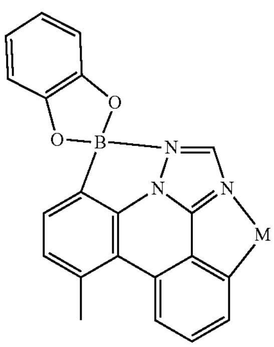
LA417
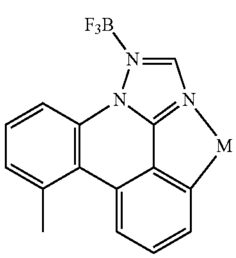
LA418
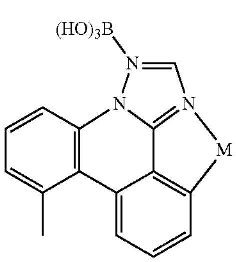
-continued
LA421
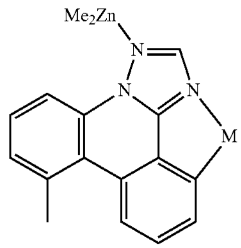
LA422
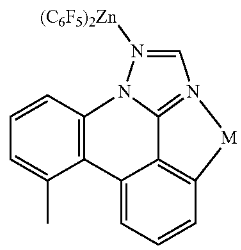
LA423
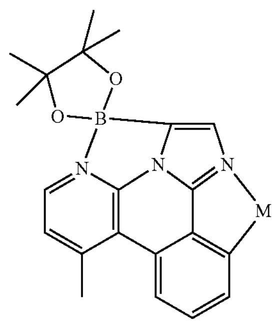
LA424
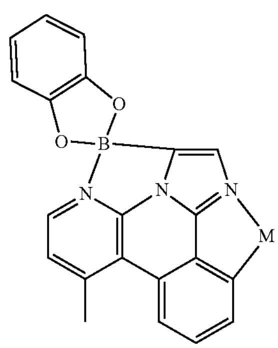
LA425
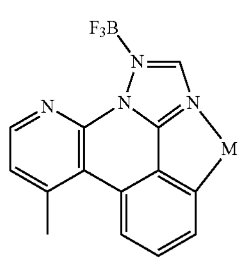

-continued
LA426
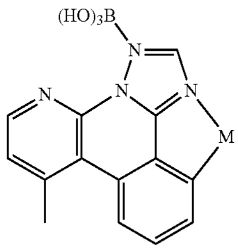
LA429
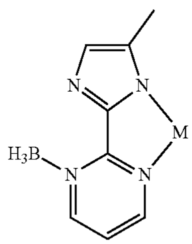
LA430
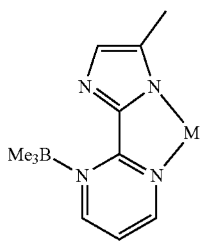
LA431
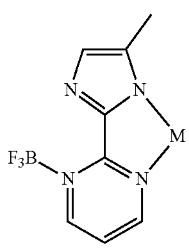
LA432
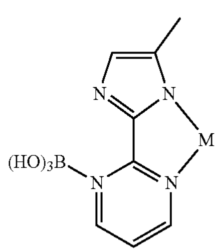
LA433
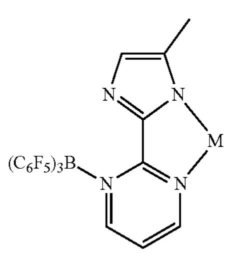
-continued
LA434
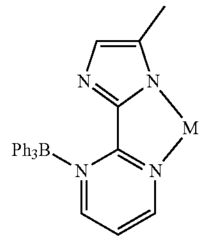
LA435
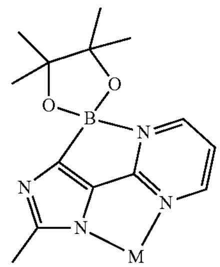
LA436
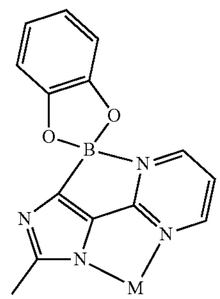
LA437
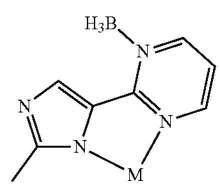
LA438
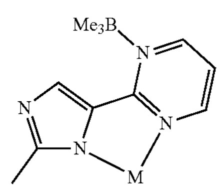
LA439
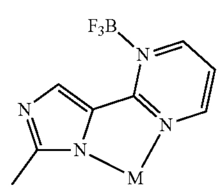
LA440
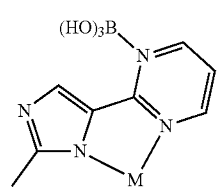

-continued
LA441
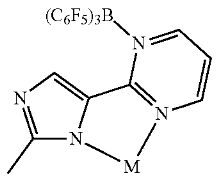
LA442
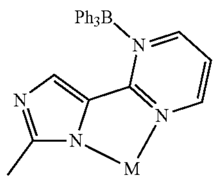
LA443
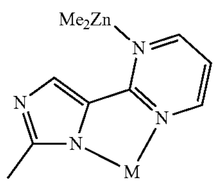
LA444
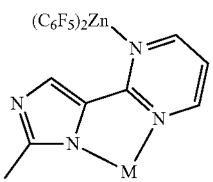
LA445
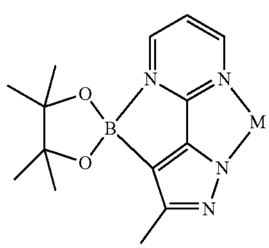
LA446
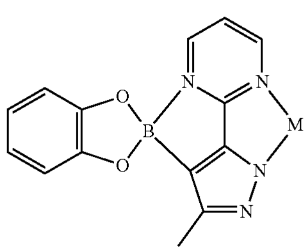
LA447
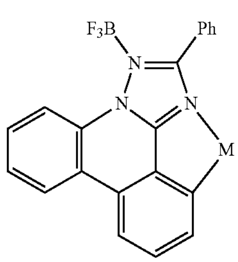
-continued
LA448
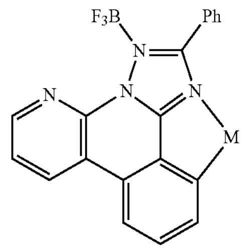
LA450
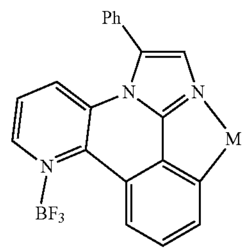
LA451
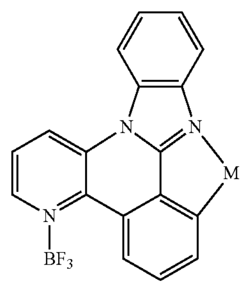
LA452
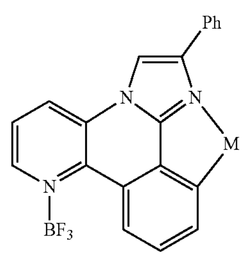
LA453
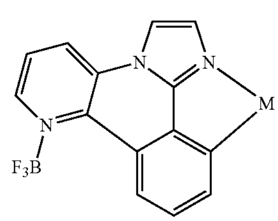
LA456
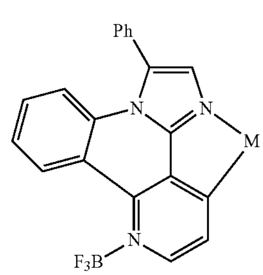

-continued
LA457
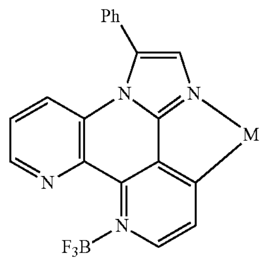
LA458
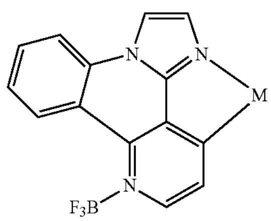
LA459
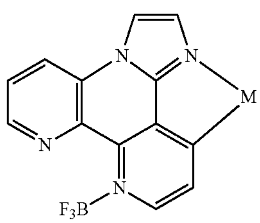
LA460
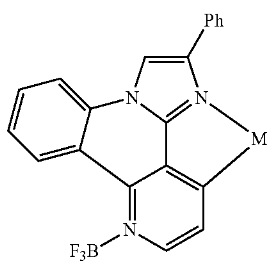
LA461
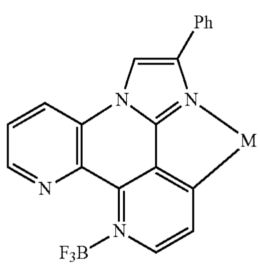
LA462
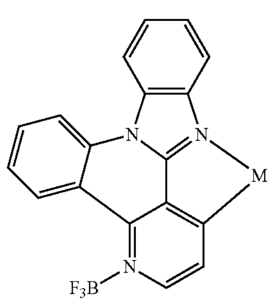
-continued
LA463
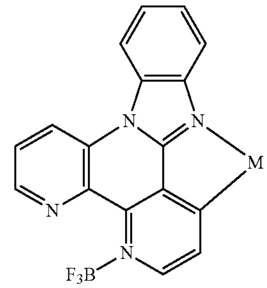
LA464
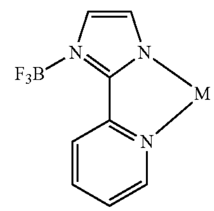
LA465
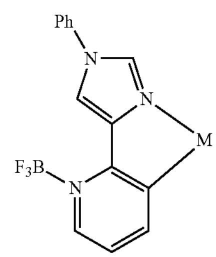
LA466
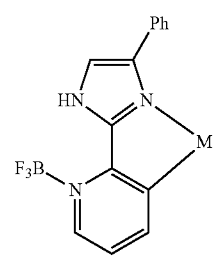
LA467
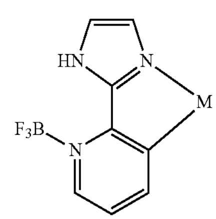
LA468
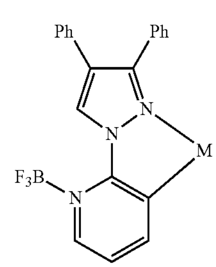

LA469
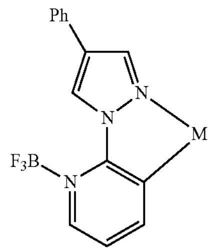
LA470
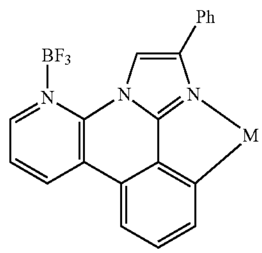
LA471
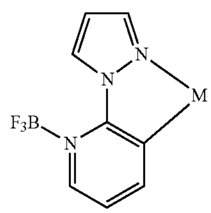
LA472
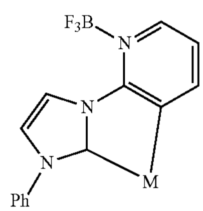
LA473
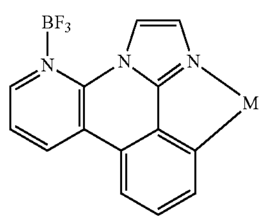
LA474
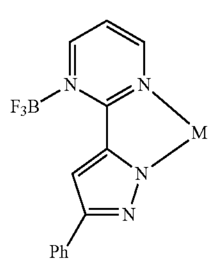
LA475
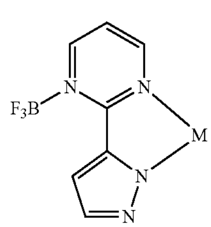
LA476
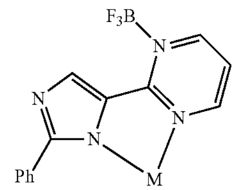
LA477
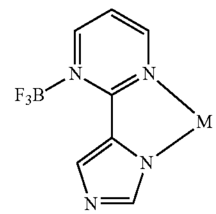
LA478
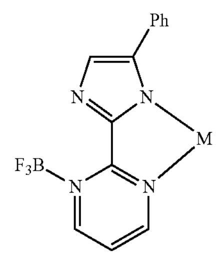
LA479
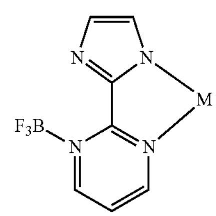
LA480
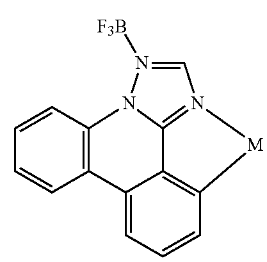
LA481
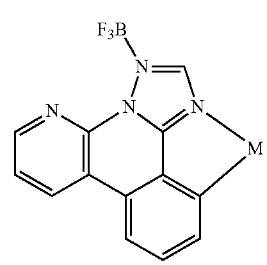

-continued
LA482
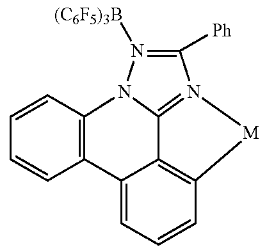
LA499
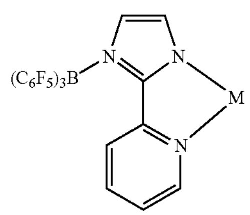
LA500
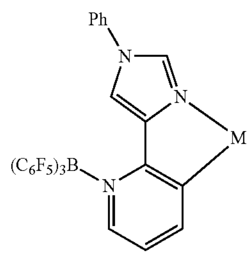
LA501
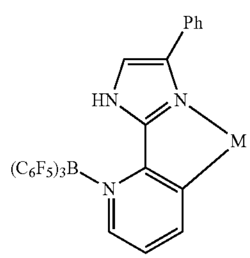
LA502
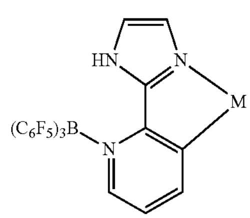
LA503
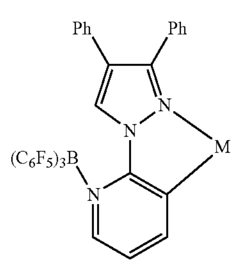
-continued
LA504
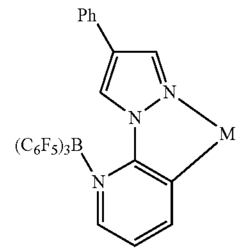
LA505
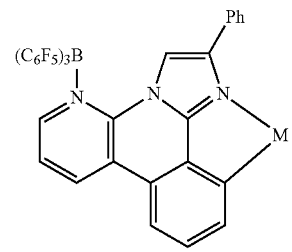
LA506
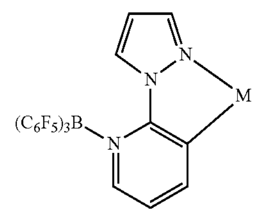
LA507
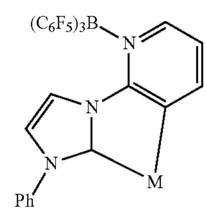
LA508
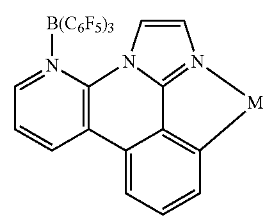
LA509
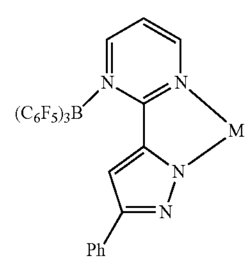
LA510
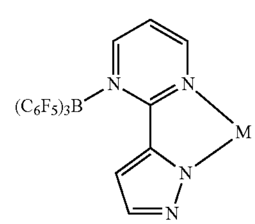

LA511
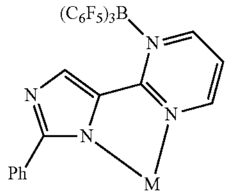
LA512
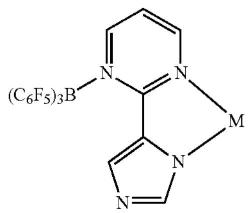
LA513
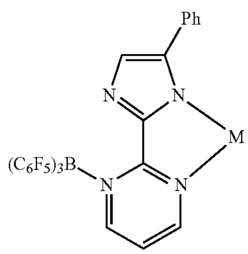
LA514
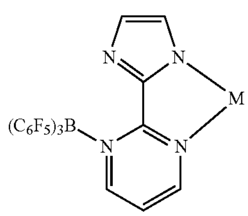
LA517
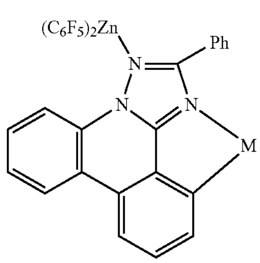
LA518
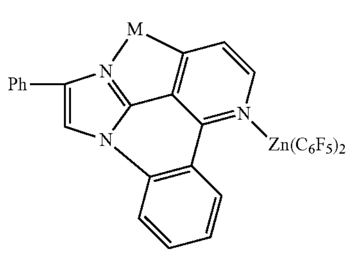
LA520
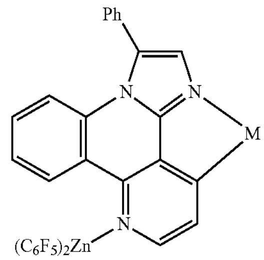
LA521
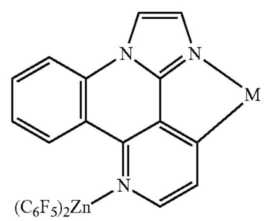
LA522
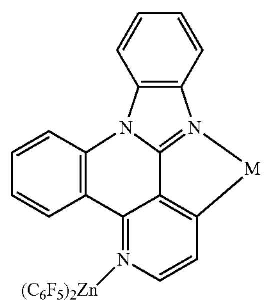
LA523
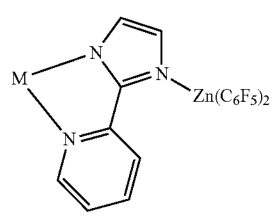
LA524
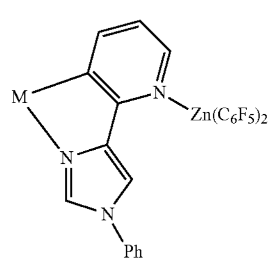
LA525
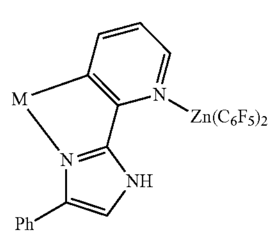

-continued
LA526
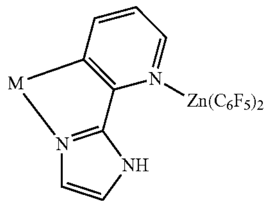
LA527
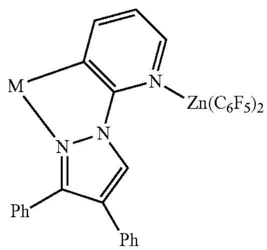
LA528
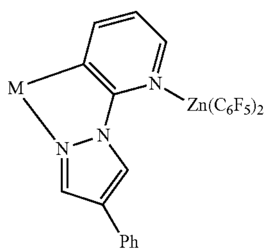
LA529
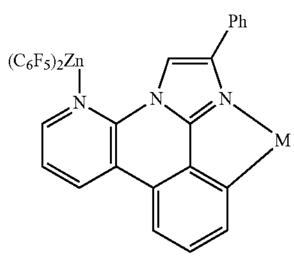
LA530
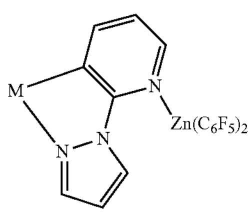
LA531
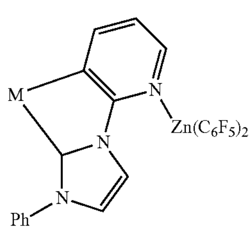
LA532
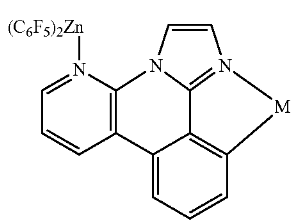
-continued
LA534
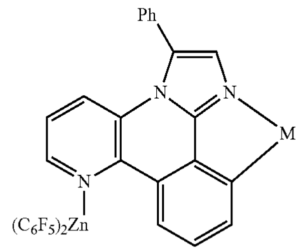
LA535
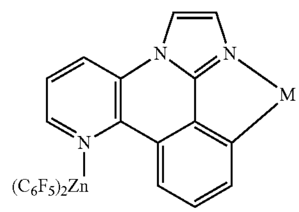
LA536
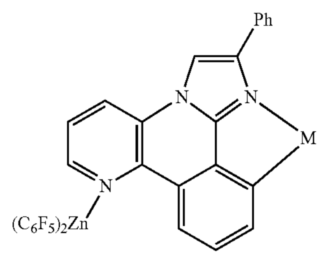
LA537
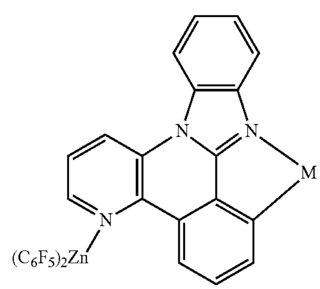
LA538
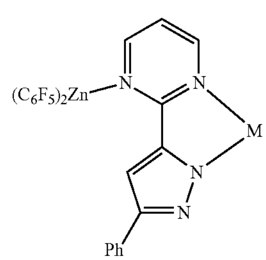
LA539
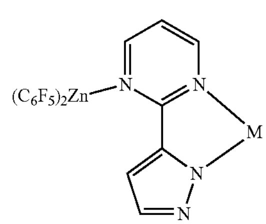

-continued
LA540
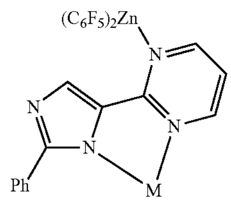
LA541
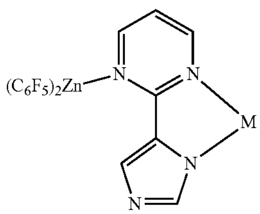
LA542
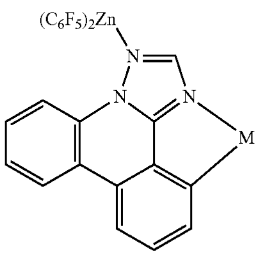
LA544
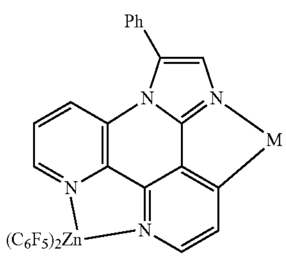
LA545
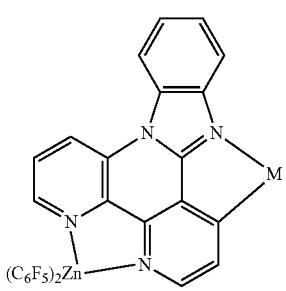
LA546
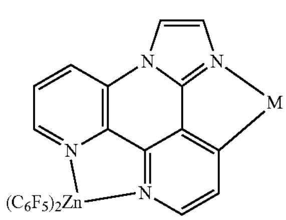
-continued
LA547
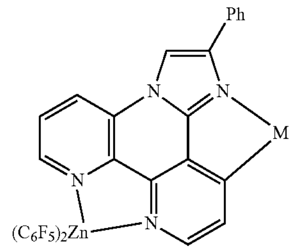
LA548
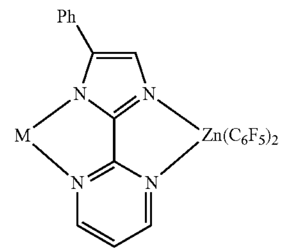
LA549
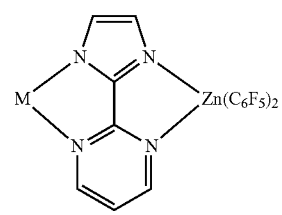
LA550
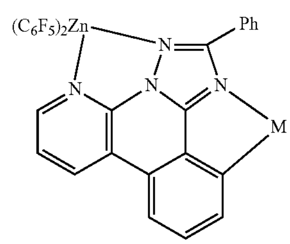
LA551
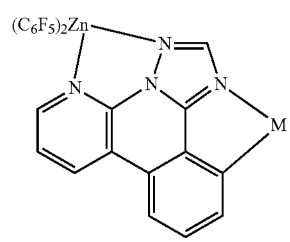
LA552
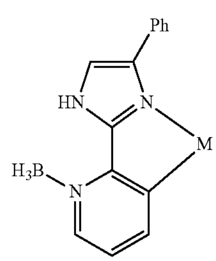

-continued
LA553
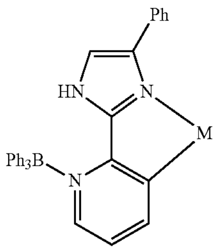
LA554
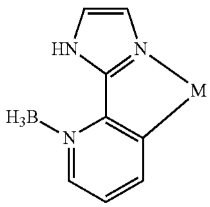
LA555
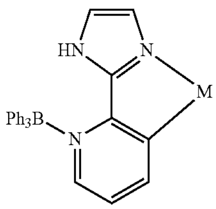
LA556
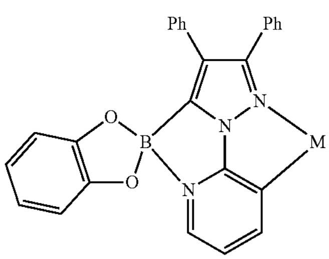
LA557
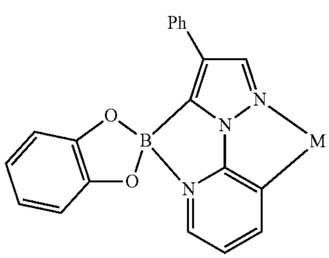
LA558
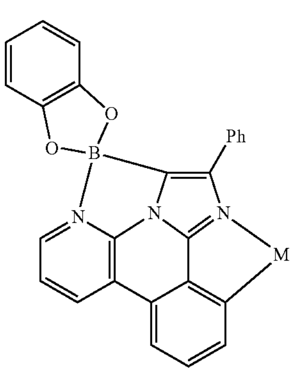
-continued
LA559
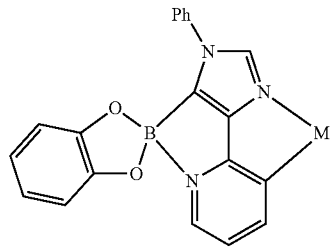
LA560
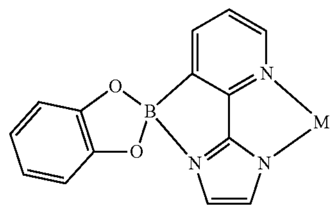
LA561
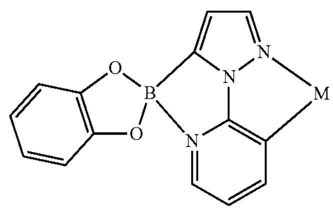
LA562
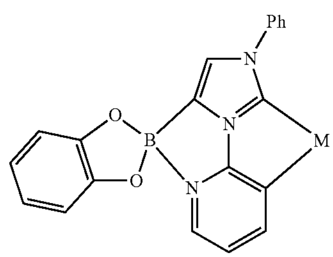
LA563
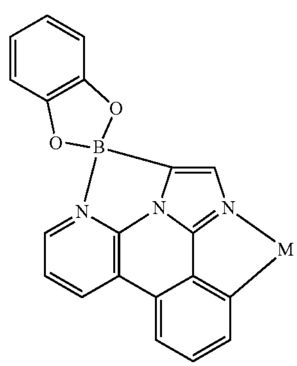
LA564
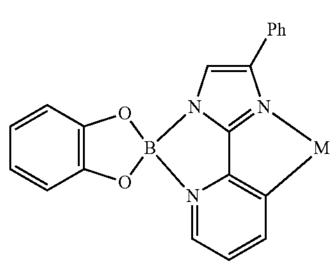

-continued
LA565
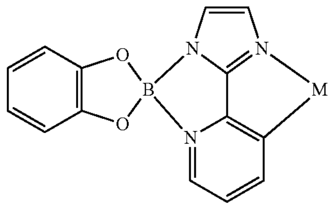
LA566
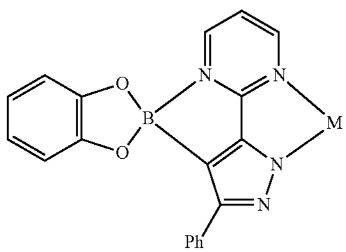
LA568
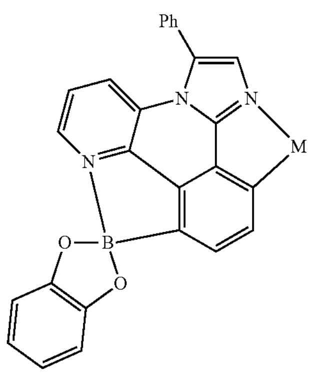
LA569
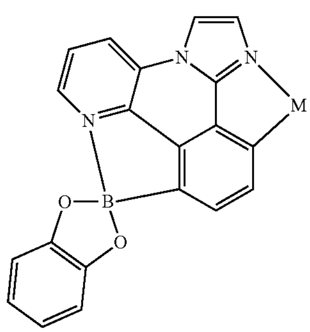
LA570
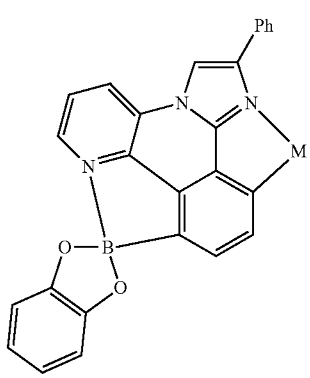
-continued
LA571
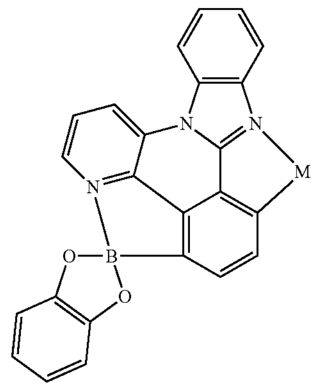
LA573
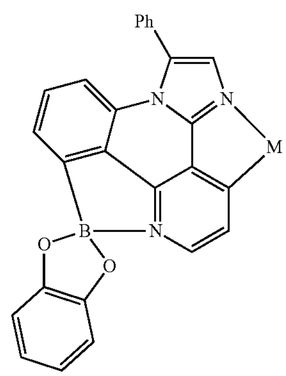
LA574
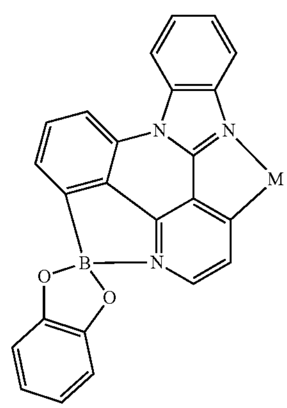
LA575
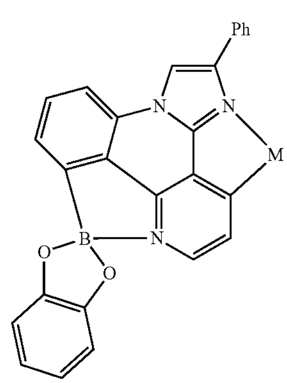

LA576
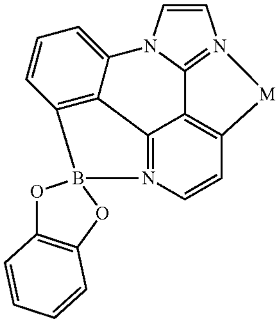
LA577
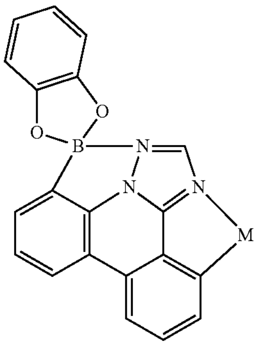
LA578
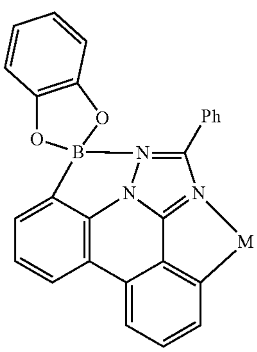
LA579
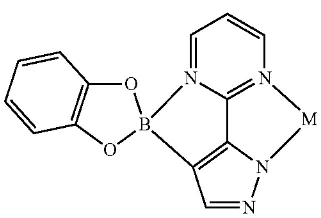
LA580
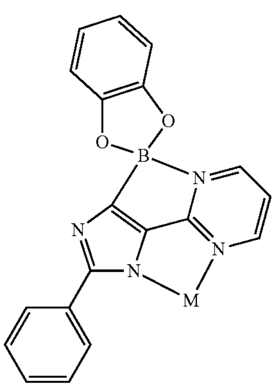
LA581
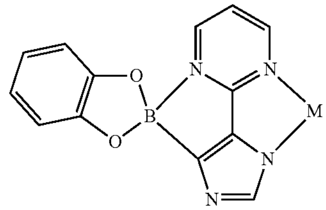
LA583
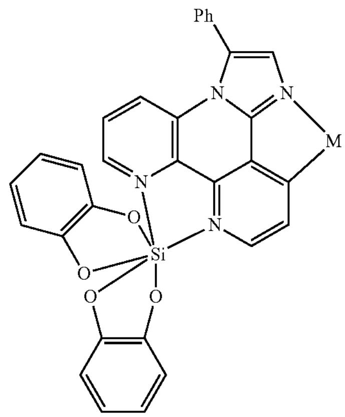
LA584
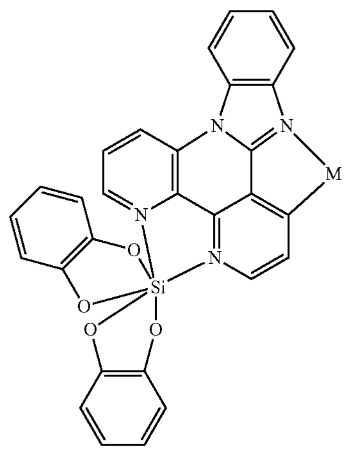
LA585
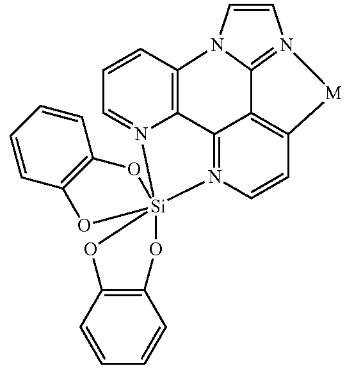

-continued
LA586
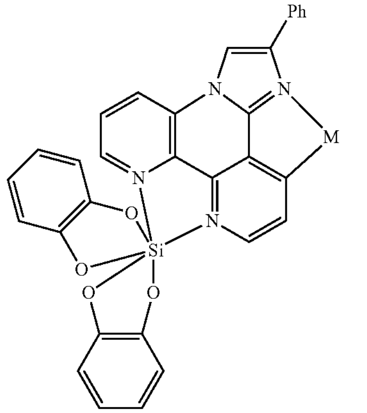
LA587
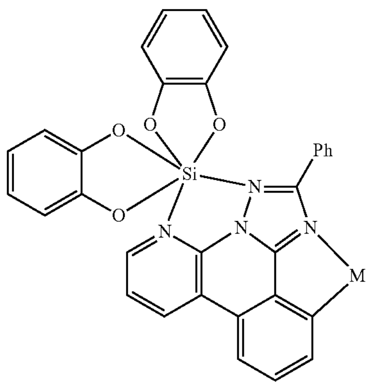
LA588
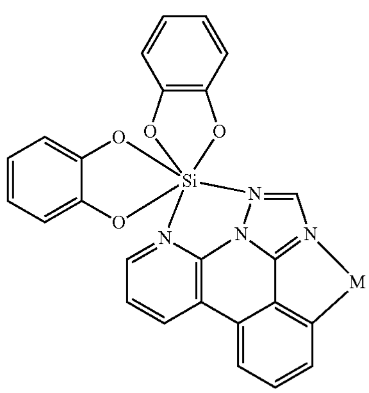
LA589
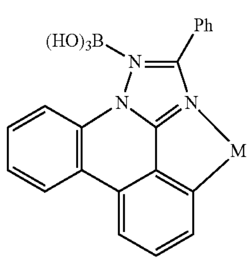
-continued
LA590
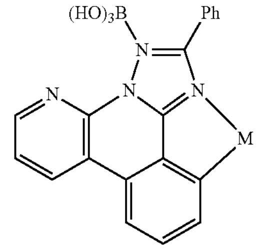
LA593
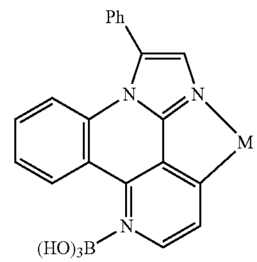
LA594
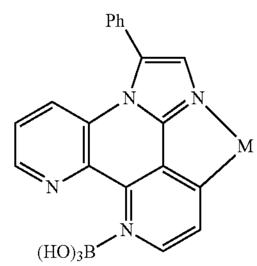
LA595
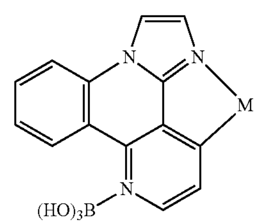
LA596
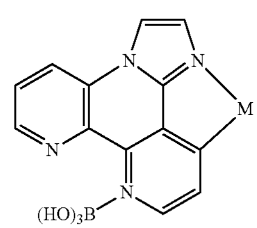
LA597
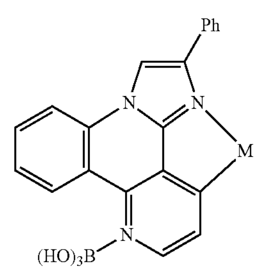

-continued
LA598
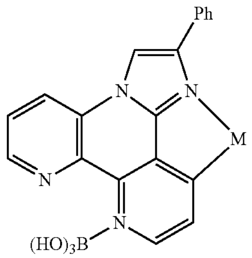
LA599
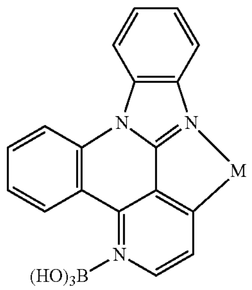
LA600
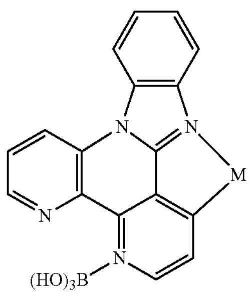
LA601
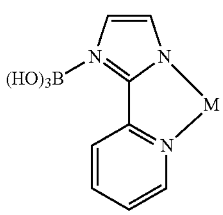
LA602
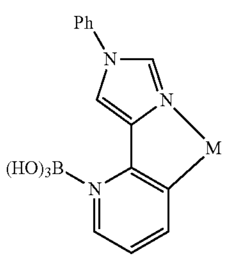
LA603
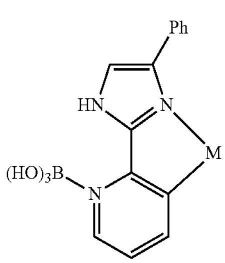
-continued
LA604
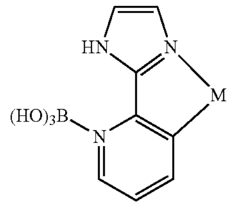
LA605
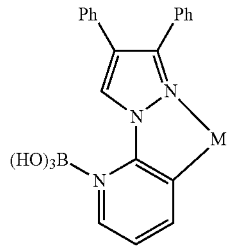
LA606
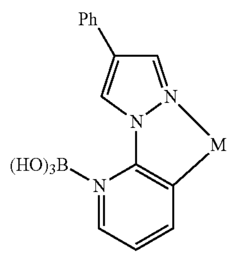
LA607
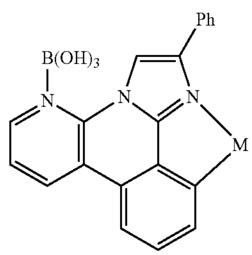
LA608
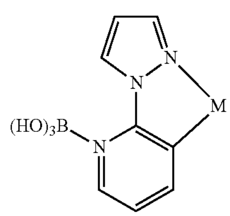
LA609
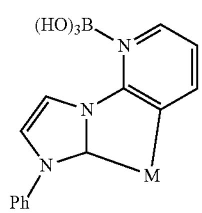
LA610
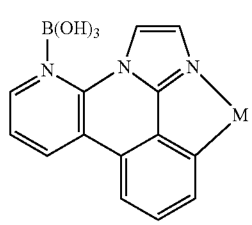

-continued
LA612
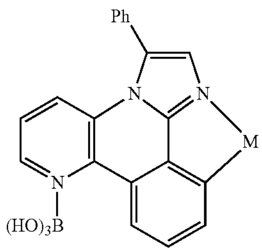
LA613
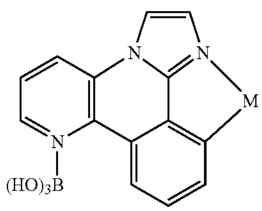
LA614
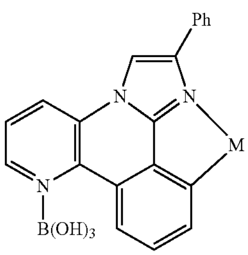
LA615
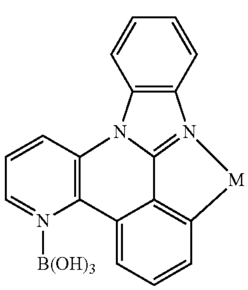
LA616
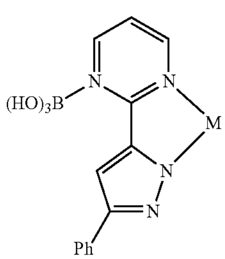
LA617
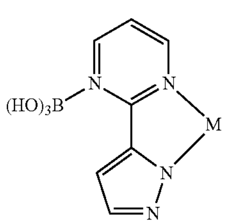
-continued
LA618
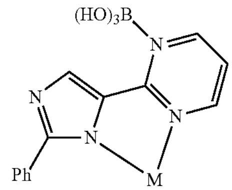
LA619
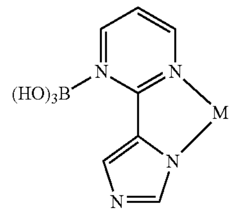
LA620
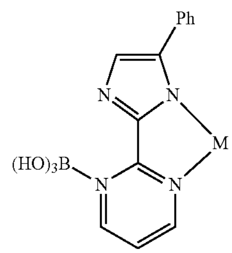
LA621
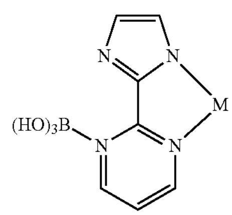
LA622
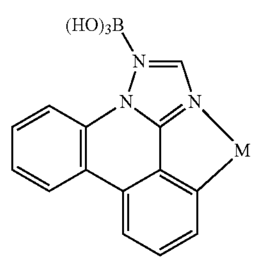
LA623
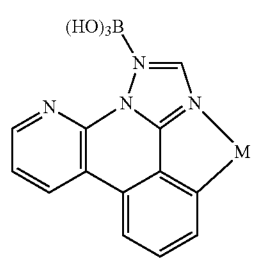

-continued
LA624
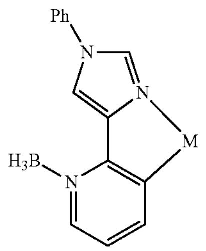
LA625
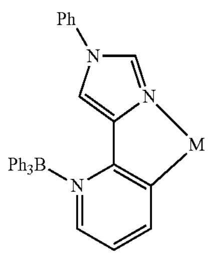
LA626
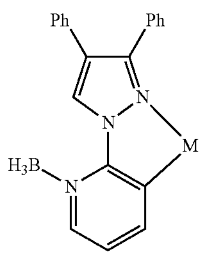
LA627
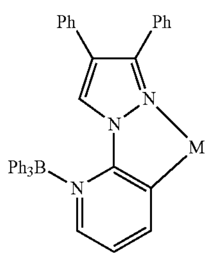
LA628
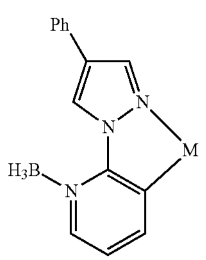
LA629
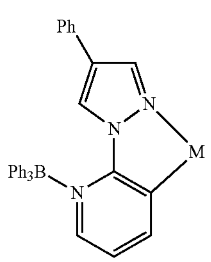
-continued
LA630
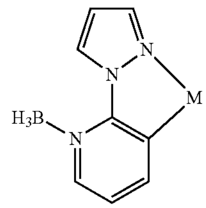
LA631
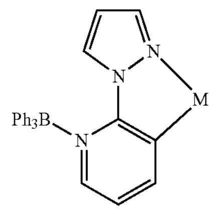
LA632
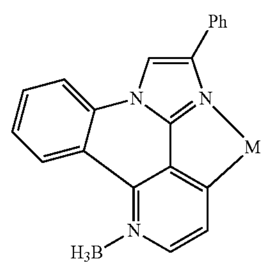
LA634
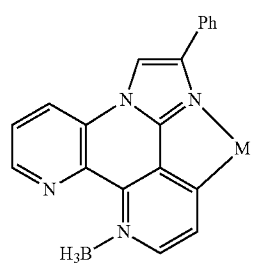
LA636
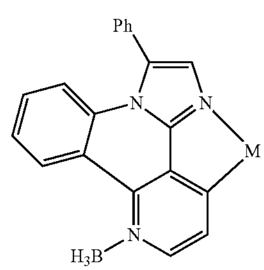
LA638
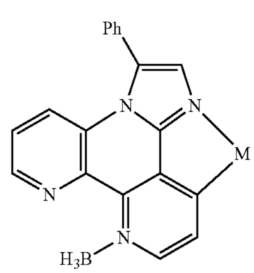

-continued
LA644
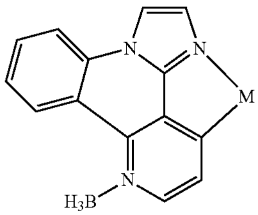
LA646
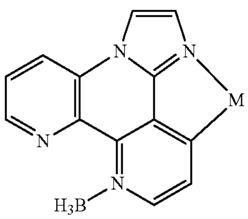
LA648
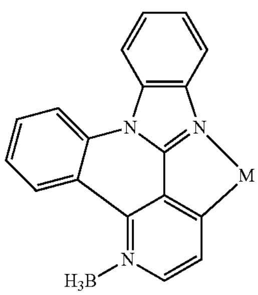
LA650
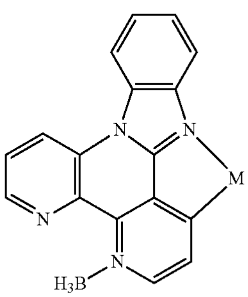
LA652
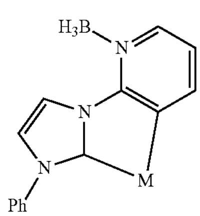
LA653
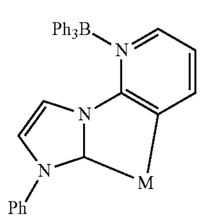
-continued
LA654
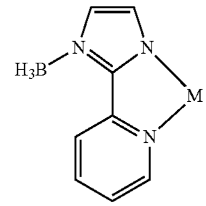
LA655
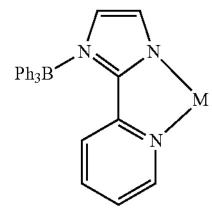
LA656
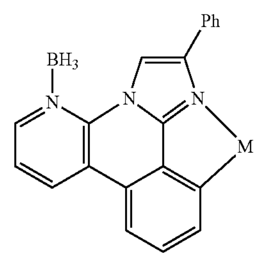
LA658
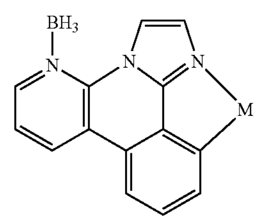
LA662
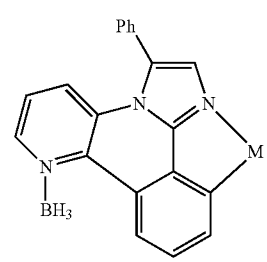
LA664
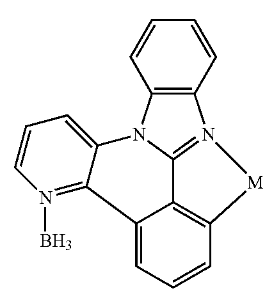

-continued
LA666
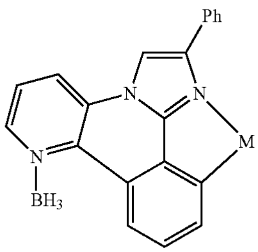
LA668
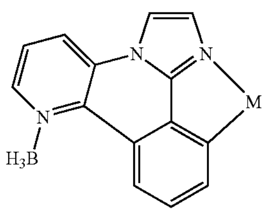
LA670
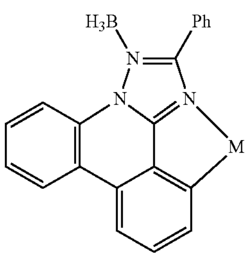
LA672
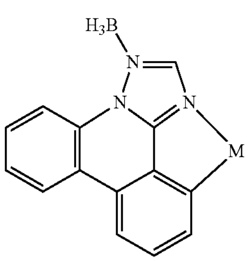
LA674
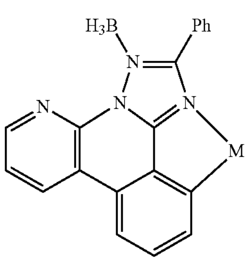
LA676
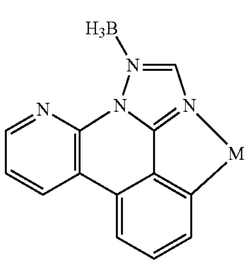
-continued
LA678
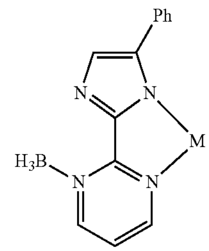
LA679
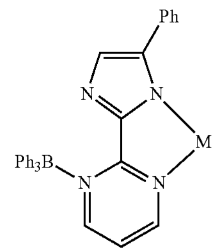
LA680
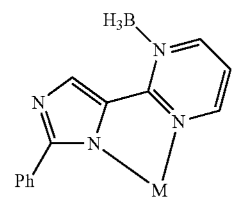
LA681
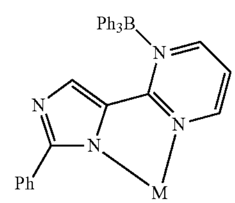
LA682
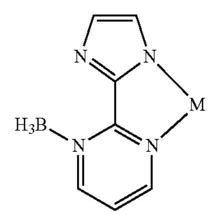
LA683
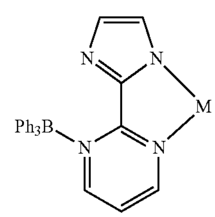
LA684
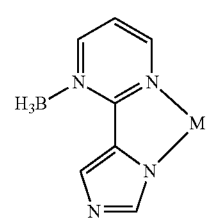

LA685
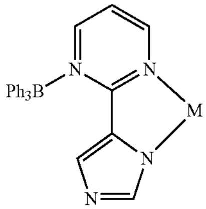
LA686
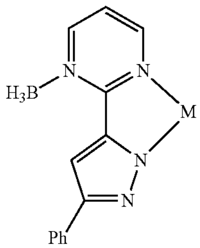
LA687
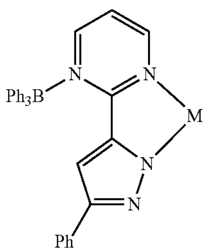
LA688
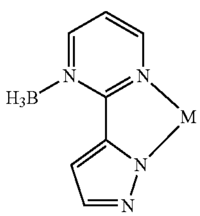
LA689
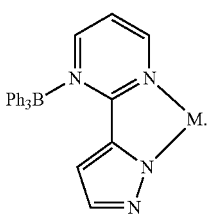
8. The compound of claim 1, wherein each $L^1$ is independently selected from the group consisting of:
$L_{B1}$
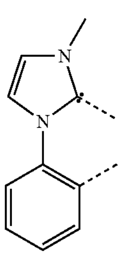
$L_{B2}$
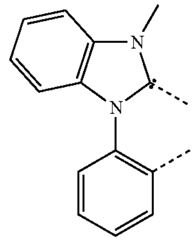
$L_{B3}$
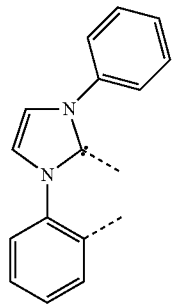
$L_{B4}$
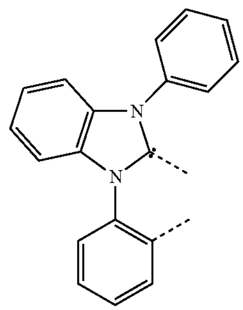
$L_{B5}$
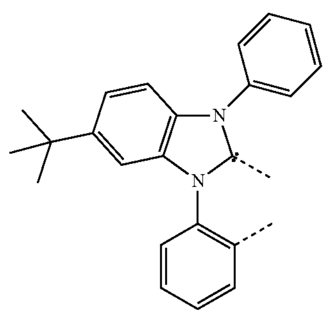
$L_{B6}$
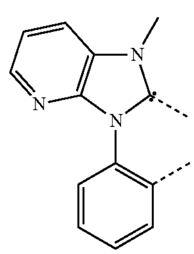

-continued
$L_{B7}$
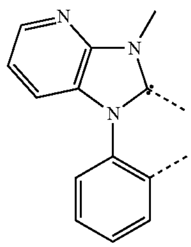
$L_{B8}$
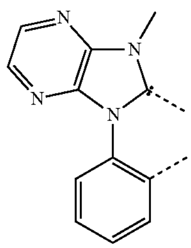
$L_{B9}$
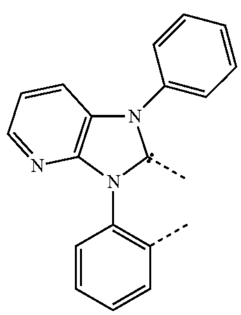
$L_{B10}$
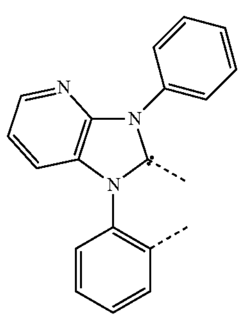
$L_{B11}$
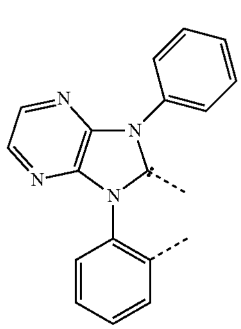
-continued
$L_{B12}$
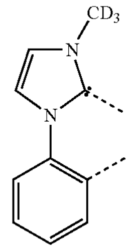
$L_{B13}$
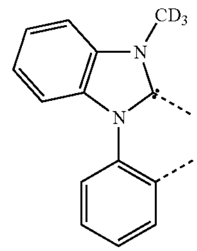
$L_{B14}$
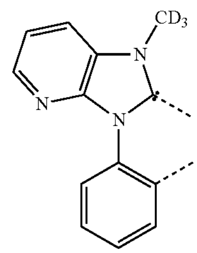
$L_{B15}$
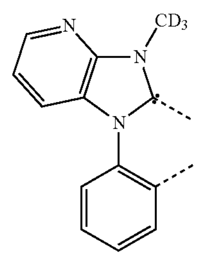
$L_{B16}$
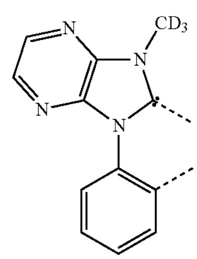
$L_{B17}$
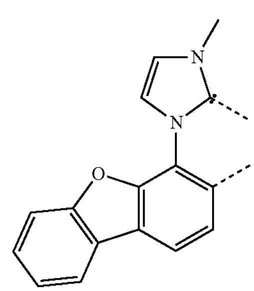

-continued
$L_{B18}$
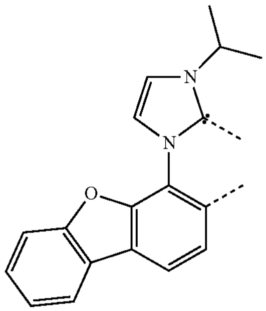
$L_{B19}$
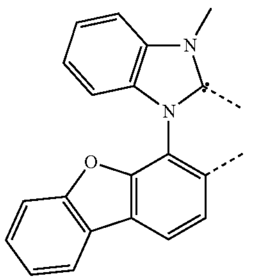
$L_{B20}$
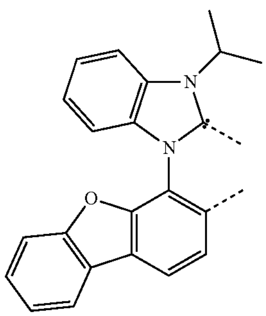
$L_{B21}$
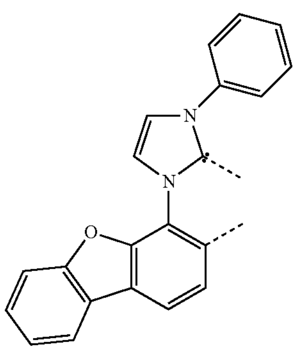
$L_{B22}$
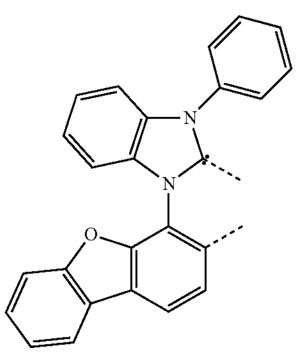
-continued
$L_{B23}$
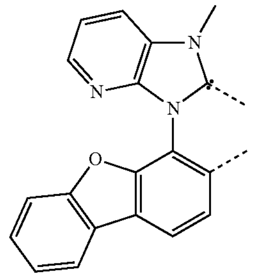
$L_{B24}$
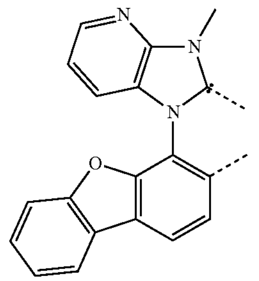
$L_{B25}$
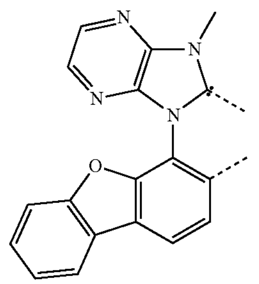
$L_{B26}$
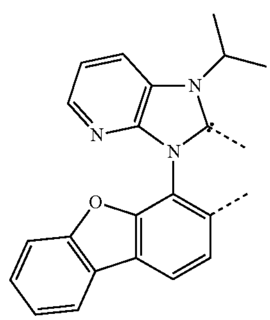
$L_{B27}$
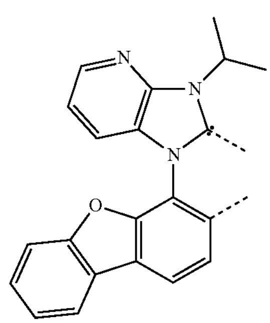

-continued
$L_{B28}$
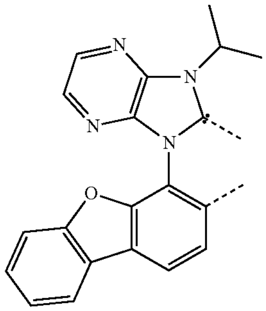
$L_{B29}$
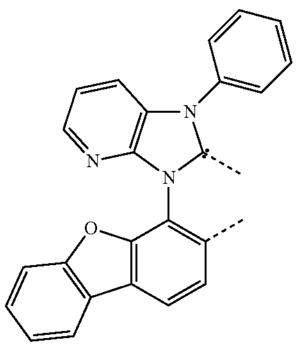
$L_{B30}$
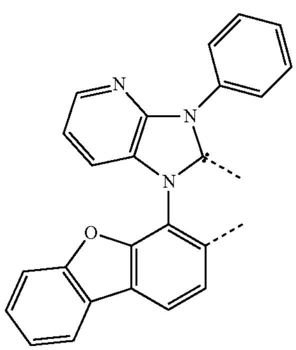
$L_{B31}$
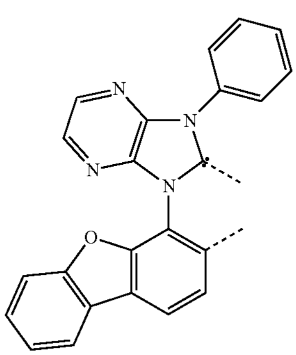
-continued
$L_{B32}$
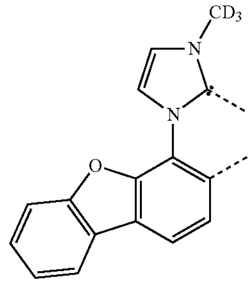
$L_{B33}$
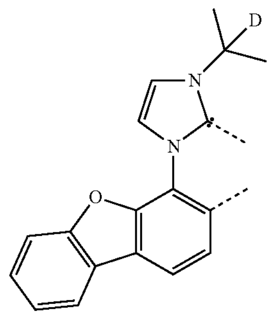
$L_{B34}$
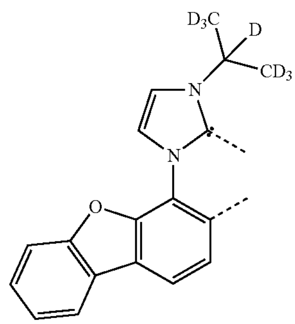
$L_{B35}$
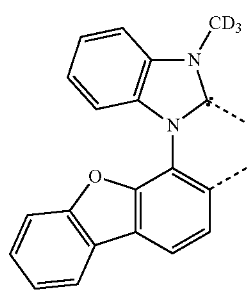
$L_{B36}$
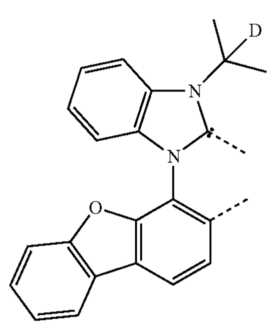

-continued
$L_{B37}$
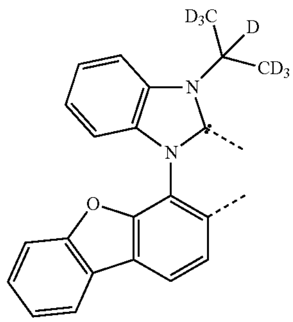
$L_{B38}$
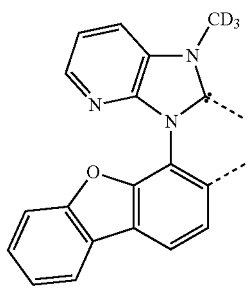
$L_{B39}$
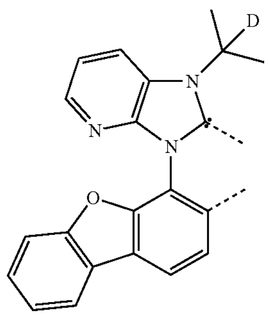
$L_{B40}$
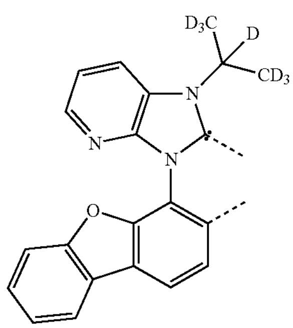
$L_{B41}$
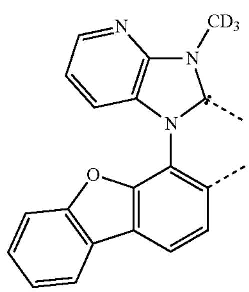
-continued
$L_{B42}$
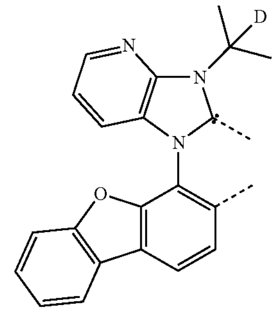
$L_{B43}$
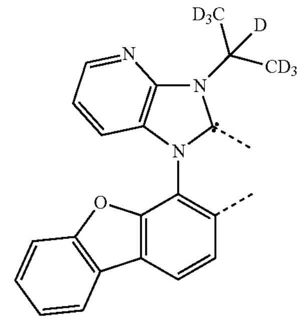
$L_{B44}$
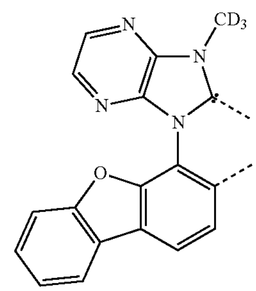
$L_{B45}$
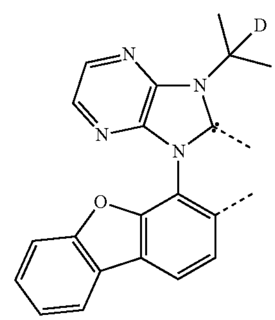
$L_{B46}$
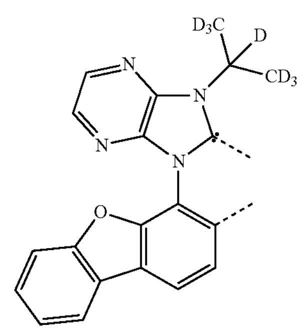

-continued
$L_{B47}$
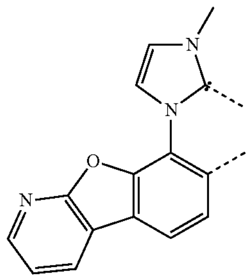
$L_{B48}$
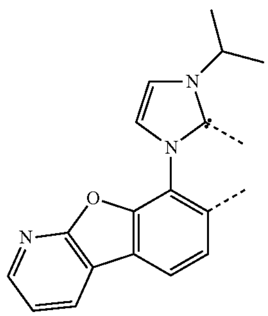
$L_{B49}$
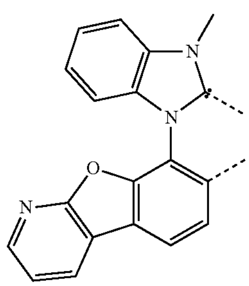
$L_{B50}$
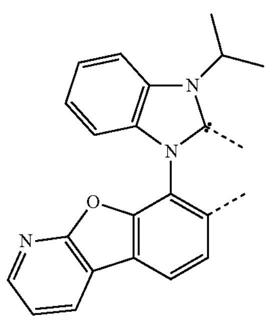
$L_{B51}$
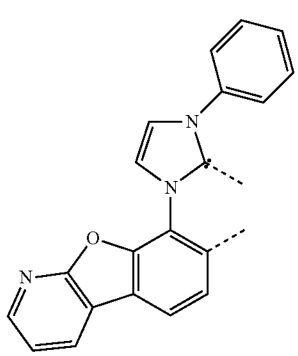
-continued
$L_{B52}$
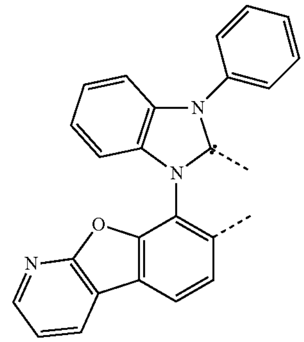
$L_{B53}$
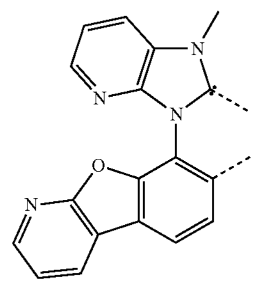
$L_{B54}$
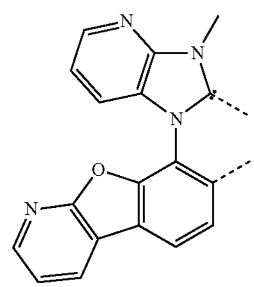
$L_{B55}$
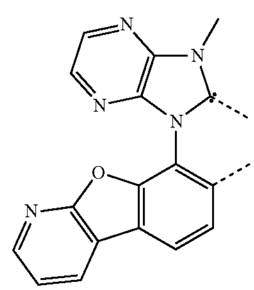
$L_{B56}$
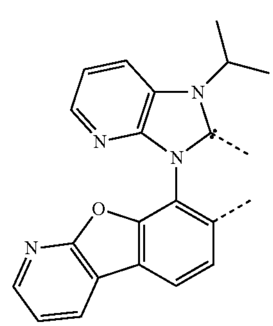

-continued
$L_{B57}$
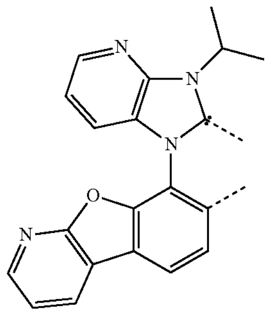
$L_{B58}$
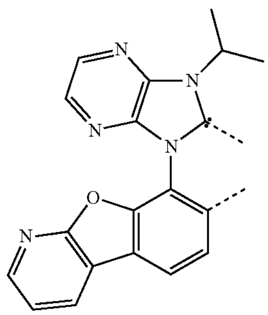
$L_{B59}$
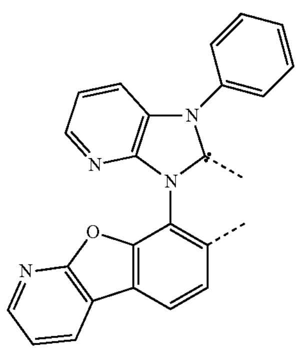
$L_{B60}$
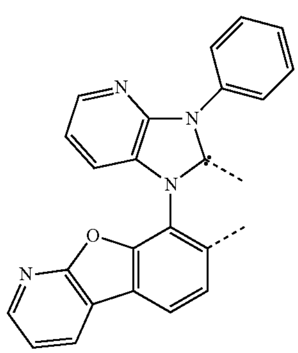
-continued
$L_{B61}$
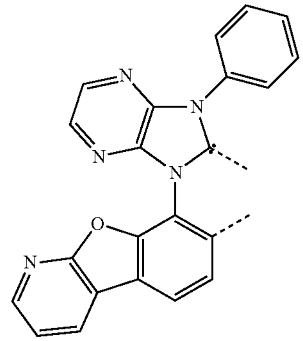
$L_{B62}$
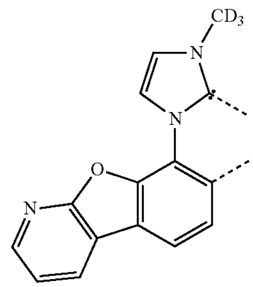
$L_{B63}$
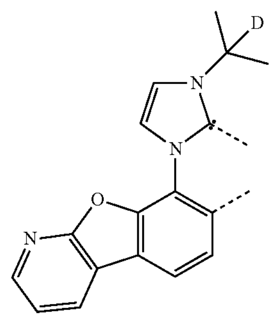
$L_{B64}$
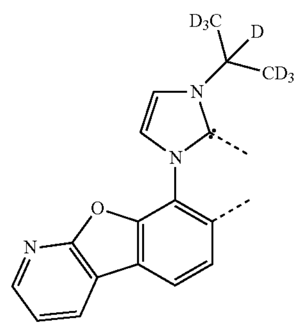
$L_{B65}$
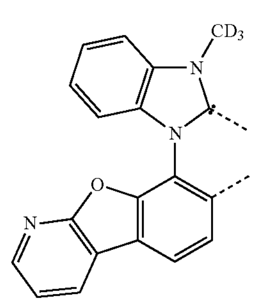

-continued
$L_{B66}$
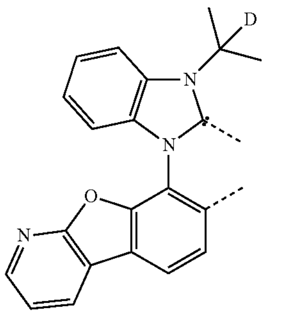
$L_{B67}$
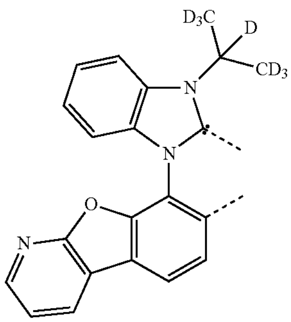
$L_{B68}$
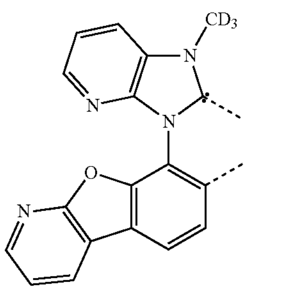
$L_{B69}$
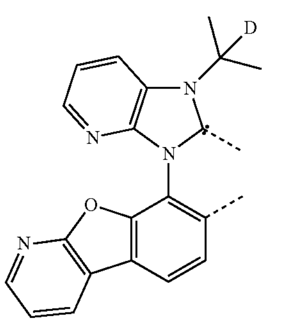
$L_{B70}$
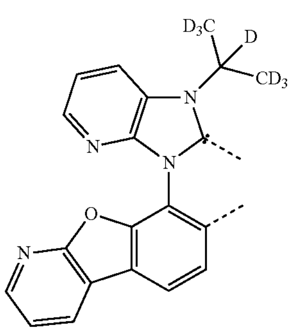
-continued
$L_{B71}$
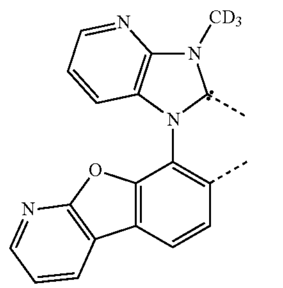
$L_{B72}$
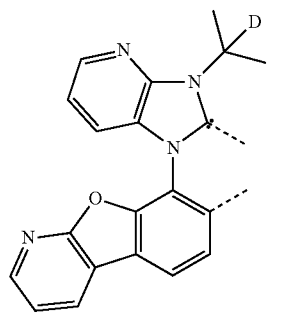
$L_{B73}$
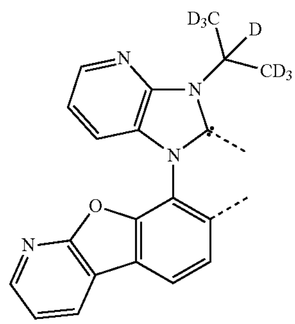
$L_{B74}$
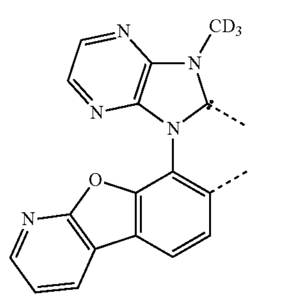
$L_{B75}$
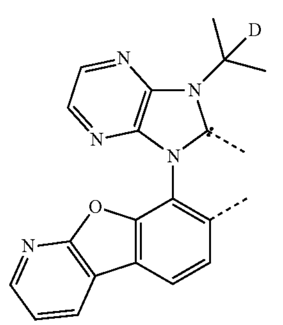

-continued
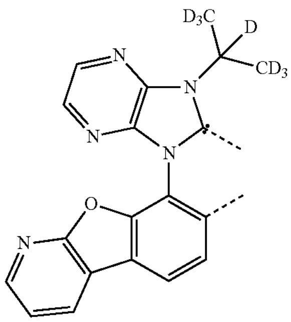
$L_{B76}$
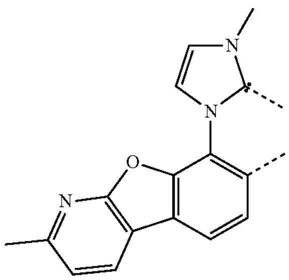
$L_{B77}$
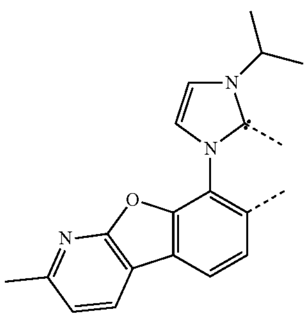
$L_{B78}$
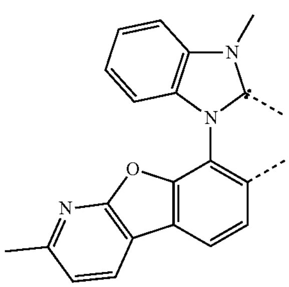
$L_{B79}$
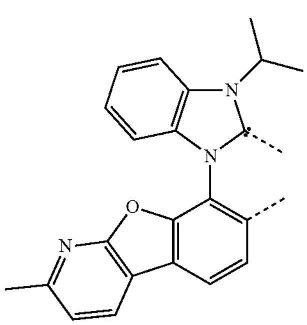
$L_{B80}$
-continued
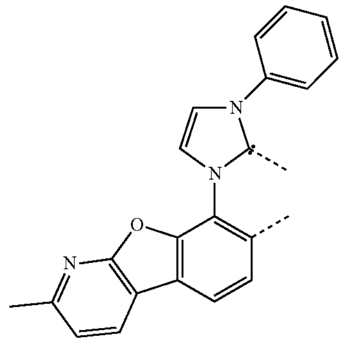
$L_{B81}$
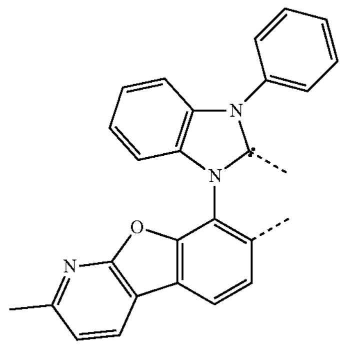
$L_{B82}$
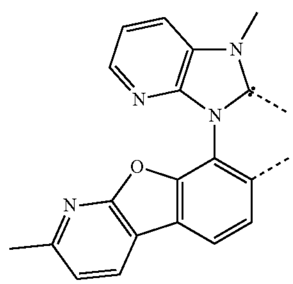
$L_{B83}$
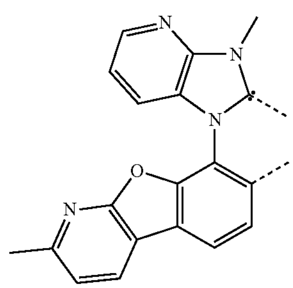
$L_{B84}$
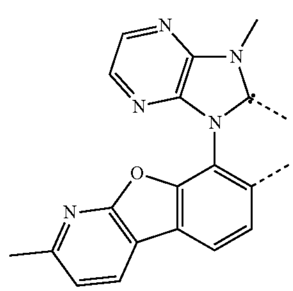
$L_{B85}$ -continued
$L_{B86}$
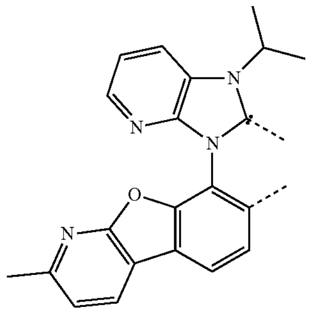
$L_{B87}$
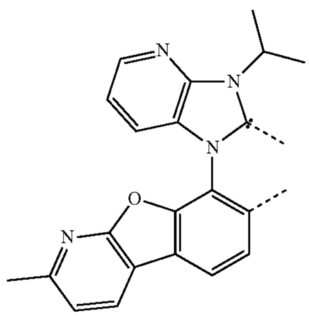
$L_{B88}$
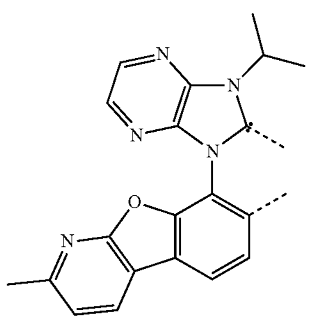
$L_{B89}$
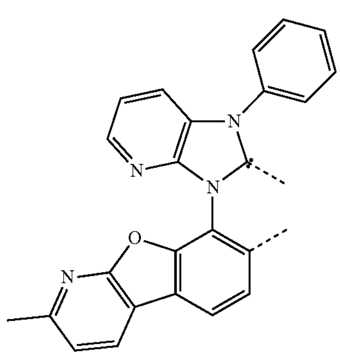
-continued
$L_{B90}$
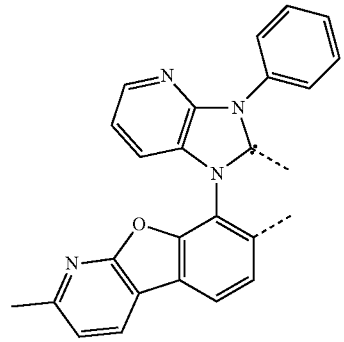
$L_{B91}$
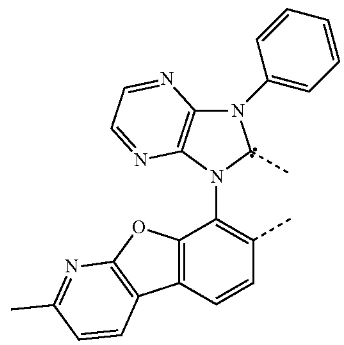
$L_{B92}$
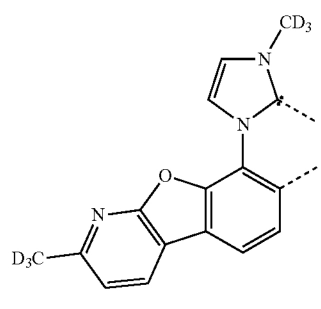
$L_{B93}$
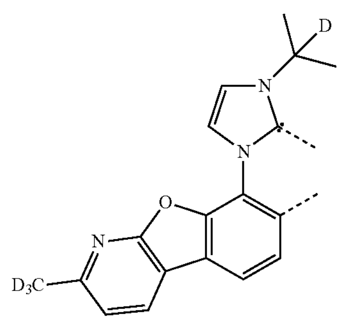
$L_{B94}$
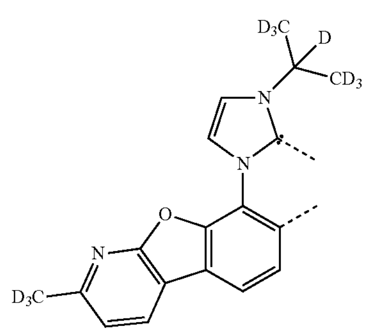

$L_{B95}$
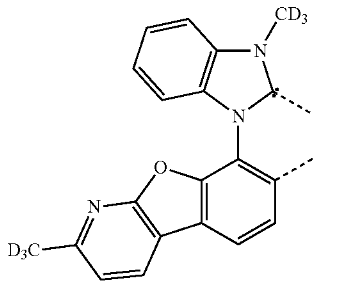
$L_{B96}$
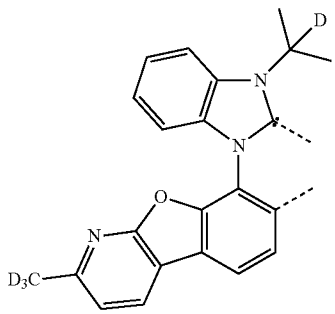
$L_{B97}$
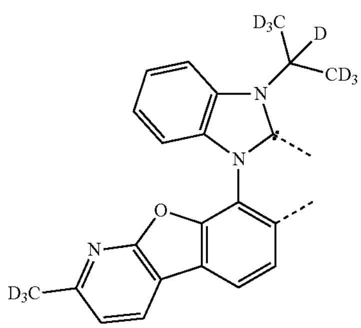
$L_{B98}$
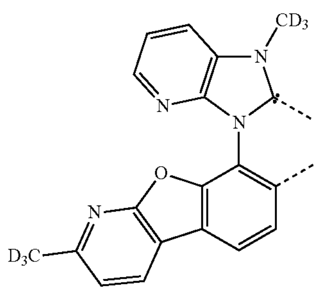
$L_{B99}$
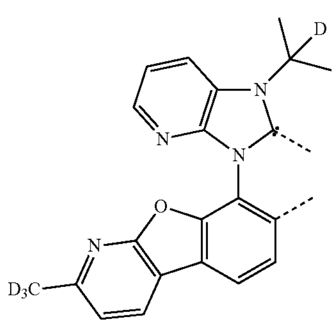
$L_{B100}$
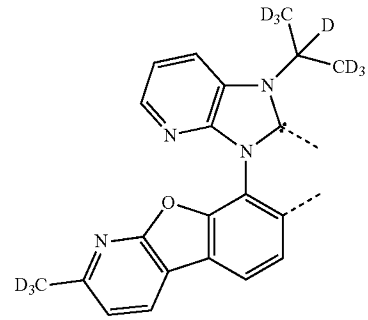
$L_{B101}$
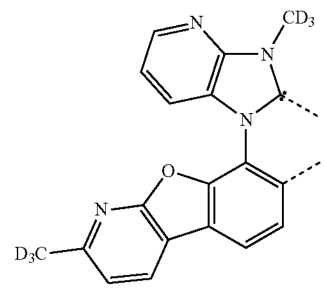
$L_{B102}$
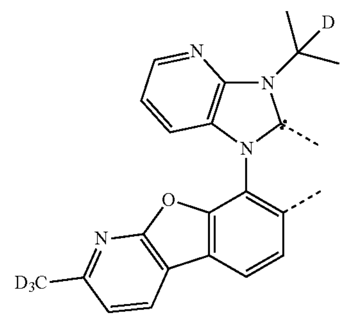
$L_{B103}$
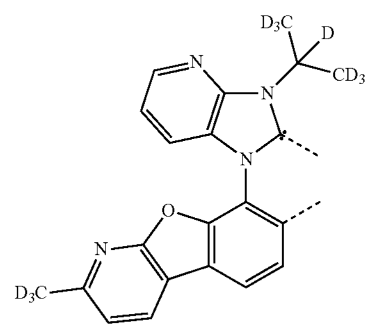
$L_{B104}$
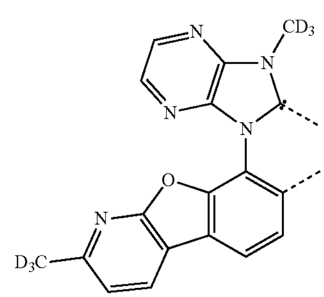

-continued
$L_{B105}$
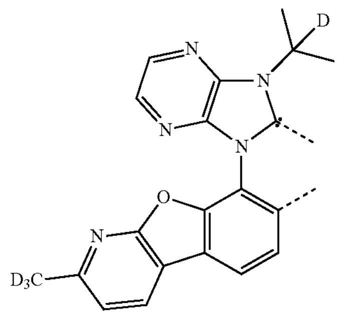
$L_{B106}$
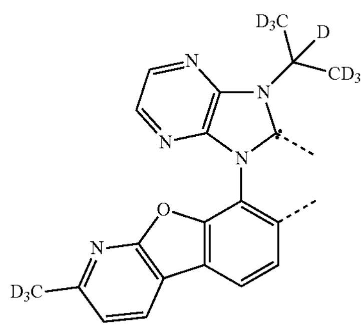
$L_{B107}$
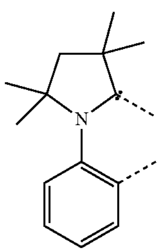
$L_{B108}$
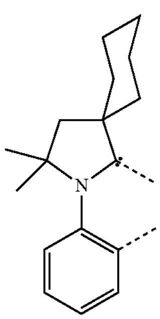
$L_{B109}$
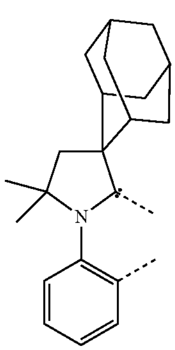
-continued
$L_{B110}$
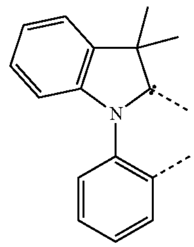
$L_{B111}$
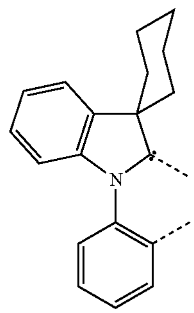
$L_{B112}$
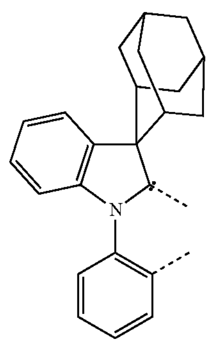
$L_{B113}$
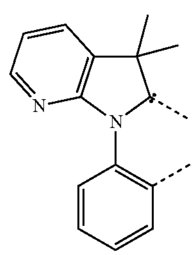
$L_{B114}$
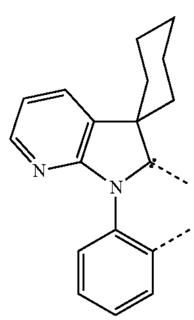

-continued
$L_{B115}$
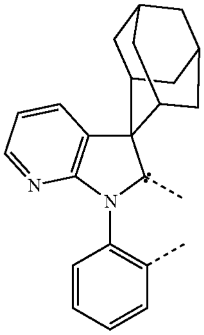
$L_{B116}$
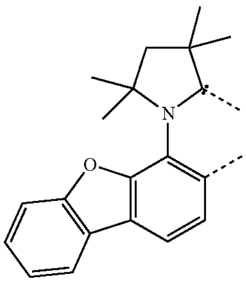
$L_{B117}$
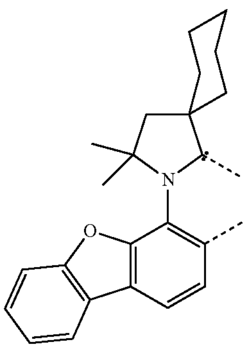
$L_{B118}$
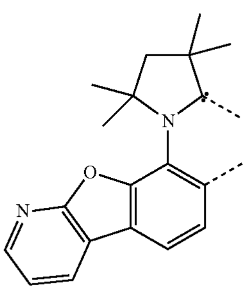
$L_{B119}$
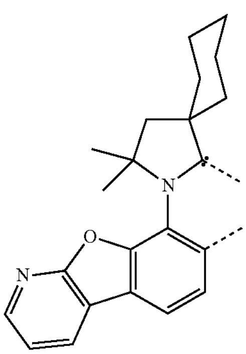
-continued
$L_{B120}$
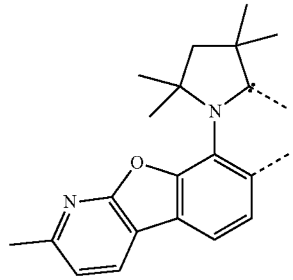
$L_{B121}$
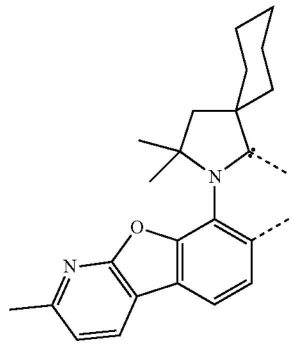
$L_{B122}$
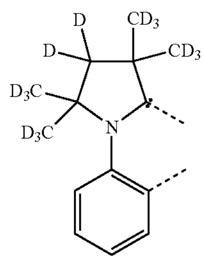
$L_{B123}$
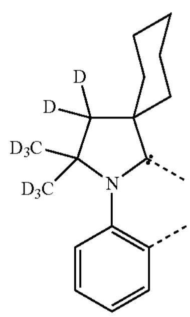
$L_{B124}$
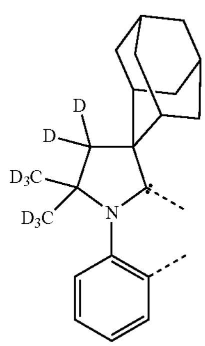

-continued
$L_{B125}$
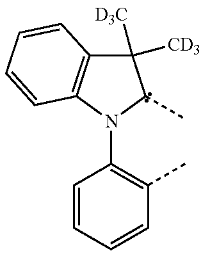
$L_{B126}$
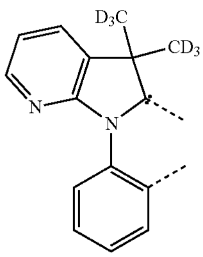
$L_{B127}$
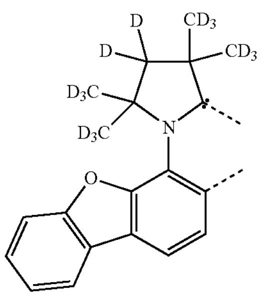
$L_{B128}$
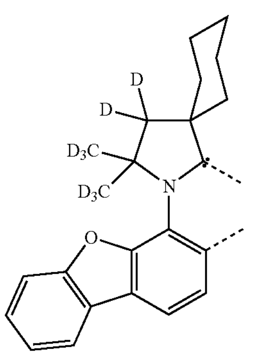
$L_{B129}$
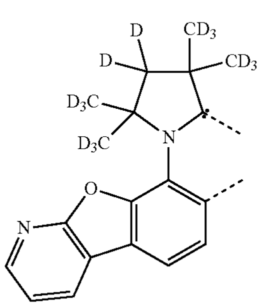
-continued
$L_{B130}$
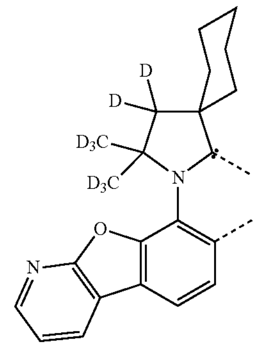
$L_{B131}$
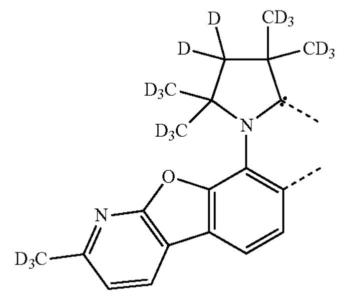
$L_{B132}$
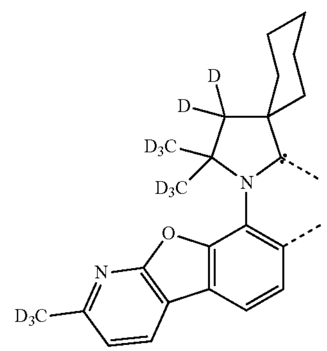
$L_{B133}$
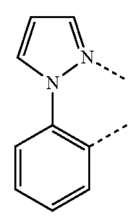
$L_{B134}$
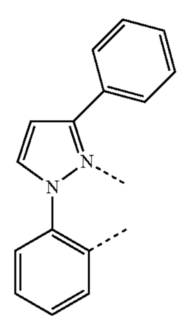

$L_{B135}$
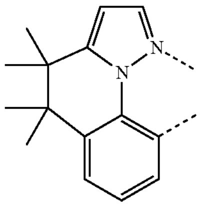
$L_{B136}$
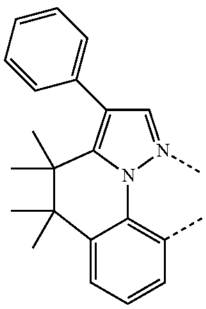
$L_{B137}$
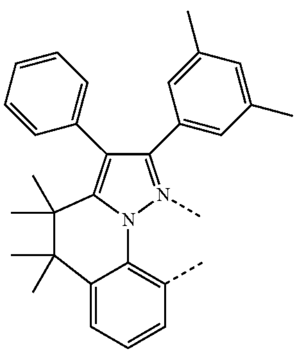
$L_{B138}$
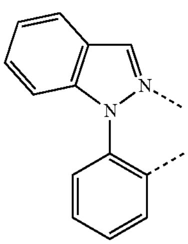
$L_{B139}$
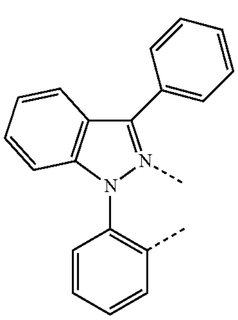
$L_{B140}$
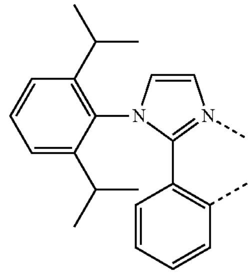
$L_{B141}$
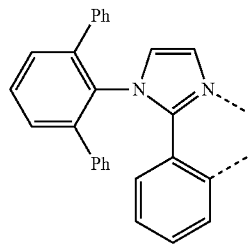
$L_{B142}$
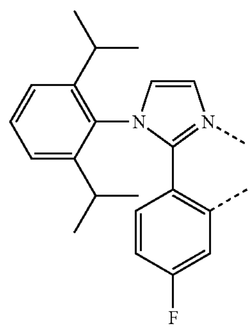
$L_{B143}$
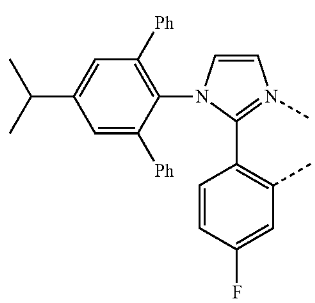
$L_{B144}$
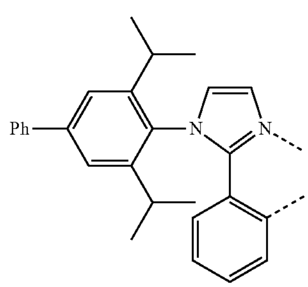

-continued
$L_{B145}$
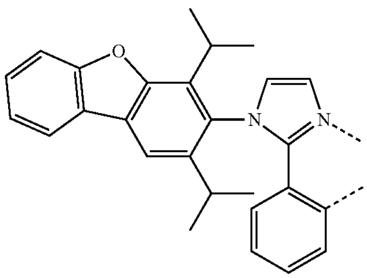
$L_{B146}$
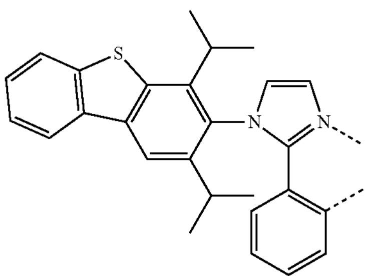
$L_{B147}$
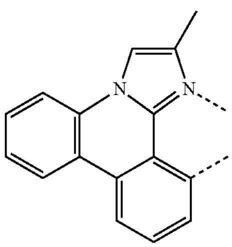
$L_{B148}$
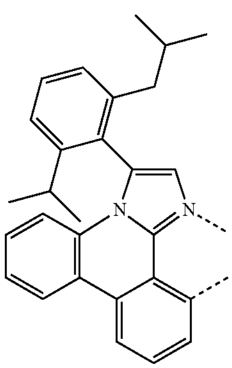
$L_{B149}$
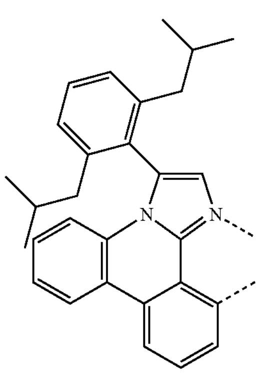
-continued
$L_{B150}$
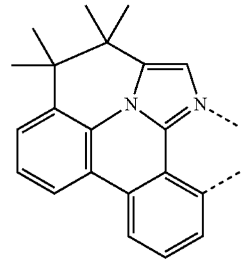
$L_{B151}$
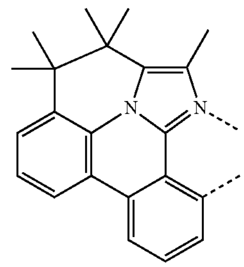
$L_{B152}$
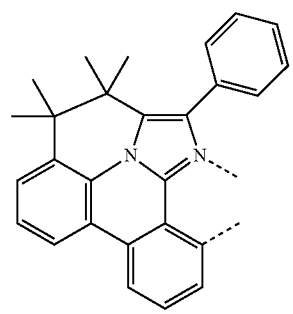
$L_{B153}$
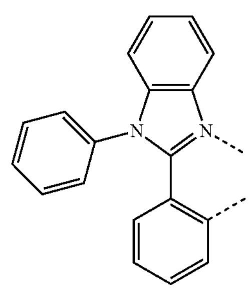
$L_{B154}$
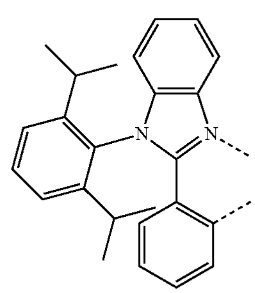

$L_{B155}$
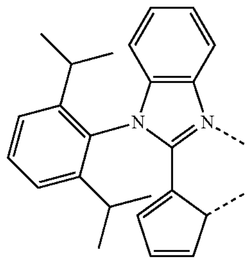
$L_{B156}$
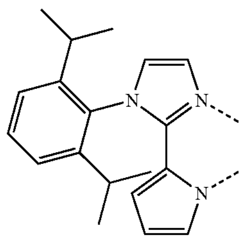
$L_{B157}$
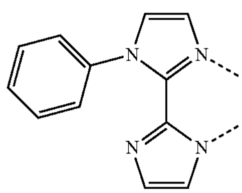
$L_{B158}$
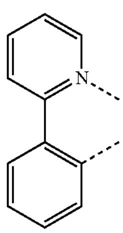
$L_{B159}$
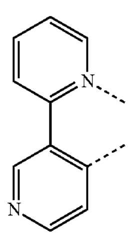
$L_{B160}$
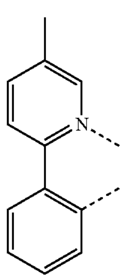
$L_{B161}$
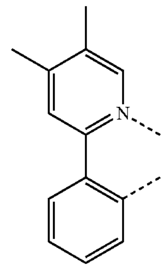
$L_{B162}$
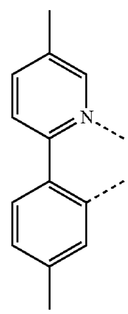
$L_{B163}$
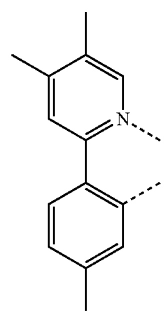
$L_{B164}$
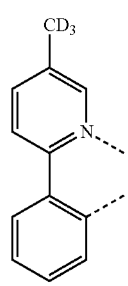
$L_{B165}$
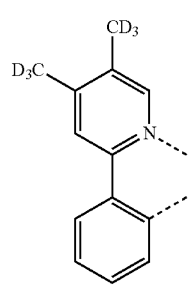

-continued
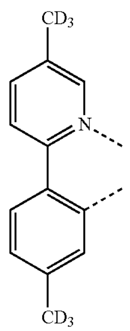
$L_{B166}$
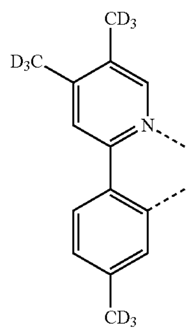
$L_{B167}$
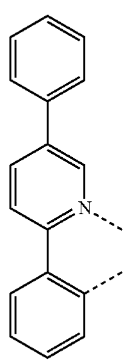
$L_{B168}$
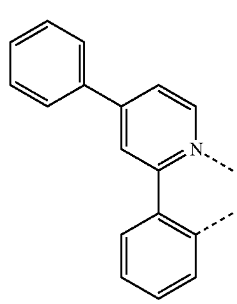
$L_{B169}$
-continued
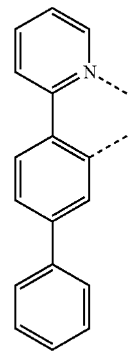
$L_{B170}$
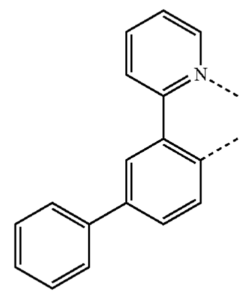
$L_{B171}$
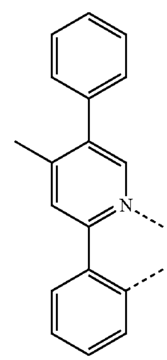
$L_{B172}$
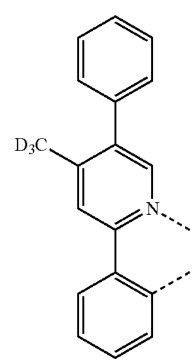
$L_{B173}$
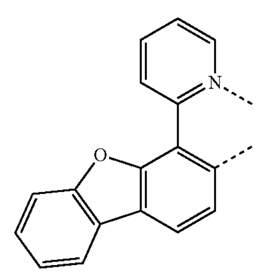
$L_{B174}$ -continued
L$_{B175}$
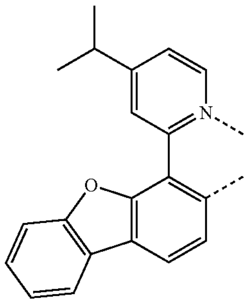
L$_{B176}$
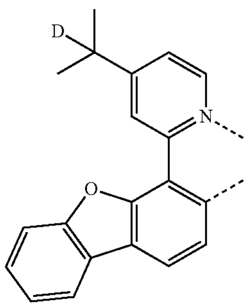
L$_{B177}$
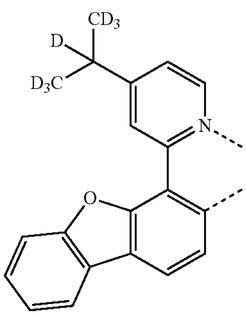
L$_{B178}$
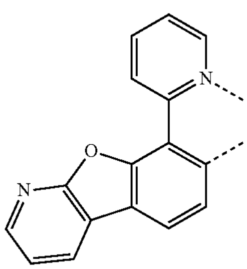
L$_{B179}$
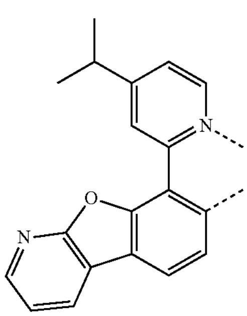
-continued
L$_{B180}$
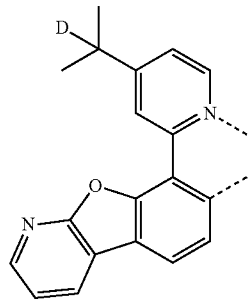
L$_{B181}$
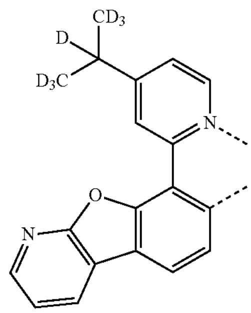
L$_{B182}$
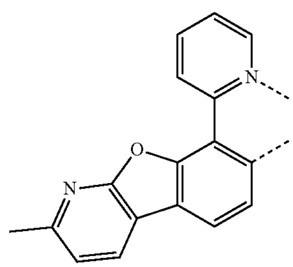
L$_{B183}$
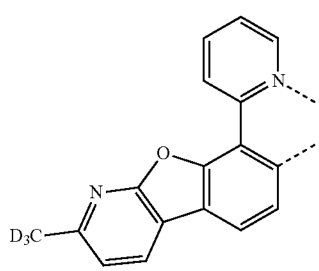
L$_{B184}$
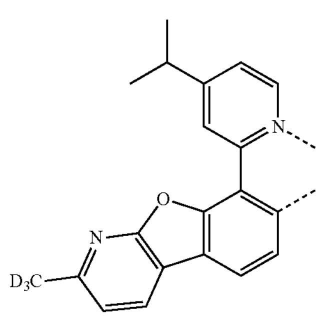

-continued
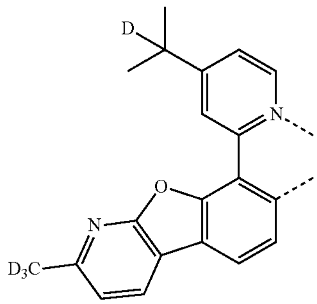
$L_{B185}$
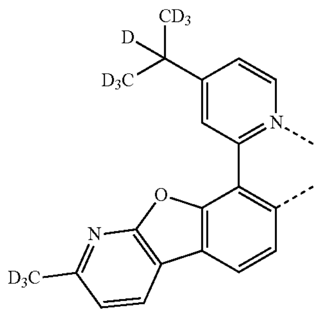
$L_{B186}$
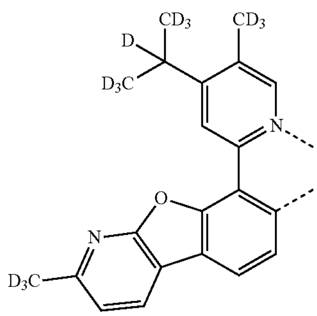
$L_{B187}$
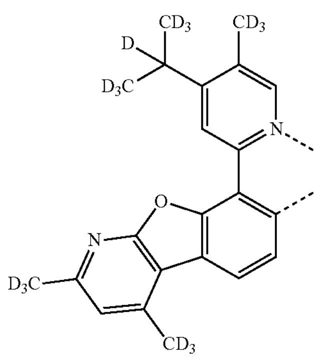
$L_{B188}$
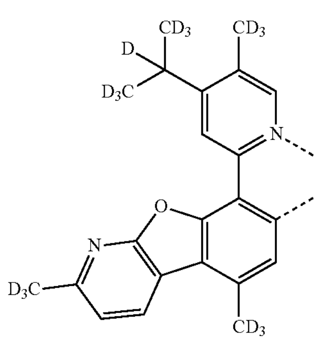
$L_{B189}$
-continued
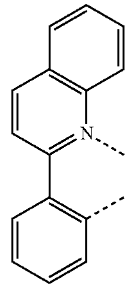
$L_{B190}$
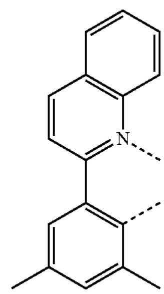
$L_{B191}$
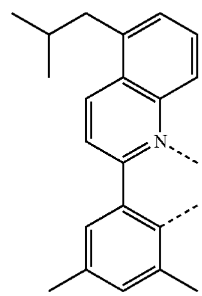
$L_{B192}$
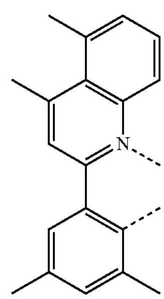
$L_{B193}$
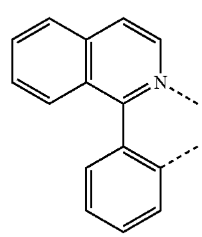
$L_{B194}$ -continued
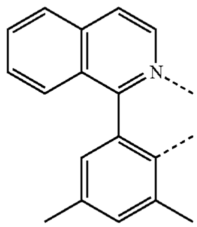
$L_{B195}$
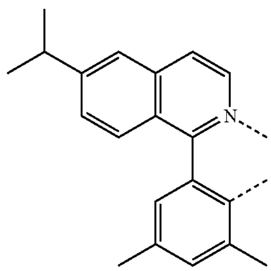
$L_{B196}$
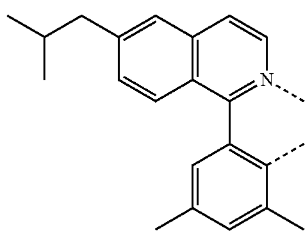
$L_{B197}$
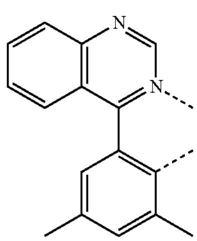
$L_{B198}$
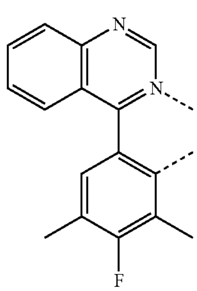
$L_{B199}$
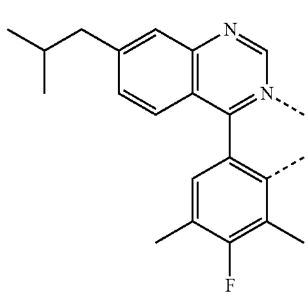
$L_{B200}$
-continued
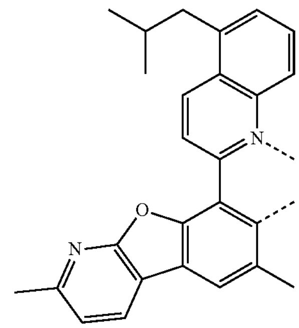
$L_{B201}$
9. A formulation comprising the compound of claim 1.
10. The compound of claim 1, wherein each $L^1$ is independently selected from the group consisting of:
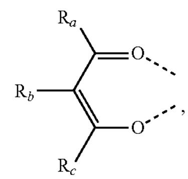
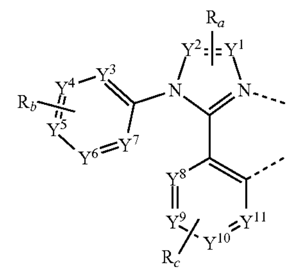
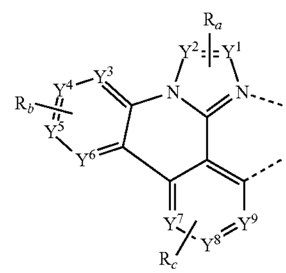
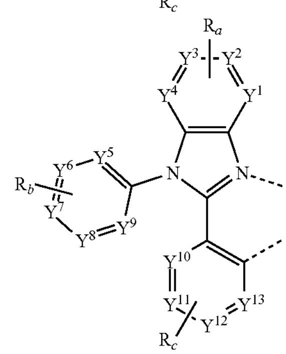
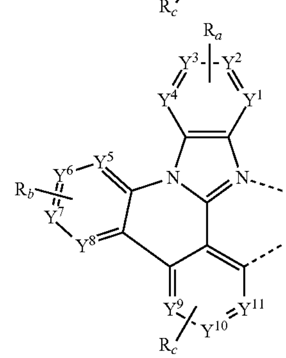
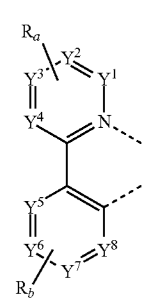

-continued

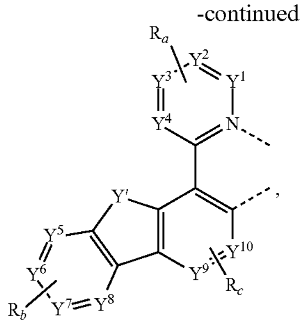

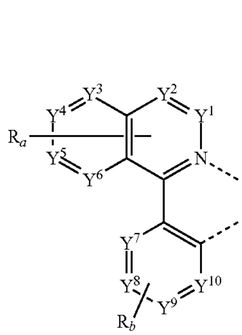

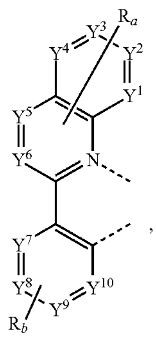

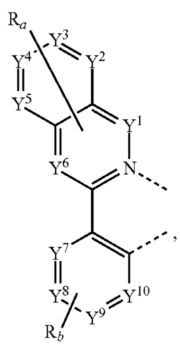

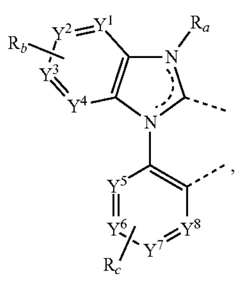

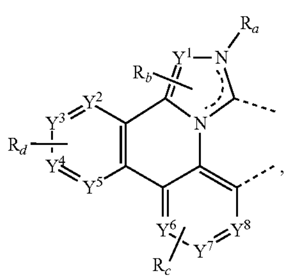

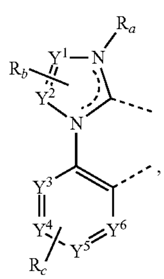

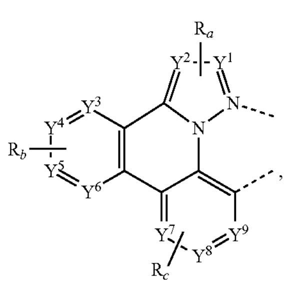

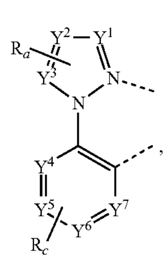

-continued

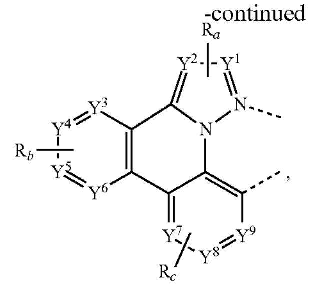

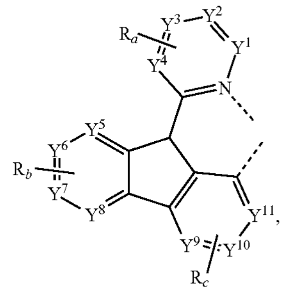

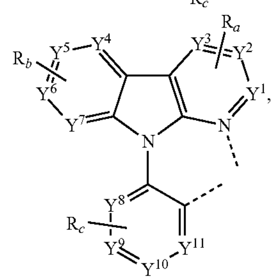

and

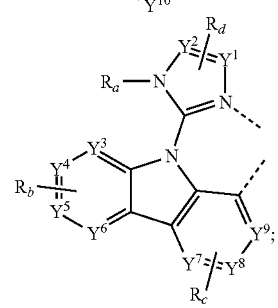

wherein each $Y^1$ to $Y^{13}$ is independently selected from the group consisting of carbon and nitrogen;

wherein Y' is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

11. The compound of claim 10, wherein the first ligand-$M^1$ structure is selected from the group consisting of:
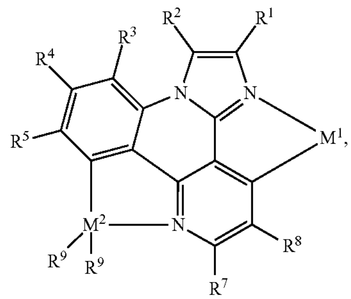
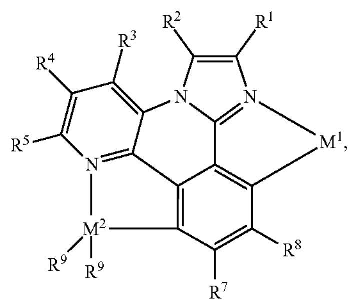
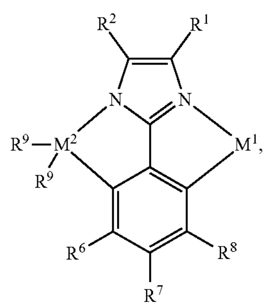
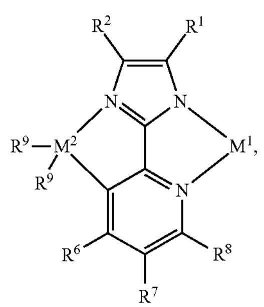
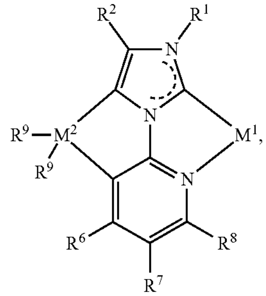
-continued
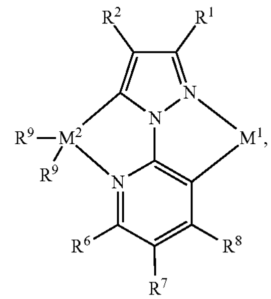
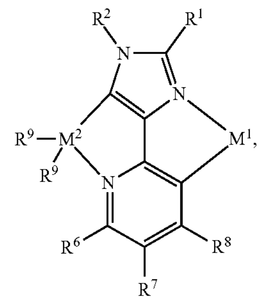
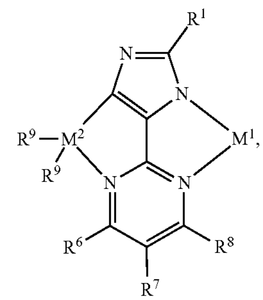
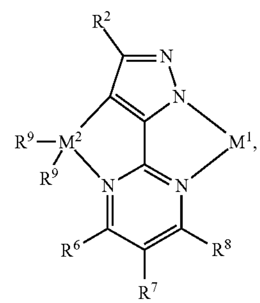
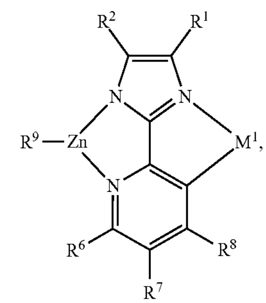
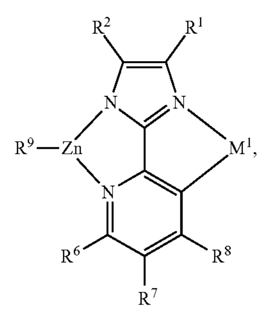
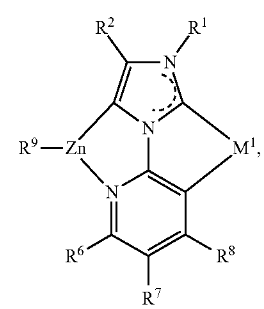
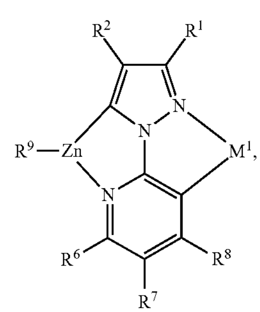
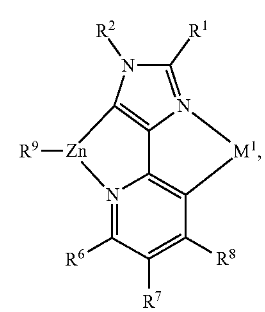

-continued

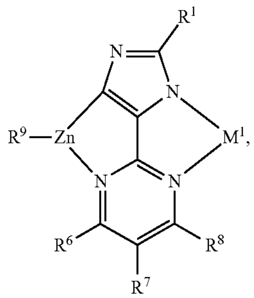

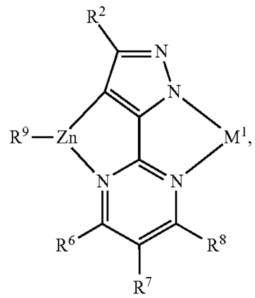

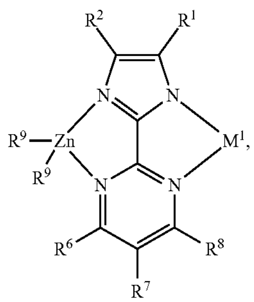

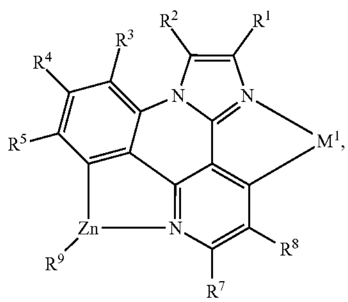

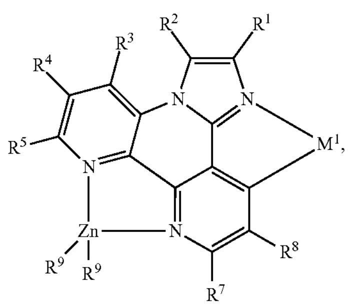

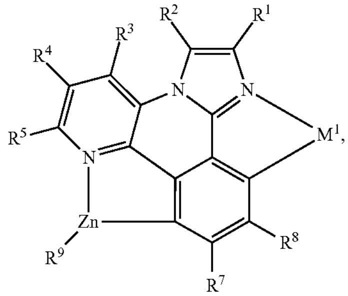

-continued

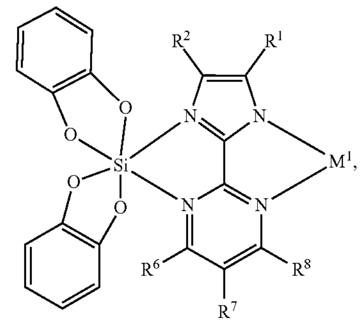

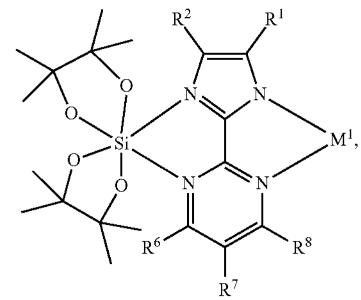

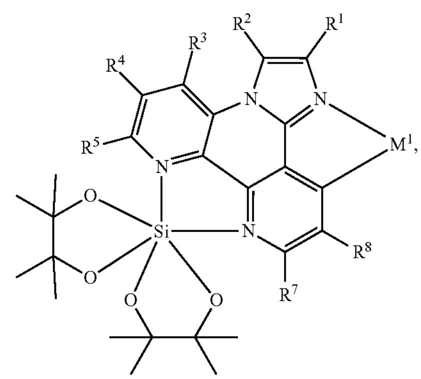

and

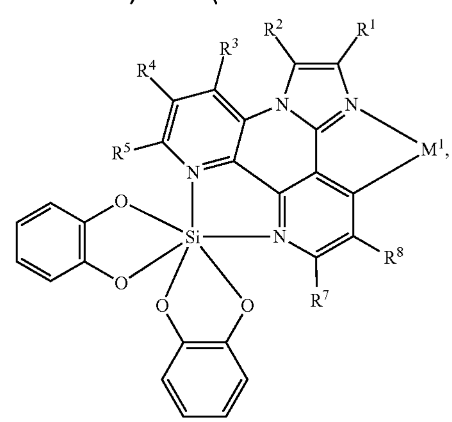

wherein $R^1$, $R^2$, $R^3$, $R^4$, $R^5$, $R^6$, $R^7$, and $R^8$ have the same definition as R'; and wherein $R^9$ has the same definition as $L^2$.

12. An organic light emitting device (OLED) comprising:

an anode;

a cathode; and an organic layer, disposed between the anode and the cathode, comprising a compound having a structure selected from the group consisting of:

Formula I

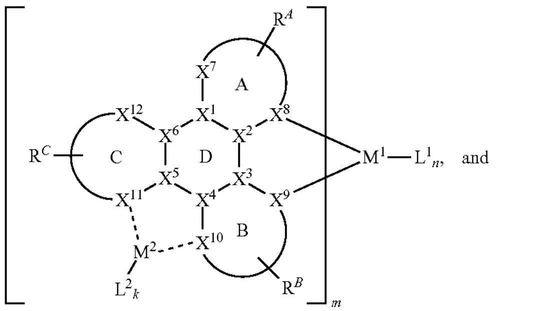

Formula II

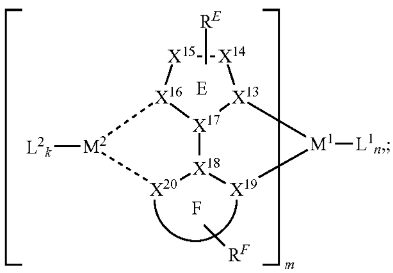

wherein $X^1$ to $X^{20}$ are each independently selected from the group consisting of carbon and nitrogen;

wherein in Formula I, rings A, B, and C are each independently a 5- or 6-membered aromatic ring, and all are fused to ring D and form a first ligand having an 18-π electronic system;

wherein one of the rings A, B, and C is a 5-membered aromatic ring, and the remaining rings A, B, and C are each independently a 6-membered aromatic ring;

wherein in Formula II, ring E is a 5-membered aromatic ring, ring F is a 5- or 6-membered aromatic ring, the structure formed by ring E and ring F connected together forms a first ligand in Formula II;

wherein $R^A$, $R^B$, $R^C$, $R^E$, and $R^F$ each independently represents none to a maximum possible number of substitutions;

wherein $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein any substitutions in $R^A$, $R^B$, $R^C$, $R^E$, and $R^F$ are optionally joined or fused into a ring;

wherein $M^1$ is a metal having atomic weight greater than 40;

wherein $M^2$ is selected from the group consisting of B, Al, Ga, Si, Ge, Sn, Zn, Cd, Pd, Pt, Co, Rh, Ir, Re, Ru, Os, Cu, Ag, and Au;

wherein $M^1$ and $M^2$ are different;

wherein in Formula I, $M^2$ coordinates to at least one of $X^{10}$ and $X^{11}$, and in Formula II, $M^2$ coordinates to at least one of $X^{16}$ and $X^{20}$;

wherein when the compound has the structure of Formula I and $M^2$ is B, $L^2$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, heteroaryl, acyl, carboxylic acid, ether, ester, nitrile, isonitrile, sulfanyl, sulfinyl, sulfonyl, phosphino, and combinations thereof;

wherein m and n have a value of at least 1 and m+n is the maximum possible number of ligands that are attached to $M^1$;

wherein k has a value of at least 1 and is the maximum possible number of ligands $L^2$ that can be attached to $M^2$;

wherein each $L^1$ is a bidentate ligand; and wherein the first ligand is optionally linked with $L^1$ to comprise a mutidentate ligand.

13. The OLED of claim 12, wherein the organic layer is an emissive layer and the compound is an emissive dopant or a non-emissive dopant.

14. The OLED of claim 12, wherein the organic layer further comprises a host, wherein host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

15. The OLED of claim 12, wherein the organic layer further comprises a host, wherein the host is selected from the group consisting of:

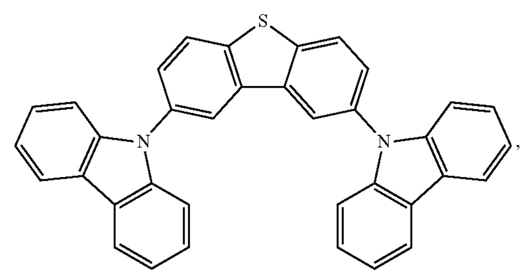

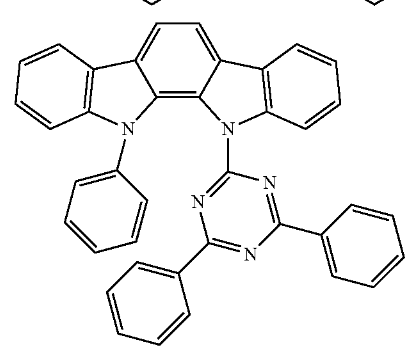

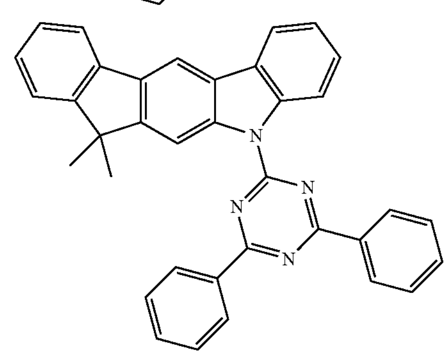

-continued
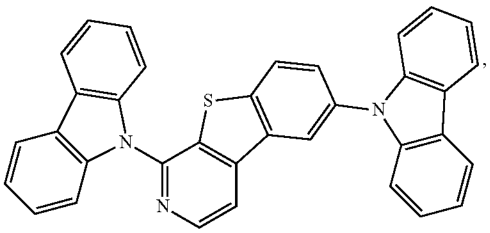
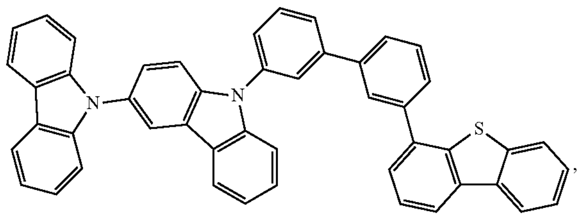
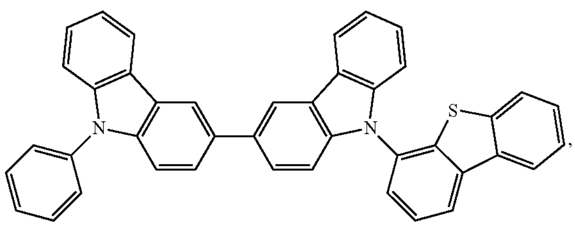
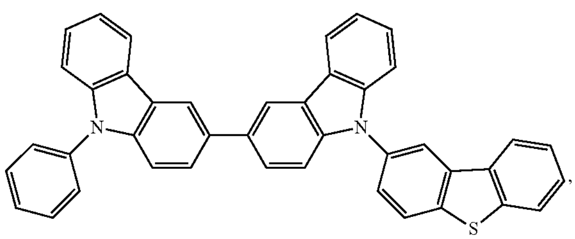
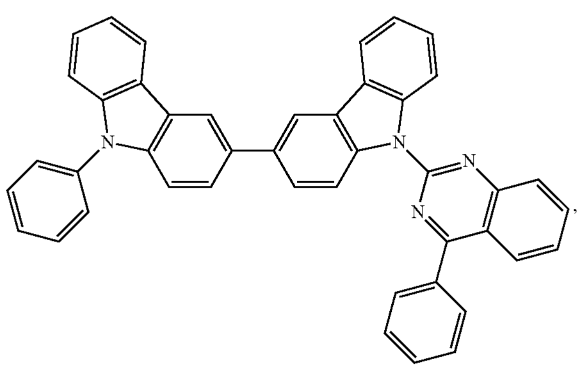
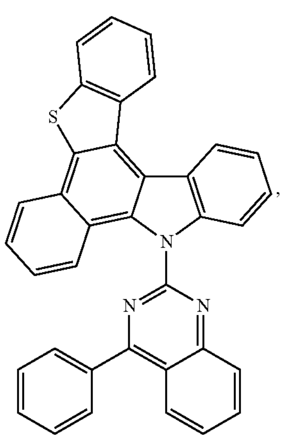
-continued
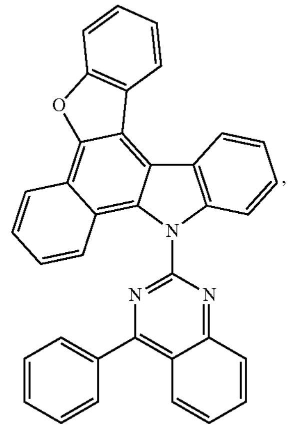
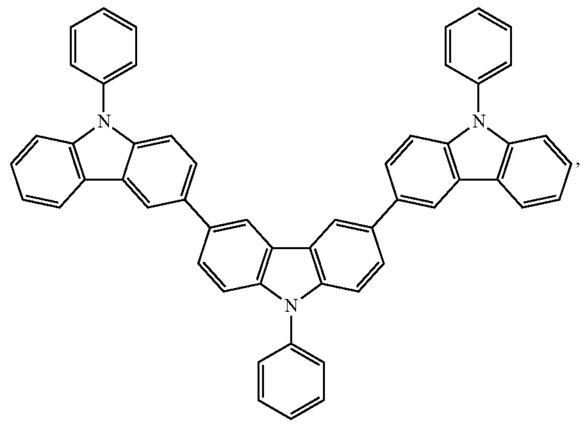
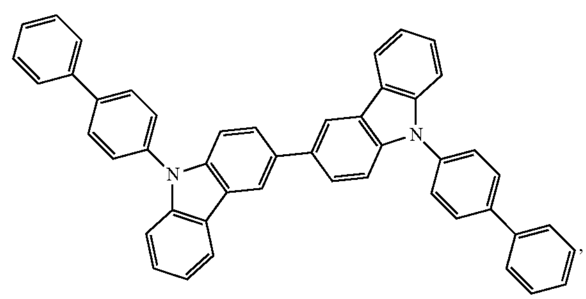
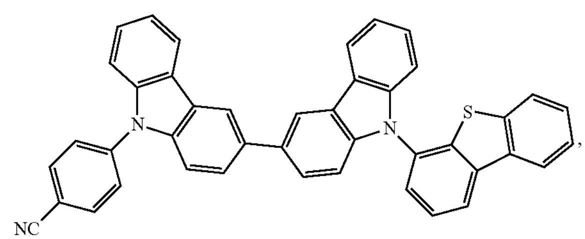
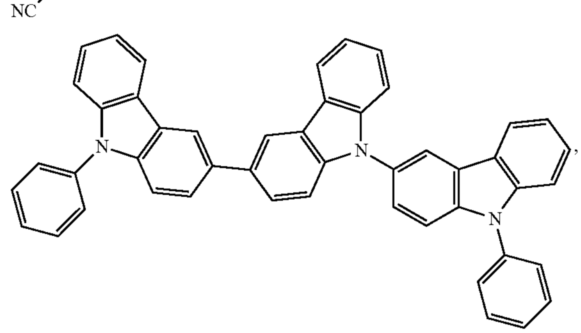

-continued

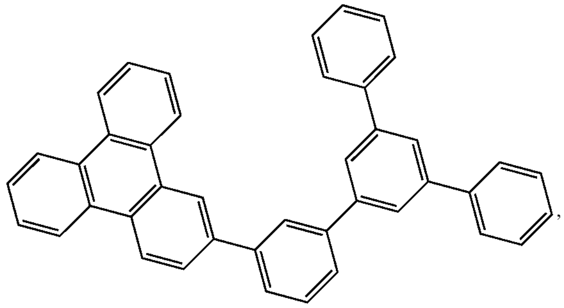

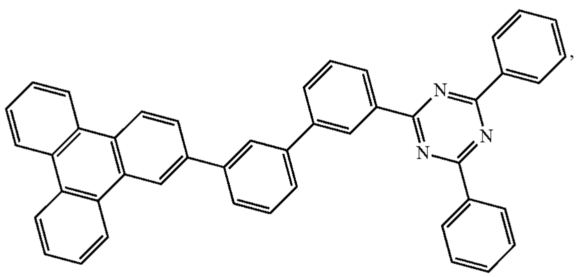

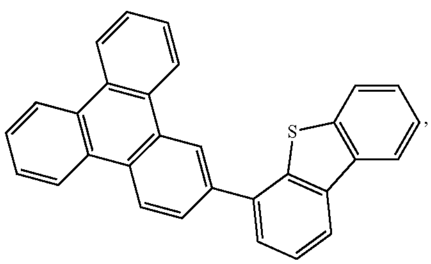

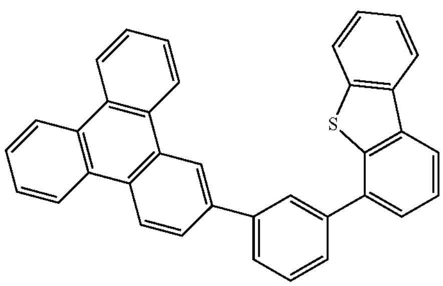

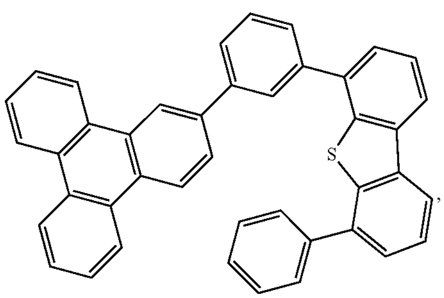

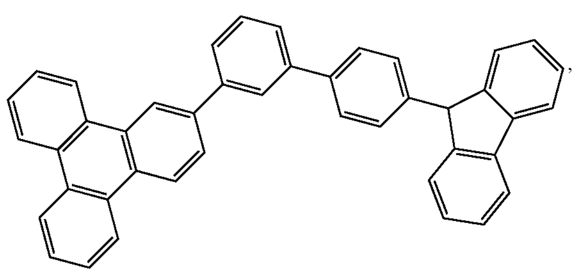

-continued

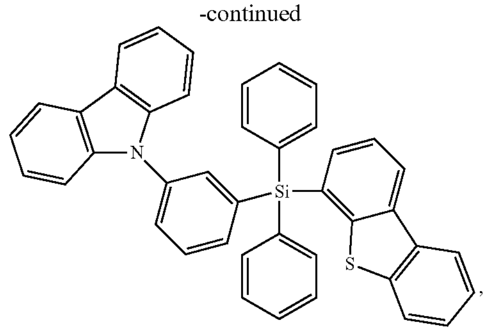

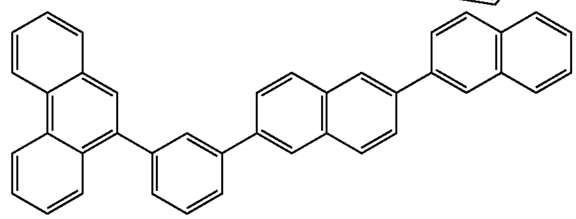

and combinations thereof.

16. A consumer product comprising an organic light-emitting device (OLED) comprising:

an anode;

a cathode; and an organic layer, disposed between the anode and the cathode, comprising a compound having a structure selected from the group consisting of:

Formula I

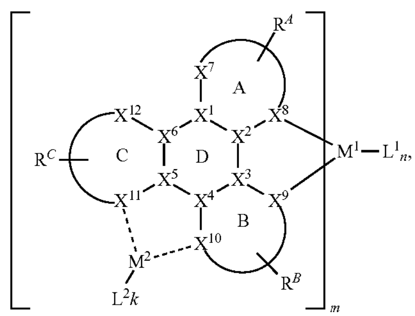

and

Formula II

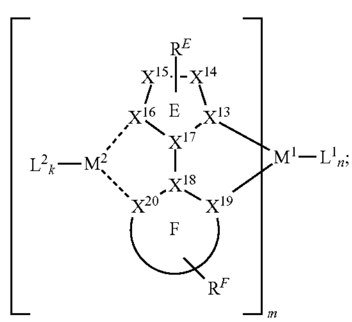

wherein $X^1$ to $X^{20}$ are each independently selected from the group consisting of carbon and nitrogen;

wherein in Formula I, rings A, B, and C are each independently a 5- or 6-membered aromatic ring, and all are fused to ring D and form a first ligand having an 18-π electronic system;

wherein one of the rings A, B, and C is a 5-membered aromatic ring, and the remaining rings A, B, and C are each independently a 6-membered aromatic ring;

wherein in Formula II, ring E is a 5-membered aromatic ring, ring F is a 5- or 6-membered aromatic ring, the structure formed by ring E and ring F connected together forms a first ligand in Formula II;

wherein $R^A$, $R^B$, $R^C$, $R^E$, and $R^F$ each independently represents none to a maximum possible number of substitutions;

wherein $R^A$, $R^B$, $R^C$, $R^E$, $R^F$, and $L^2$ are each independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein any substitutions in $R^A$, $R^B$, $R^C$, $R^E$, and $R^F$ are optionally joined or fused into a ring;

wherein $M^1$ is a metal having atomic weight greater than 40;

wherein $M^2$ is selected from the group consisting of B, Al, Ga, Si, Ge, Sn, Zn, Cd, Pd, Pt, Co, Rh, Ir, Re, Ru, Os, Cu, Ag, and Au;

wherein $M^1$ and $M^2$ are different;

wherein in Formula I, $M^2$ coordinates to at least one of $X^{10}$ and $X^{11}$, and in Formula II, $M^2$ coordinates to at least one of $X^{16}$ and $X^{20}$;

wherein when the compound has the structure of Formula I and $M^2$ is B, $L^2$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, heteroaryl, acyl, carboxylic acid, ether, ester, nitrile, isonitrile, sulfanyl, sulfinyl, sulfonyl, phosphino, and combinations thereof;

wherein m and n have a value of at least 1 and m+n is the maximum possible number of ligands that are attached to $M^1$;

wherein k has a value of at least 1;

wherein each $L^1$ is a bidentate ligand;

wherein the first ligand is optionally linked with $L^1$ to comprise a mutidentate ligand; and wherein the consumer product is one of flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays, 3-D displays, virtual reality or augmented reality displays, vehicles, video walls comprising multiple displays tiled together, theater or stadium screen, and a sign.

* * * * *

UNITED STATES PATENT AND TRADEMARK OFFICE

CERTIFICATE OF CORRECTION

PATENT NO. : 11,605,791 B2
APPLICATION NO. : 16/117638
DATED : March 14, 2023
INVENTOR(S) : Morgan C. Macinnis and George Fitzgerald It is certified that error appears in the above-identified patent and that said Letters Patent is hereby corrected as shown below:

In the Claims

In Claim 7, Column 385, Lines 1-13, please delete the chemical structure LA482.

In Claim 8, Column 411, Lines 56-67, please delete the chemical structure $L_{B1}$.

In Claim 8, Column 412, Lines 1-27, please delete the chemical structures $L_{B2}$ and $L_{B3}$.

In Claim 8, Column 412, Lines 56-67, please delete the chemical structure $L_{B6}$.

In Claim 8, Column 413, Lines 1-25, please delete the chemical structures $L_{B7}$ and $L_{B8}$.

In Claim 8, Column 414, Lines 1-67, please delete all chemical structures $L_{B12}$ through $L_{B17}$.

In Claim 8, Column 415, Lines 1-37, please delete the chemical structures $L_{B18}$ through $L_{B20}$.

In Claim 8, Column 416, Lines 1-67, please delete all chemical structures $L_{B23}$ through $L_{B27}$.

In Claim 8, Column 417, Lines 1-16, please delete the chemical structure $L_{B28}$.

In Claim 8, Column 422, Lines 31-67, please delete the chemical structures $L_{B54}$ through $L_{B56}$.

In Claim 8, Column 423, Lines 1-34, please delete the chemical structures $L_{B57}$ and $L_{B58}$.

In Claim 8, Column 424, Lines 18-67, please delete the chemical structures $L_{B62}$ through $L_{B65}$.

In Claim 8, Column 425, Lines 1-67, please delete all chemical structures $L_{B66}$ through $L_{B70}$.

In Claim 8, Column 426, Lines 1-67, please delete all chemical structures $L_{B71}$ through $L_{B75}$.

Signed and Sealed this
Thirteenth Day of June, 2023

Katherine Kelly Vidal

Katherine Kelly Vidal
*Director of the United States Patent and Trademark Office*

In Claim 8, Column 427, Lines 1-67, please delete all chemical structures $L_{B76}$ through $L_{B80}$.

In Claim 8, Column 428, Lines 30-67, please delete the chemical structures $L_{B83}$ through $L_{B85}$.

In Claim 8, Column 429, Lines 1-52, please delete the chemical structures $L_{B86}$ through $L_{B88}$.

In Claim 8, Column 430, Lines 31-67, please delete the chemical structures $L_{B92}$ through $L_{B94}$.

In Claim 8, Column 431, Lines 1-67, please delete all chemical structures $L_{B95}$ through $L_{B99}$.

In Claim 8, Column 432, Lines 1-67, please delete all chemical structures $L_{B100}$ through $L_{B104}$.

In Claim 8, Column 433, Lines 1-29, please delete the chemical structures $L_{B105}$ through $L_{B106}$.